United States Patent
Saeki

(10) Patent No.: US 10,784,906 B2
(45) Date of Patent: Sep. 22, 2020

(54) TRANSMITTING DEVICE, TRANSMITTING METHOD, AND COMMUNICATION SYSTEM

(71) Applicant: Sony Corporation, Tokyo (JP)

(72) Inventor: Takanori Saeki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/307,760

(22) PCT Filed: Jun. 6, 2017

(86) PCT No.: PCT/JP2017/020913
§ 371 (c)(1),
(2) Date: Dec. 6, 2018

(87) PCT Pub. No.: WO2018/012145
PCT Pub. Date: Jan. 18, 2018

(65) Prior Publication Data
US 2019/0181893 A1    Jun. 13, 2019

(30) Foreign Application Priority Data
Jul. 14, 2016 (JP) ................... 2016-139024

(51) Int. Cl.
*H04B 1/04* (2006.01)
*H04L 25/02* (2006.01)

(52) U.S. Cl.
CPC ............. *H04B 1/04* (2013.01); *H04B 1/0475* (2013.01); *H04L 25/02* (2013.01)

(58) Field of Classification Search
CPC .......... H04B 1/16; H04B 2001/0408; H04B 5/0037; H04B 1/0475; H04B 10/11; H04B 1/18; H04B 2001/045; H04B 1/0057; H04B 1/0458; H04B 1/48
USPC .......................................... 375/257; 379/394
See application file for complete search history.

(56) References Cited

U.S. PATENT DOCUMENTS

2004/0242171 A1* 12/2004 Hosokawa ........... H03K 5/1534
                                                                    455/127.1
2009/0110040 A1*  4/2009 Jang ...................... H04L 7/0054
                                                                    375/224

FOREIGN PATENT DOCUMENTS

| JP | 2010-520715 A | 6/2010 |
| JP | 2011-517159 A | 5/2011 |
| JP | 2012-049784 A | 3/2012 |
| JP | 2013-187678 A | 9/2013 |
| JP | 2016-006937 A | 1/2016 |

* cited by examiner

*Primary Examiner* — David C Payne
*Assistant Examiner* — Sarah Hassan
(74) *Attorney, Agent, or Firm* — Michael Best & Friedrich LLP

(57) ABSTRACT

A transmitting device of the present disclosure include: a first driver that includes a first sub-driver unit which operates on a basis of a first control signal and a second sub-driver unit which operates on a basis of, of the first control signal and a second control signal, a signal selected through a first selecting operation, and is configured to be able to set a voltage at a first output terminal; and a controller that controls the first selecting operation.

32 Claims, 79 Drawing Sheets

[ FIG. 1A ]
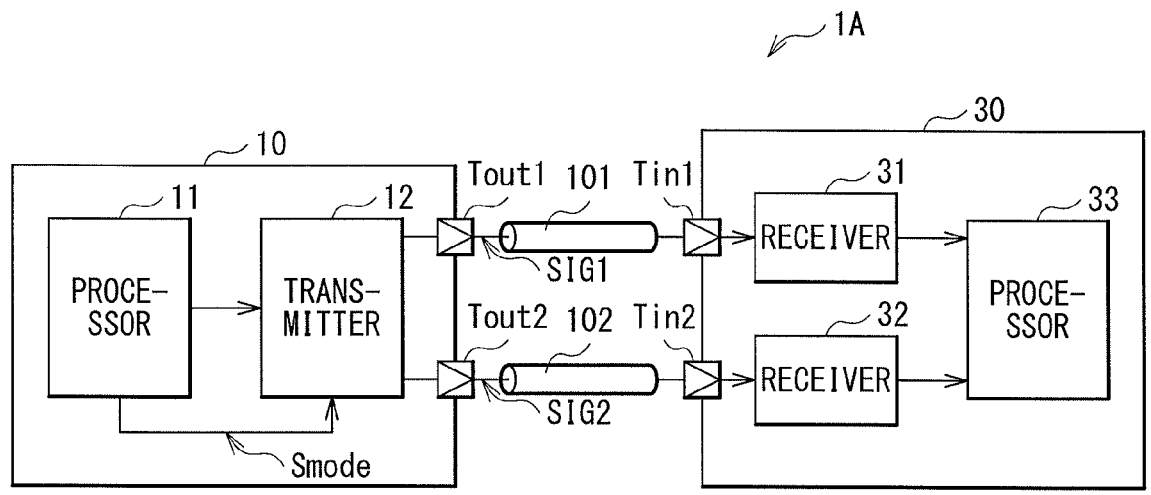
[ FIG. 1B ]
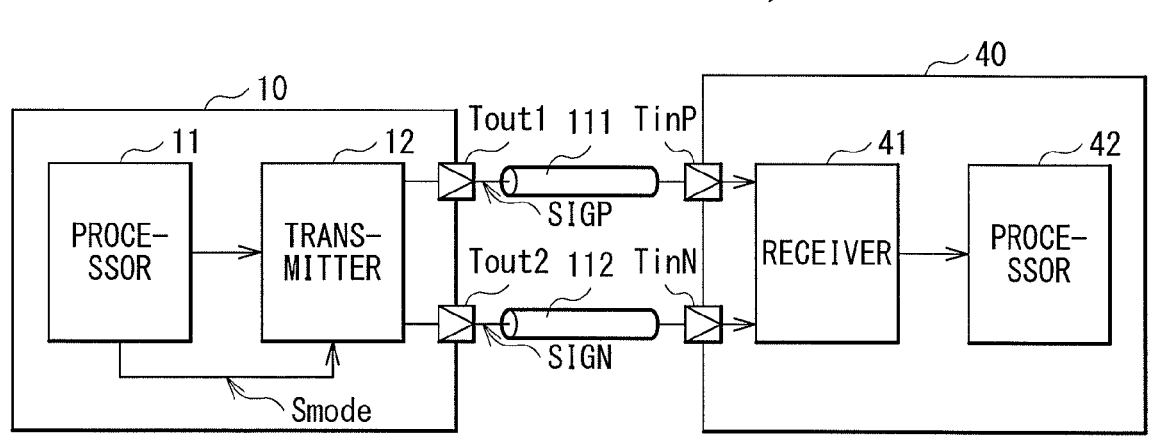

[FIG. 2]
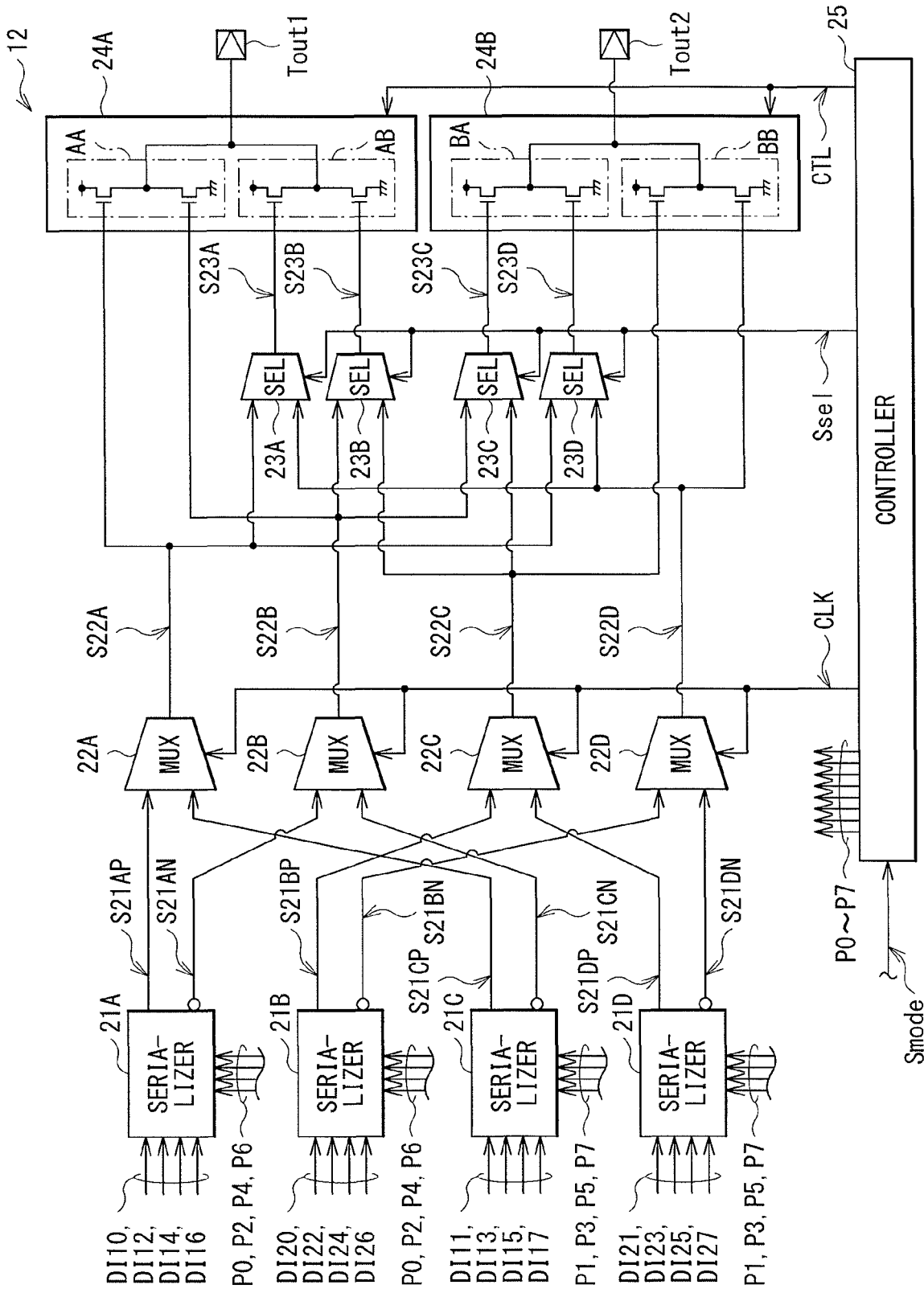

[FIG. 3]
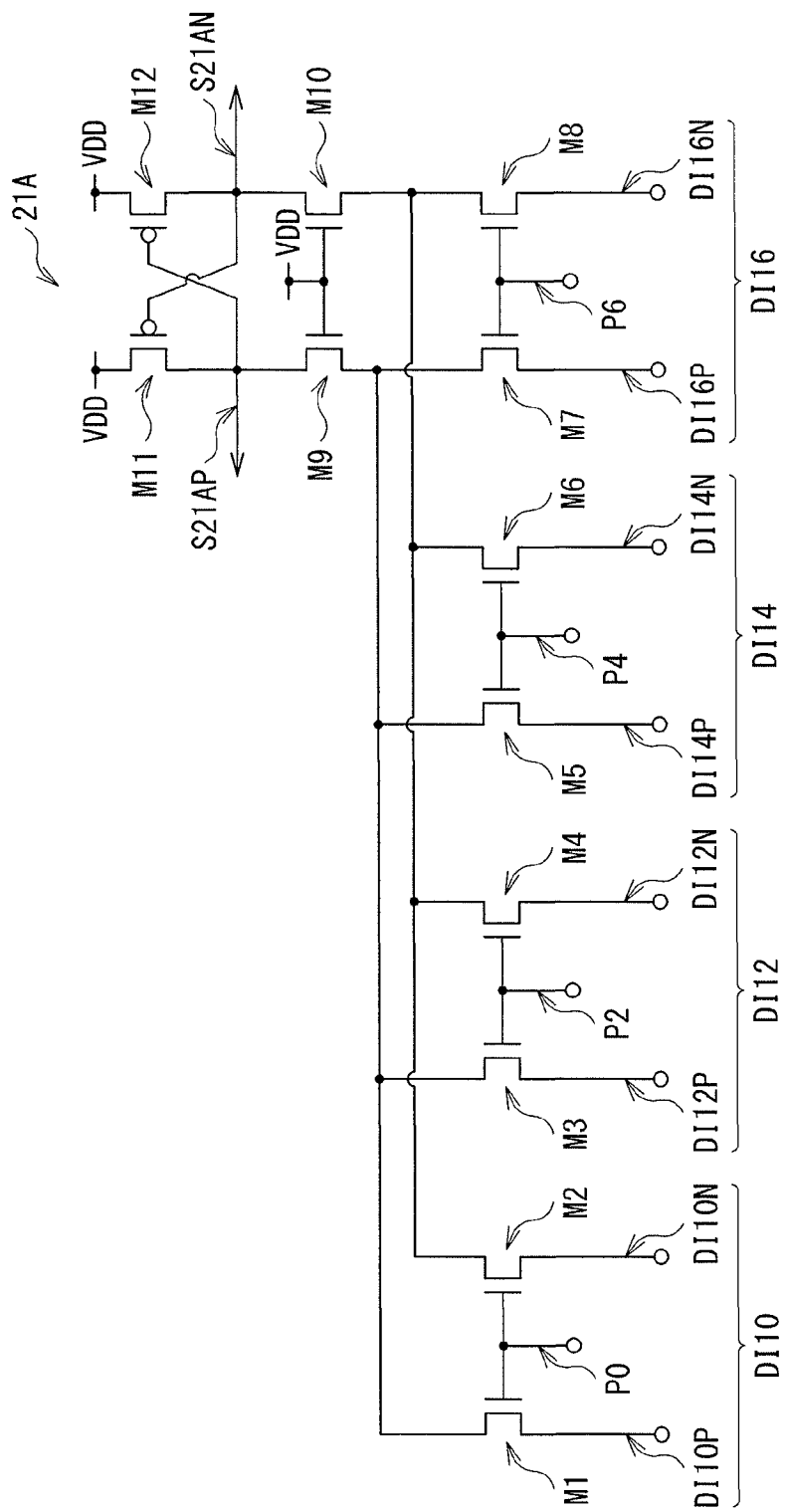

[ FIG. 4 ]
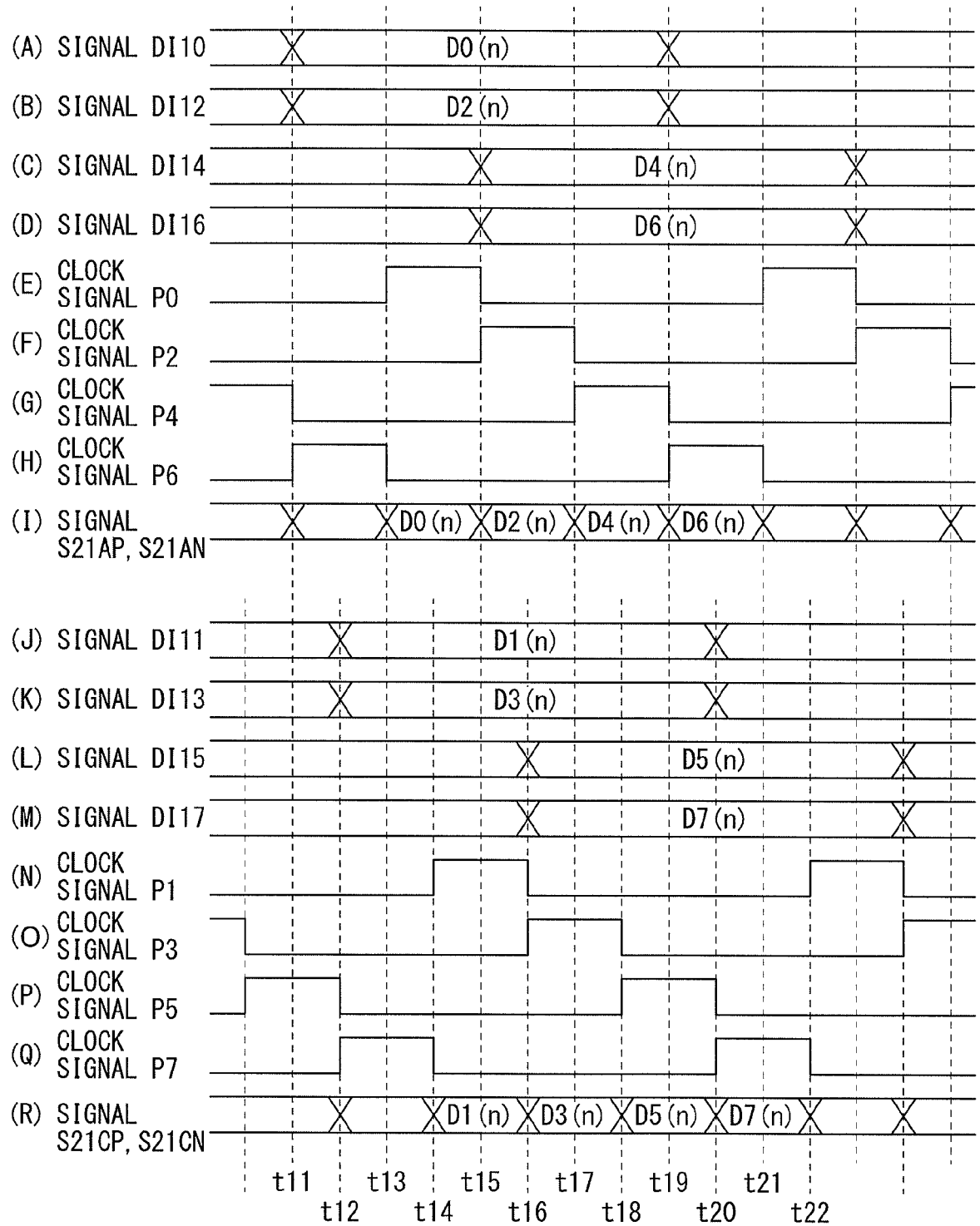

[FIG. 5]
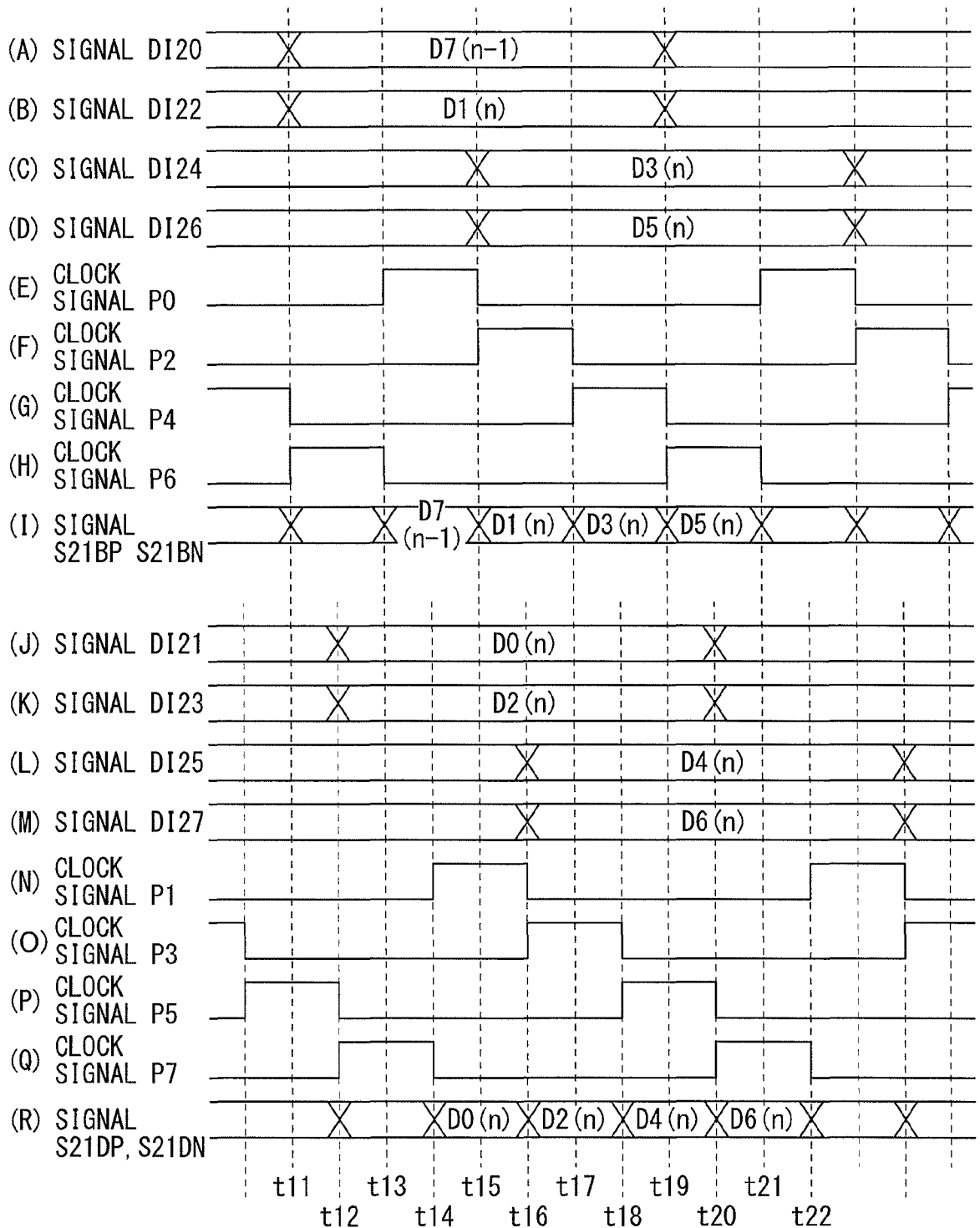

[ FIG. 6 ]
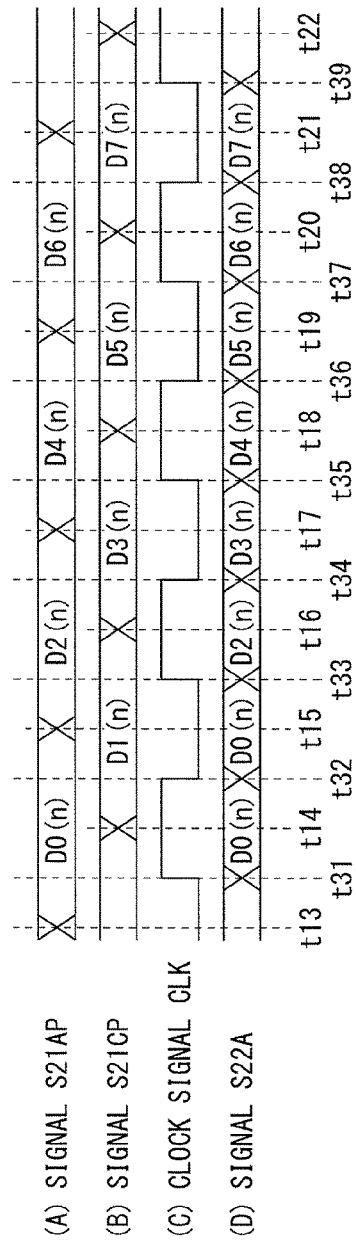

[ FIG. 7 ]
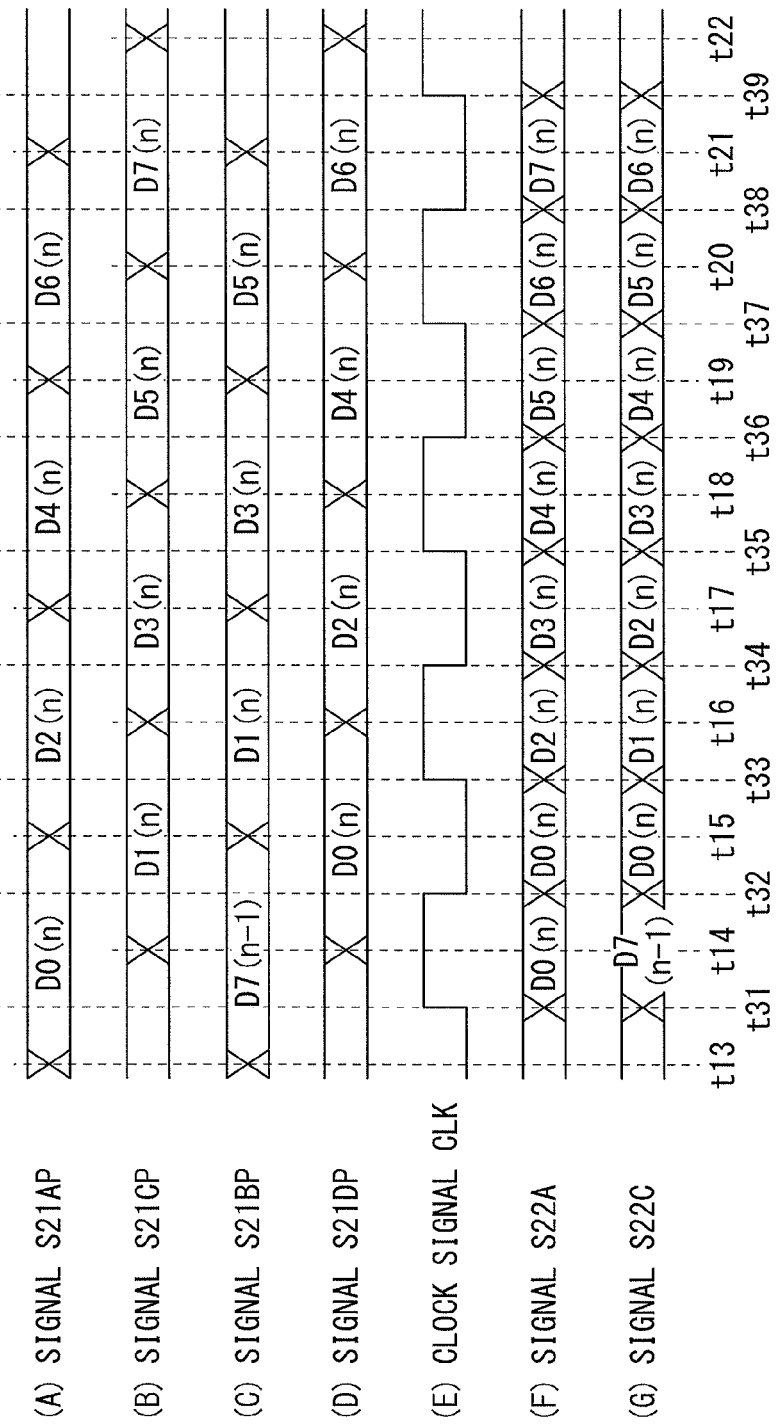

[ FIG. 8 ]
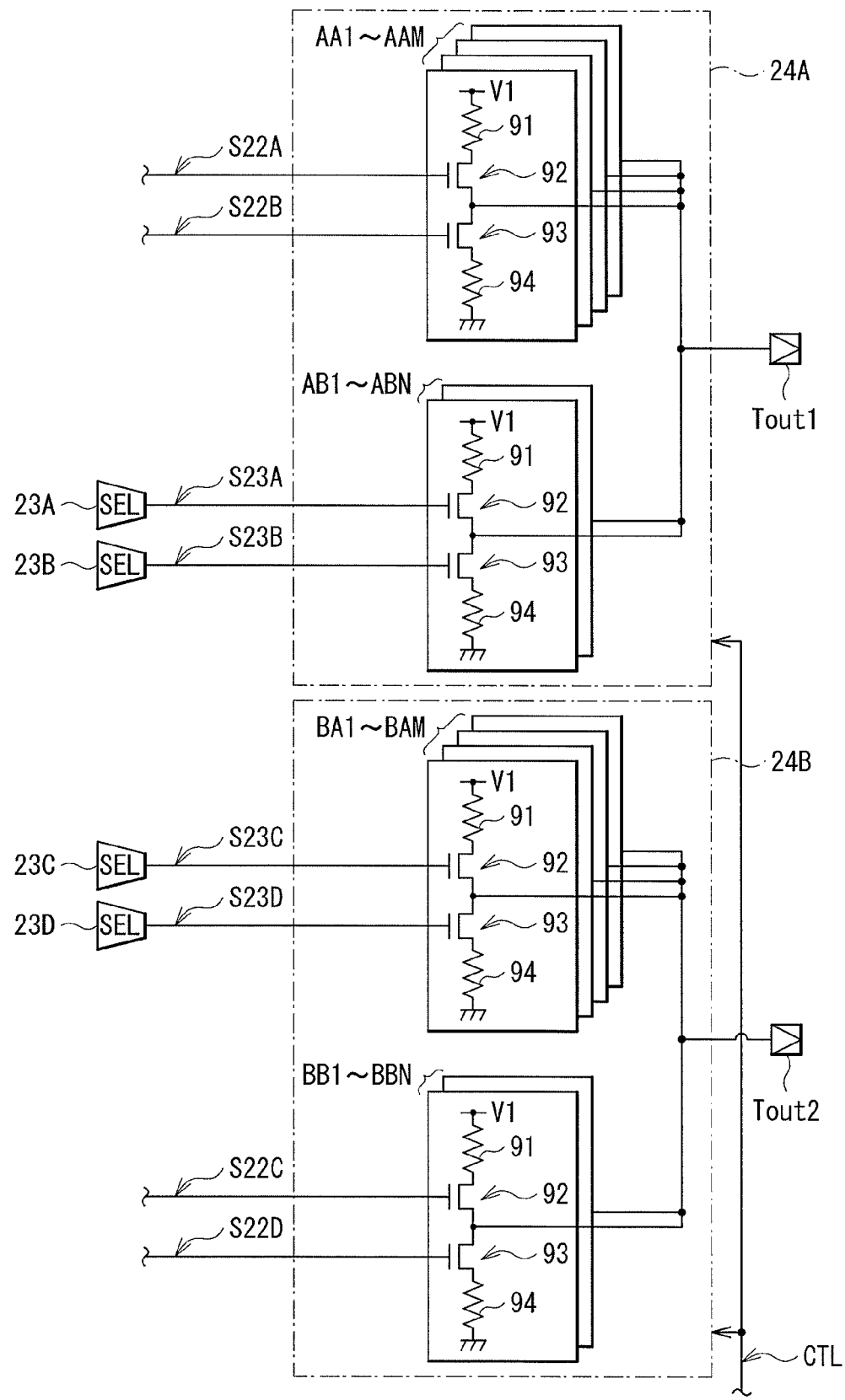

[ FIG. 9 ]
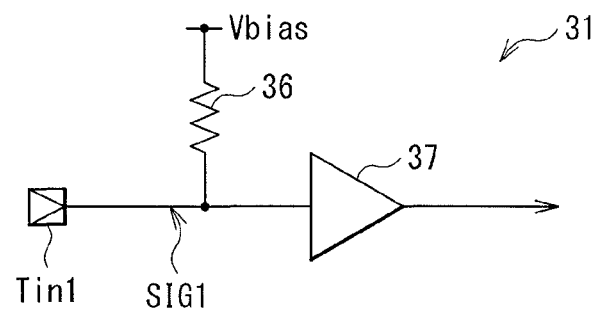
[ FIG. 10 ]
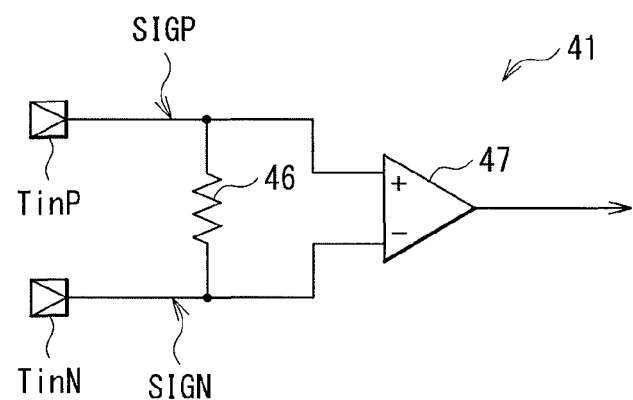

[ FIG. 11 ]
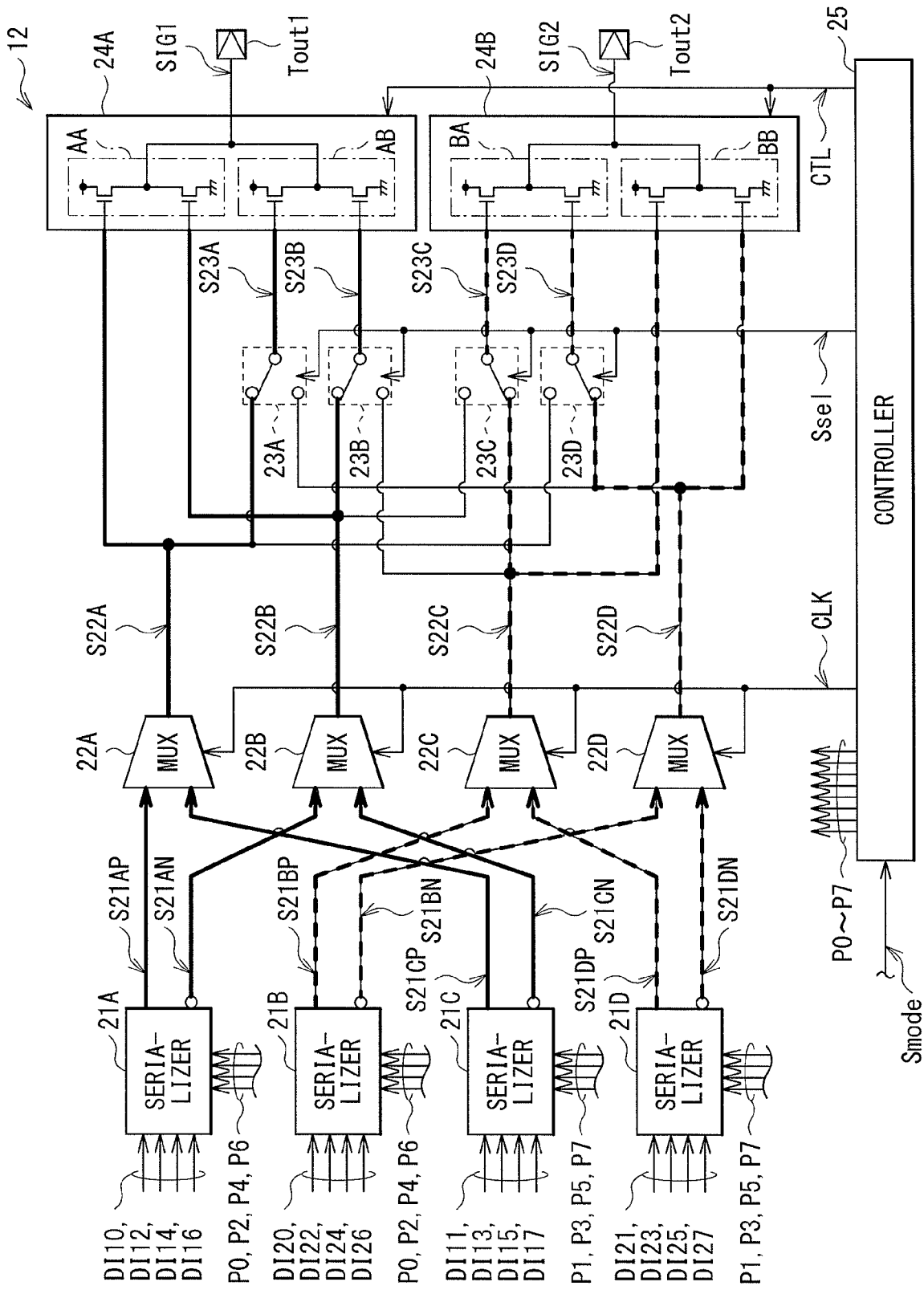

[ FIG. 12 ]
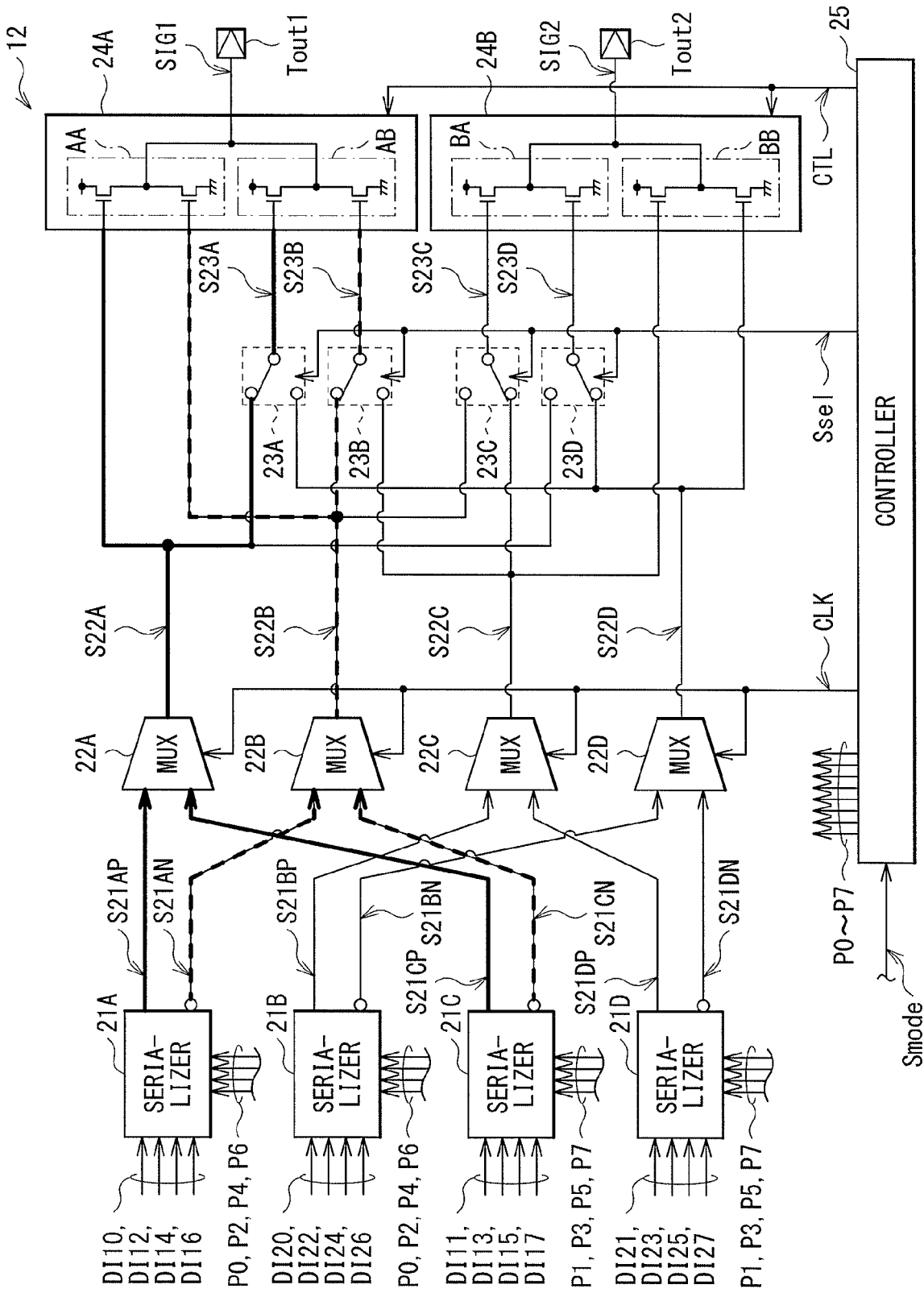

[ FIG. 13 ]
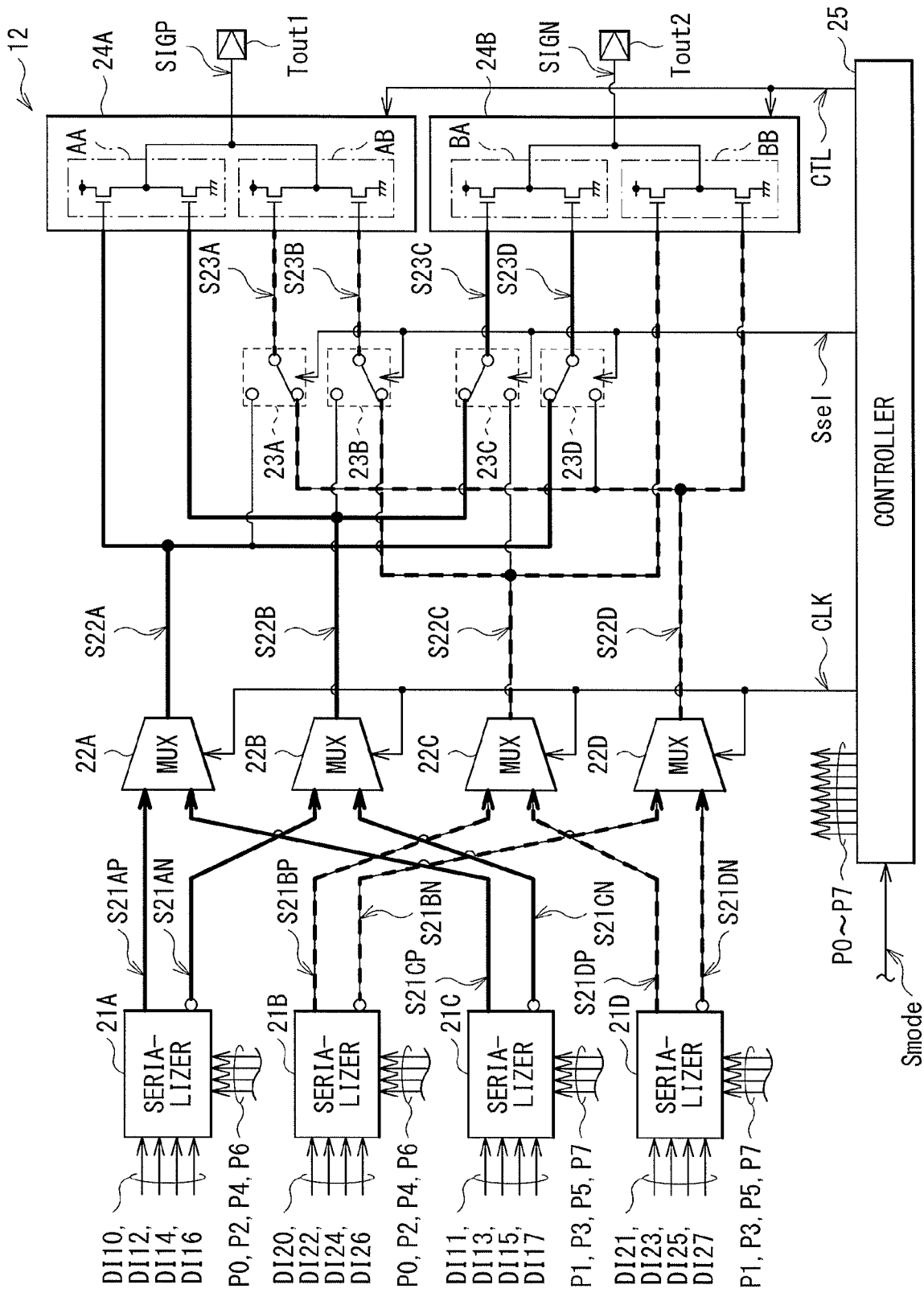

[ FIG. 14 ]
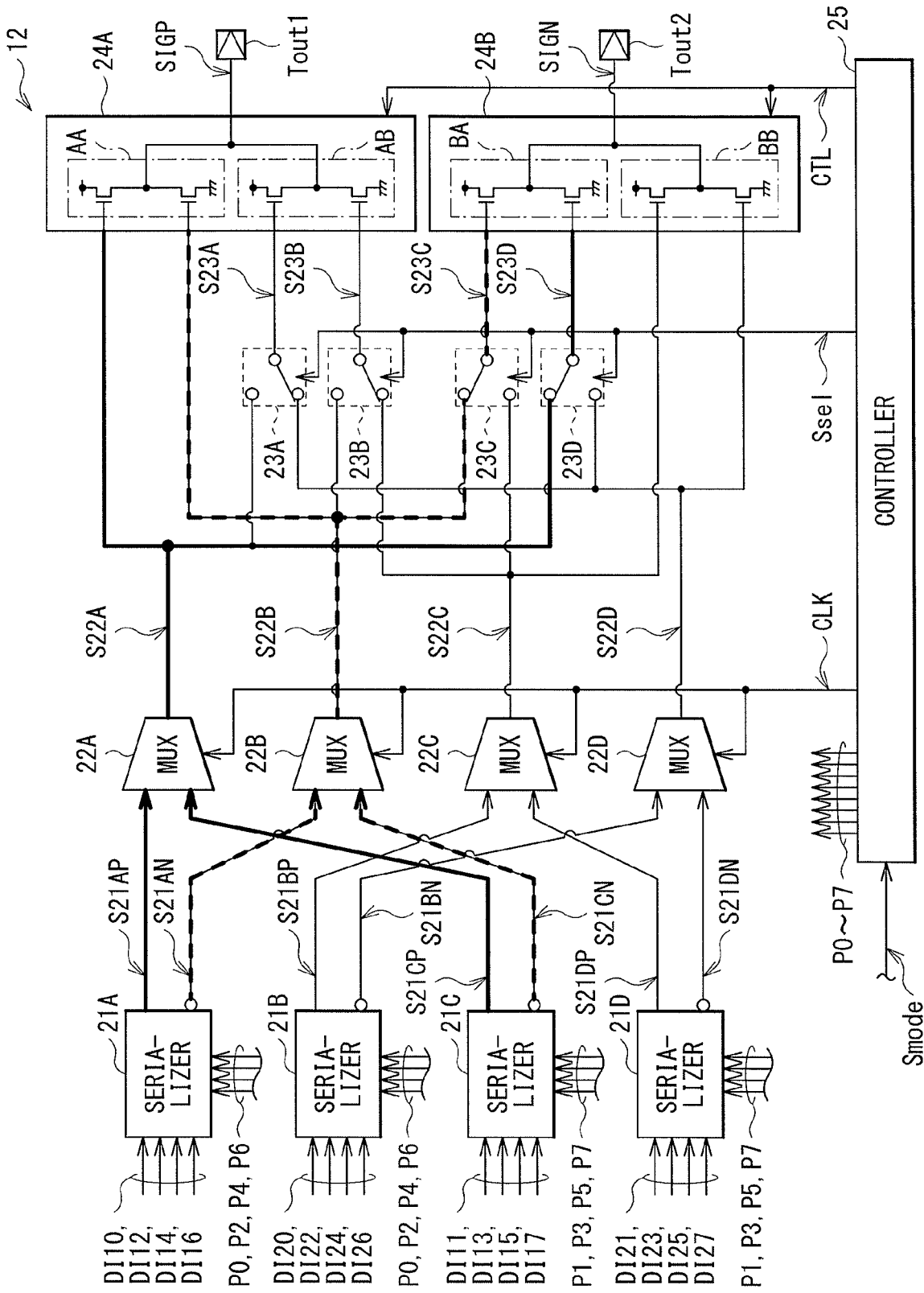

[ FIG. 15 ]
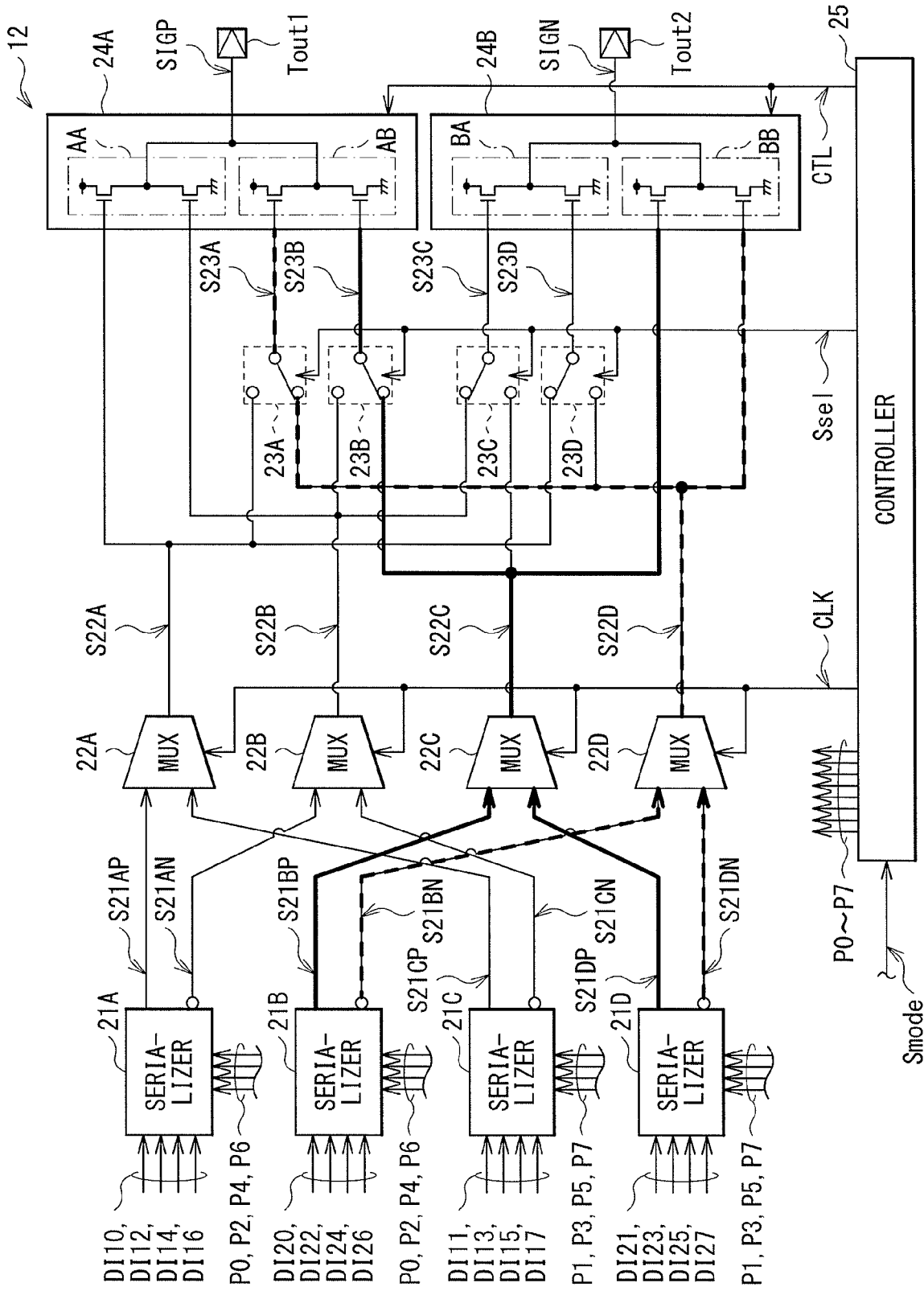

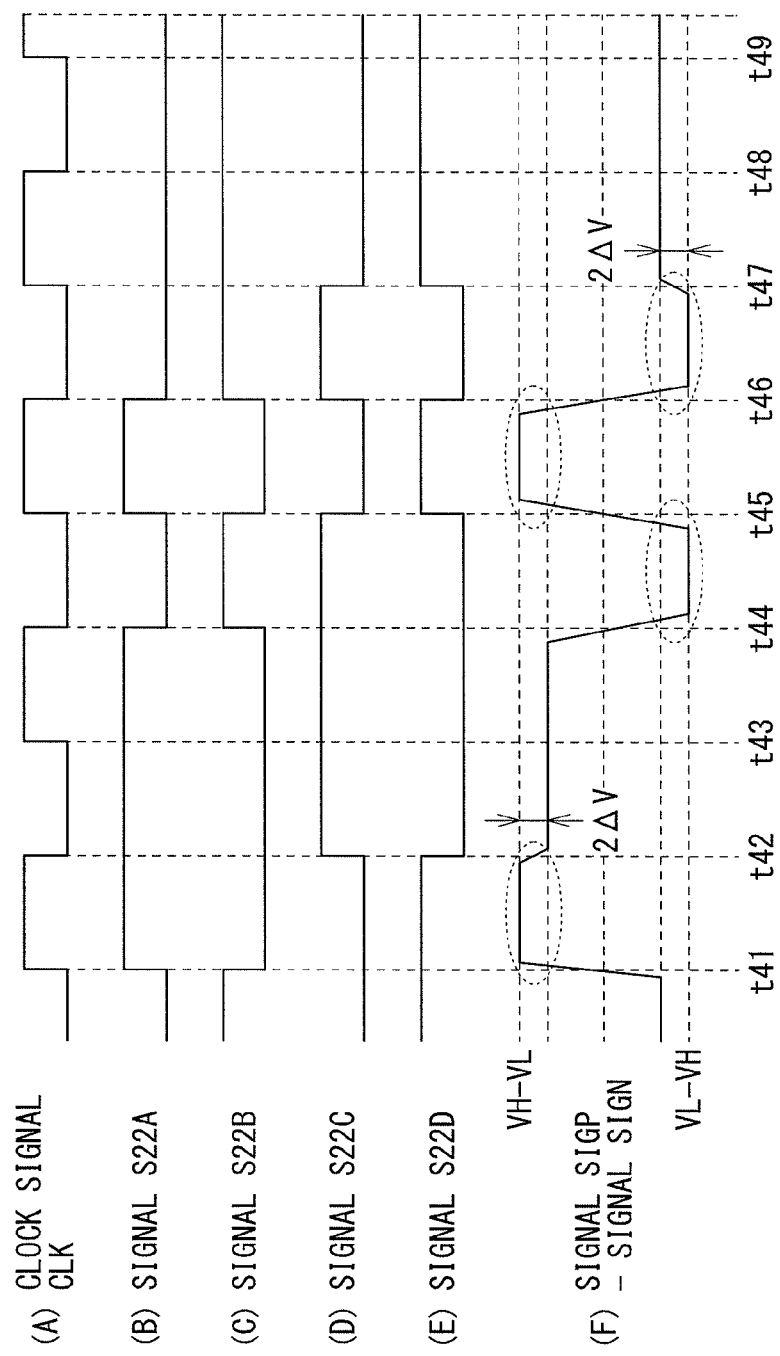
[ FIG. 16 ]

[ FIG. 17 ]
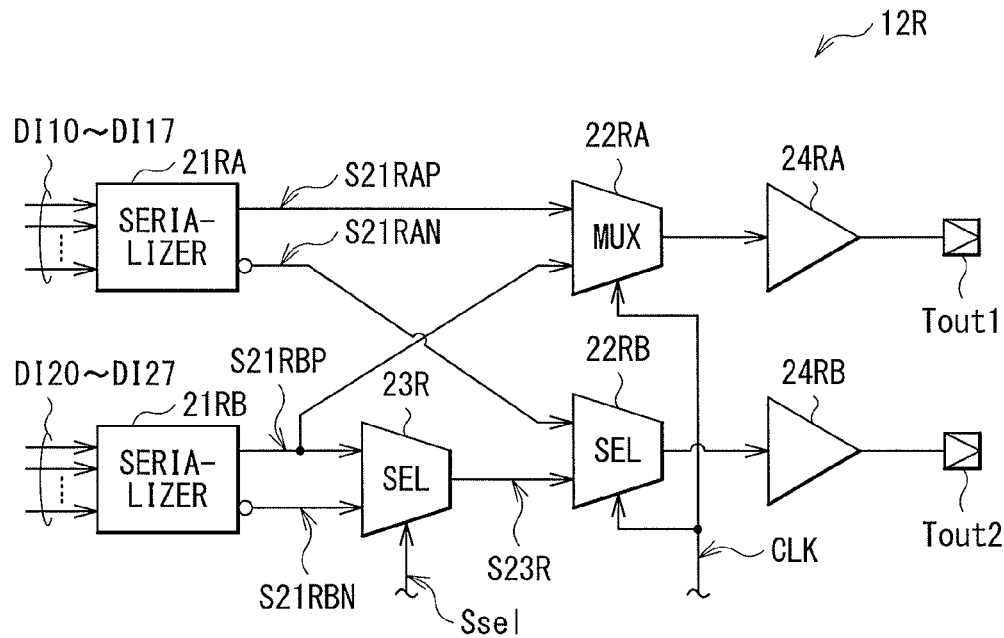
[ FIG. 18 ]
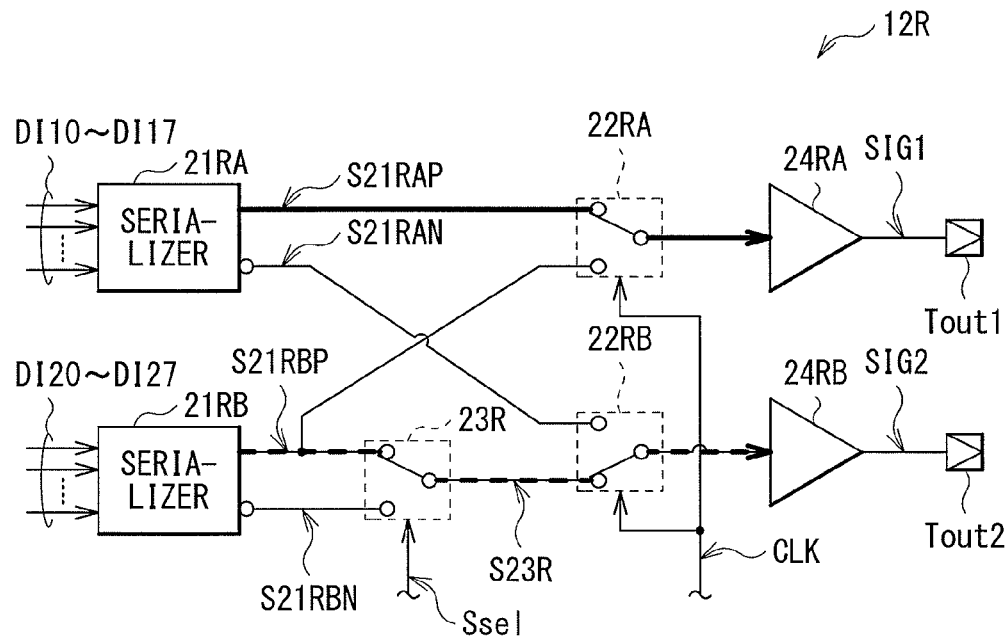

[ FIG. 19 ]
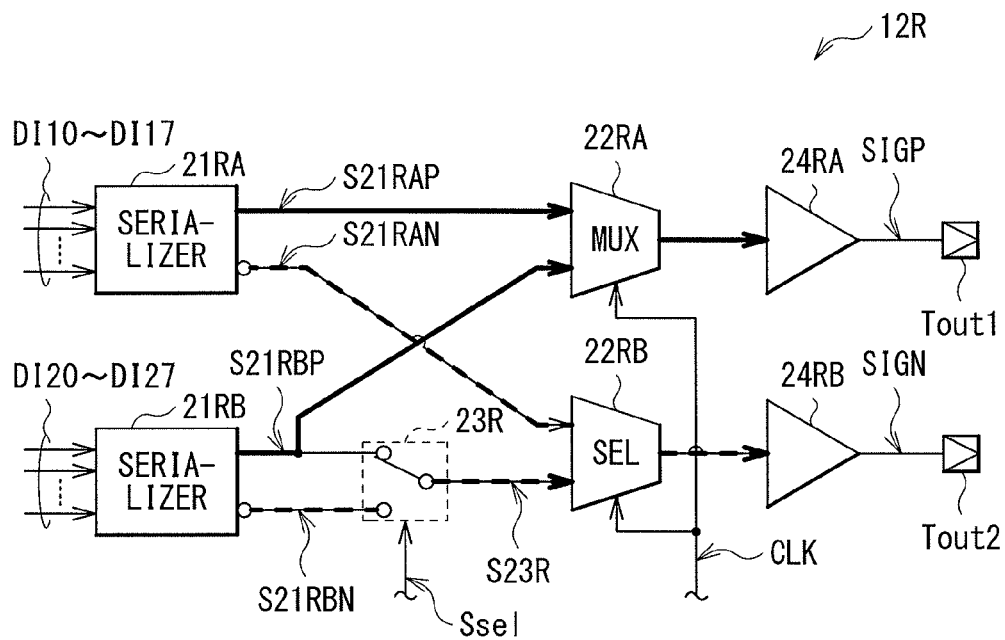
[ FIG. 20 ]
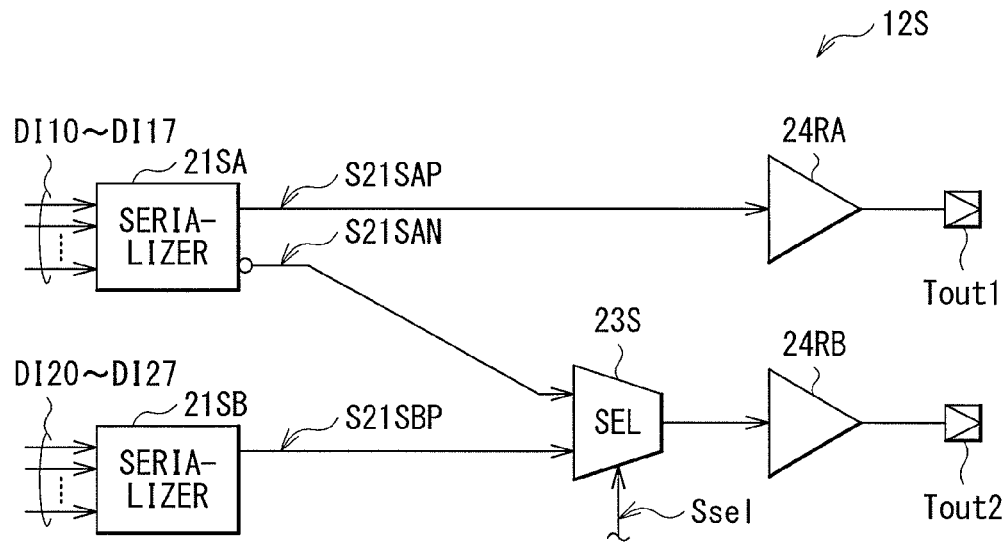

[ FIG. 21 ]
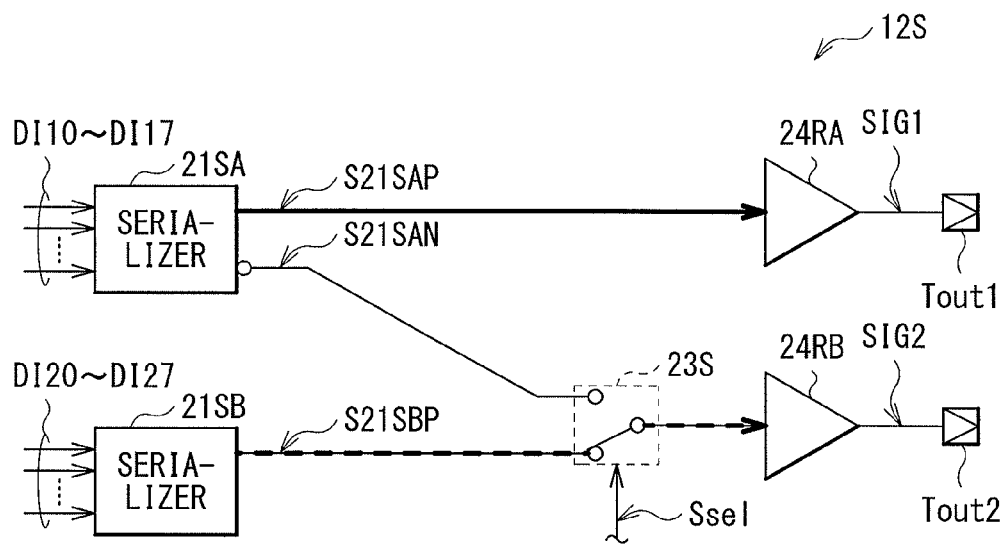
[ FIG. 22 ]
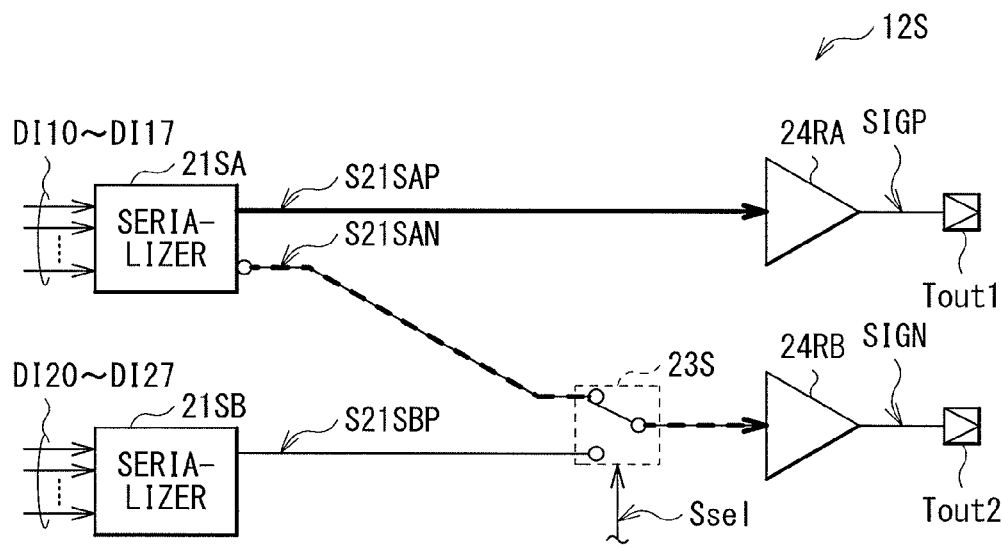

[ FIG. 23 ]
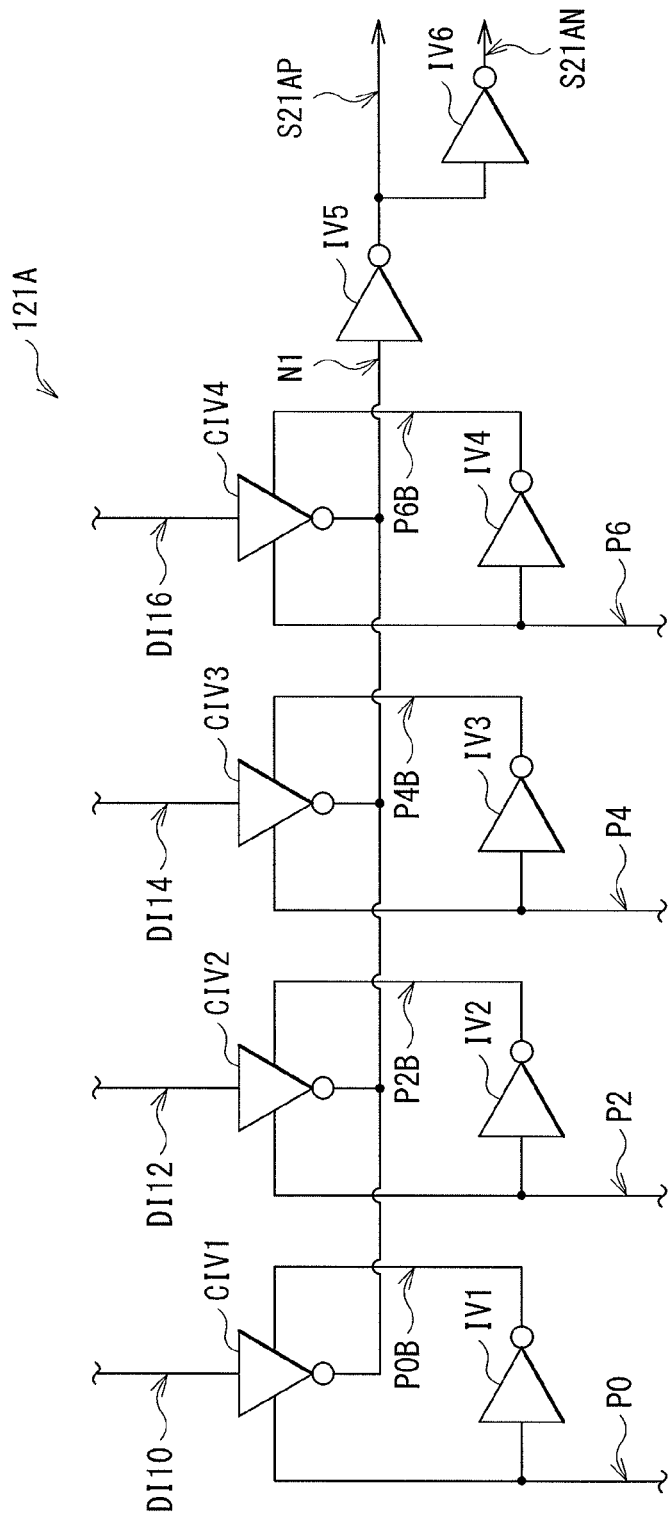

[ FIG. 24 ]
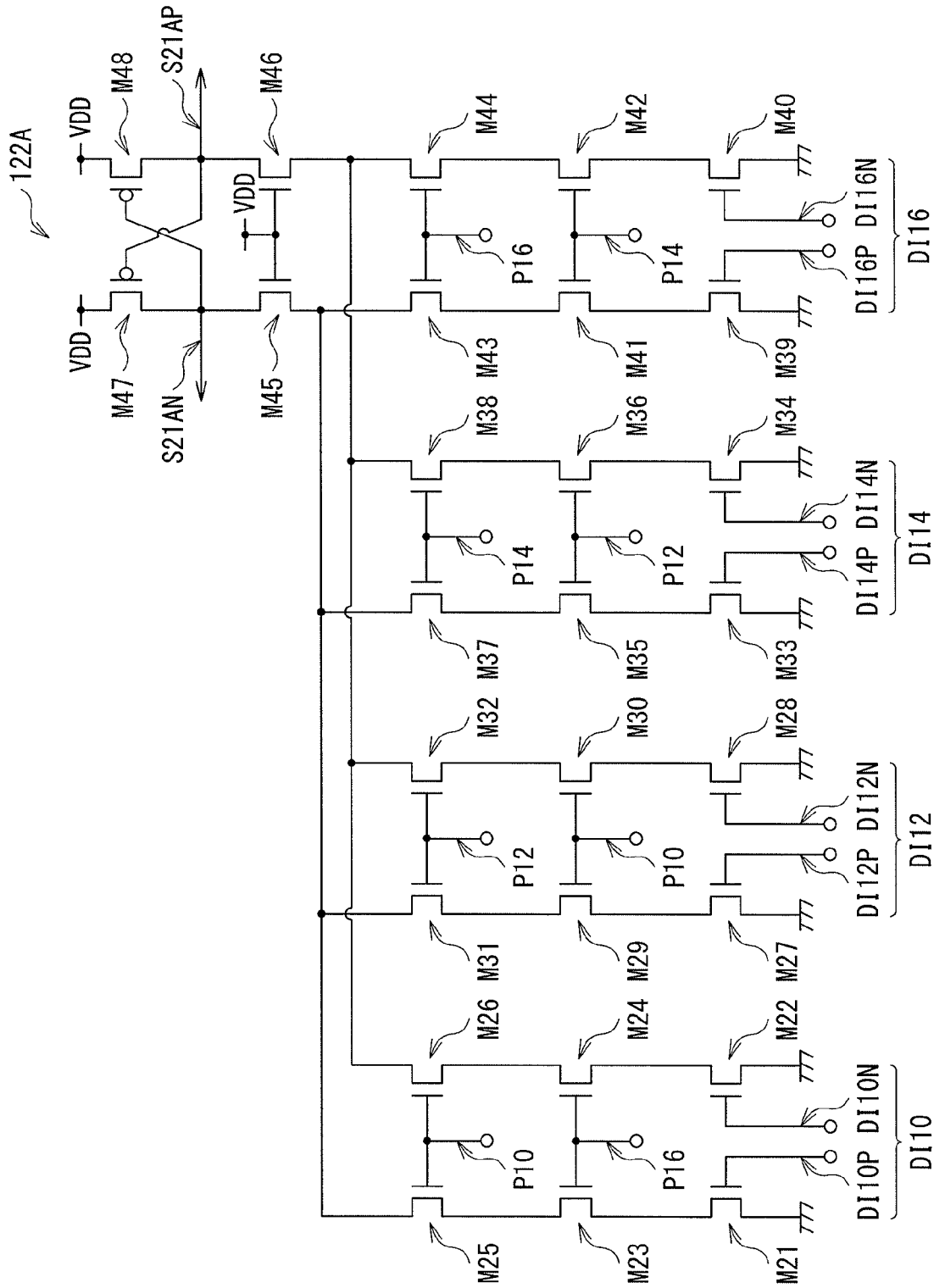

[ FIG. 25 ]
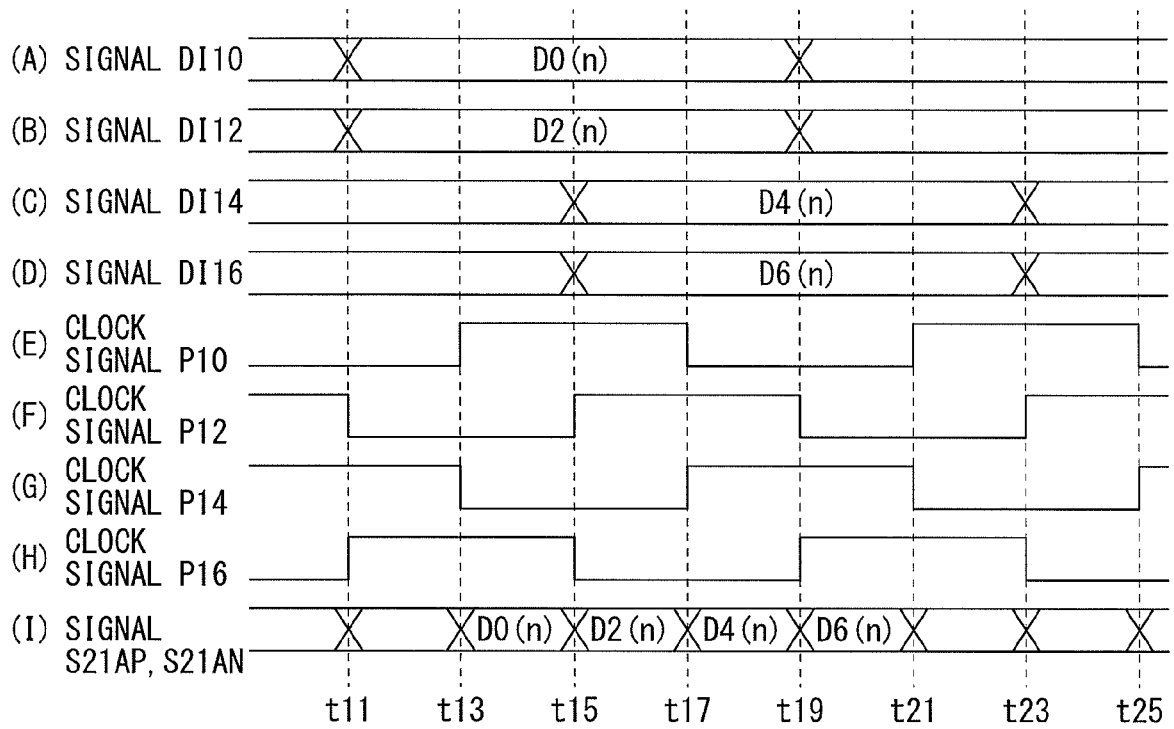
[ FIG. 26 ]
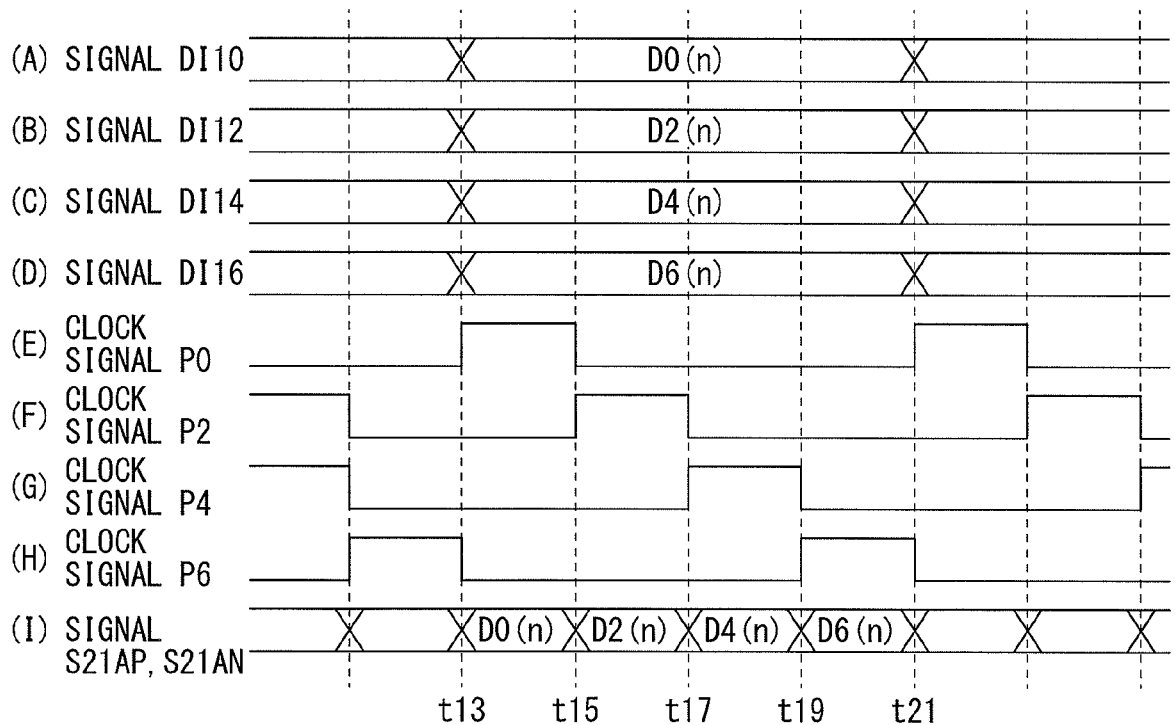

[ FIG. 27 ]
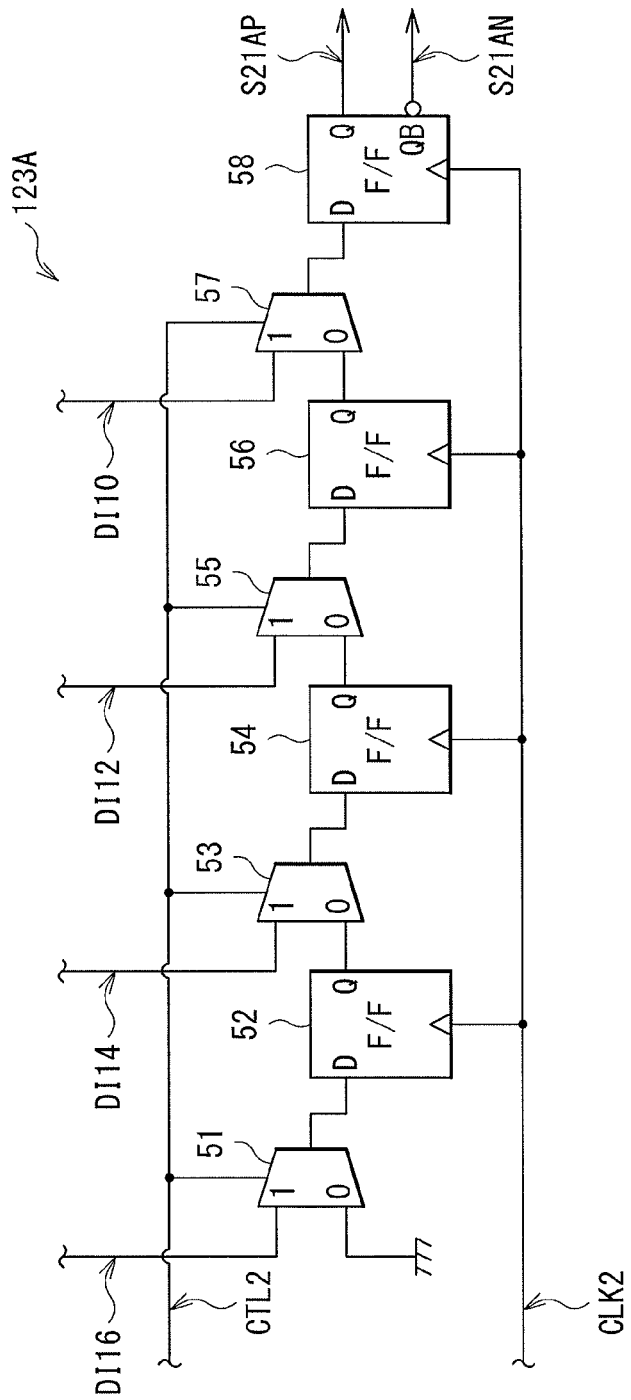

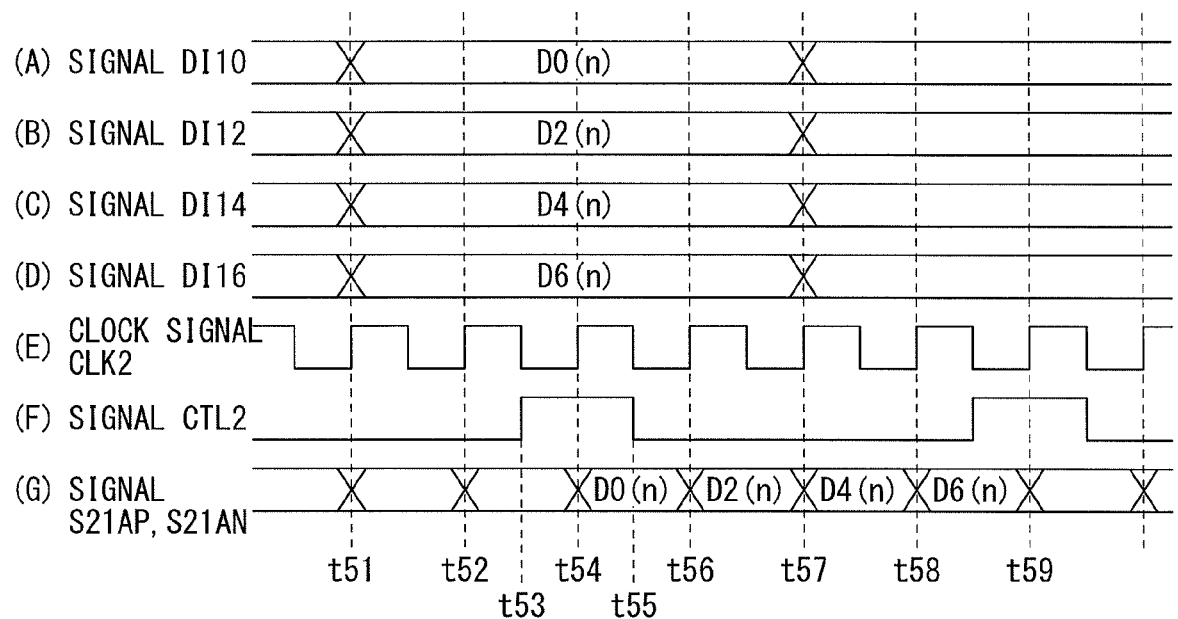
[ FIG. 28 ]

[FIG. 29]
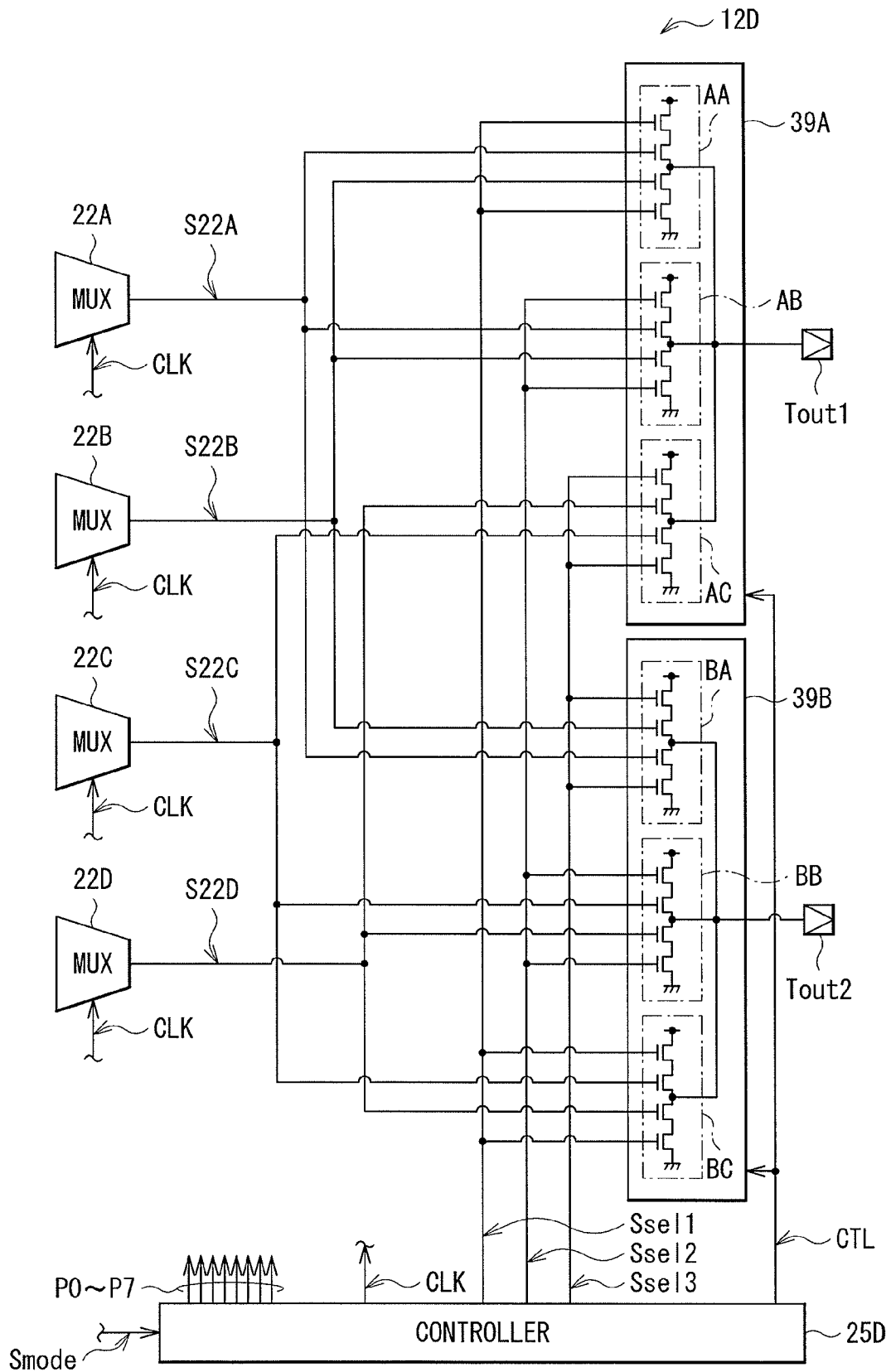

[ FIG. 30 ]
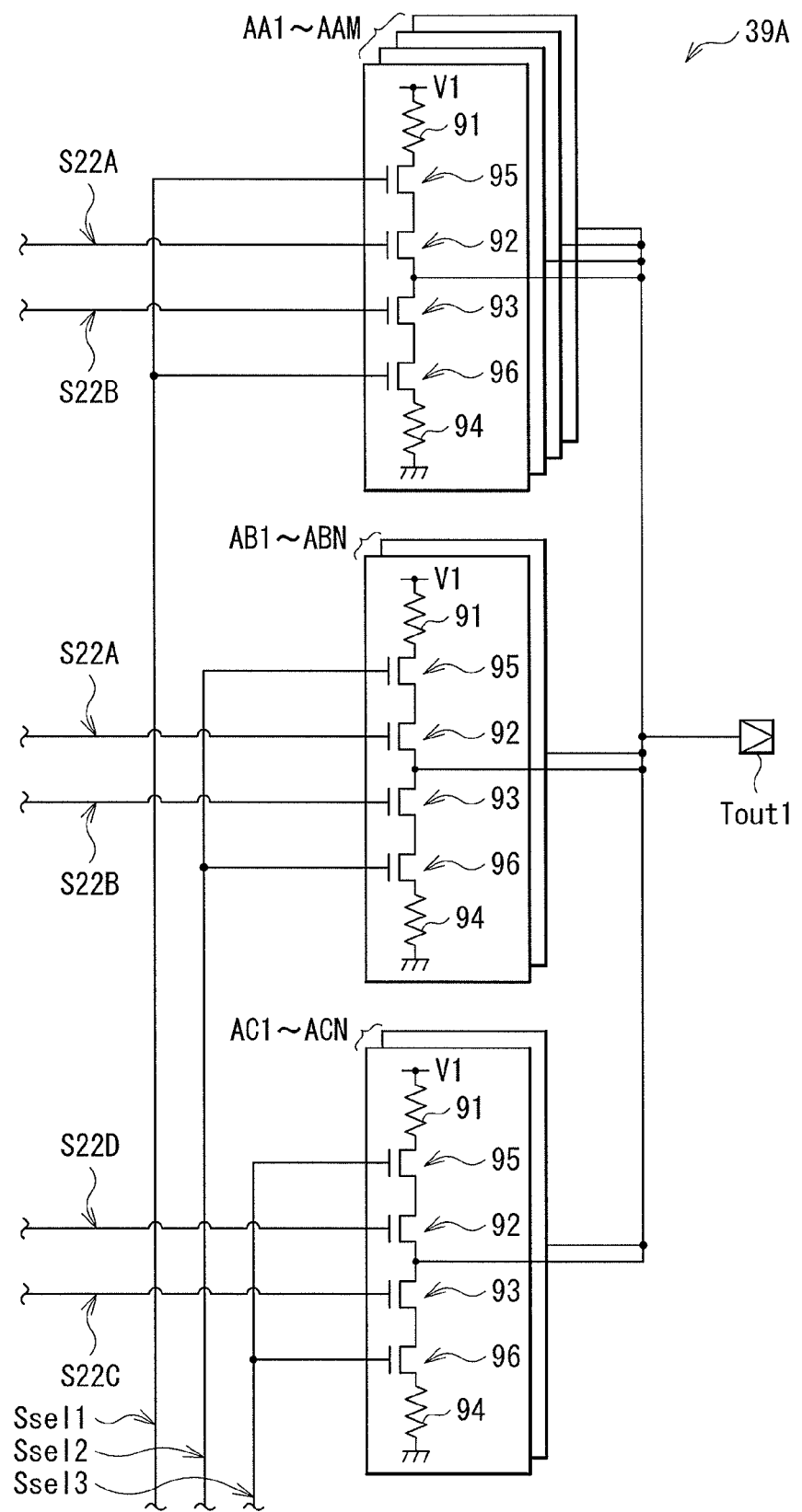

[FIG. 31]
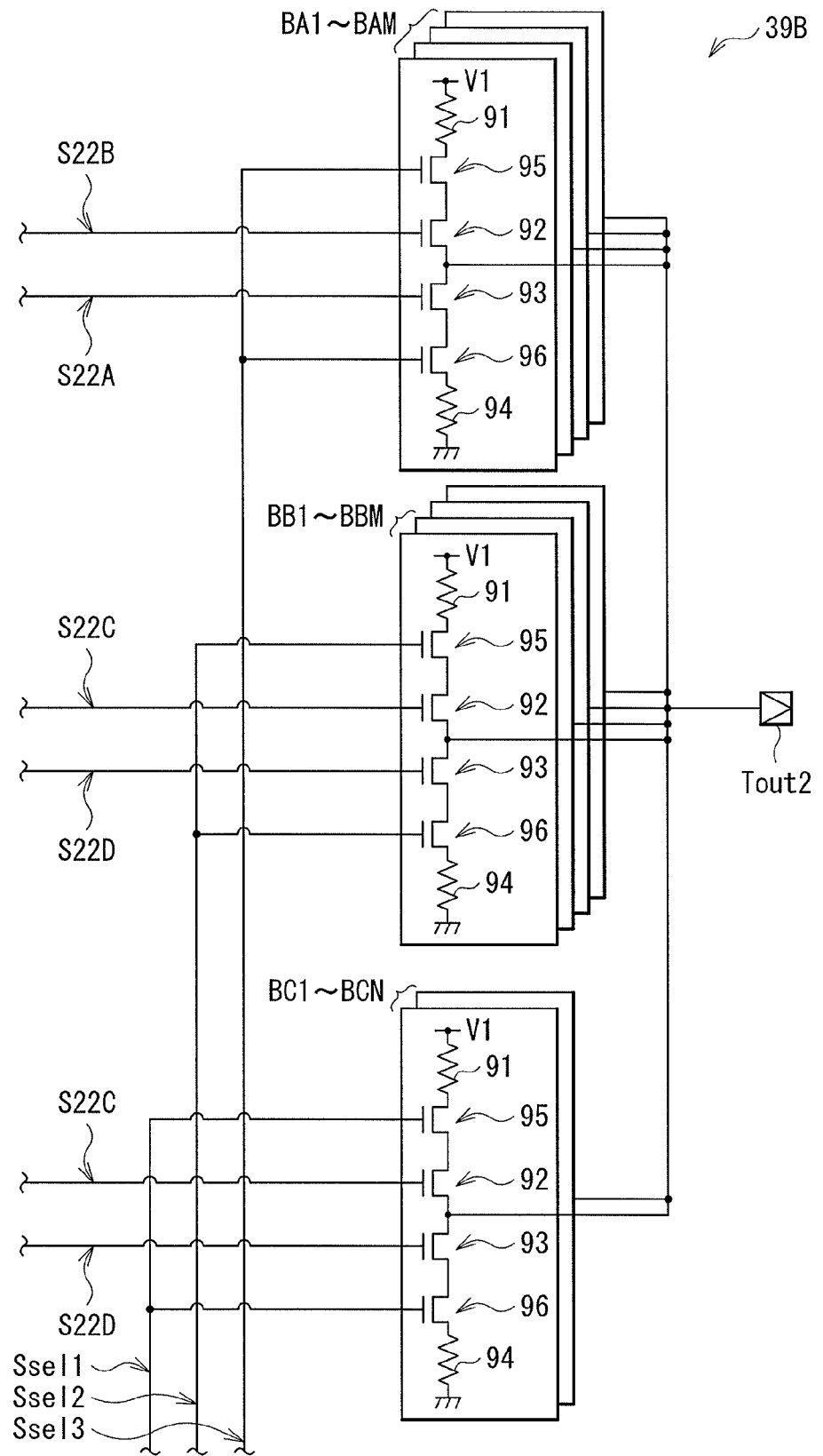

[ FIG. 32 ]
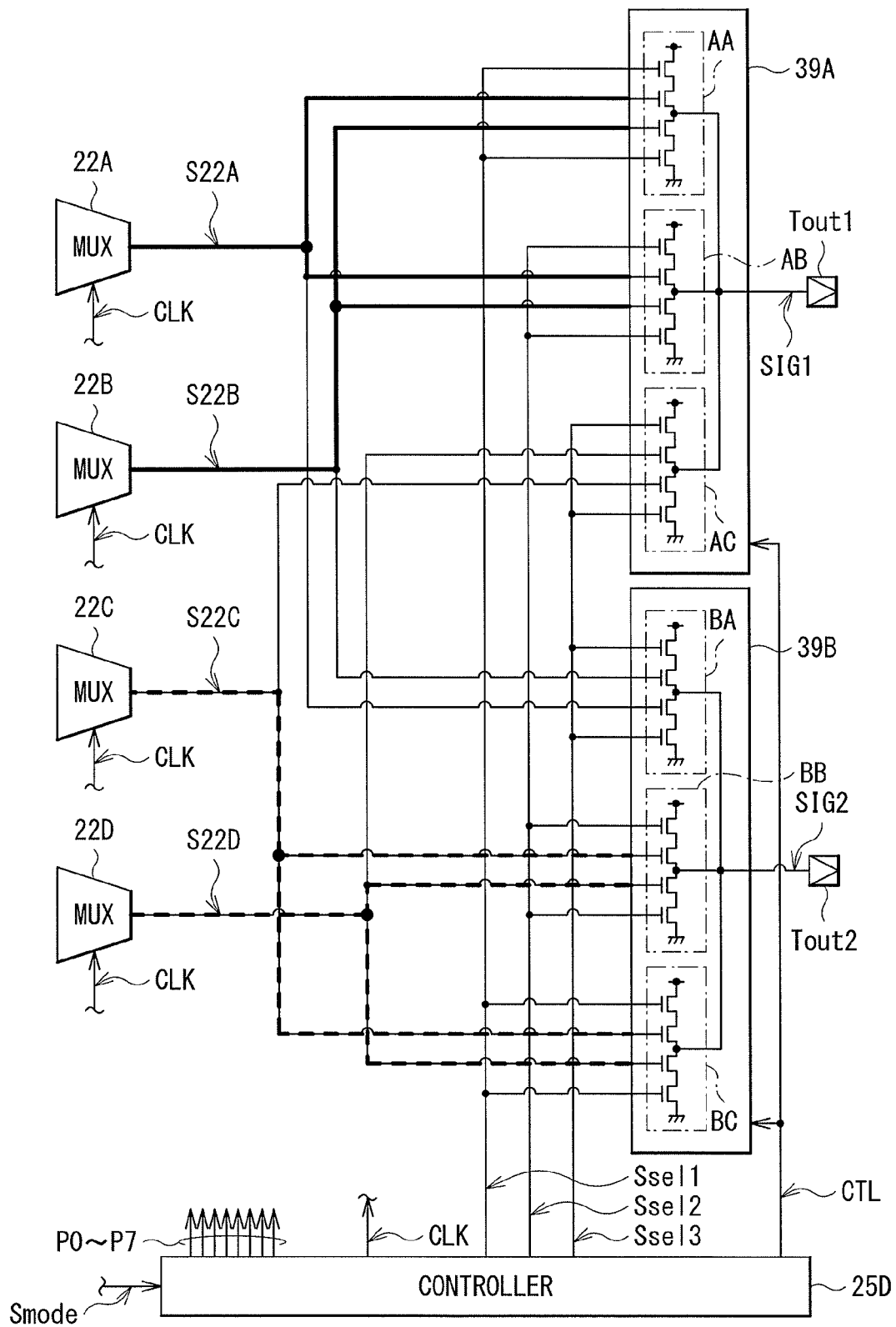

[ FIG. 33 ]
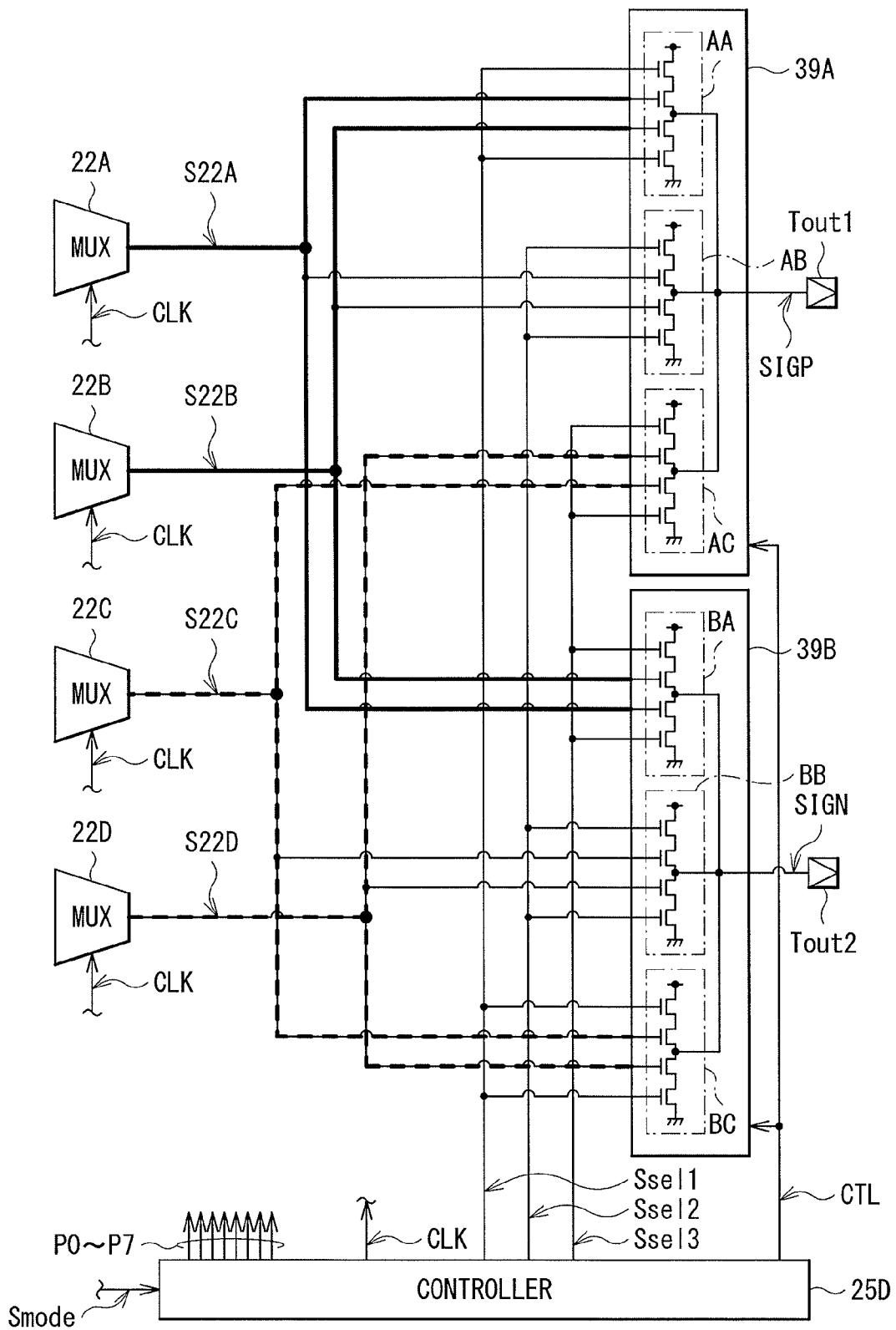

[FIG. 34]
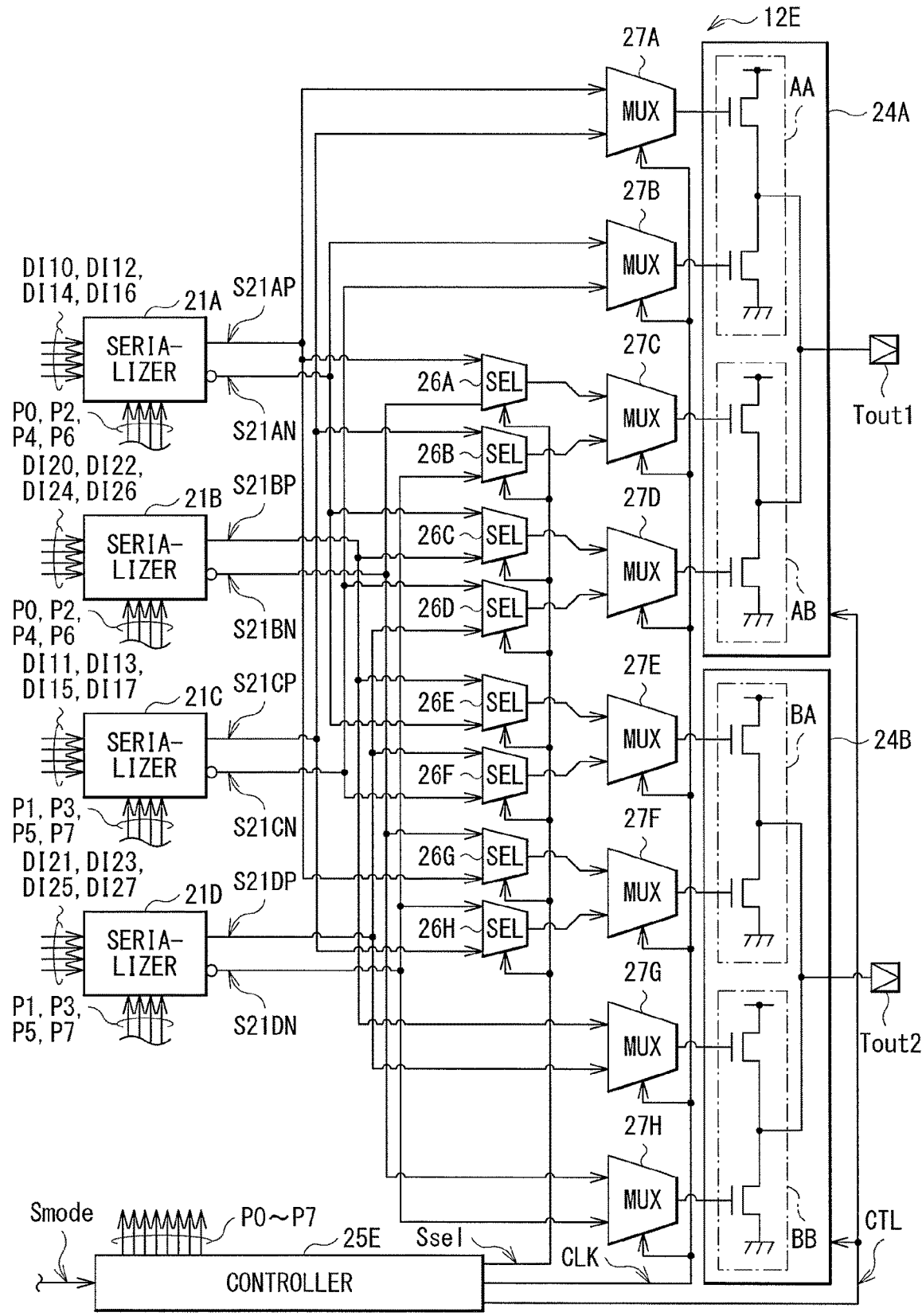

[ FIG. 35 ]
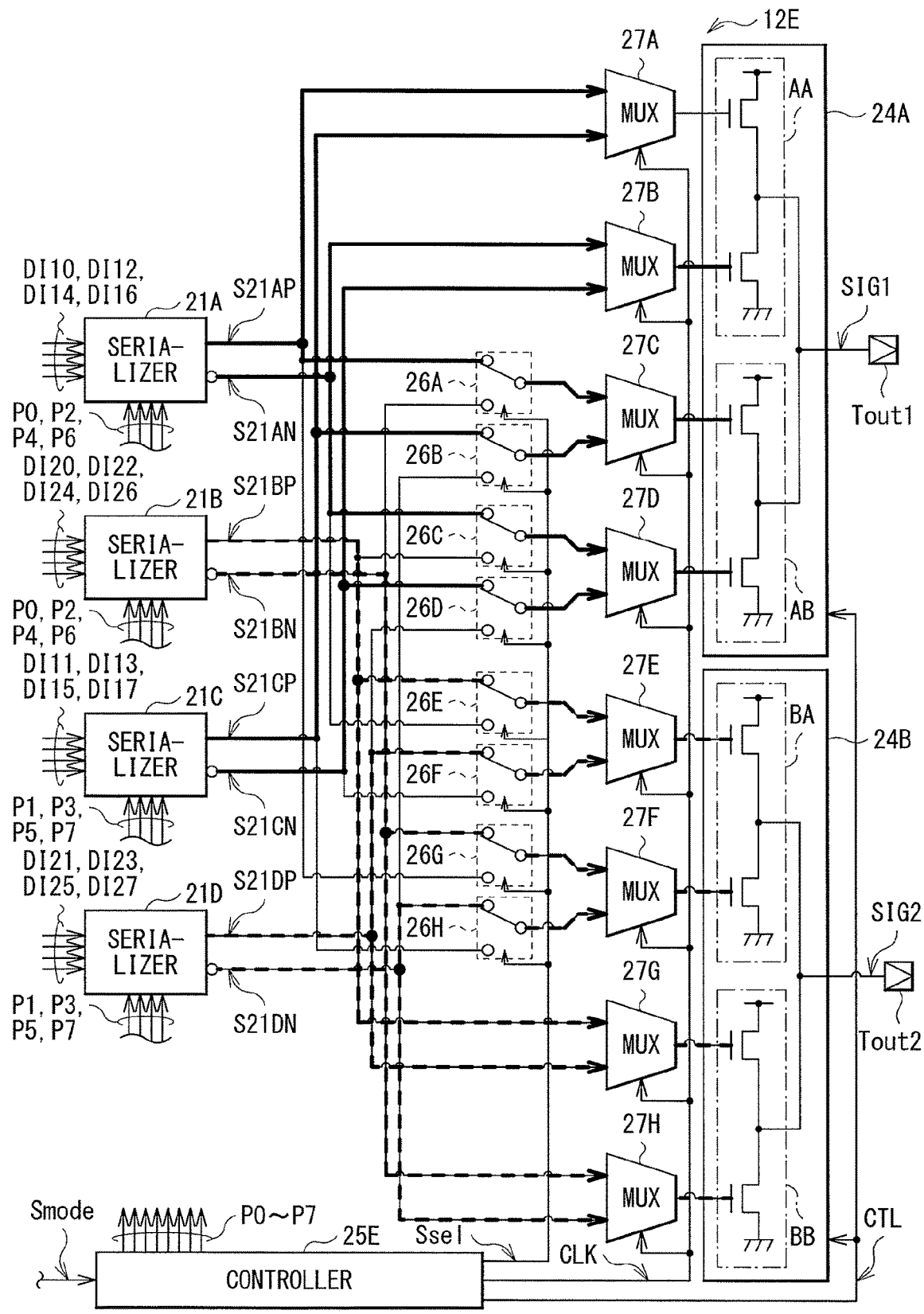

[FIG. 36]
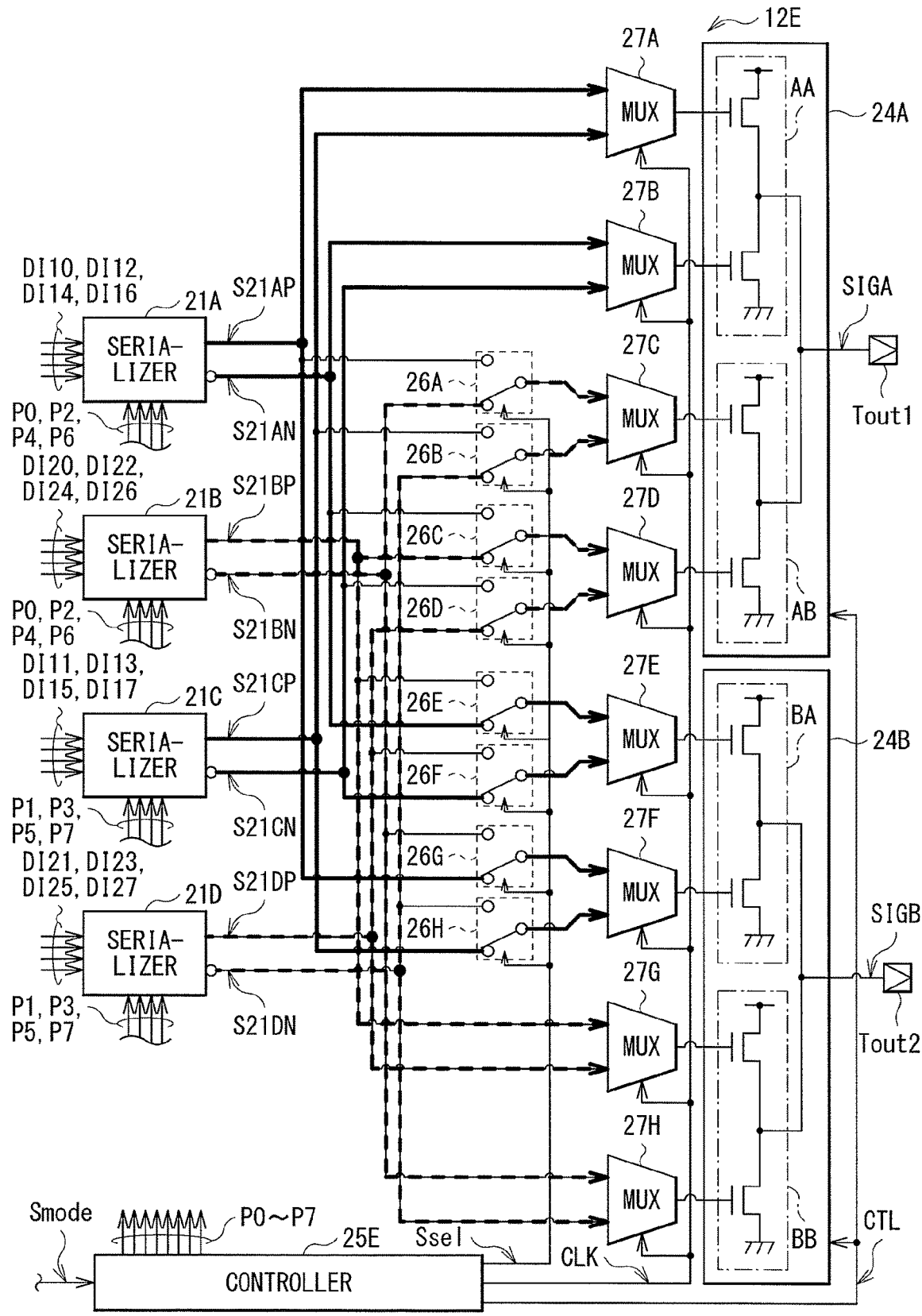

[ FIG. 37A ]
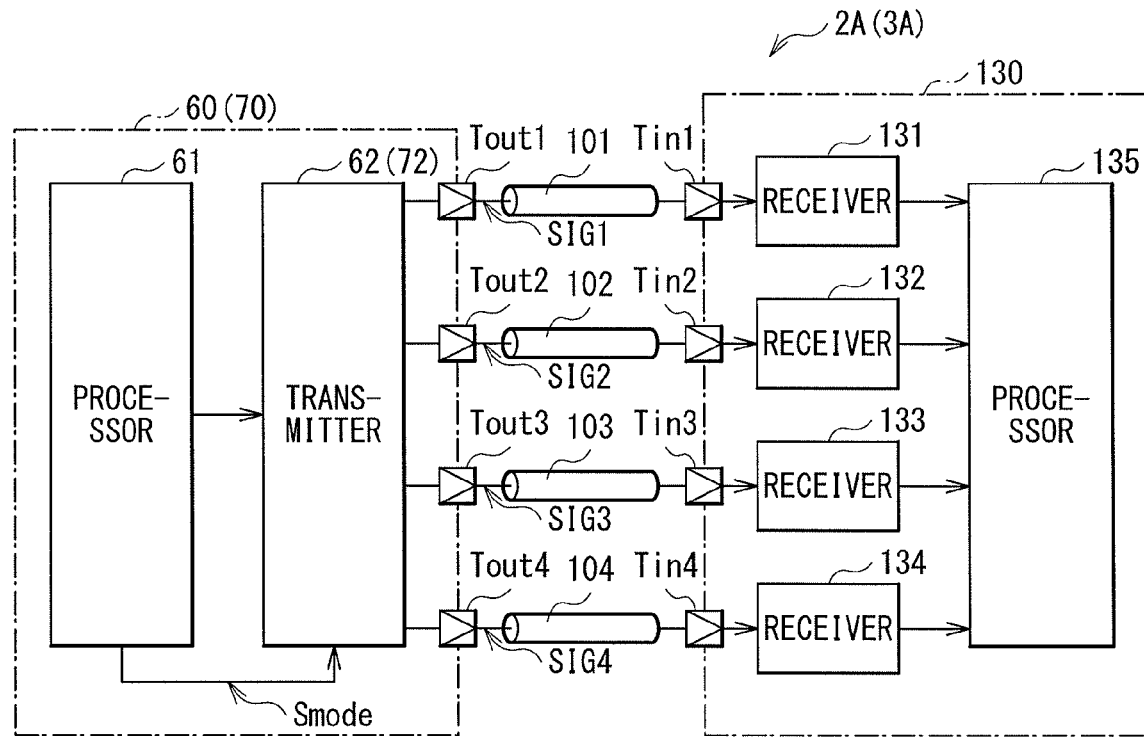
[ FIG. 37B ]
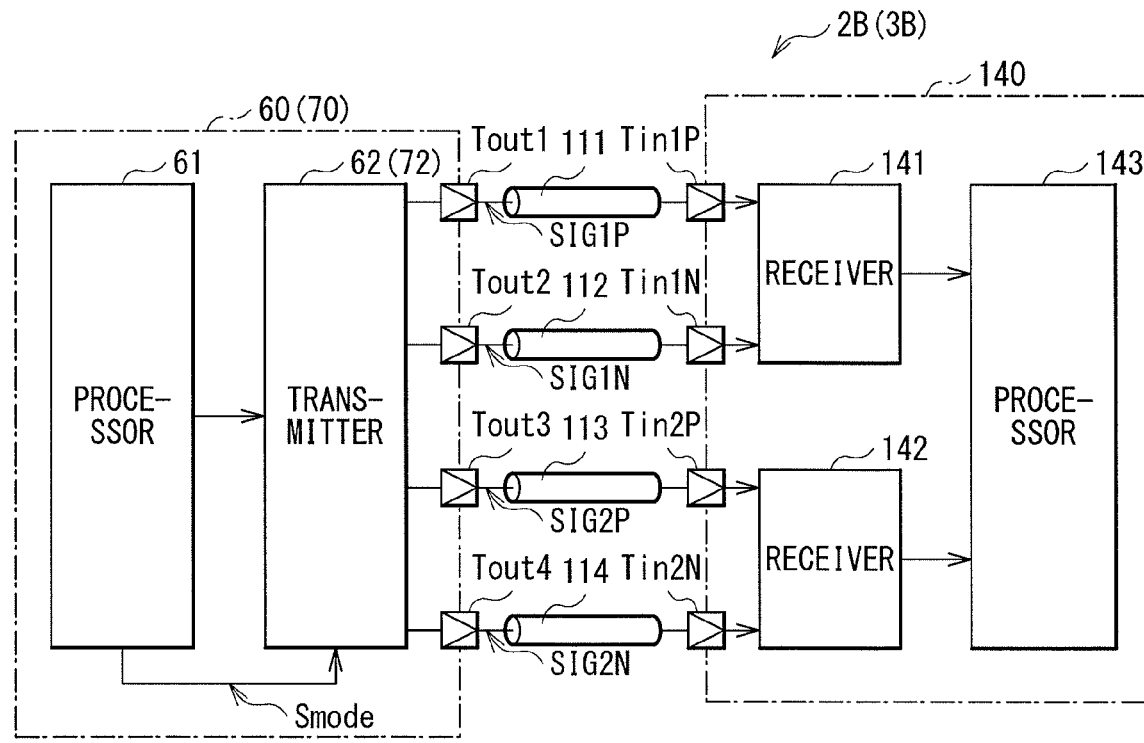

[ FIG. 37C ]
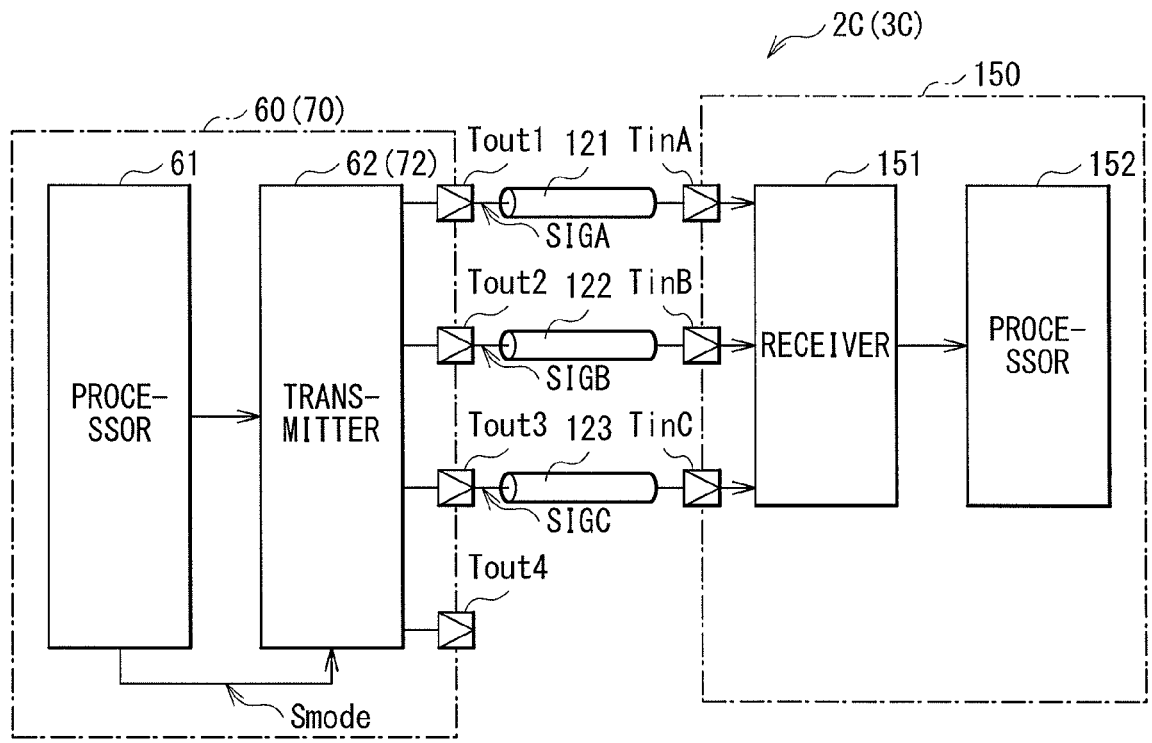
[ FIG. 38 ]
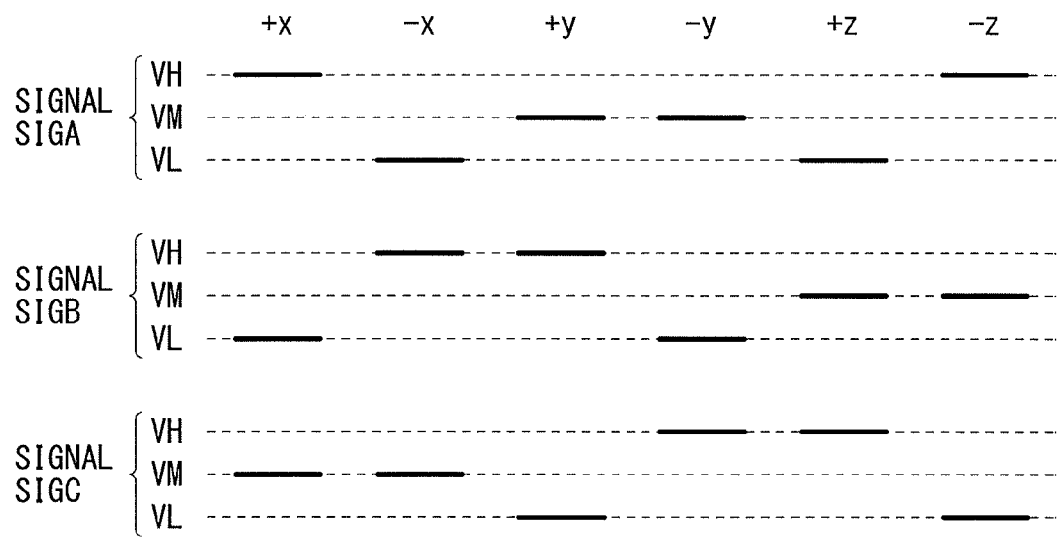

[ FIG. 39 ]
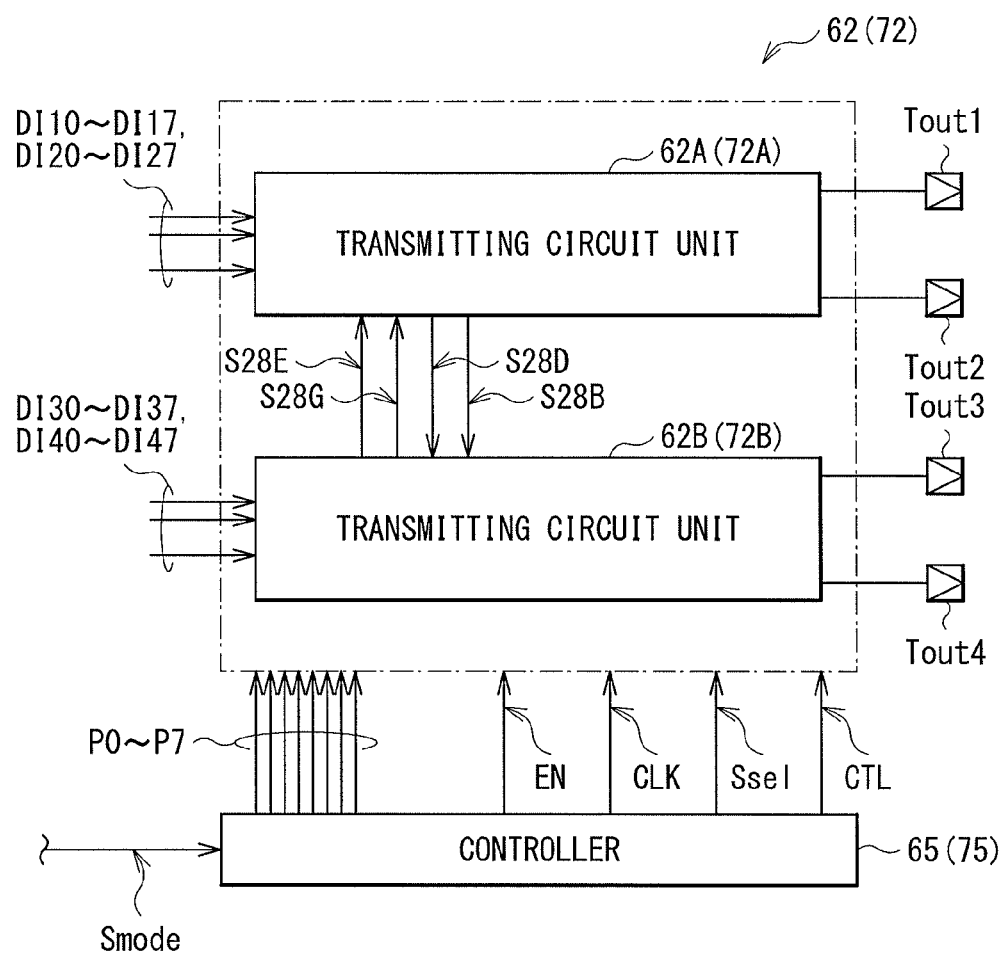

[ FIG. 40A ]
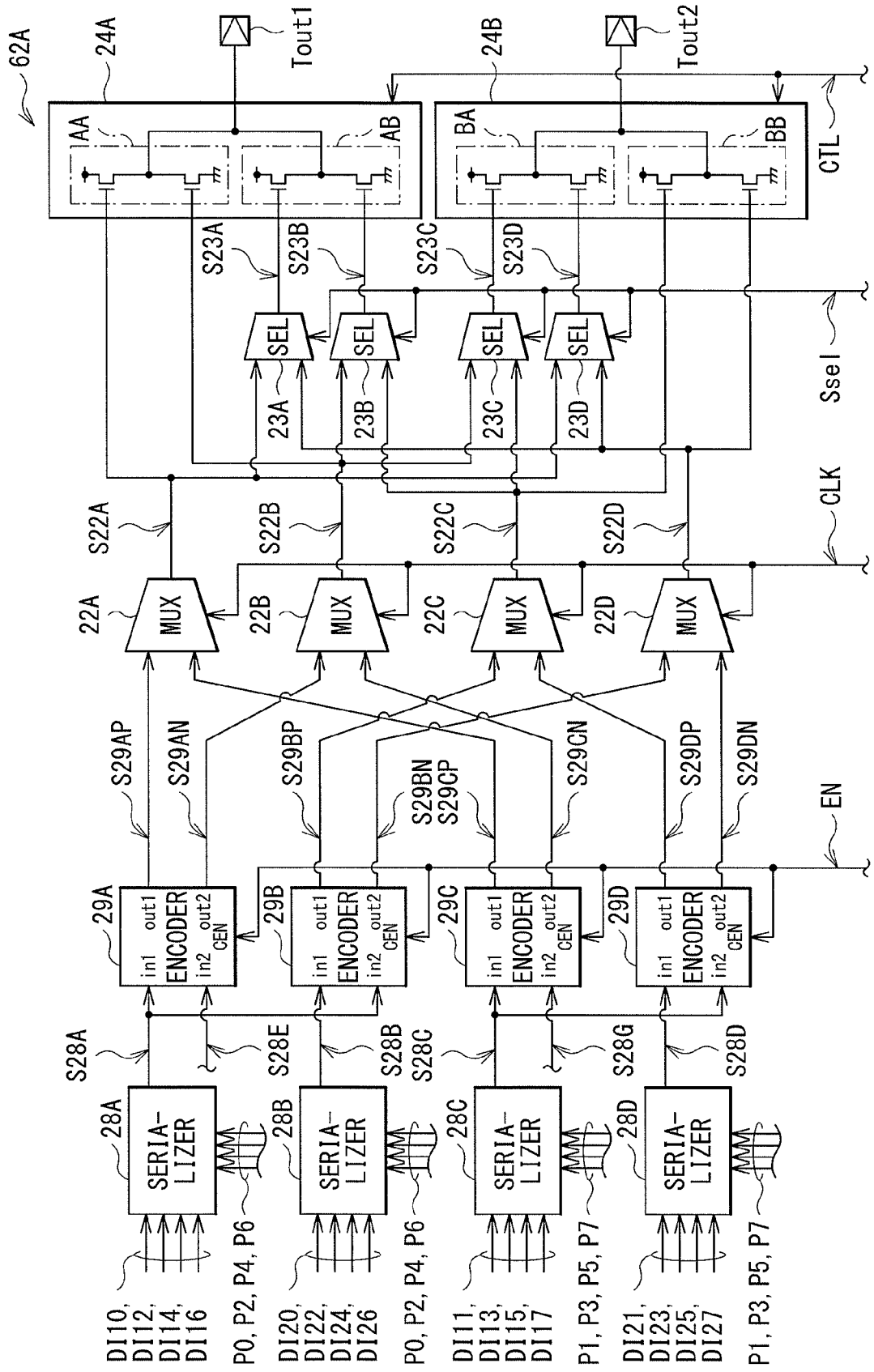

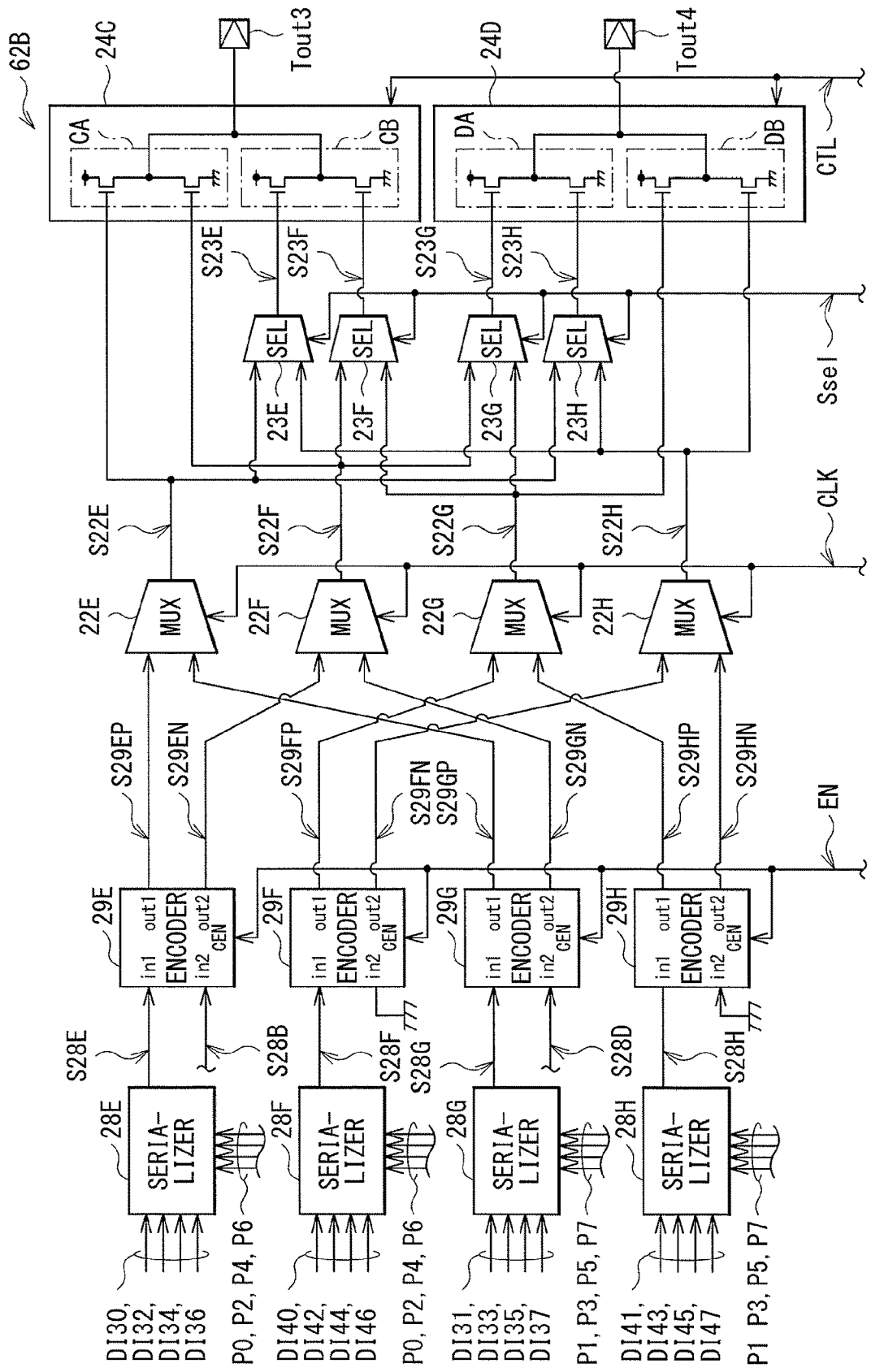
[ FIG. 40B ]

[ FIG. 41 ]
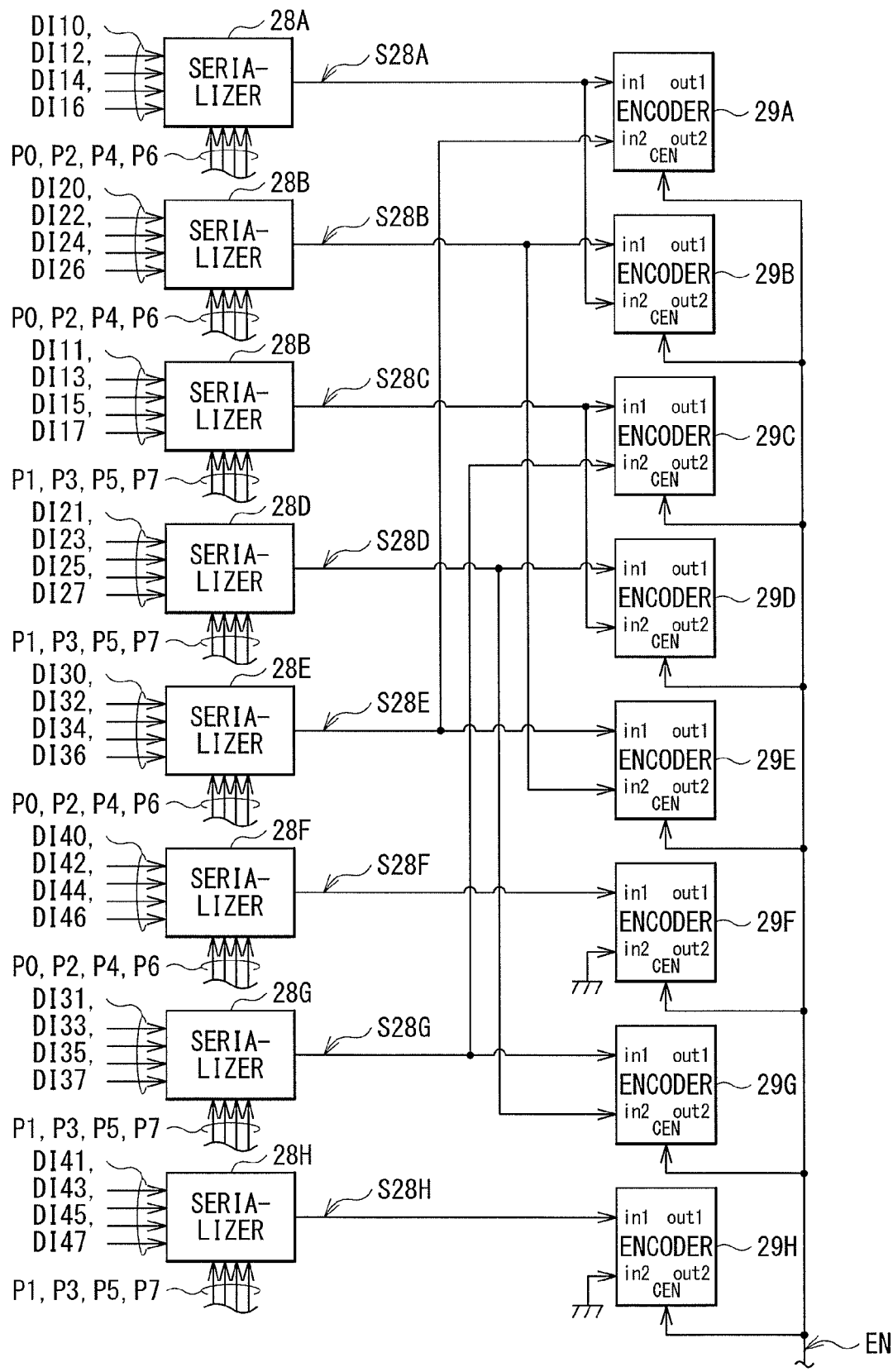

[ FIG. 42 ]
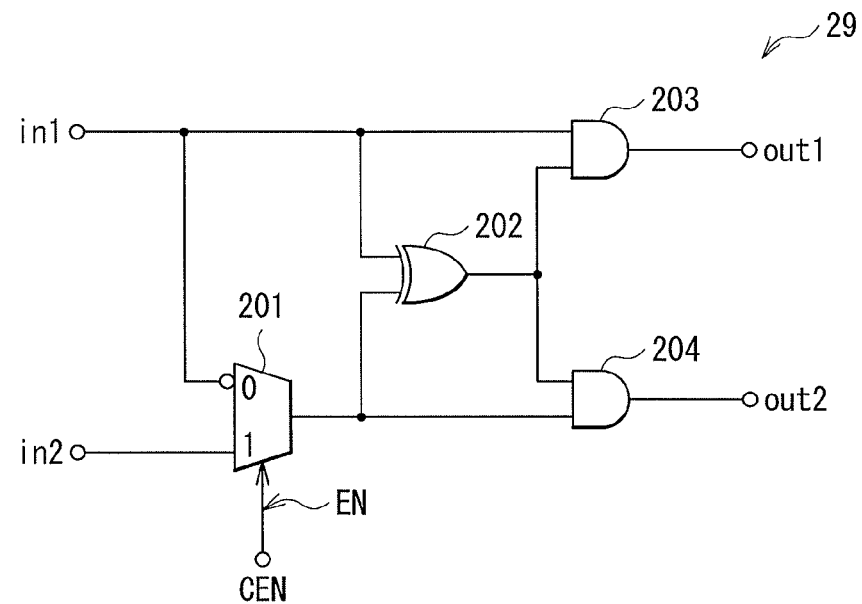
[ FIG. 43 ]
| in1 | in2 | CEN | out1 | out2 |
|---|---|---|---|---|
| 0 | 0 | 1 | 0 | 0 |
| 1 | 0 | 1 | 1 | 0 |
| 0 | 1 | 1 | 0 | 1 |
| 1 | 1 | 1 | 0 | 0 |
| 0 | 0 | 0 | 0 | 1 |
| 1 | 0 | 0 | 1 | 0 |
| 0 | 1 | 0 | 0 | 1 |
| 1 | 1 | 0 | 1 | 0 |

[ FIG. 44 ]
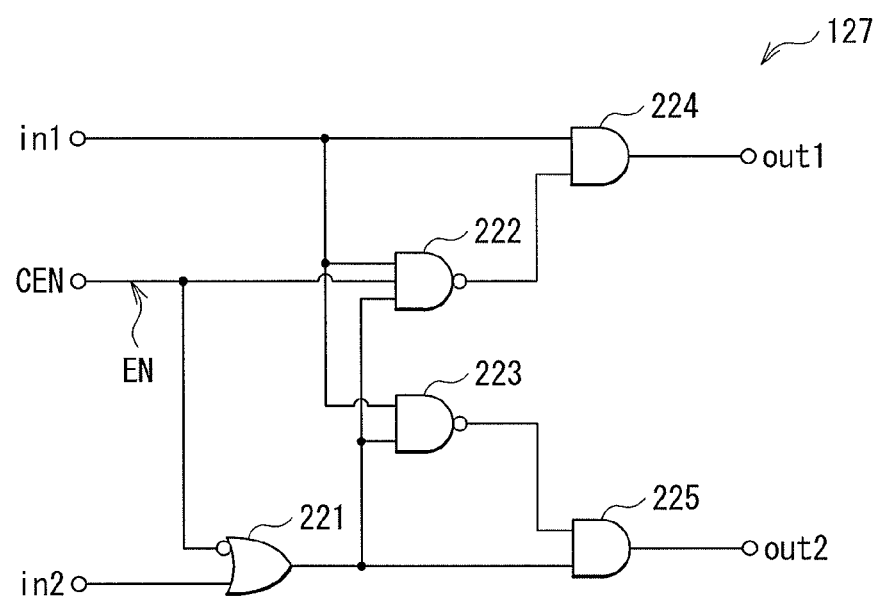

[ FIG. 45 ]
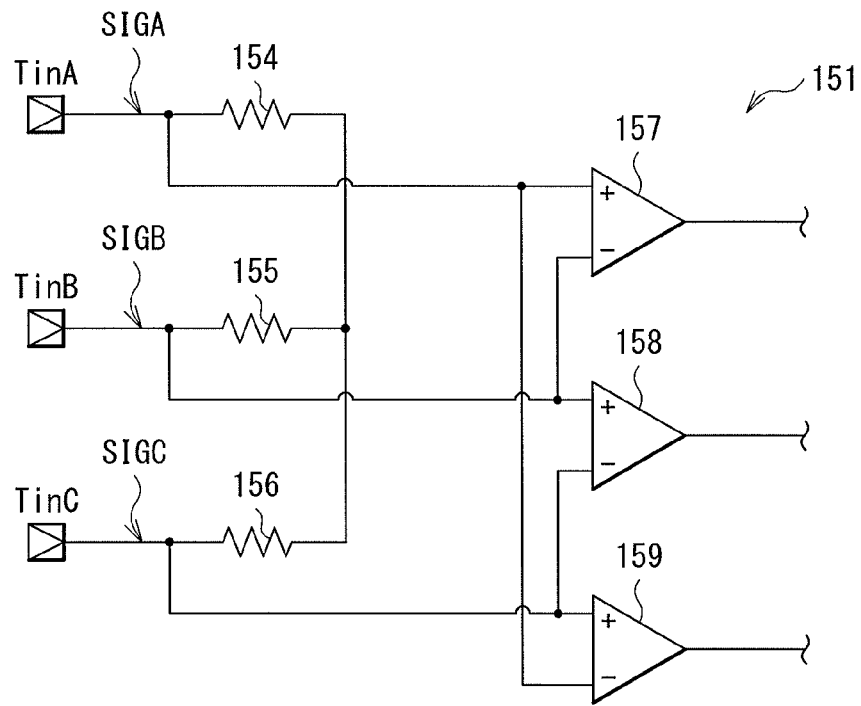
[ FIG. 46 ]
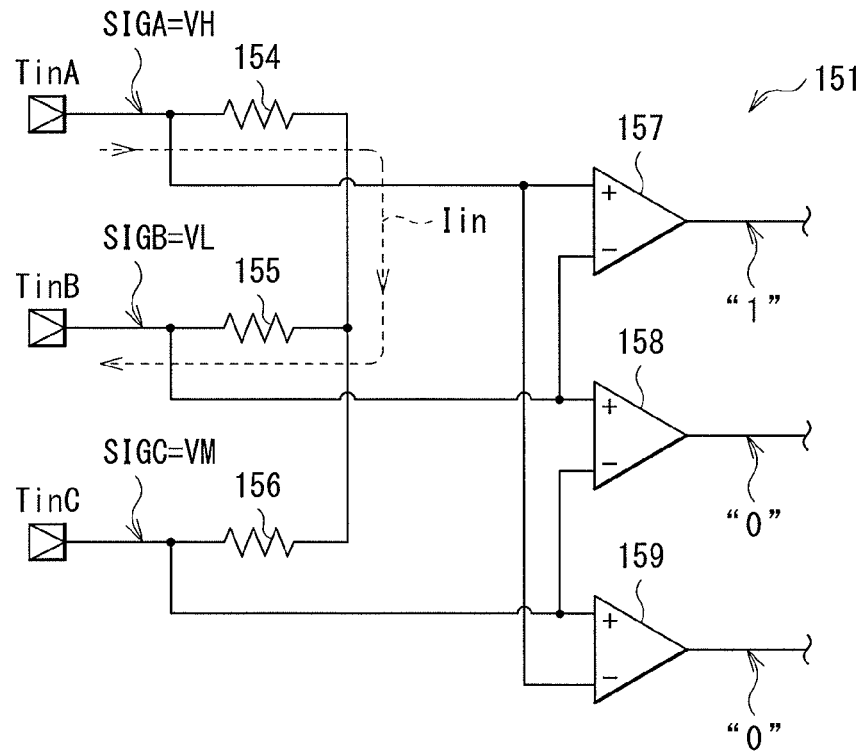

[ FIG. 47A ]
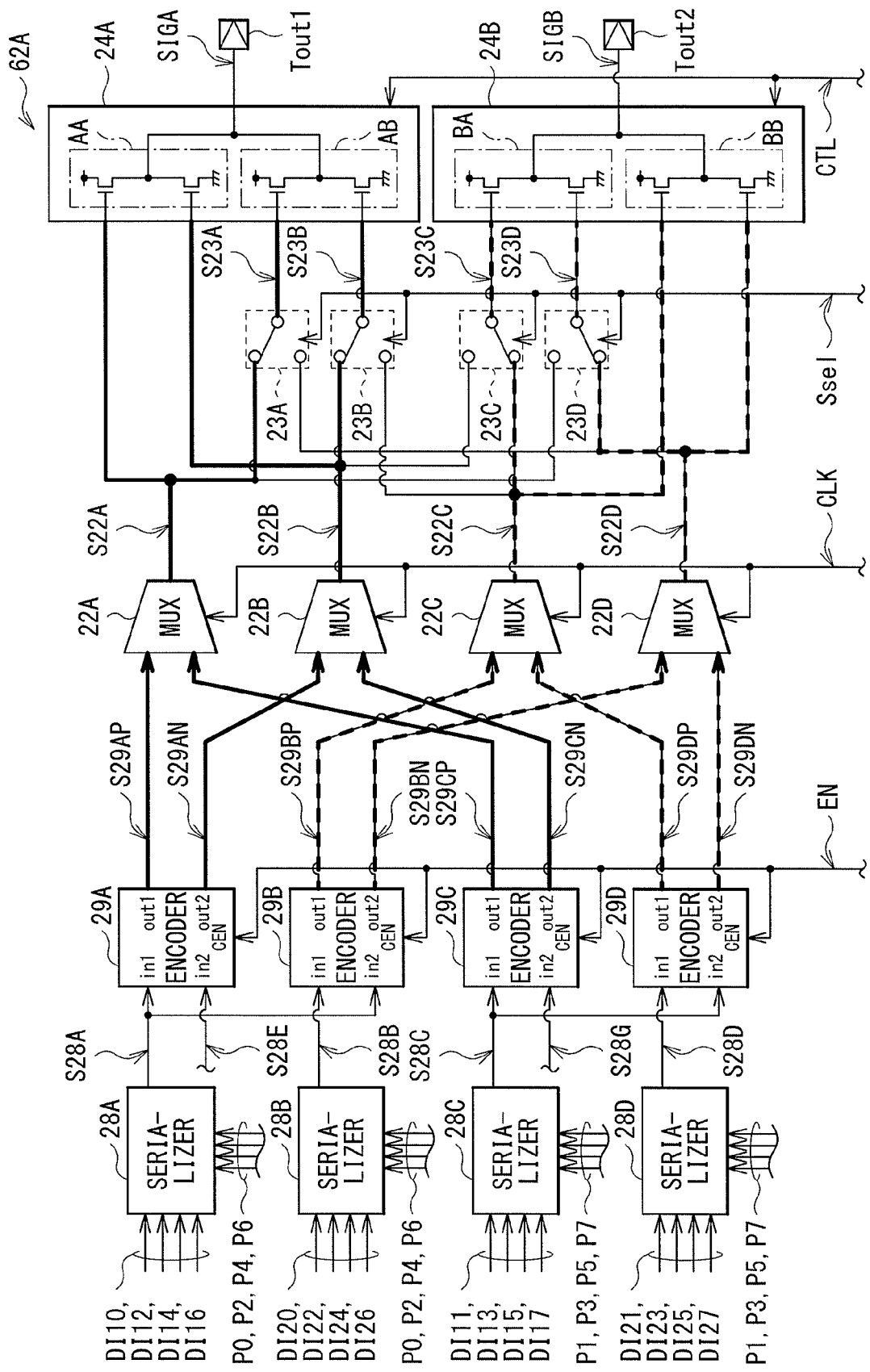

[FIG. 47B]
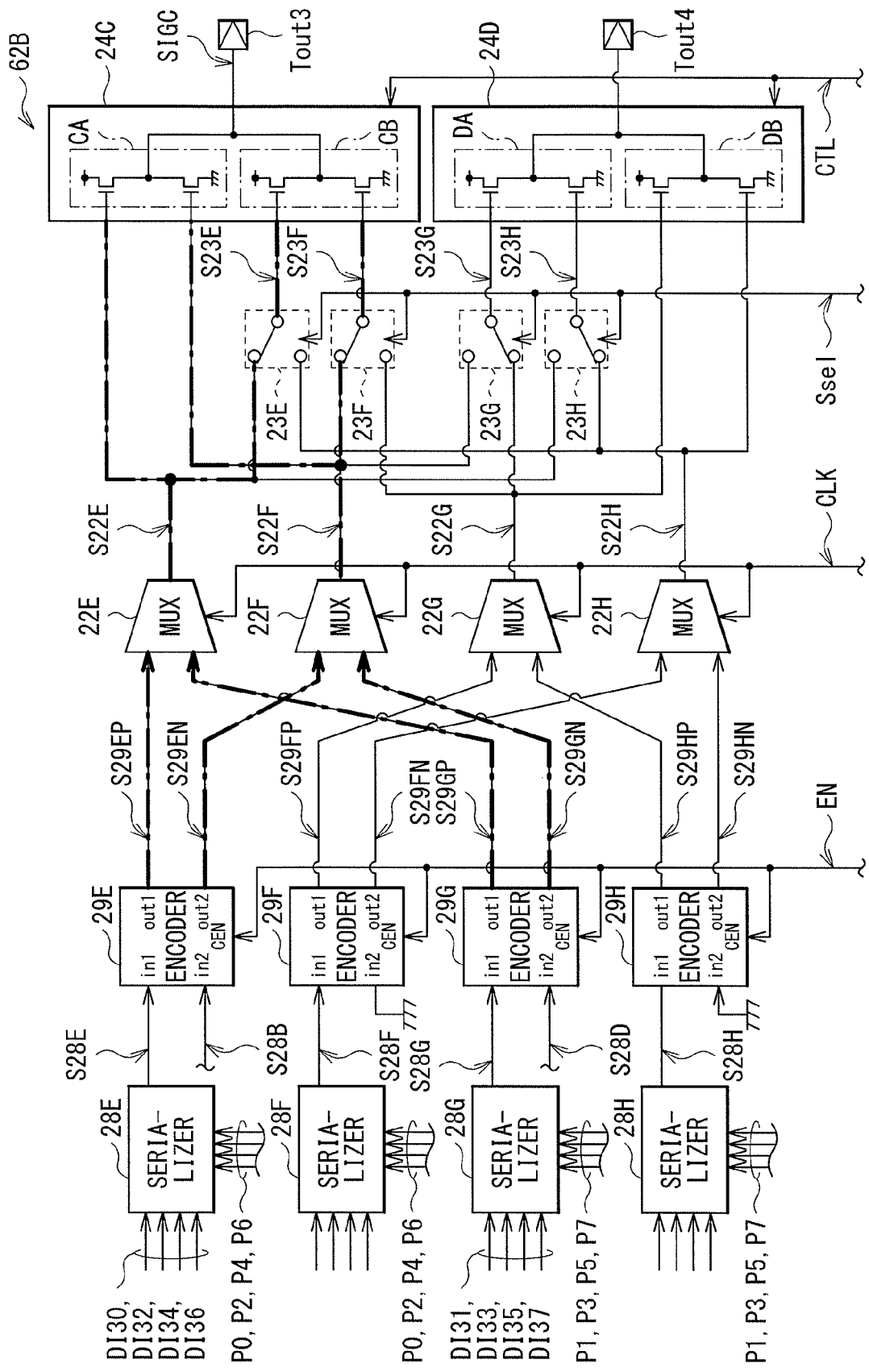

[ FIG. 48 ]

| SYMBOL | SIGNAL S28A (SIGNAL S28C) | SIGNAL S28B (SIGNAL S28D) | SIGNAL S28E (SIGNAL S28G) | SIGNAL S22A | SIGNAL S22B | SIGNAL S22C | SIGNAL S22D | SIGNAL S22E | SIGNAL S22F | SIGNAL SIGA | SIGNAL SIGB | SIGNAL SIGC |
|---|---|---|---|---|---|---|---|---|---|---|---|---|
| +x | 1 | 0 | 0 | 1 | 0 | 0 | 1 | 0 | 0 | VH | VL | VM |
| -x | 0 | 1 | 1 | 0 | 1 | 1 | 0 | 0 | 0 | VL | VH | VM |
| +y | 0 | 1 | 0 | 0 | 0 | 1 | 0 | 0 | 1 | VM | VH | VL |
| -y | 1 | 0 | 1 | 0 | 0 | 0 | 1 | 1 | 0 | VM | VL | VH |
| +z | 0 | 0 | 1 | 0 | 1 | 0 | 0 | 1 | 0 | VL | VM | VH |
| -z | 1 | 1 | 0 | 1 | 0 | 0 | 0 | 0 | 1 | VH | VM | VL |

[FIG. 49A]
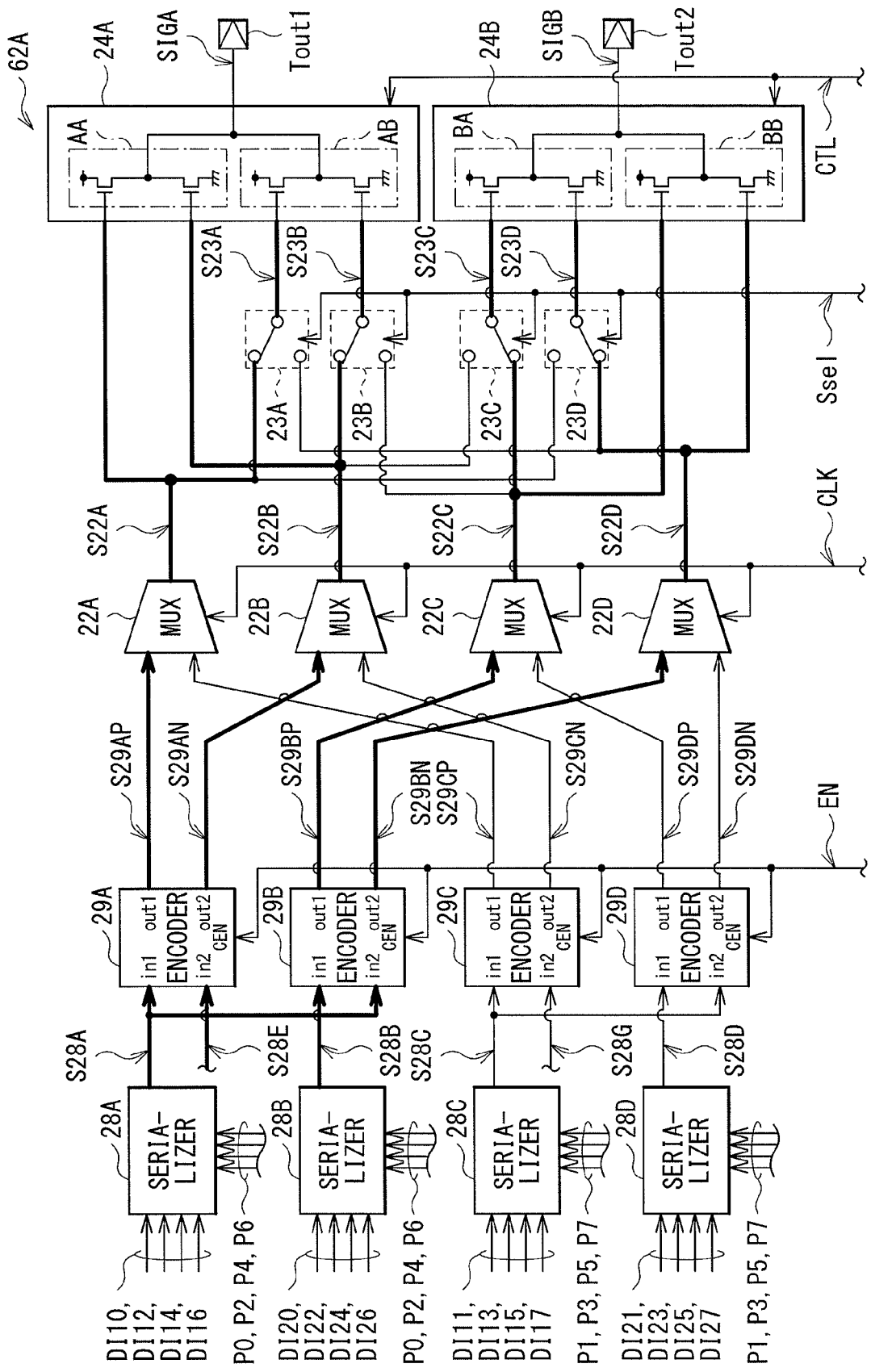

[ FIG. 49B ]
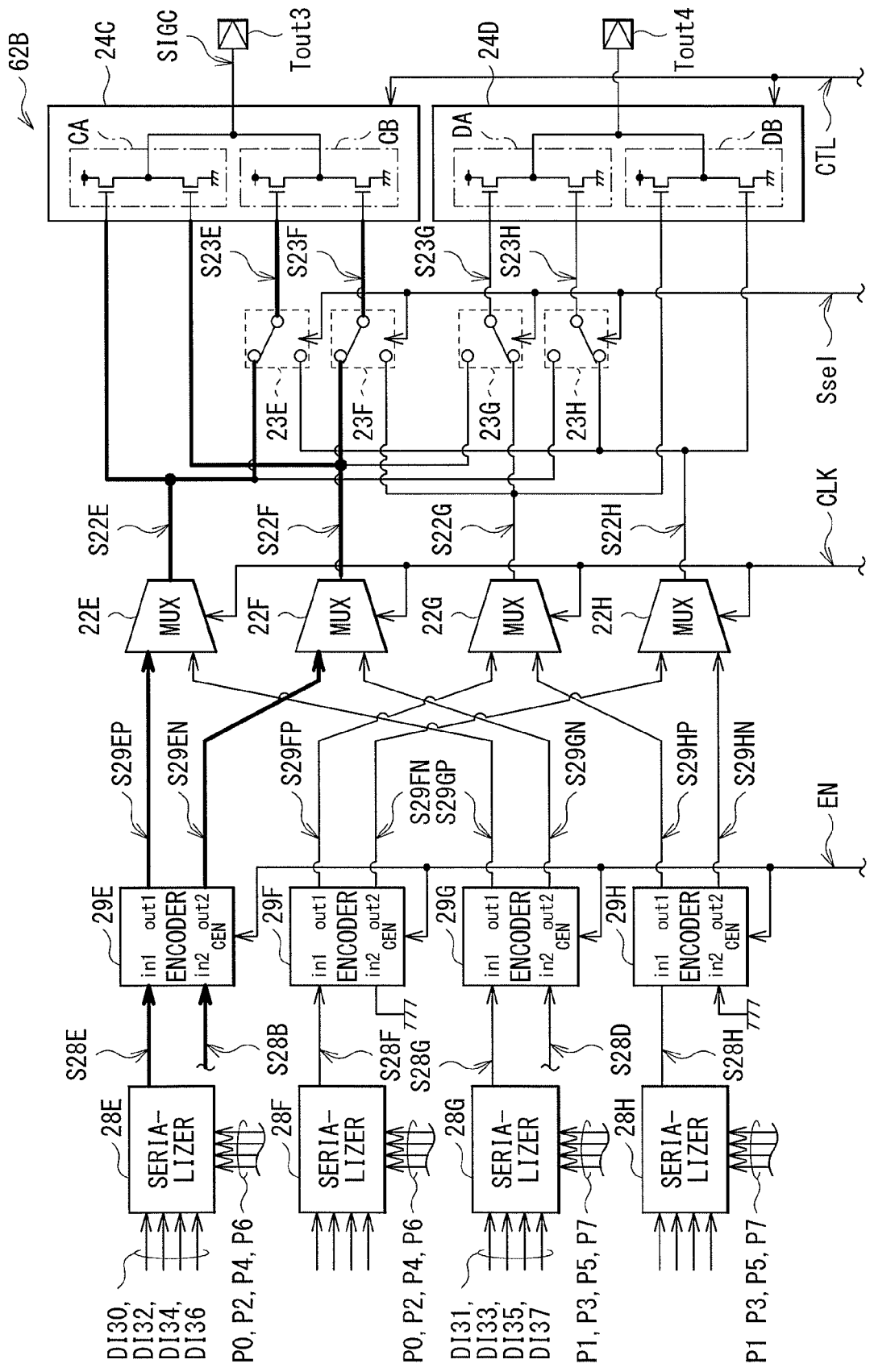

[ FIG. 50A ]
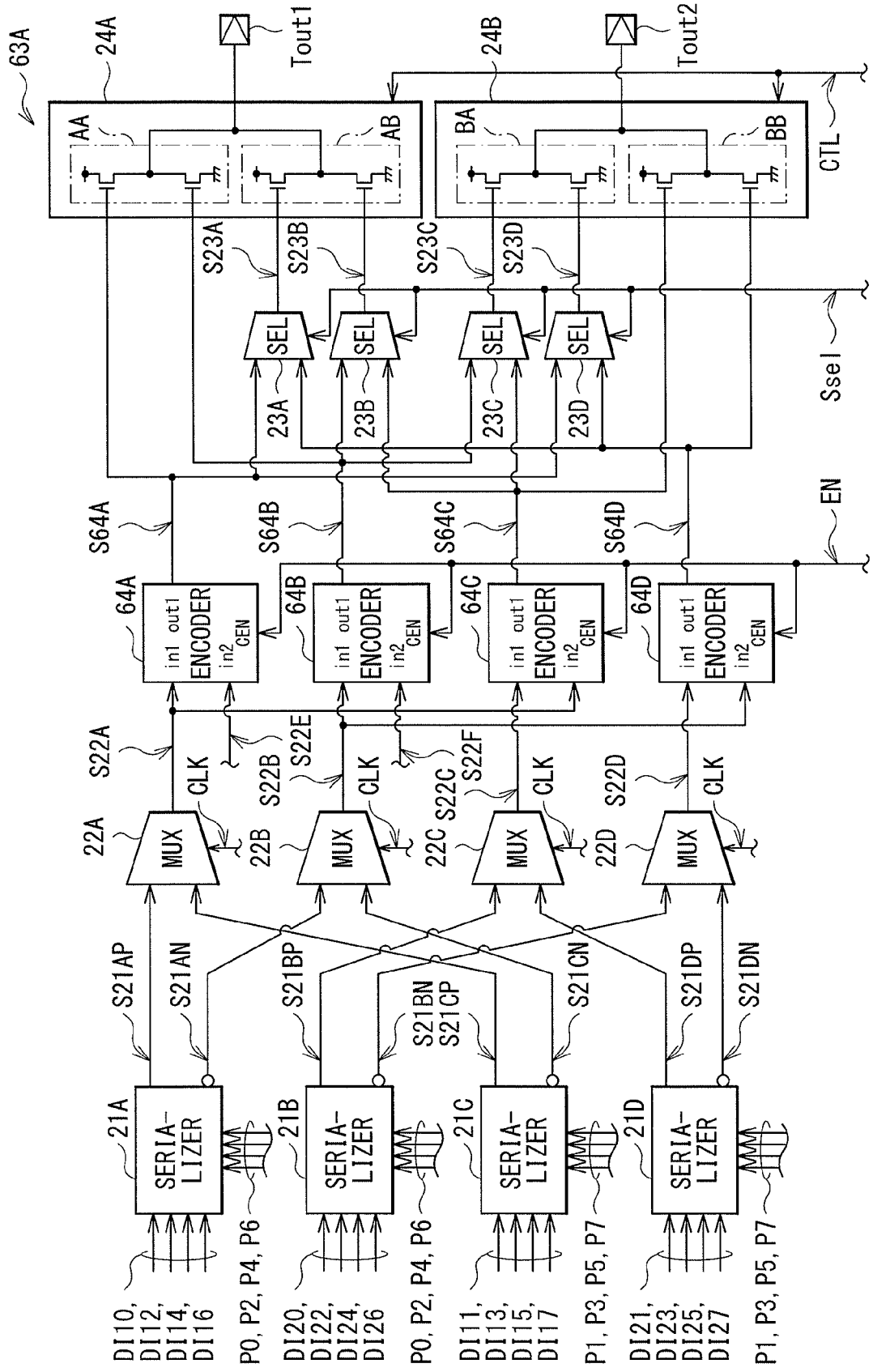

[FIG. 50B]
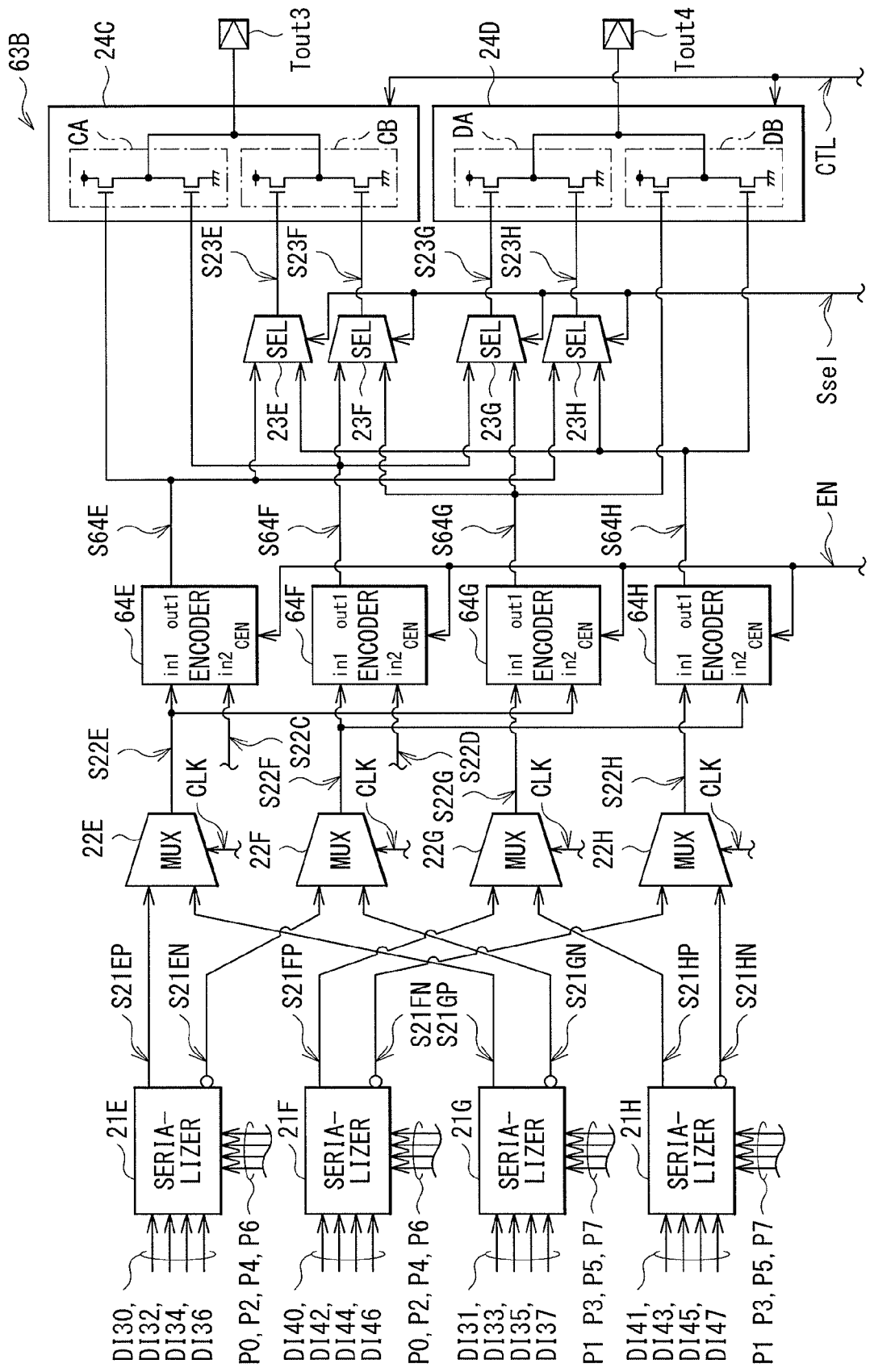

[FIG. 51]
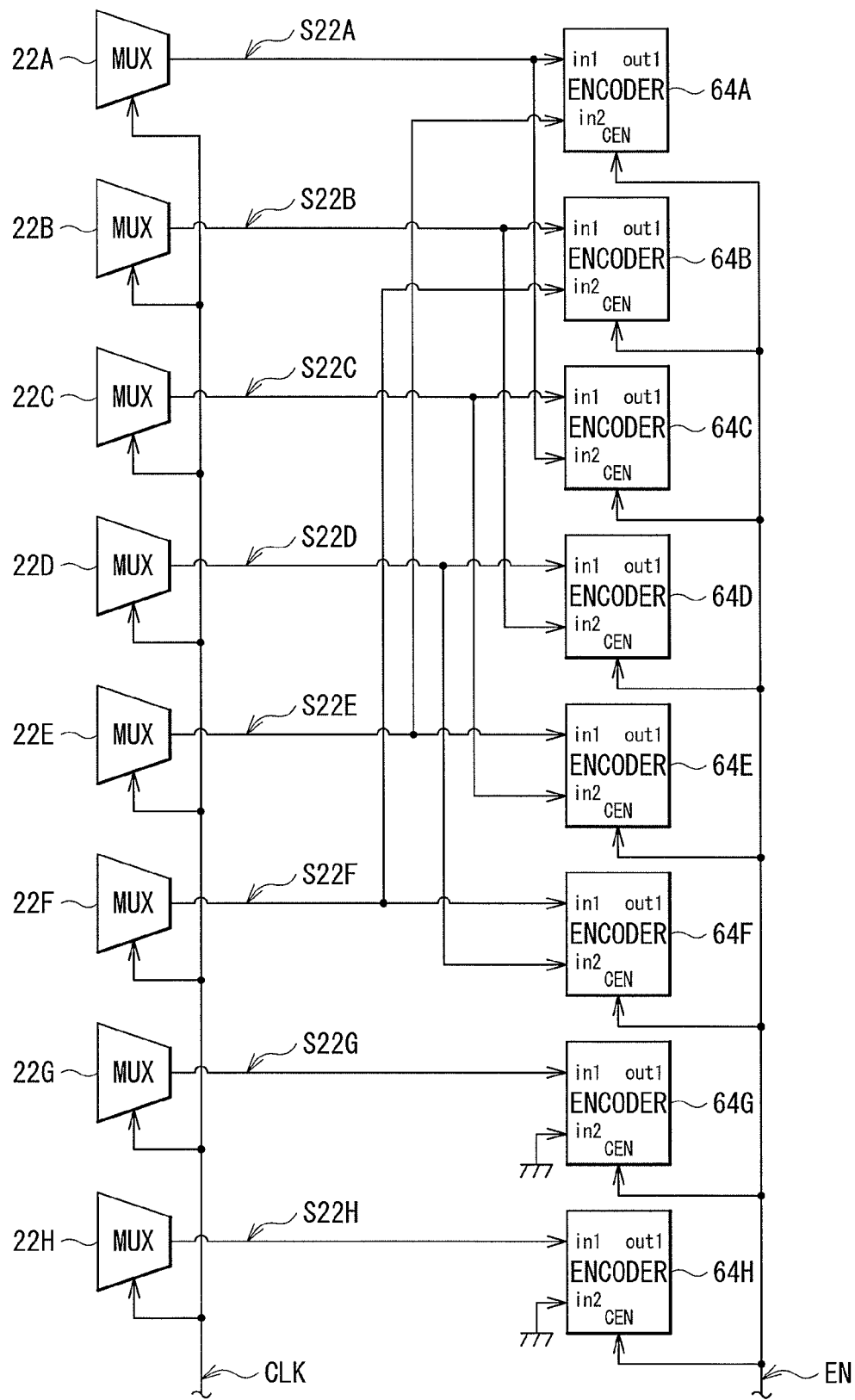

[ FIG. 52 ]
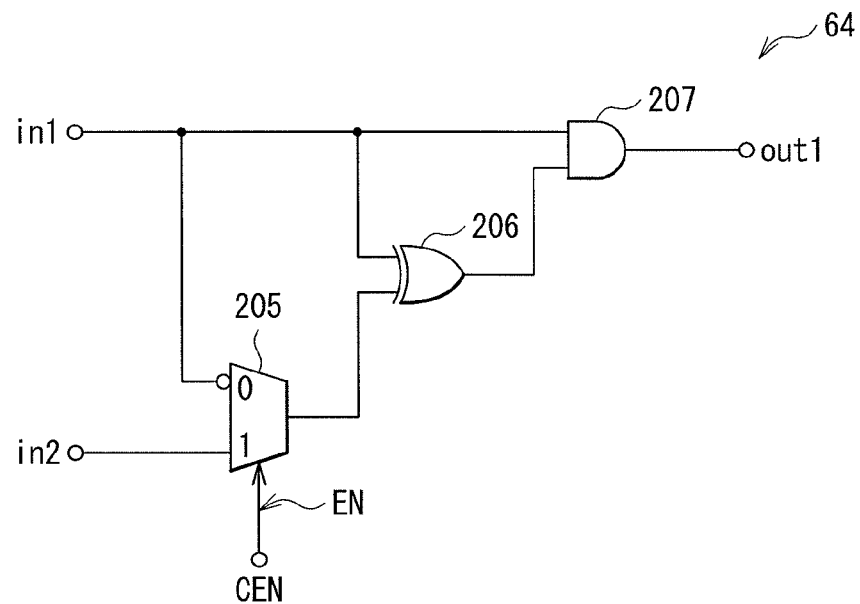
[ FIG. 53 ]
| in1 | in2 | CEN | out1 |
|---|---|---|---|
| 0 | 0 | 1 | 0 |
| 1 | 0 | 1 | 1 |
| 0 | 1 | 1 | 0 |
| 1 | 1 | 1 | 0 |
| 0 | 0 | 0 | 0 |
| 1 | 0 | 0 | 1 |
| 0 | 1 | 0 | 0 |
| 1 | 1 | 0 | 1 |

[ FIG. 54 ]
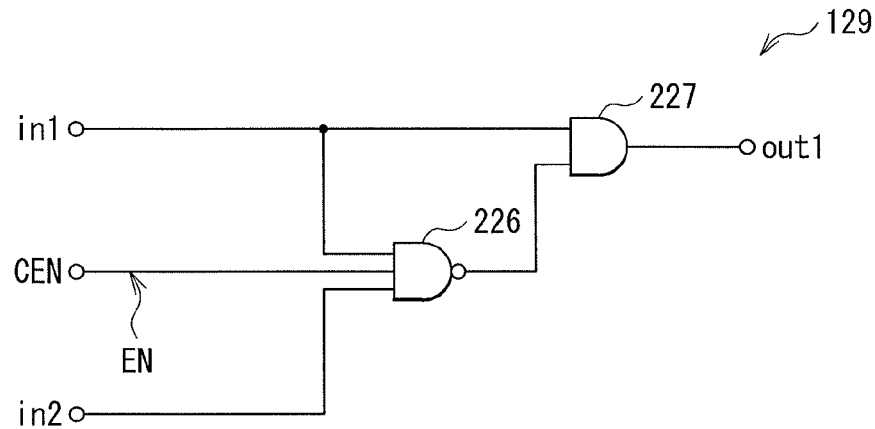
[ FIG. 55 ]
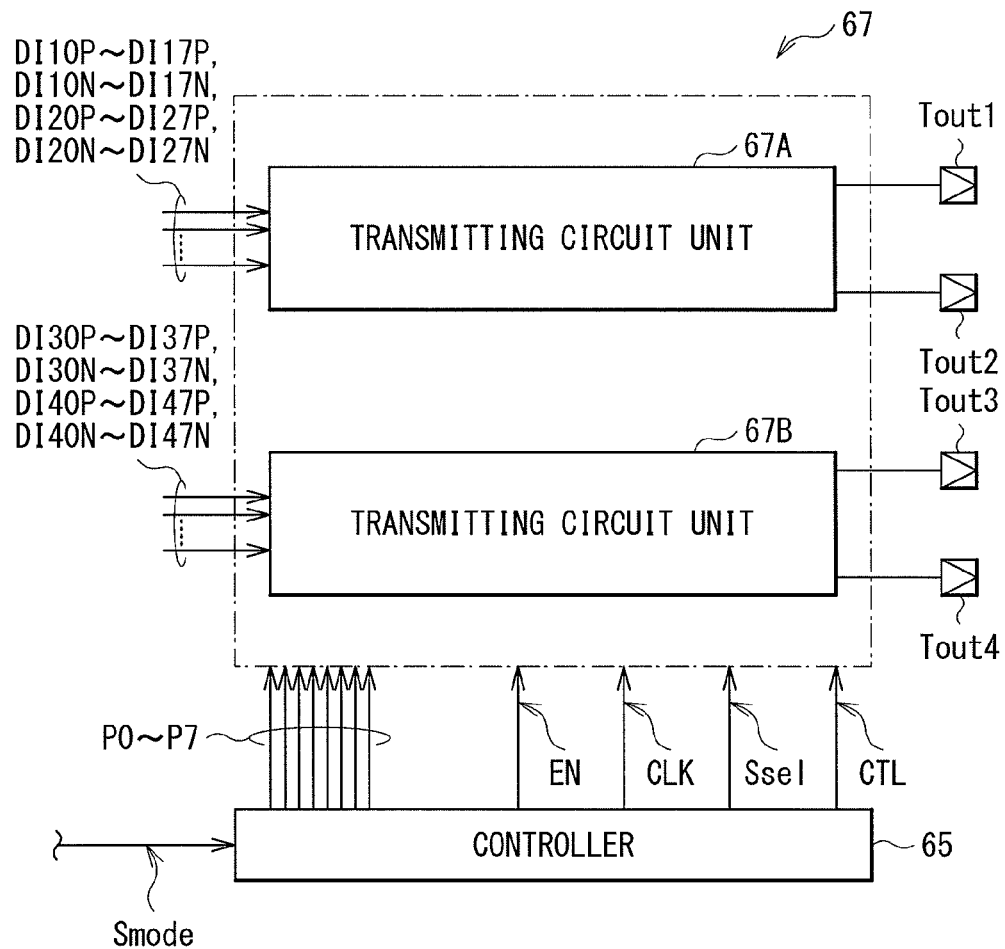

[FIG. 56A]
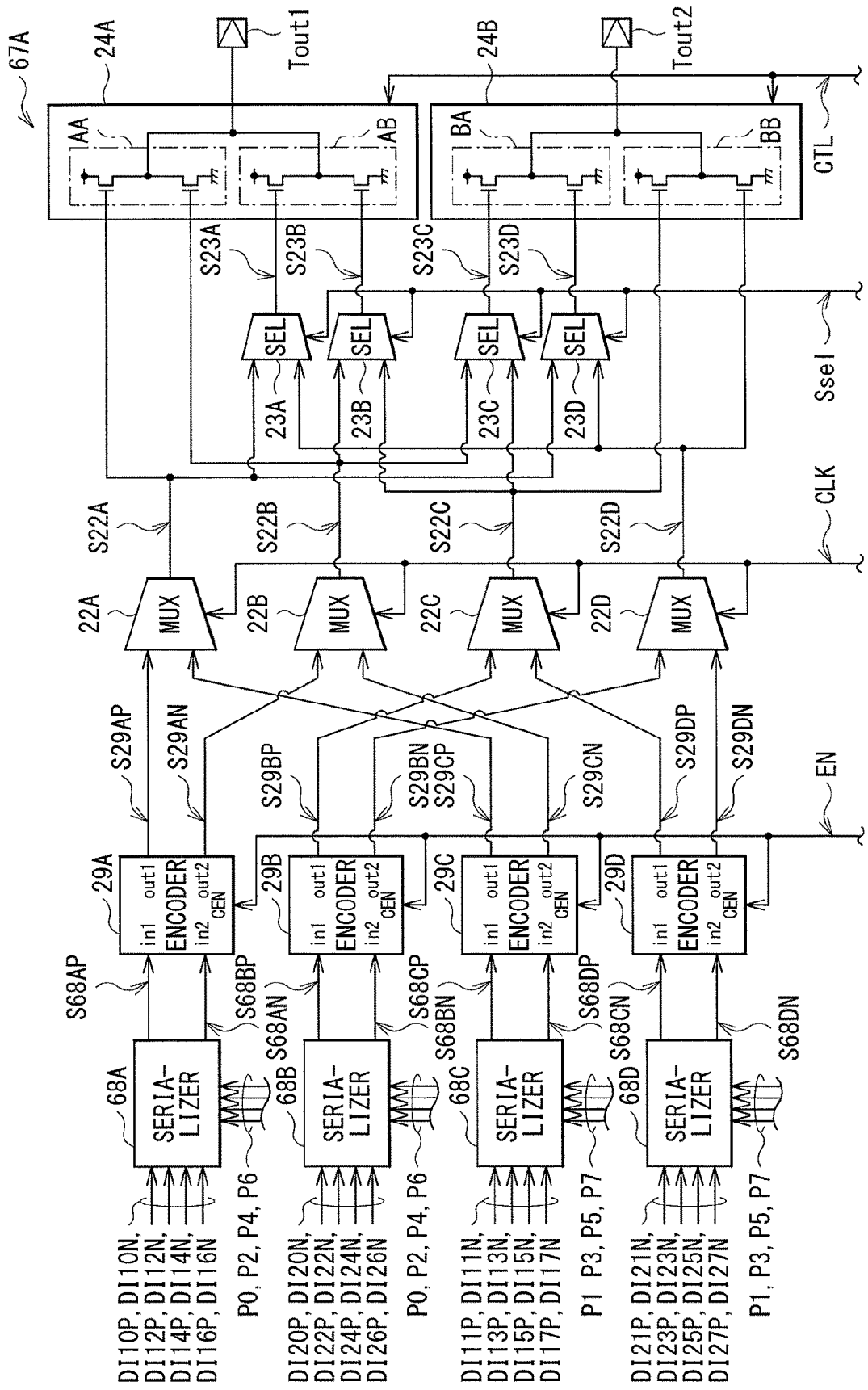

[ FIG. 56B ]
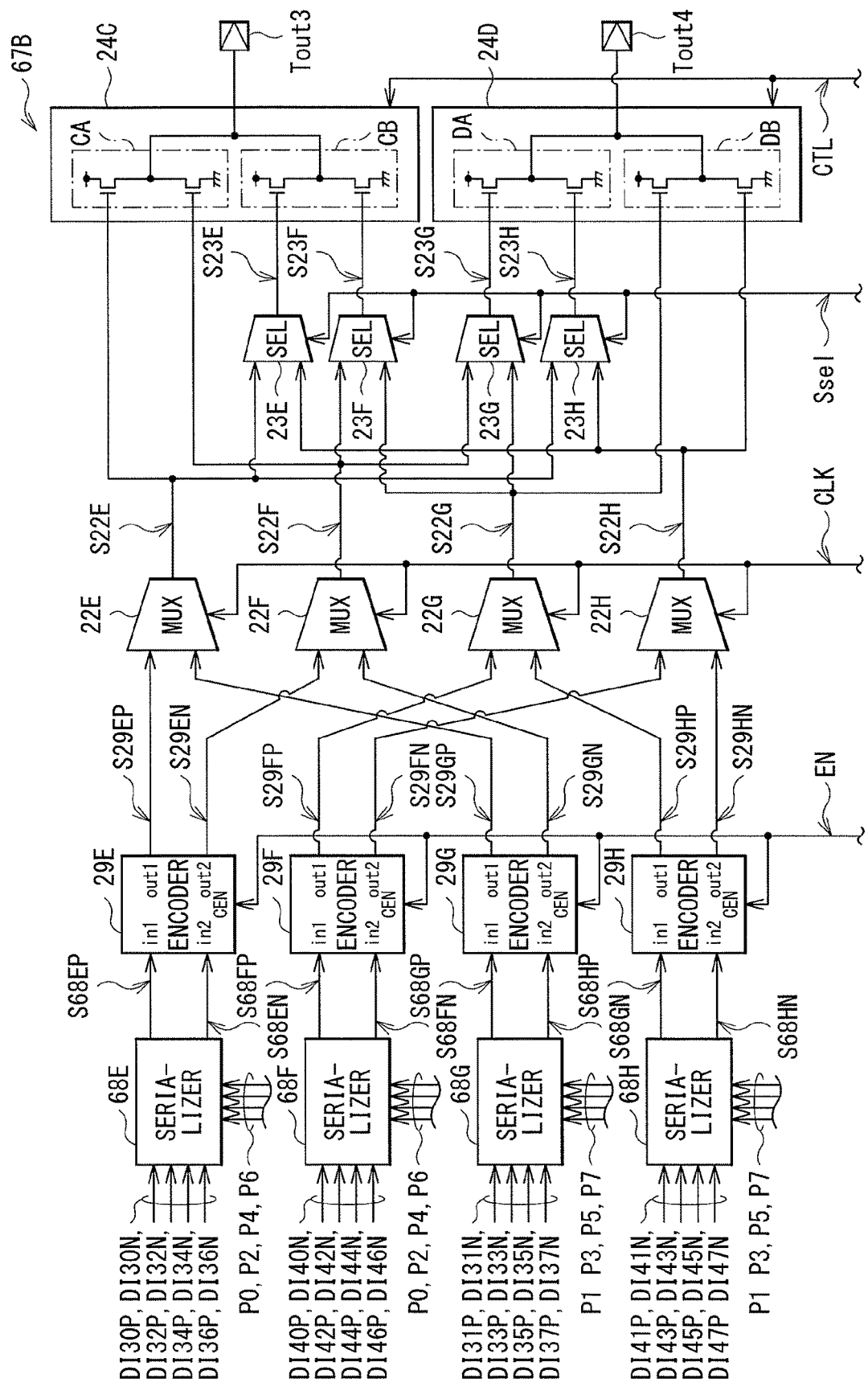

[FIG. 57]
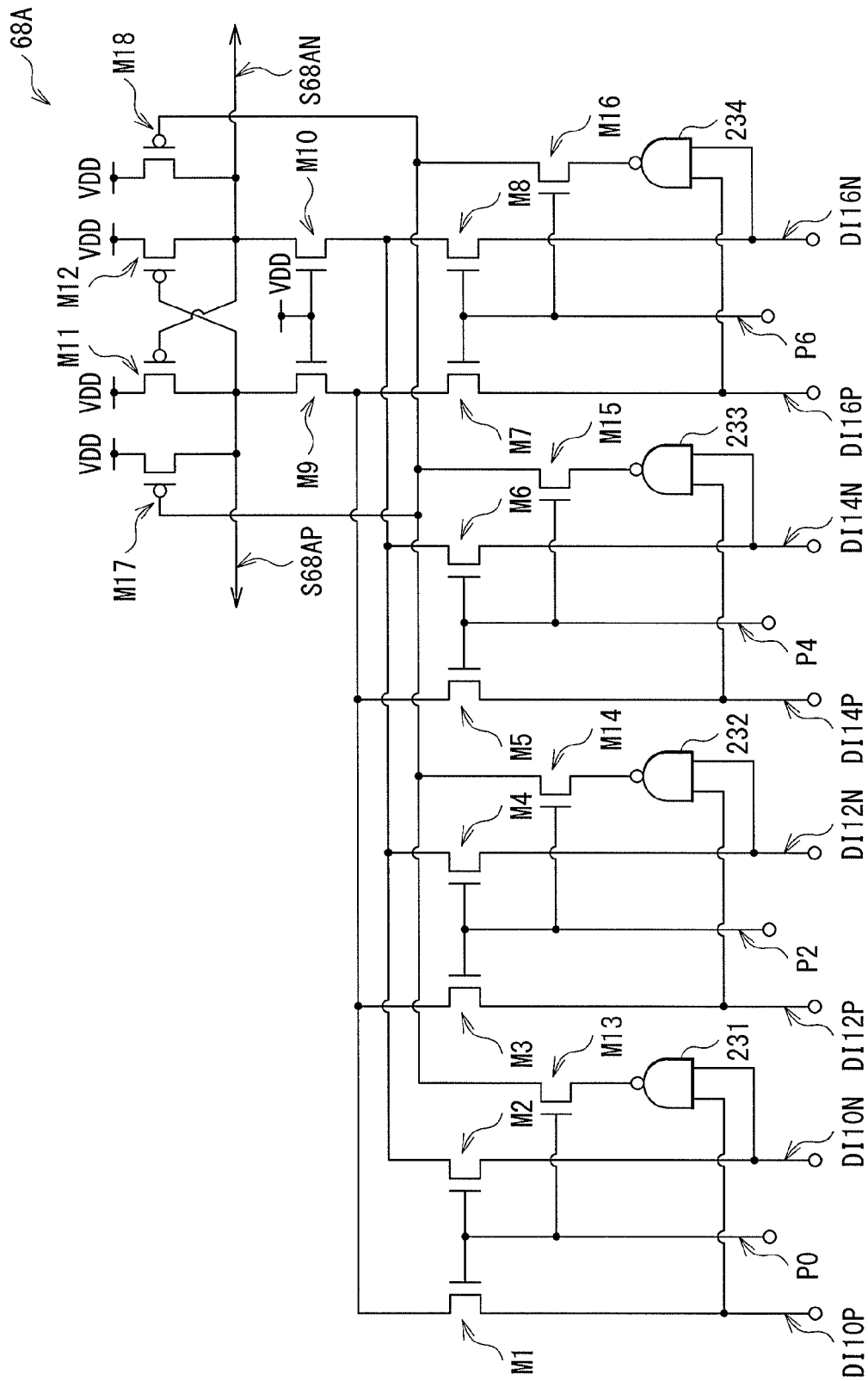

[ FIG. 58 ]
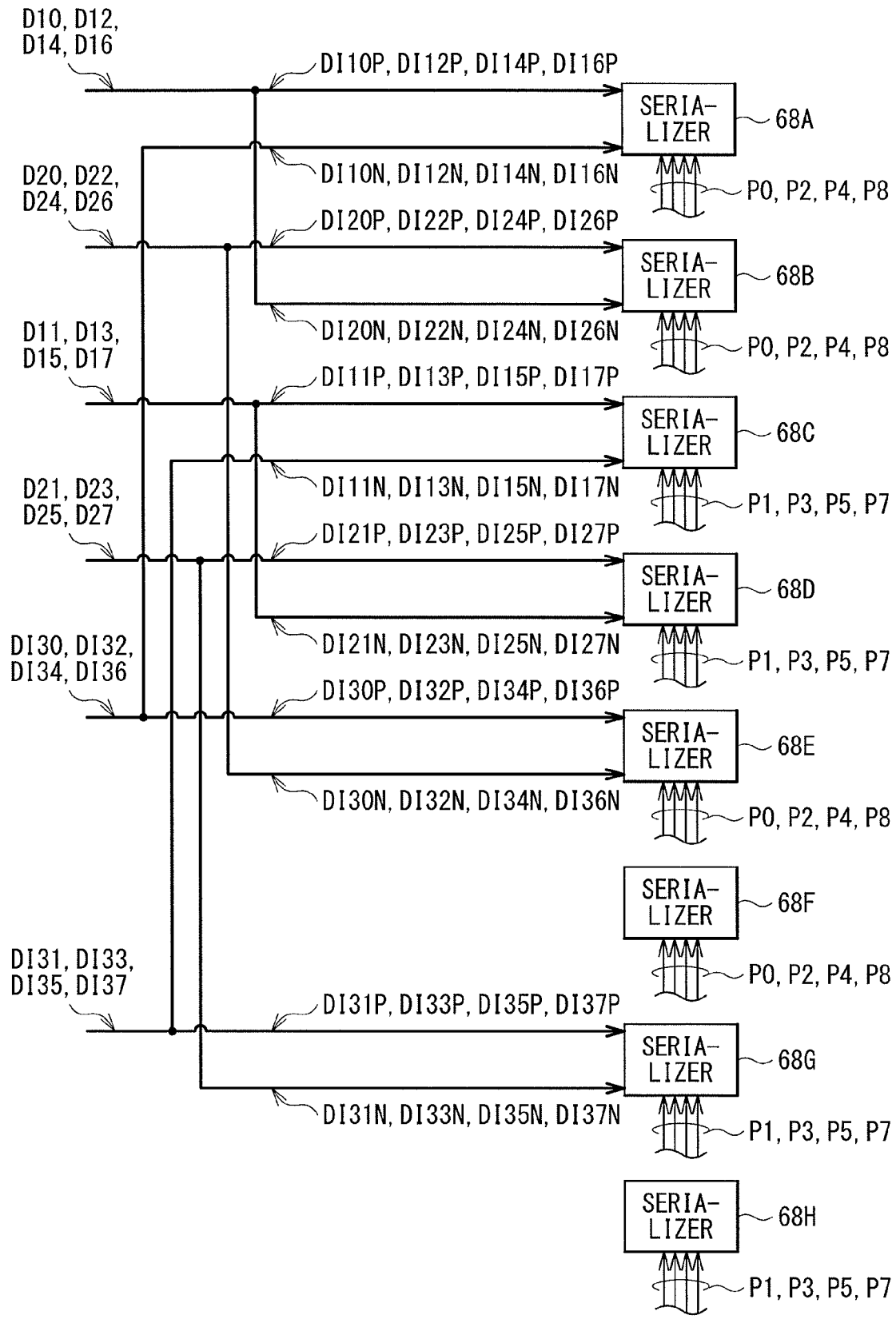

[ FIG. 59A ]
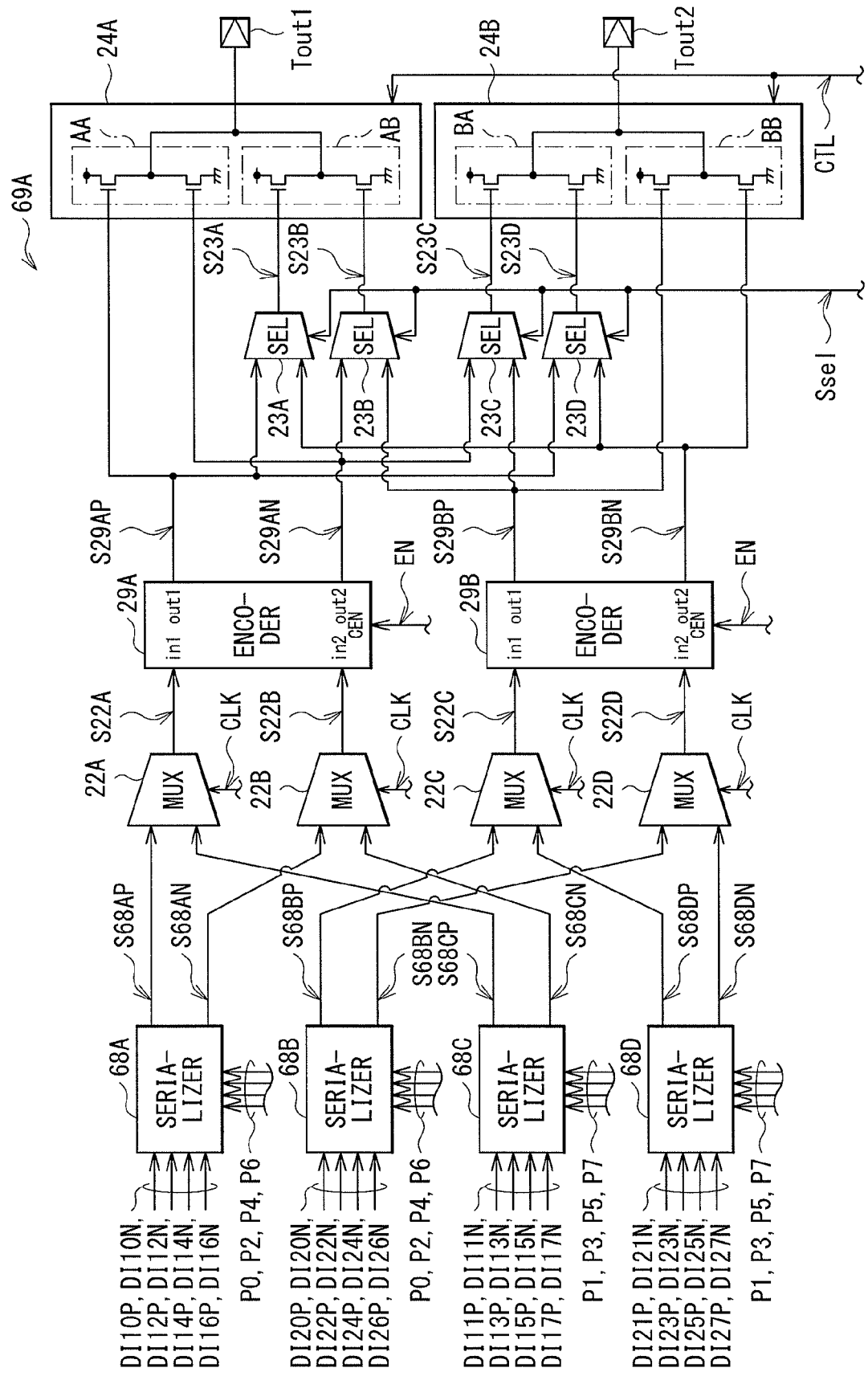

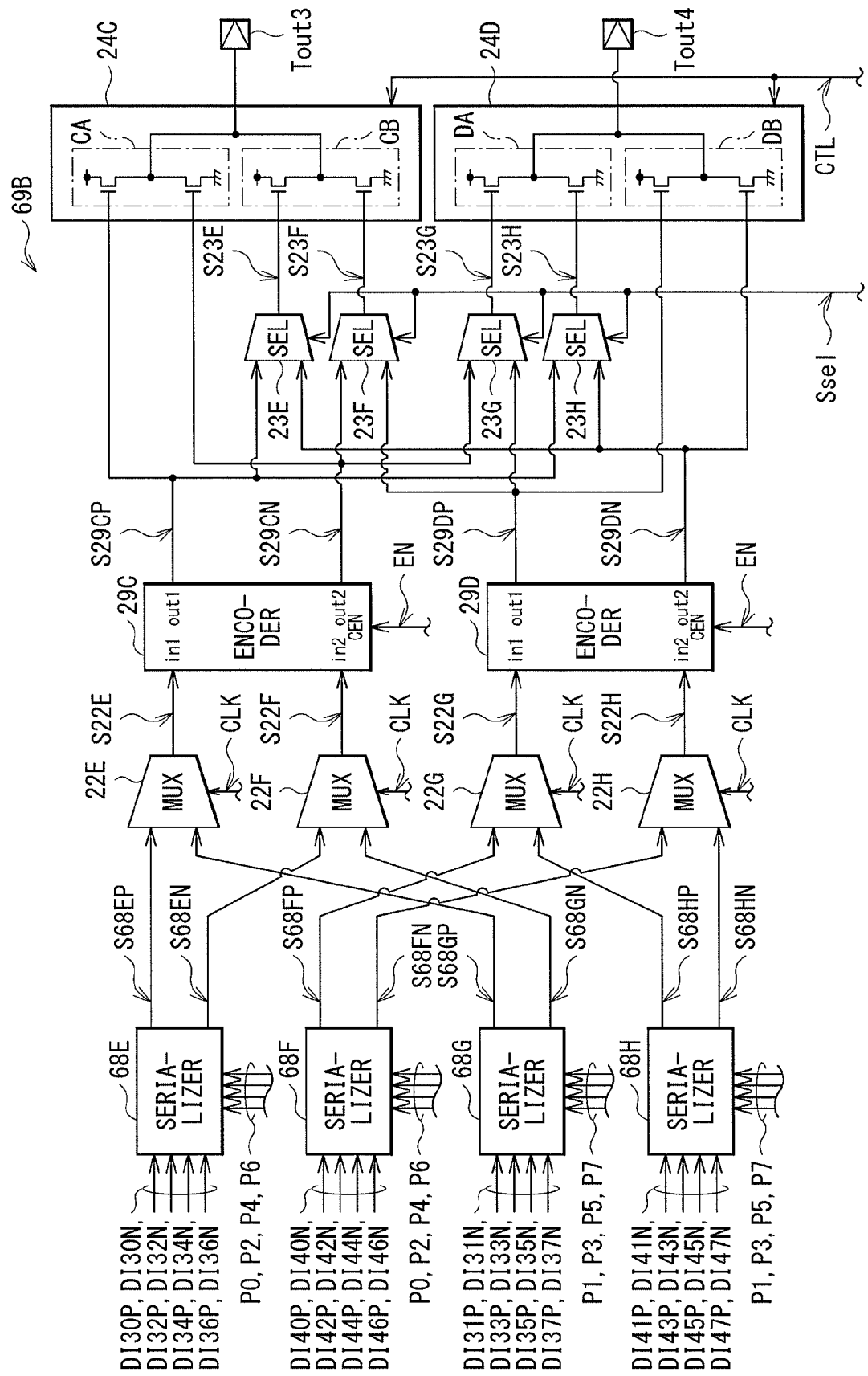
[FIG. 59B]

[FIG. 60A]
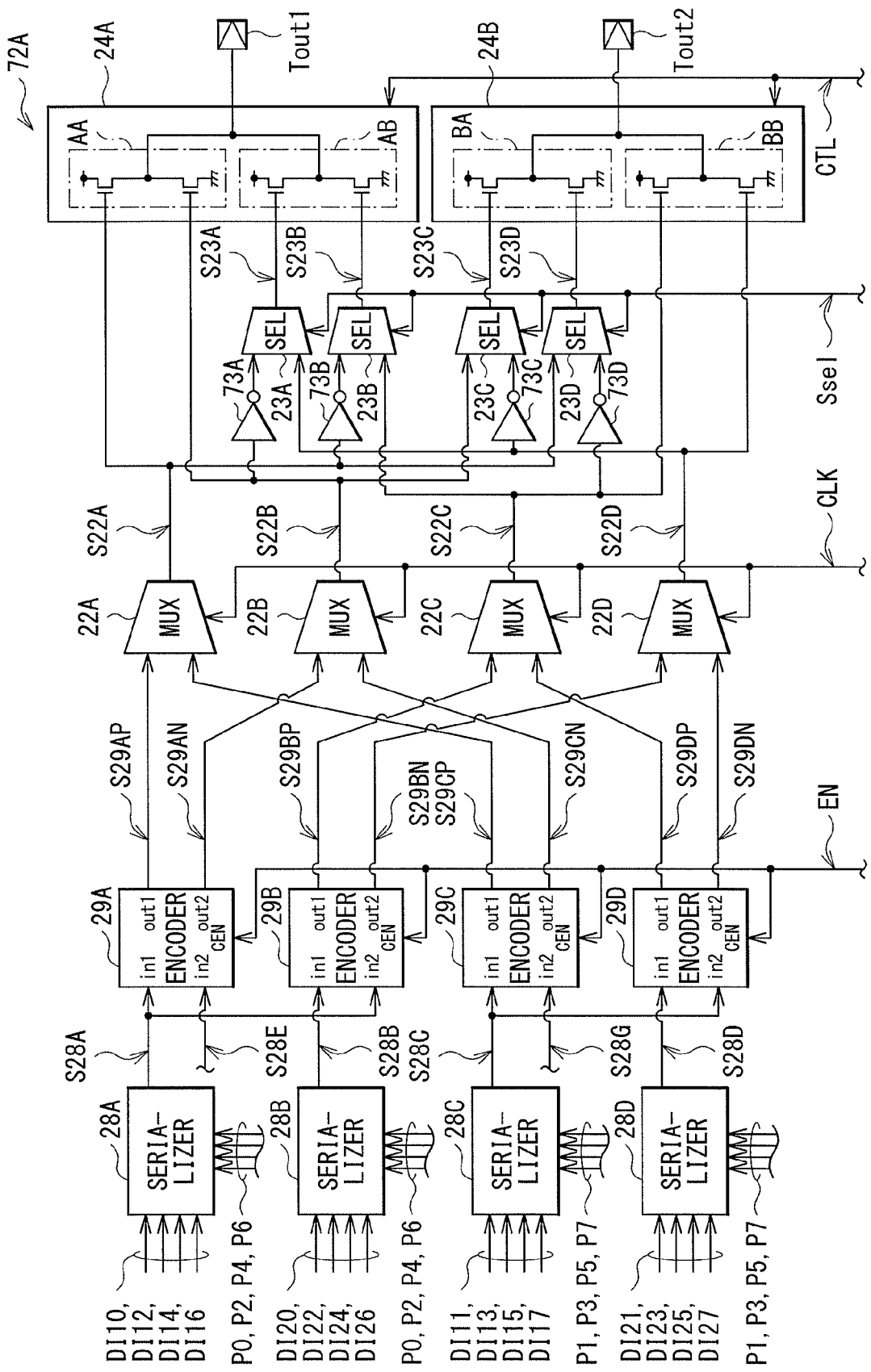

[FIG. 60B]
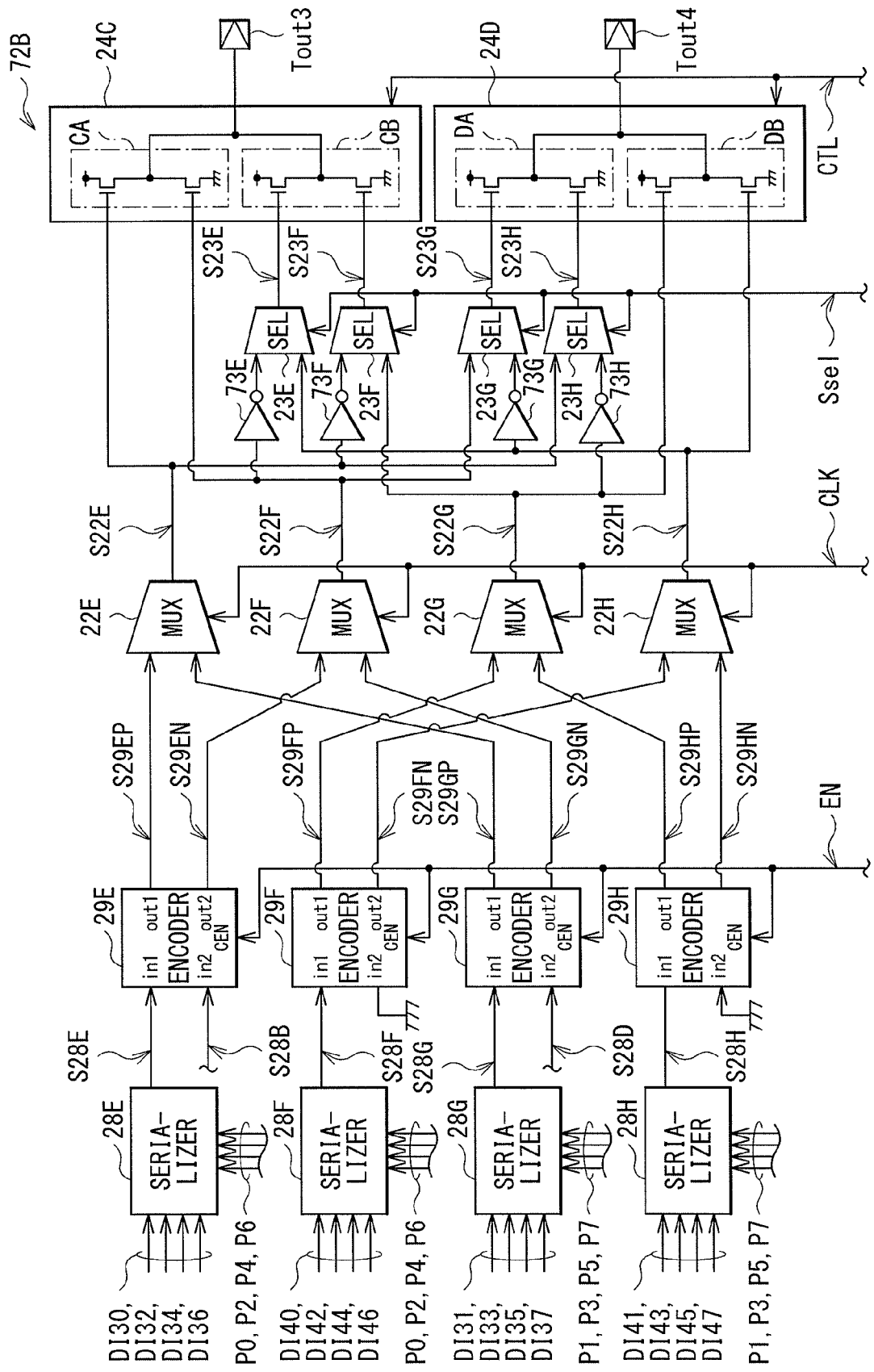

[ FIG. 61 ]
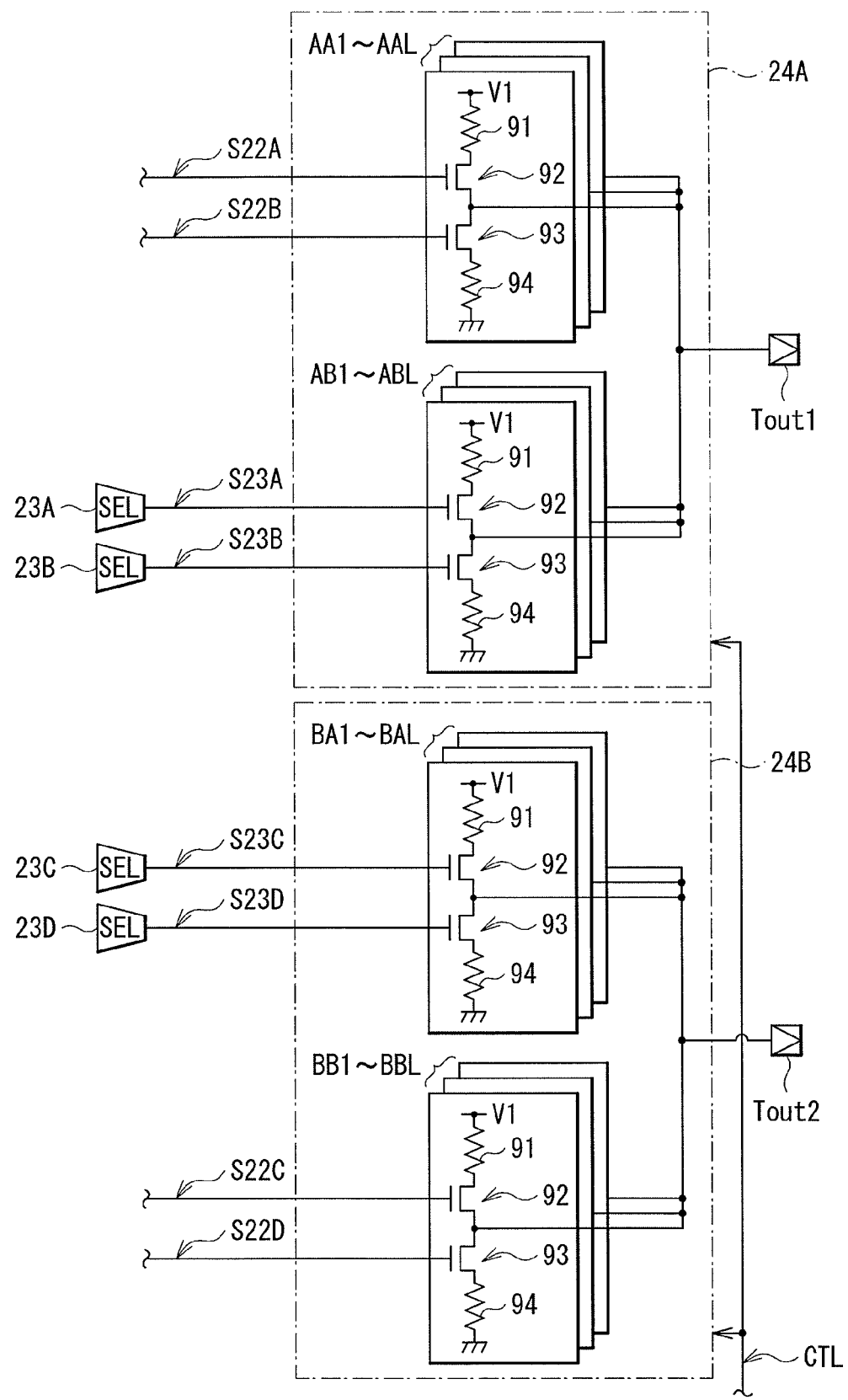

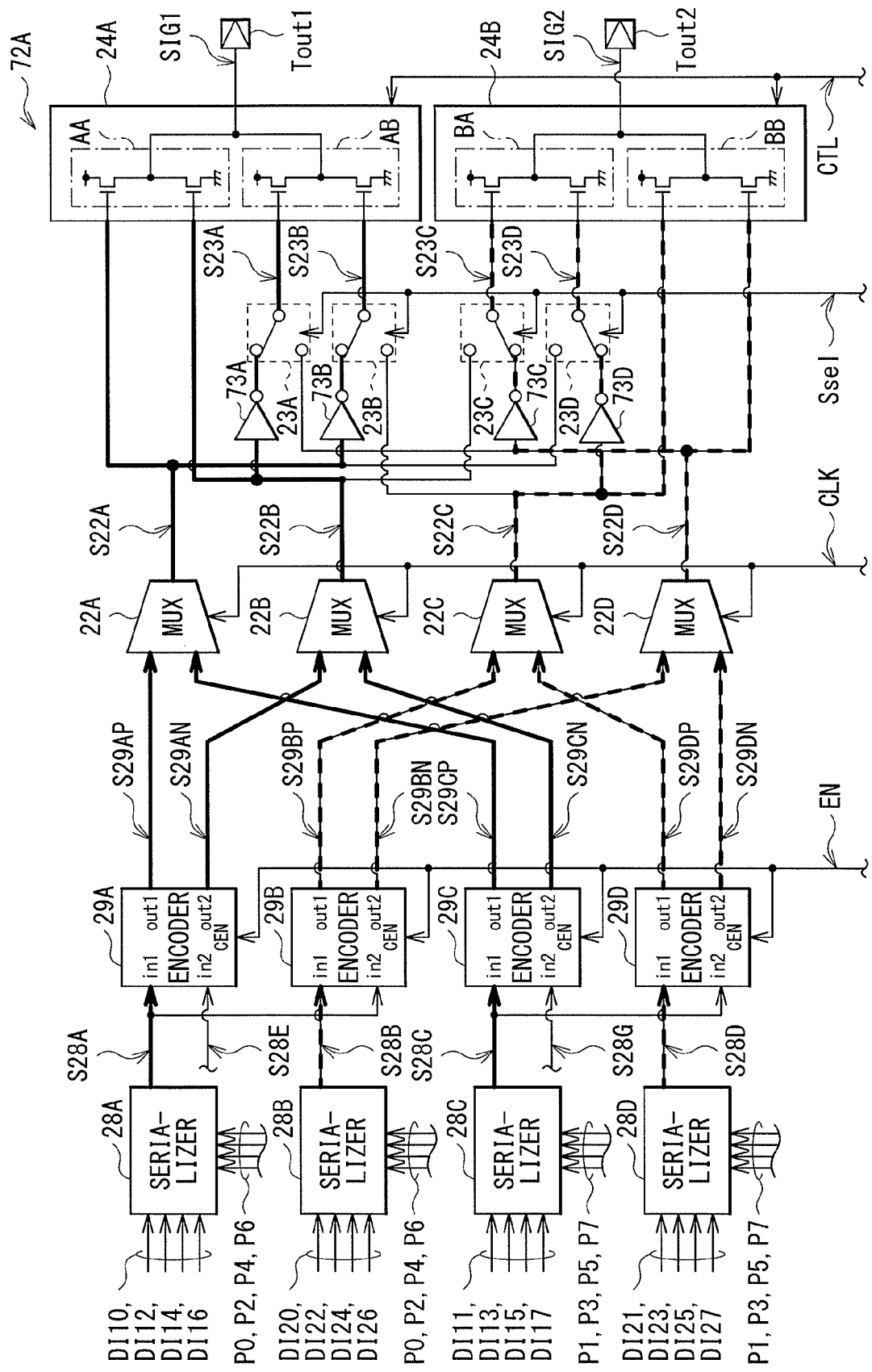
[ FIG. 62 ]

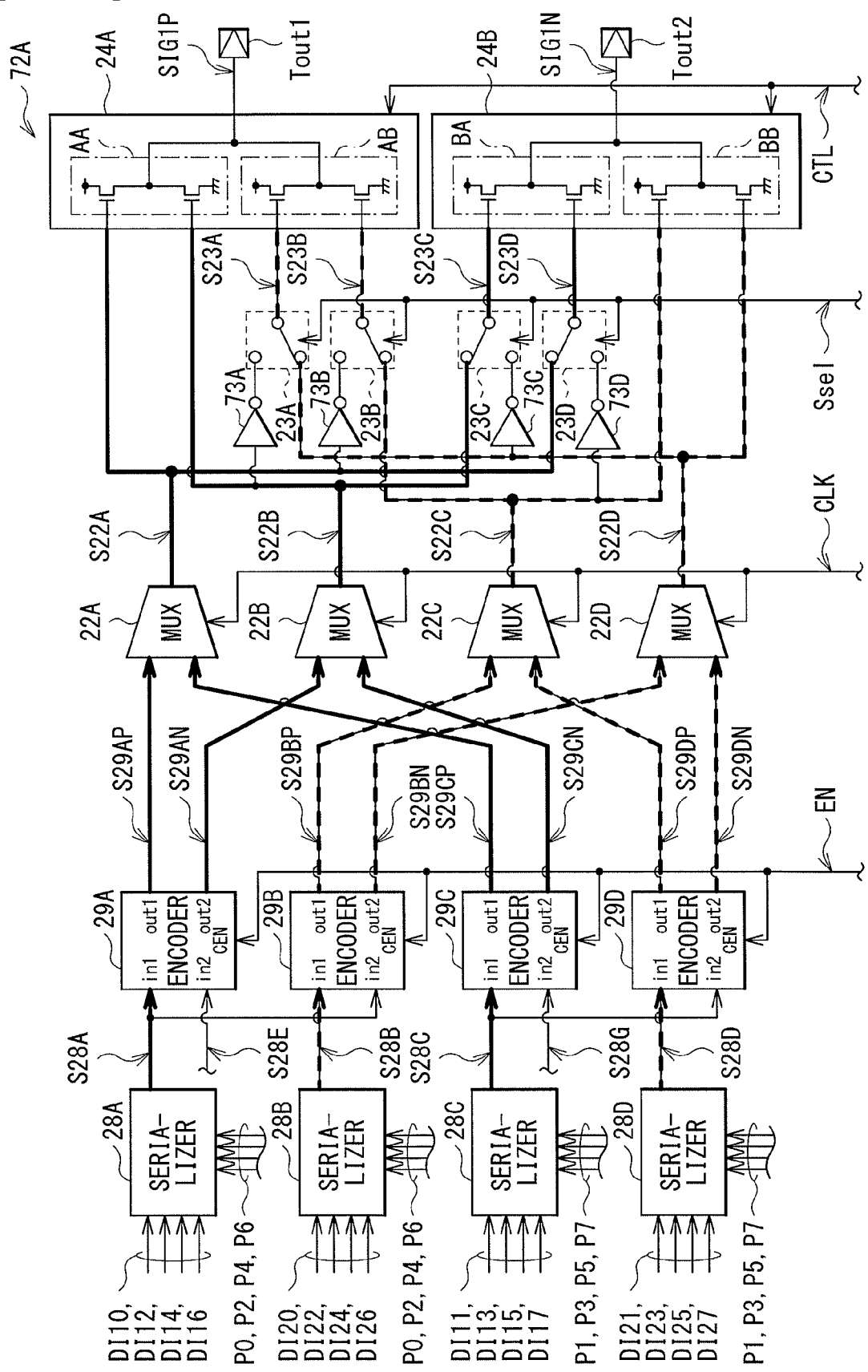
[ FIG. 63 ]

[FIG. 64A]
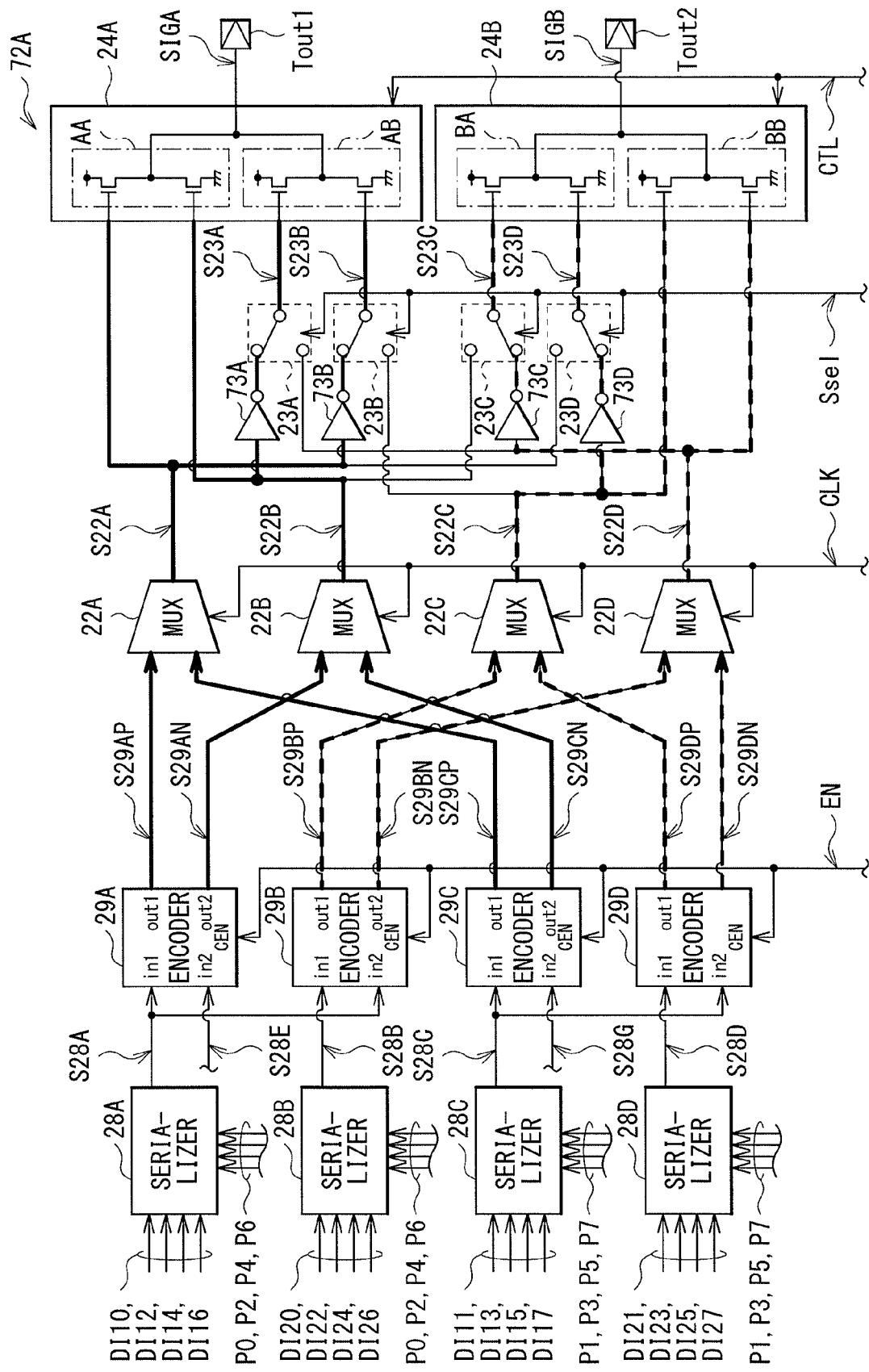

[ FIG. 64B ]
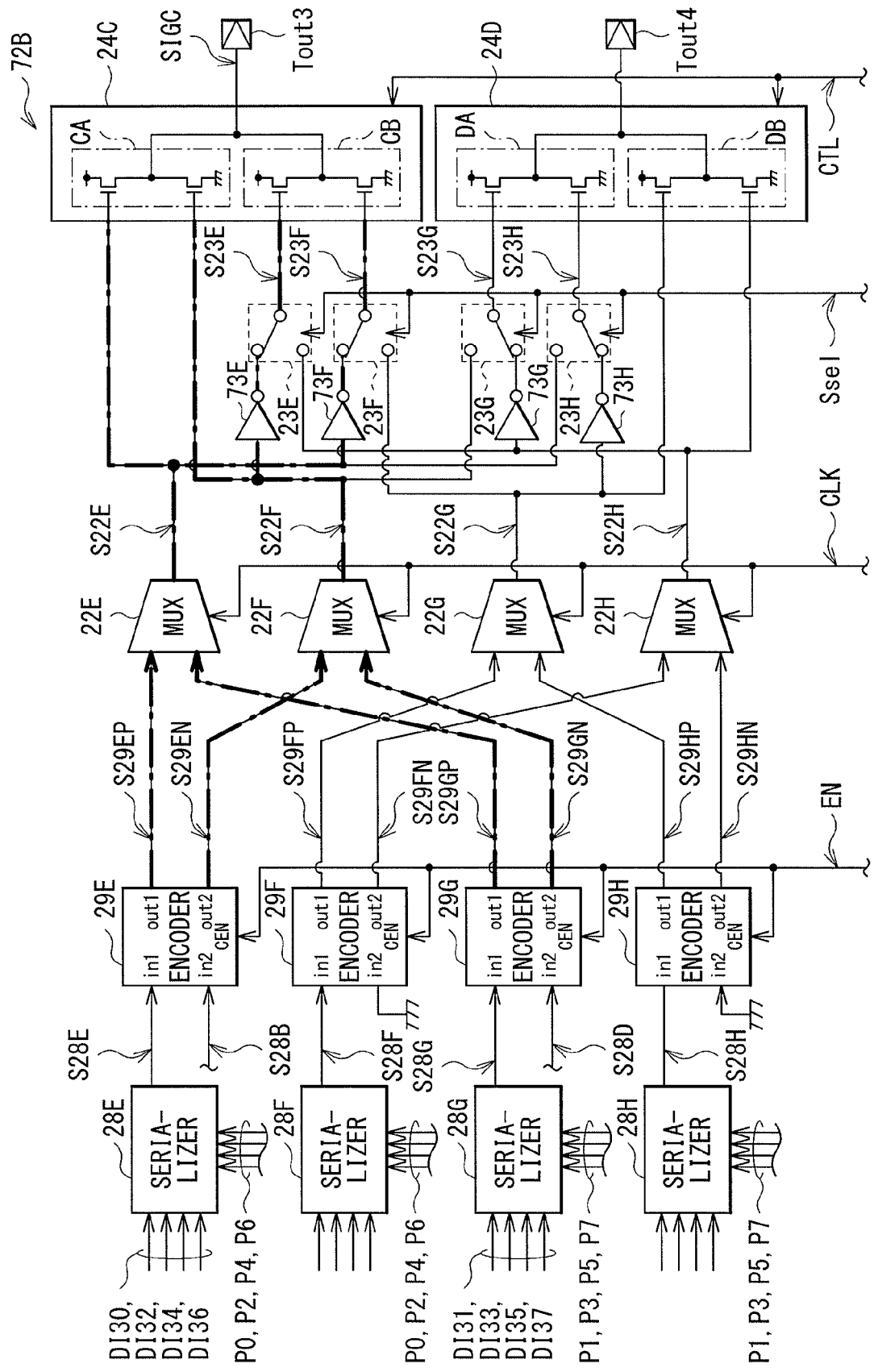

[ FIG. 65A ]
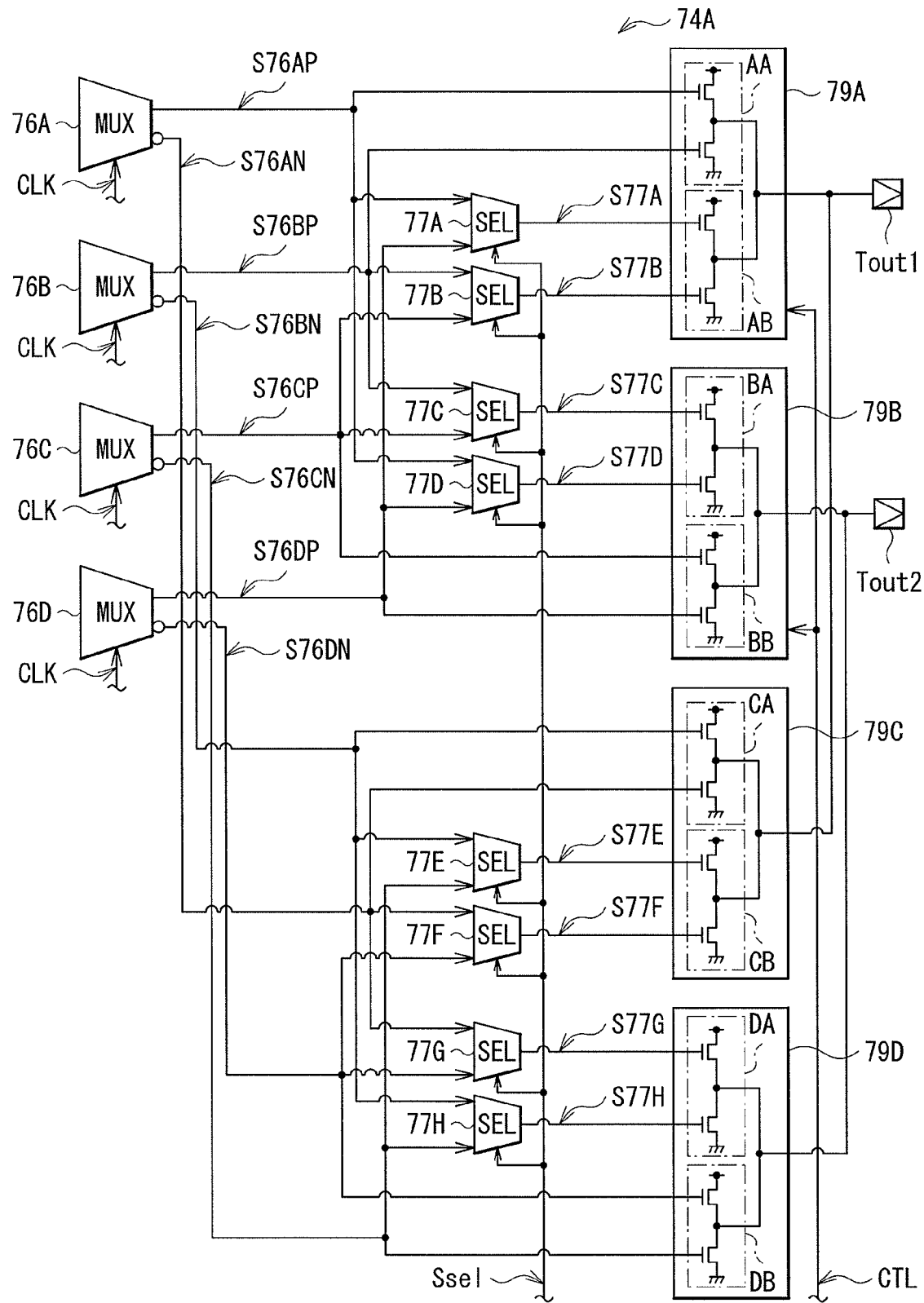

[ FIG. 65B ]
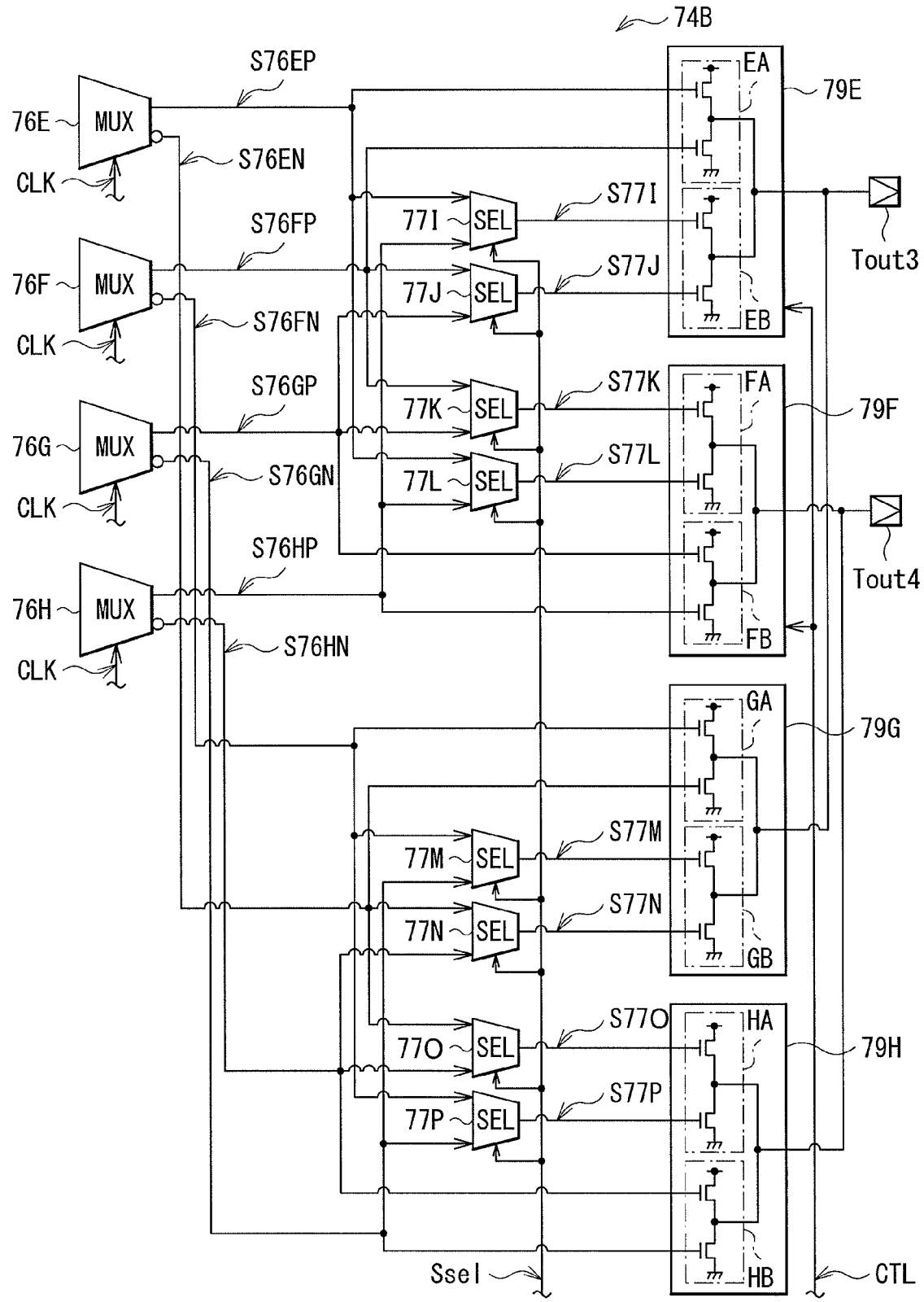

[ FIG. 66 ]
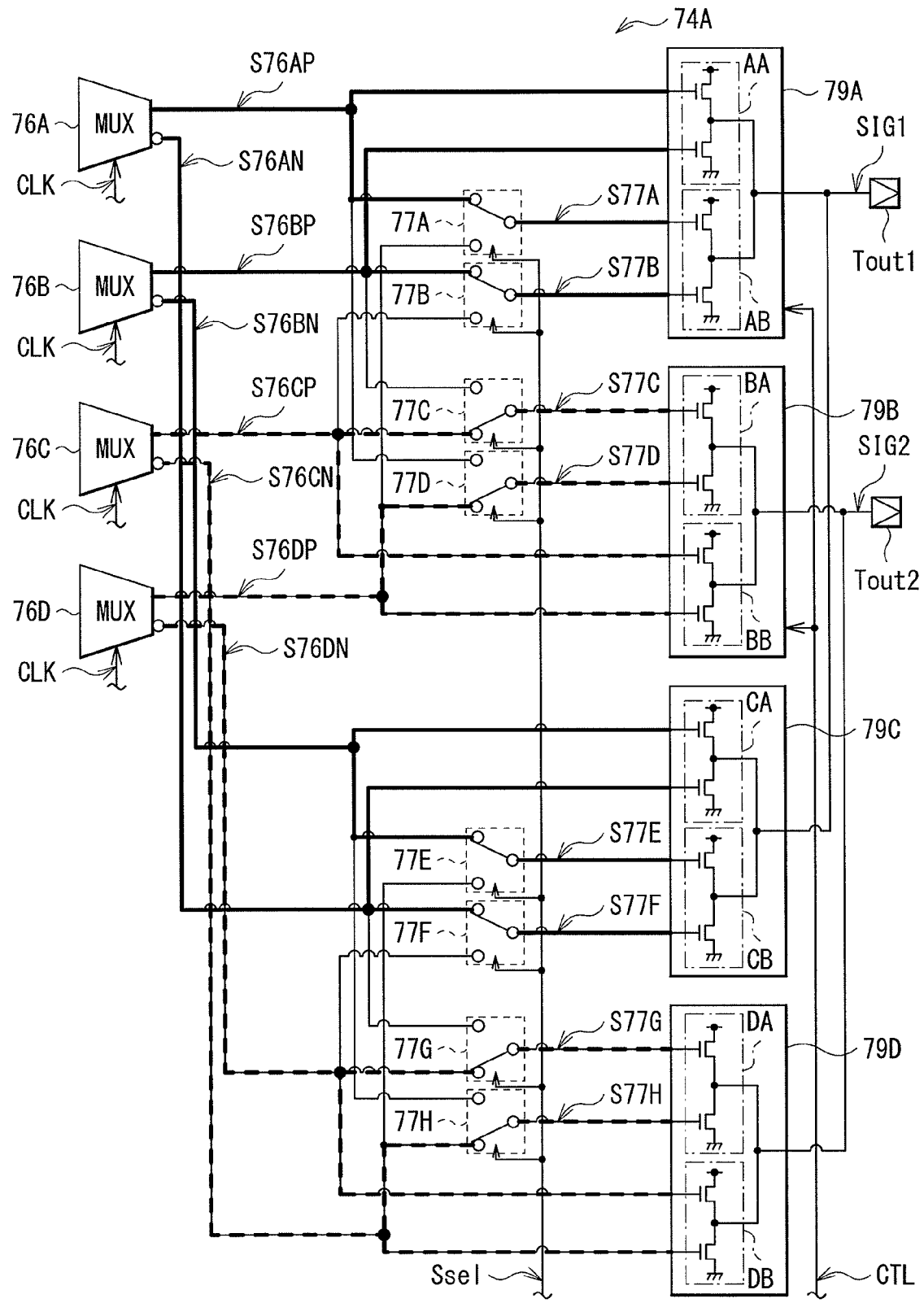

[ FIG. 67 ]
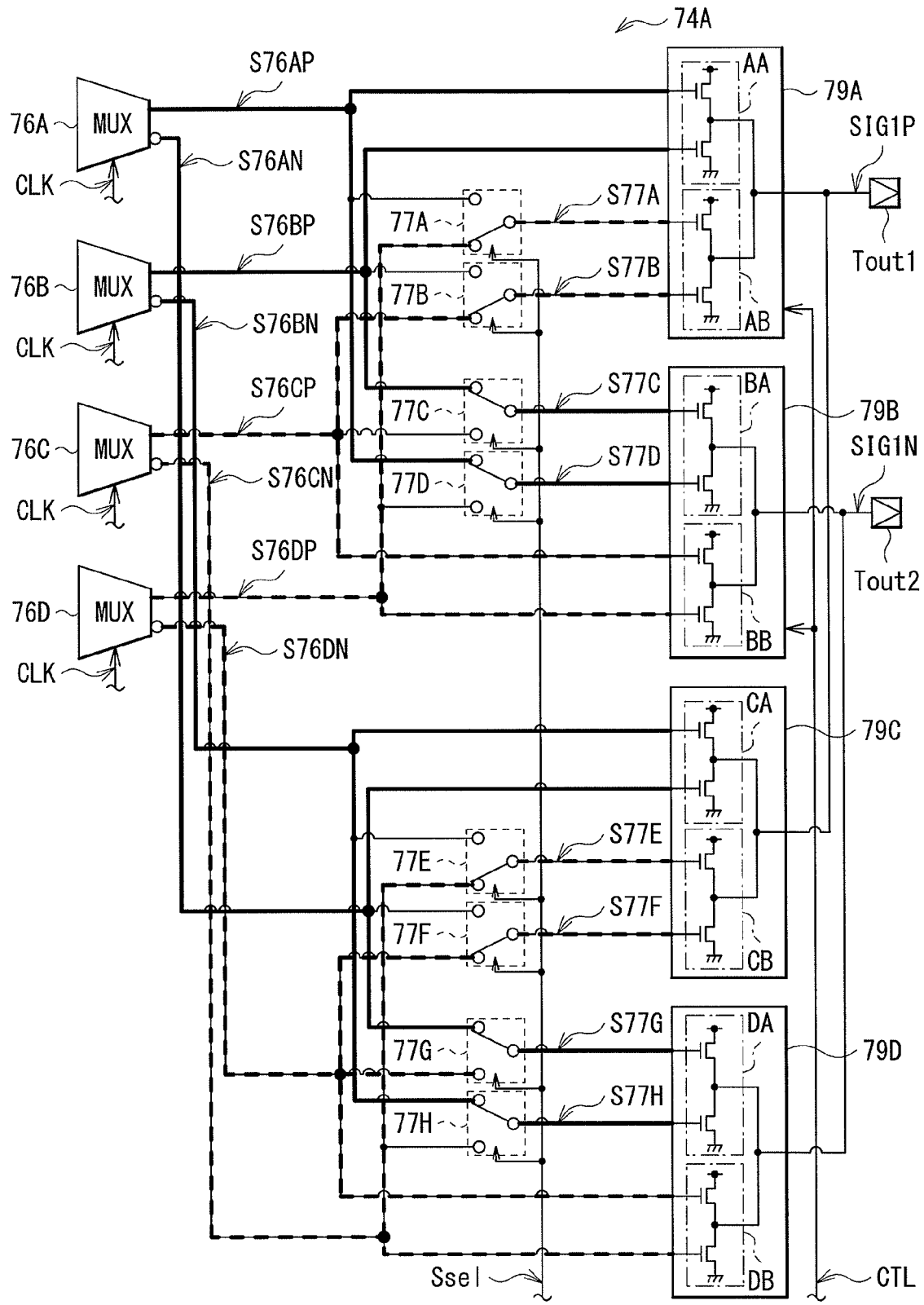

[ FIG.68A ]
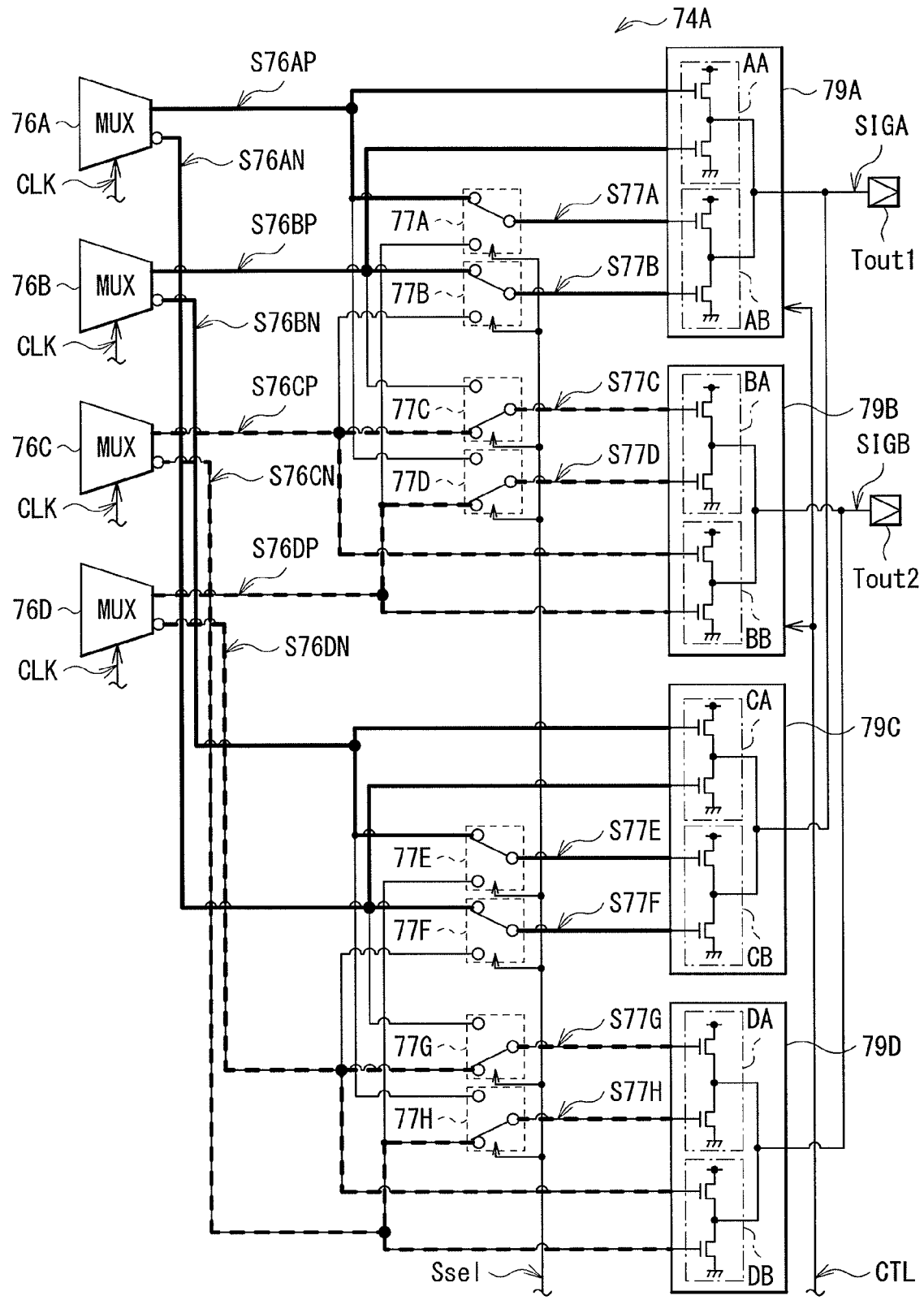

[ FIG. 68B ]
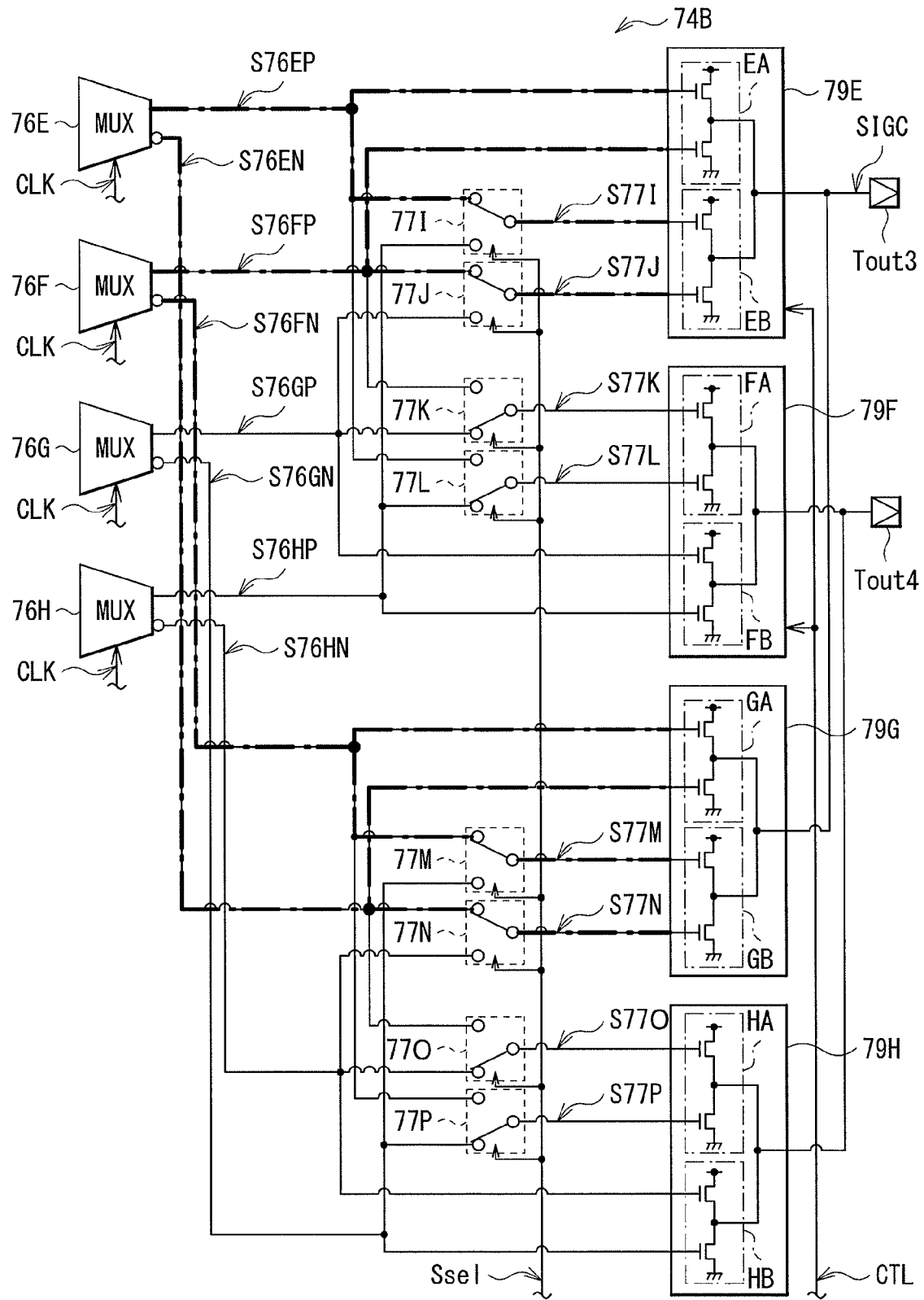

[ FIG. 69A ]
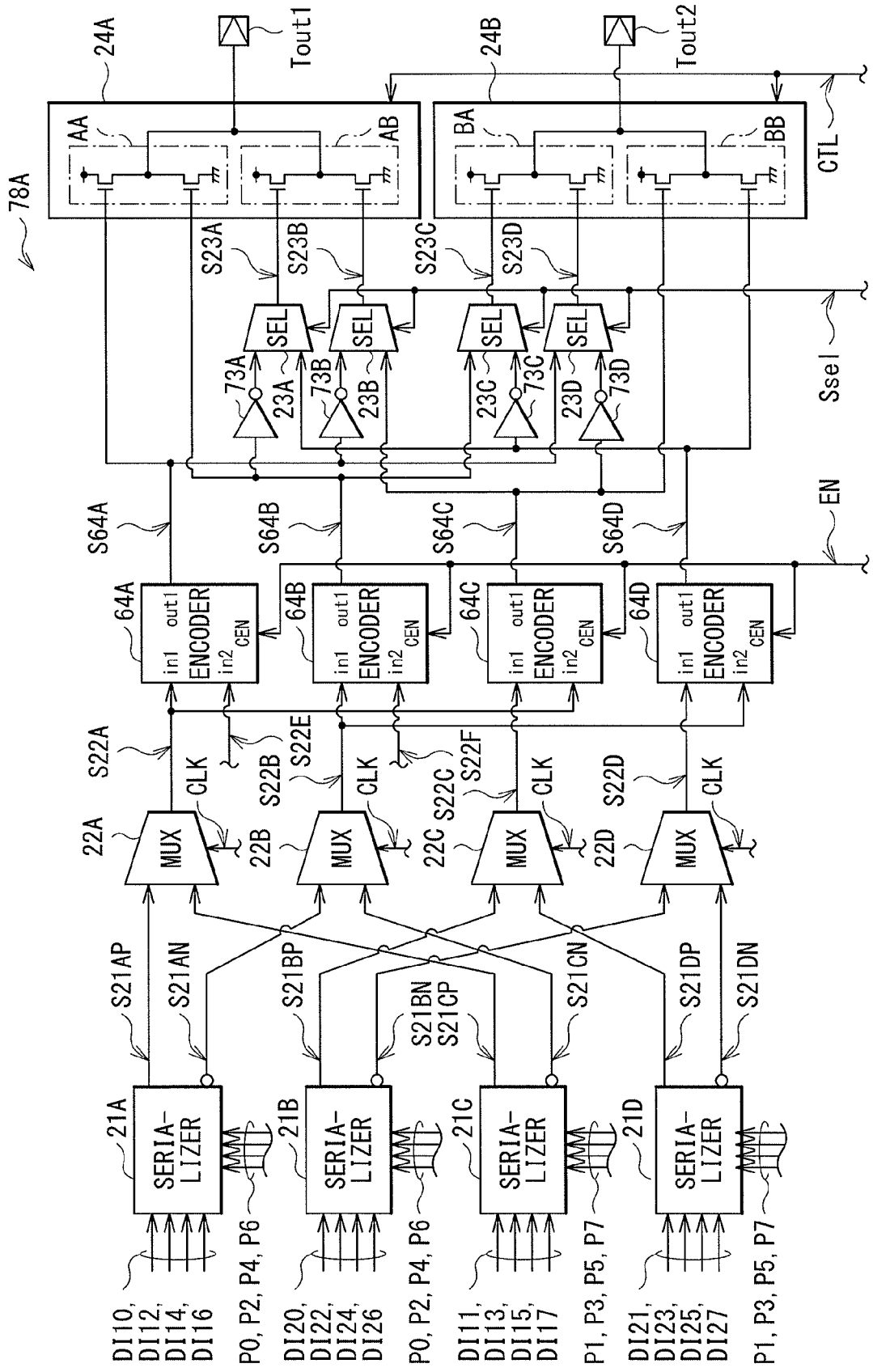

[FIG. 69B]
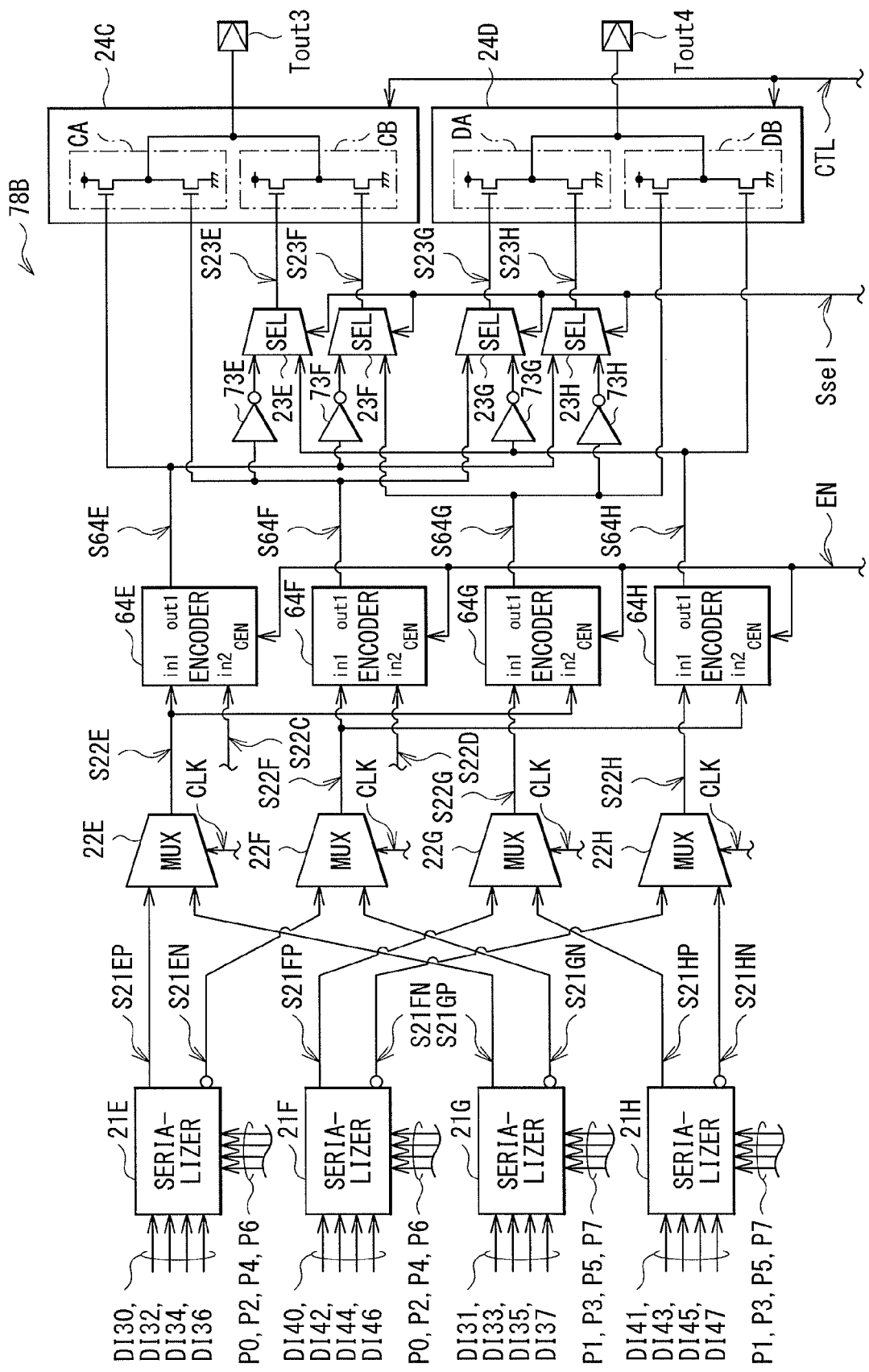

[ FIG. 70A ]
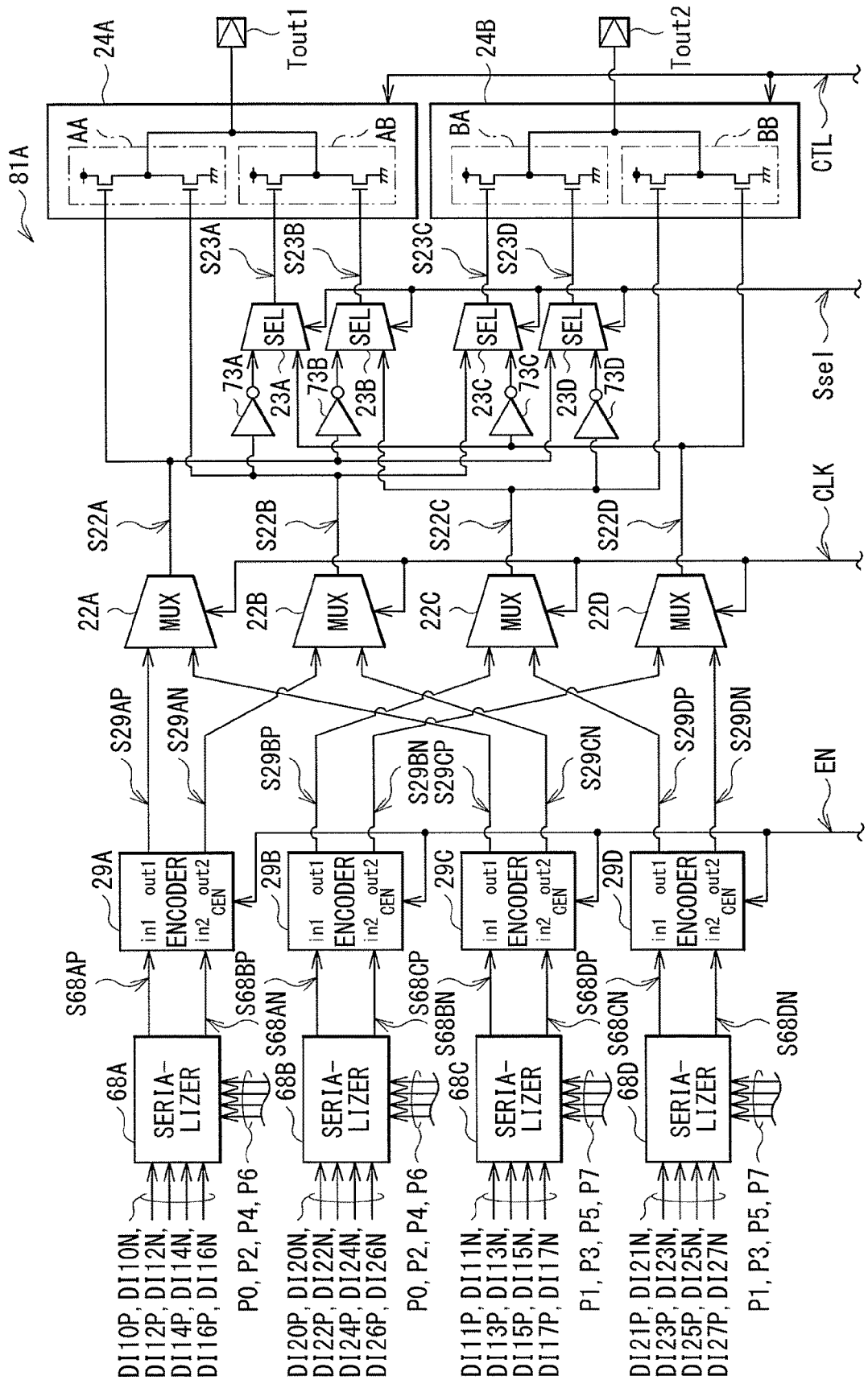

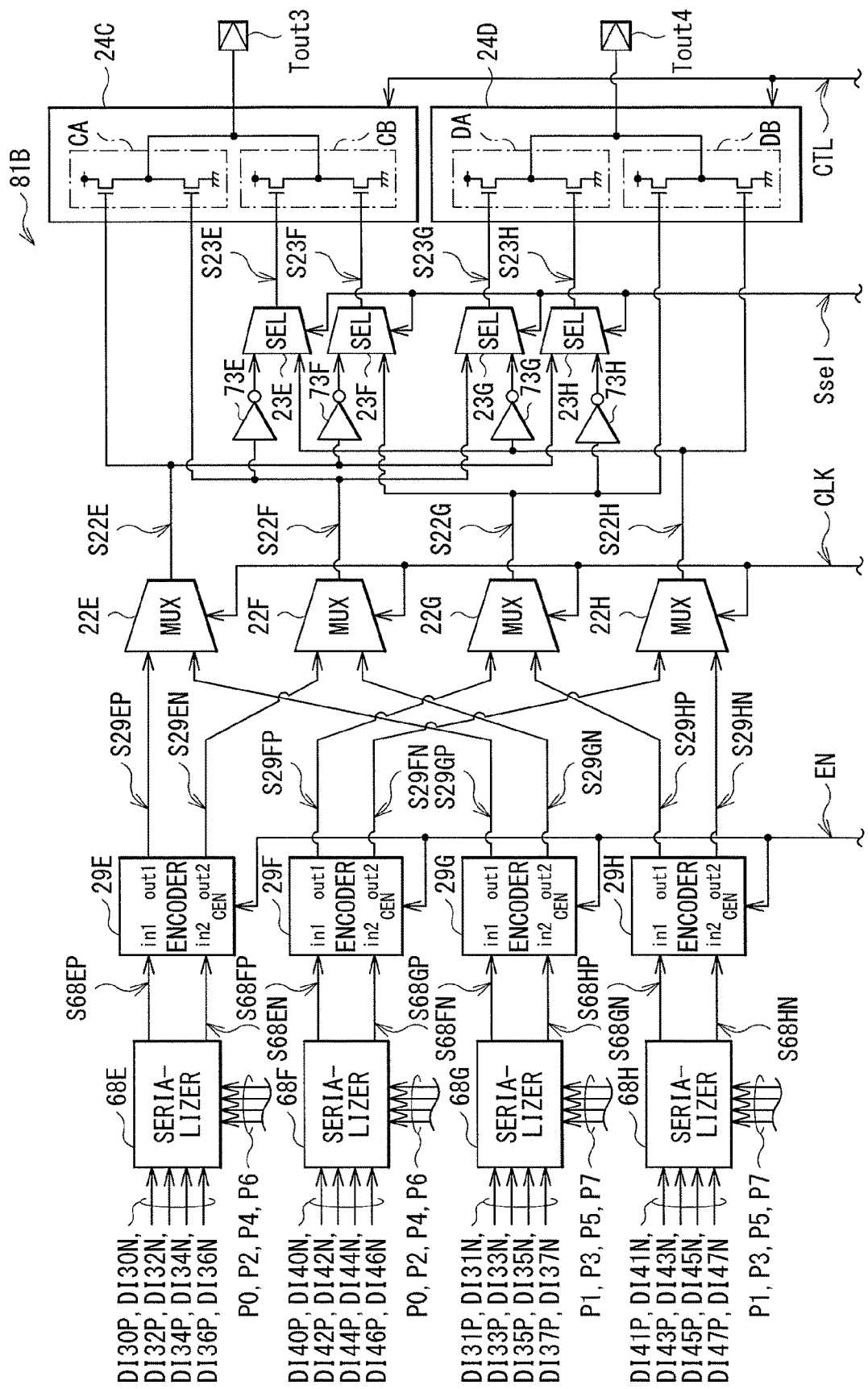
[FIG. 70B]

[ FIG. 71A ]
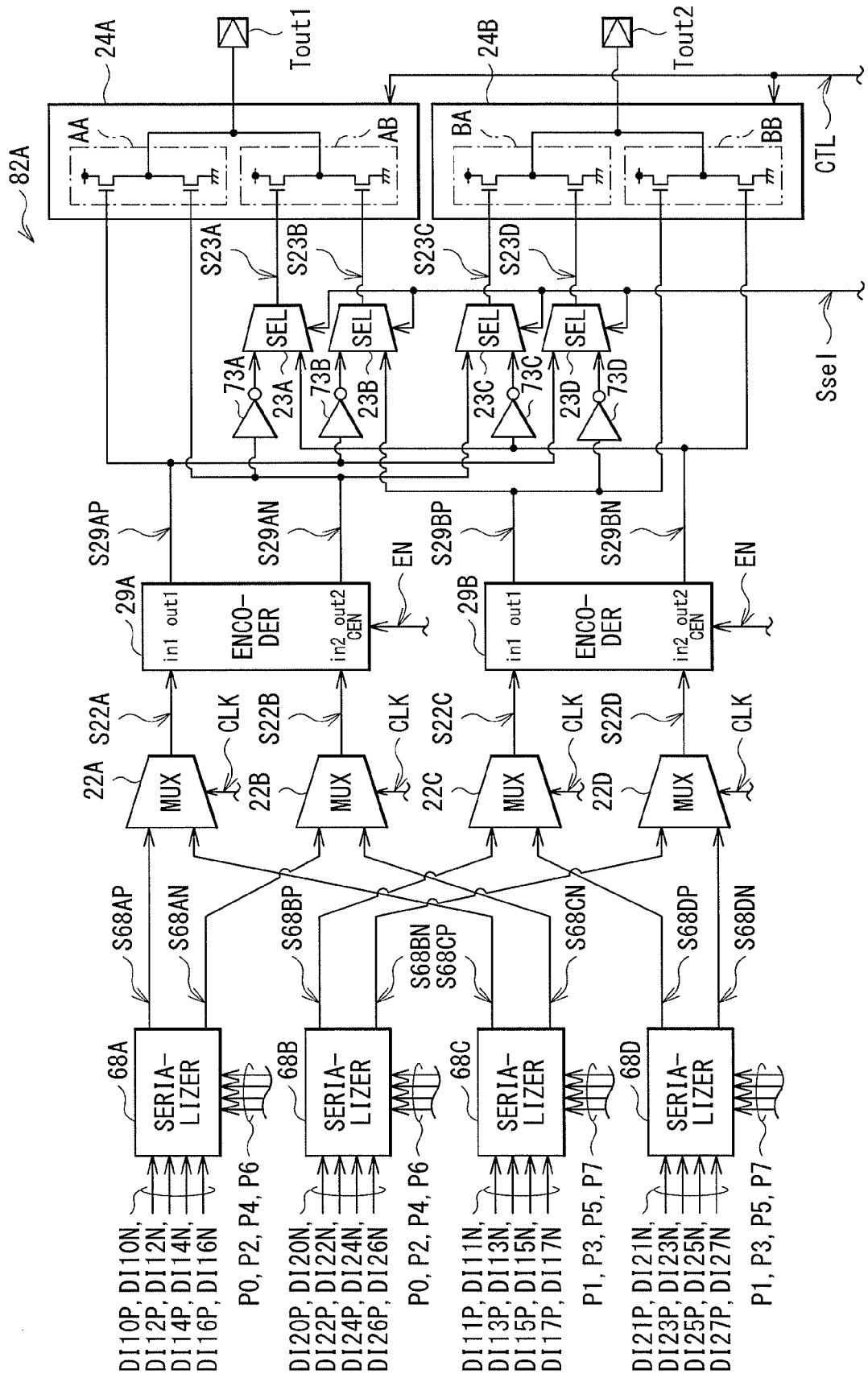

[FIG. 71B]
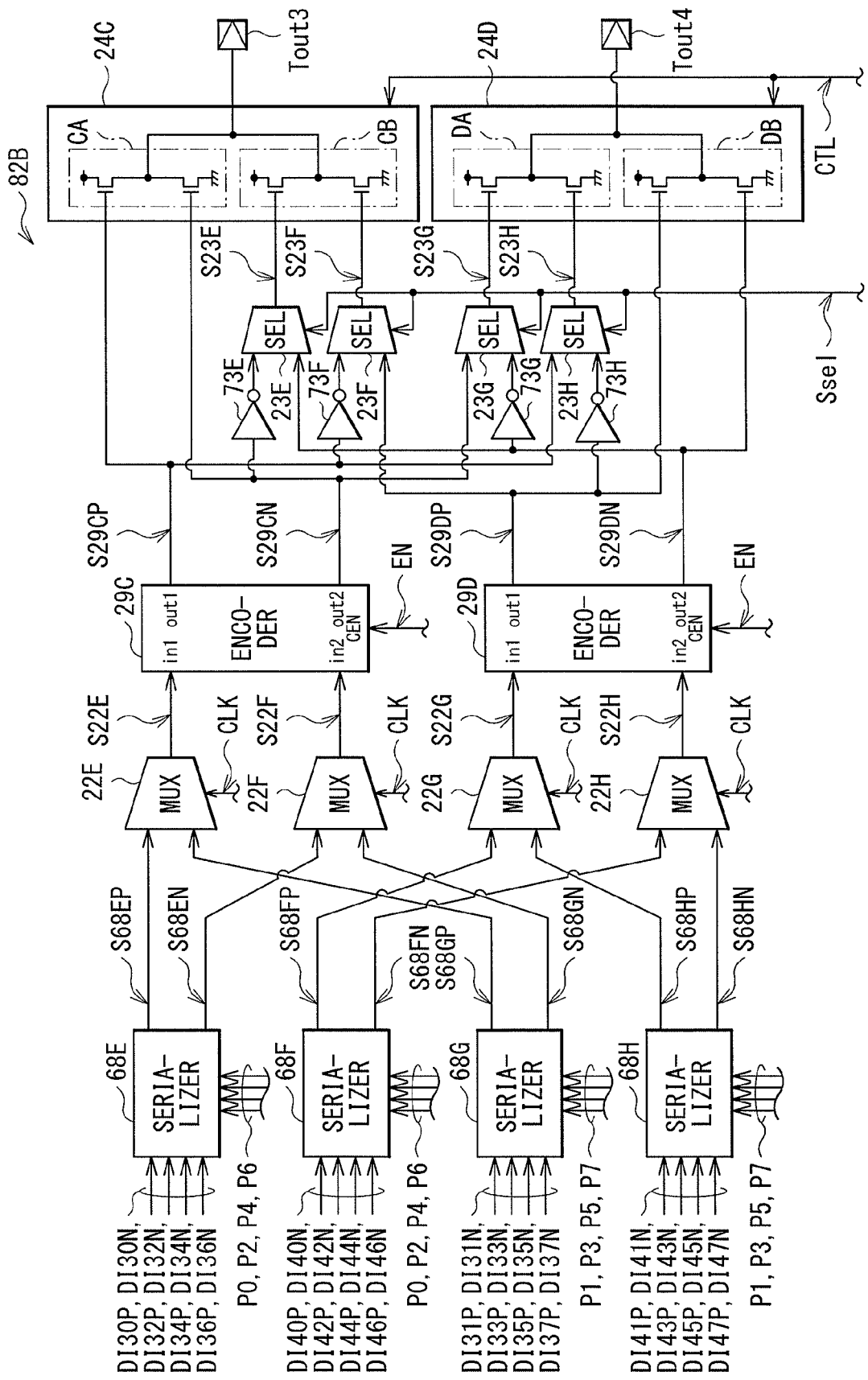

[ FIG. 72 ]
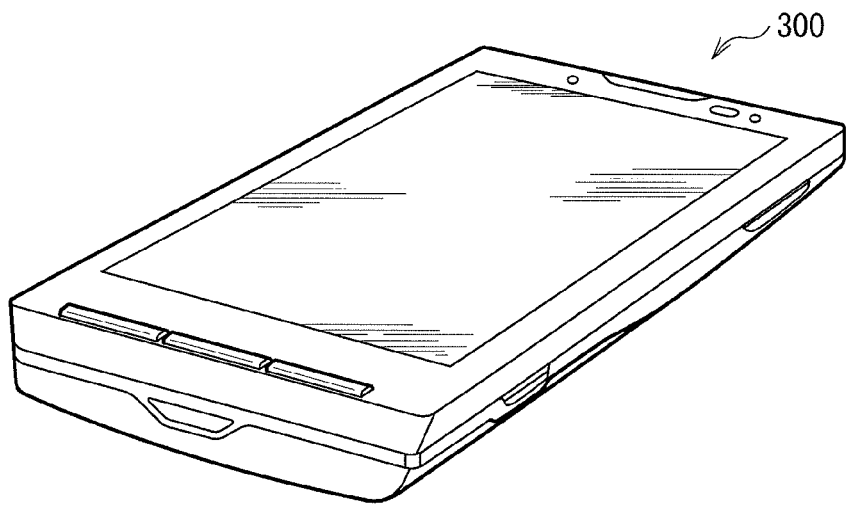

[ FIG. 73 ]
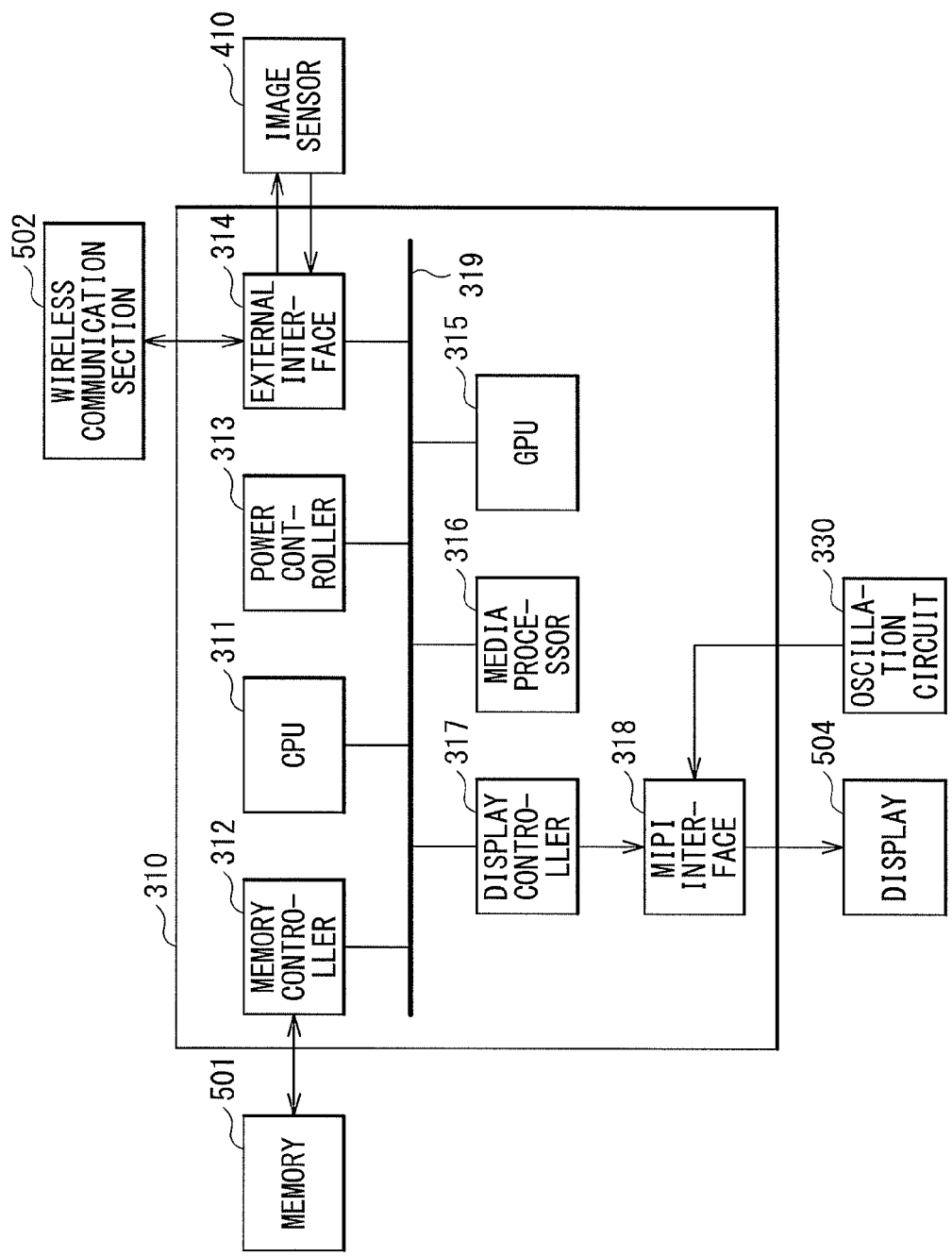

[ FIG. 74 ]
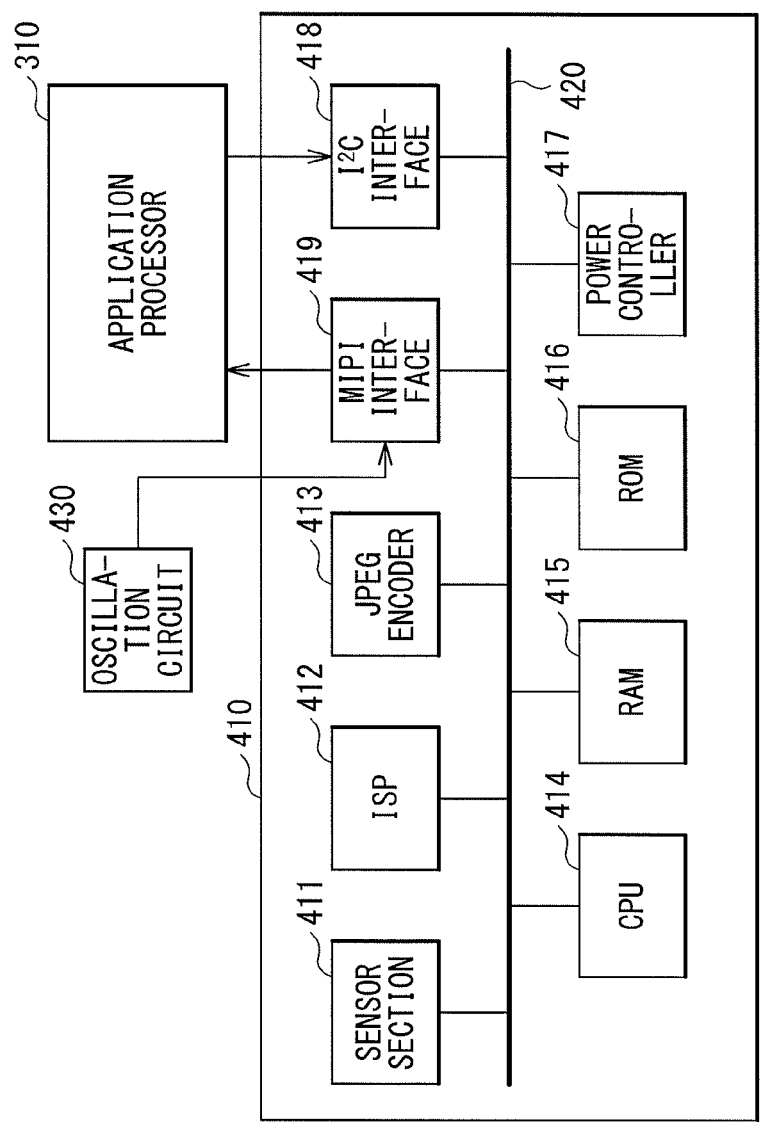

[ FIG. 75 ]
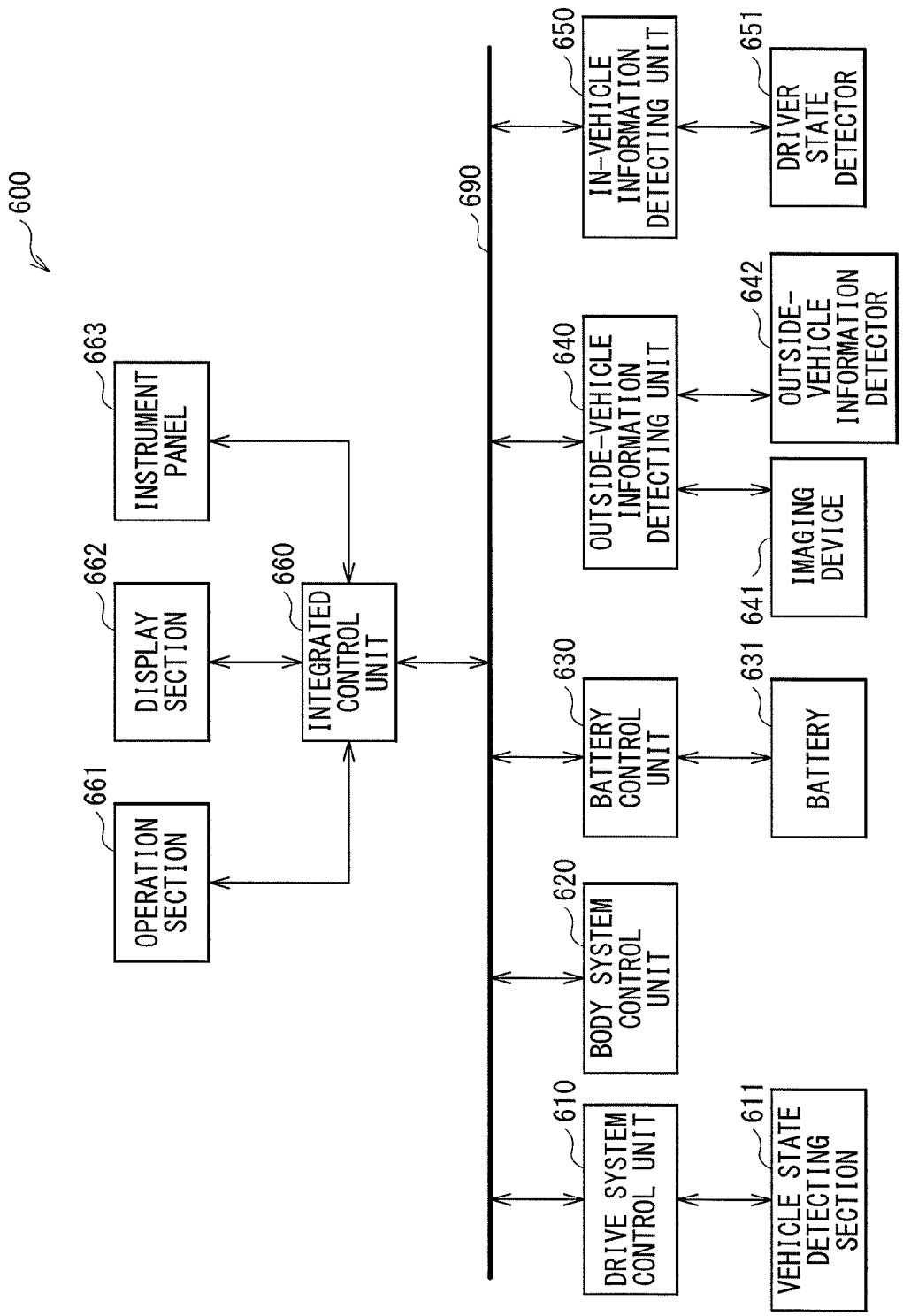

TRANSMITTING DEVICE, TRANSMITTING METHOD, AND COMMUNICATION SYSTEM

TECHNICAL FIELD

The present disclosure relates to a transmitting device that transmits a signal, a transmitting method employed in such a transmitting device, and a communication system including such a transmitting device.

BACKGROUND ART

With high functionalization and multi-functionalization of electronic apparatuses in recent years, electronic apparatuses are equipped with various devices such as a semiconductor chip, a sensor, and a display device. These devices exchange a lot of data between them, and the data amount has increased in accordance with the high functionalization and multi-functionalization of electronic apparatuses. Accordingly, a high-speed interface that is able to transmit and receive data, for example, at a few Gbps (gigabits per second) is often used to perform data exchange.

In such a communication system, a single-phase signal or a differential signal is often used to perform data exchange. Furthermore, there is a communication system that uses a signal having multiple voltage levels to perform data exchange. For example, PTLs 1 and 2 disclose a communication system that uses three voltage levels to perform data exchange.

CITATION LIST

Patent Literatures

PTL 1: Japanese Unexamined Patent Application Publication (Published Japanese Translation of PCT Application) No. JP2011-517159

PTL 2: Japanese Unexamined Patent Application Publication (Published Japanese Translation of PCT Application) No. JP2010-520715

SUMMARY OF THE INVENTION

Incidentally, an electronic apparatus is often equipped with various devices supplied from vendors. Such devices may include an interface different from one another. Therefore, a device that exchanges data with such devices is desirably able to implement various interfaces.

It is desirable to provide a transmitting device, a transmitting method, and a communication system that make it possible to implement various interfaces.

A transmitting device of an embodiment of the present disclosure includes a first driver and a controller. The first driver includes a first sub-driver unit that operates on a basis of a first control signal and a second sub-driver unit that operates on a basis of, out of the first control signal and a second control signal, a signal selected through a first selecting operation, and is able to set a voltage at a first output terminal. The controller controls the first selecting operation.

A transmitting method of an embodiment of the present disclosure includes: preparing a first control signal and a second control signal; and causing a first sub-driver unit to operate on the basis of the first control signal and a second sub-driver unit to operate on the basis of, out of the first control signal and the second control signal, a signal selected through a first selecting operation, thereby setting a voltage at a first output terminal.

A communication system of an embodiment of the present disclosure includes a transmitting device and a receiving device. The transmitting device includes a first driver and a controller. The first driver includes a first sub-driver unit that operates on the basis of a first control signal and a second sub-driver unit that operates on the basis of, out of the first control signal and a second control signal, a signal selected through a first selecting operation, and is able to set a voltage at a first output terminal. The controller controls the first selecting operation.

In the transmitting device, the transmitting method, and the communication system of the embodiments of the present disclosure, one of the first control signal and the second control signal is selected through the first selecting operation. Then, the first sub-driver unit operates on the basis of the first control signal, and the second sub-driver unit operates on the basis of, out of the first control signal and the second control signal, a signal selected through the first selecting operation, thereby the voltage at the first output terminal is set.

According to the transmitting device, the transmitting method, and the communication system of the embodiments of the present disclosure, the first sub-driver unit operates on the basis of the first control signal, and the second sub-driver unit operates on the basis of, out of the first control signal and the second control signal, a signal selected through the first selecting operation; therefore, it is possible to implement various interfaces. It is to be noted that the effects described here are not necessarily limited, and any effect described in the present disclosure may be provided.

BRIEF DESCRIPTION OF DRAWINGS

FIG. 1A is a block diagram illustrating a configuration example of a communication system to which a transmitting device according to a first embodiment of the present disclosure is applied.

FIG. 1B is a block diagram illustrating a configuration example of another communication system to which the transmitting device according to the first embodiment is applied.

FIG. 2 is a block diagram illustrating a configuration example of a transmitter according to the first embodiment.

FIG. 3 is a circuit diagram illustrating a configuration example of a serializer illustrated in FIG. 2.

FIG. 4 is a timing waveform diagram illustrating an operation example of the serializer illustrated in FIG. 2.

FIG. 5 is another timing waveform diagram illustrating an operation example of the serializer illustrated in FIG. 2.

FIG. 6 is a timing waveform diagram illustrating an operation example of a multiplexer illustrated in FIG. 2.

FIG. 7 is a timing waveform diagram illustrating another operation example of the multiplexer illustrated in FIG. 2.

FIG. 8 is a circuit diagram illustrating a configuration example of drivers illustrated in FIG. 2.

FIG. 9 is a circuit diagram illustrating a configuration example of a receiver illustrated in FIG. 1A.

FIG. 10 is a circuit diagram illustrating a configuration example of a receiver illustrated in FIG. 1B.

FIG. 11 is a diagram that describes an operation example of the transmitter illustrated in FIG. 2.

FIG. 12 is a diagram that describes another operation example of the transmitter illustrated in FIG. 2.

FIG. 13 is a diagram that describes another operation example of the transmitter illustrated in FIG. 2.

FIG. 14 is a diagram that describes another operation example of the transmitter illustrated in FIG. 2.

FIG. 15 is a diagram that describes another operation example of the transmitter illustrated in FIG. 2.

FIG. 16 is a timing waveform diagram illustrating an operation example of the transmitter illustrated in FIG. 2.

FIG. 17 is a block diagram illustrating a configuration example of a transmitter according to a comparative example.

FIG. 18 is a diagram that describes an operation example of the transmitter illustrated in FIG. 17.

FIG. 19 is a diagram that describes another operation example of the transmitter illustrated in FIG. 17.

FIG. 20 is a block diagram illustrating a configuration example of another transmitter according to a comparative example.

FIG. 21 is a diagram that describes an operation example of the transmitter illustrated in FIG. 20.

FIG. 22 is a diagram that describes another operation example of the transmitter illustrated in FIG. 20.

FIG. 23 is a circuit diagram illustrating a configuration example of a serializer according to a modification example.

FIG. 24 is a circuit diagram illustrating a configuration example of a serializer according to another modification example.

FIG. 25 is a timing waveform diagram illustrating an operation example of the serializer illustrated in FIG. 24.

FIG. 26 is a timing waveform diagram illustrating an operation example of a serializer according to another modification example.

FIG. 27 is a circuit diagram illustrating a configuration example of a serializer according to another modification example.

FIG. 28 is a timing waveform diagram illustrating an operation example of the serializer illustrated in FIG. 27.

FIG. 29 is a block diagram illustrating a configuration example of a transmitter according to another modification example.

FIG. 30 is a circuit diagram illustrating a configuration example of drivers illustrated in FIG. 29.

FIG. 31 is a circuit diagram illustrating a configuration example of another driver illustrated in FIG. 29.

FIG. 32 is a diagram that describes an operation example of the transmitter illustrated in FIG. 29.

FIG. 33 is a diagram that describes another operation example of the transmitter illustrated in FIG. 29.

FIG. 34 is a block diagram illustrating a configuration example of a transmitter according to another modification example.

FIG. 35 is a diagram that describes an operation example of the transmitter illustrated in FIG. 34.

FIG. 36 is a diagram that describes another operation example of the transmitter illustrated in FIG. 34.

FIG. 37A is a block diagram illustrating a configuration example of a communication system to which a transmitting device according to a second embodiment is applied.

FIG. 37B is a block diagram illustrating a configuration example of another communication system to which the transmitting device according to the second embodiment is applied.

FIG. 37C is a block diagram illustrating a configuration example of another communication system to which the transmitting device according to the second embodiment is applied.

FIG. 38 is a diagram that describes an example of signals used in the communication system illustrated in FIG. 37C.

FIG. 39 is a block diagram illustrating a configuration example of a transmitter according to the second embodiment FIG. 40A is a block diagram illustrating a configuration example of a transmitting circuit unit illustrated in FIG. 39.

FIG. 40B is a block diagram illustrating a configuration example of another transmitting circuit unit illustrated in FIG. 39.

FIG. 41 is a diagram that describes an example of signal paths in the transmitting circuit units illustrated in FIGS. 40A and 40B.

FIG. 42 is a circuit diagram illustrating a configuration example of an encoder illustrated in FIGS. 40A and 40B.

FIG. 43 is a truth table illustrating an operation example of the encoder illustrated in FIG. 42.

FIG. 44 is a circuit diagram illustrating a configuration example of another encoder.

FIG. 45 is a circuit diagram illustrating a configuration example of a receiver illustrated in FIG. 37C.

FIG. 46 is a diagram that describes an operation example of the receiver illustrated in FIG. 45.

FIG. 47A is a diagram that describes an operation example of the transmitting circuit unit illustrated in FIG. 40A.

FIG. 47B is a diagram that describes an operation example of the other transmitting circuit unit illustrated in FIG. 40B.

FIG. 48 is a table illustrating an operation example of the transmitting circuit units illustrated in FIGS. 40A and 40B.

FIG. 49A is a diagram that describes another operation example of the transmitting circuit unit illustrated in FIG. 40A.

FIG. 49B is a diagram that describes another operation example of the other transmitting circuit unit illustrated in FIG. 40B.

FIG. 50A is a block diagram illustrating a configuration example of a transmitting circuit unit according to a modification example.

FIG. 50B is a block diagram illustrating a configuration example of another transmitting circuit unit according to the modification example.

FIG. 51 is a diagram that describes an example of signal paths in the transmitting circuit units illustrated in FIGS. 50A and 50B.

FIG. 52 is a circuit diagram illustrating a configuration example of an encoder illustrated in FIGS. 50A and 50B.

FIG. 53 is a truth table illustrating an operation example of the encoder illustrated in FIG. 52.

FIG. 54 is a circuit diagram illustrating a configuration example of another encoder.

FIG. 55 is a block diagram illustrating a configuration example of a transmitter according to another modification example.

FIG. 56A is a block diagram illustrating a configuration example of a transmitting circuit units illustrated in FIG. 55.

FIG. 56B is a block diagram illustrating a configuration example of another transmitting circuit unit illustrated in FIG. 55.

FIG. 57 is a circuit diagram illustrating a configuration example of a serializer illustrated in FIGS. 56A and 56B.

FIG. 58 is a diagram that describes an example of signal paths in the transmitting circuit units illustrated in FIGS. 56A and 56B.

FIG. 59A is a block diagram illustrating a configuration example of a transmitting circuit unit according to another modification example.

FIG. 59B is a block diagram illustrating a configuration example of another transmitting circuit unit according to another modification example.

FIG. 60A is a block diagram illustrating a configuration example of a transmitting circuit unit according to a third embodiment.

FIG. 60B is a block diagram illustrating a configuration example of another transmitting circuit unit according to the third embodiment.

FIG. 61 is a circuit diagram illustrating a configuration example of drivers illustrated in FIGS. 60A and 60B.

FIG. 62 is a diagram that describes an operation example of the transmitting circuit unit illustrated in FIG. 60A.

FIG. 63 is a diagram that describes another operation example of the transmitting circuit unit illustrated in FIG. 60A.

FIG. 64A is a diagram that describes another operation example of the transmitting circuit unit illustrated in FIG. 60A.

FIG. 64B is a diagram that describes another operation example of the transmitting circuit unit illustrated in FIG. 60B.

FIG. 65A is a block diagram illustrating a configuration example of a transmitting circuit unit according to a modification example.

FIG. 65B is a block diagram illustrating a configuration example of another transmitting circuit unit according to the modification example.

FIG. 66 is a diagram that describes an operation example of the transmitting circuit unit illustrated in FIG. 65A.

FIG. 67 is a diagram that describes another operation example of the transmitting circuit unit illustrated in FIG. 65A.

FIG. 68A is a diagram that describes another operation example of the transmitting circuit unit illustrated in FIG. 65A.

FIG. 68B is a diagram that describes another operation example of the transmitting circuit unit illustrated in FIG. 65B.

FIG. 69A is a block diagram illustrating a configuration example of a transmitting circuit unit according to another modification example.

FIG. 69B is a block diagram illustrating a configuration example of another transmitting circuit unit according to another modification example.

FIG. 70A is a block diagram illustrating a configuration example of a transmitting circuit unit according to another modification example.

FIG. 70B is a block diagram illustrating a configuration example of another transmitting circuit unit according to another modification example.

FIG. 71A is a block diagram illustrating a configuration example of a transmitting circuit unit according to another modification example.

FIG. 71B is a block diagram illustrating a configuration example of another transmitting circuit unit according to another modification example.

FIG. 72 is a perspective view illustrating an external appearance configuration of a smartphone to which the transmitting device according to the embodiments is applied.

FIG. 73 is a block diagram illustrating a configuration example of an application processor to which the transmitting device according to the embodiments is applied.

FIG. 74 is a block diagram illustrating a configuration example of an image sensor to which the transmitting device according to the embodiments is applied.

FIG. 75 is a block diagram illustrating a configuration example of a vehicle control system to which the communication system according to one of the embodiments is applied.

MODES FOR CARRYING OUT THE INVENTION

In the following, some embodiments of the present disclosure are described in detail with reference to drawings. It is to be noted that description is made in the following order.
1. First Embodiment
2. Second Embodiment
3. Third Embodiment
4. Application Example 1. First Embodiment

[Configuration]

FIGS. 1A and 1B illustrate respective configuration examples of communication systems to which a transmitting device (a transmitting device 10) according to a first embodiment is applied; FIG. 1A illustrates a communication system 1A, and FIG. 1B illustrates a communication system 1B. The communication system 1A performs communication using a single-phase signal, and the communication system 1B performs communication using a differential signal.

As illustrated in FIG. 1A, the communication system 1A includes the transmitting device 10 and a receiving device 30. The transmitting device 10 has two output terminals Tout1 and Tout2, and the receiving device 30 has two input terminals Tin1 and Tin2. The output terminal Tout1 of the transmitting device 10 and the input terminal Tin1 of the receiving device 30 are coupled to each other through a line 101, and the output terminal Tout2 of the transmitting device 10 and the input terminal Tin2 of the receiving device 30 are coupled to each other through a line 102. Respective characteristic impedances of the lines 101 and 102 are about 50[Ω] in this example. The transmitting device 10 uses the line 101 to transmit a signal SIG1, and uses the line 102 to transmit a signal SIG2. The signals SIG1 and SIG2 are both a single-phase signal.

As illustrated in FIG. 1B, the communication system 1B includes the transmitting device 10 and a receiving device 40. The receiving device 40 has two input terminals TinP and TinN. The output terminal Tout1 of the transmitting device 10 and the input terminal TinP of the receiving device 40 are coupled to each other through a line 111, and the output terminal Tout2 of the transmitting device 10 and the input terminal TinN of the receiving device 40 are coupled to each other through a line 112. Respective characteristic impedances of the lines 111 and 112 are about 50[Ω] in this example. The transmitting device 10 uses the line 111 to transmit a signal SIGP, and uses the line 112 to transmit a signal SIGN. The signals SIGP and SIGN compose a differential signal. In the communication system 1B, as will be described later, the transmitting device 10 performs a so-called emphasis operation (pre-emphasis, de-emphasis), thereby transmitting signals SIGP and SIGN.

The transmitting device 10 has two operation modes MA and MB. In a case where the transmitting device 10 is applied to the communication system 1A, the transmitting device 10 operates in the operation mode MA (single-phase mode); in a case where the transmitting device 10 is applied to the communication system 1B, the transmitting device 10 operates in the operation mode MB (differential mode).

(Transmitting Device 10)

The transmitting device 10 includes a processor 11 and a transmitter 12 as illustrated in FIGS. 1A and 1B.

The processor 11 generates data to be transmitted by performing a predetermined process. Furthermore, the processor 11 selects one of the two operation modes MA and MB, and notifies the transmitter 12 of the selected operation mode by using a mode signal Smode. Specifically, in a case where the transmitting device 10 is applied to the communication system 1A, the processor 11 selects the operation mode MA (single-phase mode), and instructs the transmitter 12 to perform the operation in the operation mode MA by using a mode signal Smode. Furthermore, in a case where the transmitting device 10 is applied to the communication system 1B, the transmitter 12 selects the operation mode MB (differential mode), and instructs the transmitter 12 to perform the operation in the operation mode MB by using a mode signal Smode.

The transmitter 12 transmits data generated by the processor 11 on the basis of a mode signal Smode. Specifically, in a case where the operation mode indicated by the mode signal Smode is the operation mode MA (single-phase mode), the transmitter 12 transmits data generated by the processor 11 by using signals SIG1 and SIG2. Furthermore, in a case where the operation mode indicated by the mode signal Smode is the operation mode MB, the transmitter 12 transmits data generated by the processor 11 by using signals SIGP and SIGN.

FIG. 2 illustrates a configuration example of the transmitter 12. The transmitter 12 includes four serializers 21 (serializers 21A, 21B, 21C, and 21D), four multiplexers (MUXs) 22 (multiplexers 22A, 22B, 22C, and 22D), four selectors (SELs) 23 (selectors 23A, 23B, 23C, and 23D), two drivers 24 (drivers 24A and 24B), and a controller 25.

The serializer 21A serializes signals DI10, DI12, DI14, and DI16 on the basis of clock signals P0, P2, P4, and P6, thereby generating signals S21AP and S21AN. The signals S21AP and S21AN are signals that are inverted from each other. Likewise, the serializer 21B serializes signals DI20, DI22, DI24, and DI26 on the basis of clock signals P0, P2, P4, and P6, thereby generating signals S21BP and S21BN. The signals S21BP and S21BN are signals that are inverted from each other. The serializer 21C serializes signals DI11, DI13, DI15, and DI17 on the basis of clock signals P1, P3, P5, and P7, thereby generating signals S21CP and S21CN. The signals S21CP and S21CN are signals that are inverted from each other. The serializer 21D serializes signals DI21, DI23, DI25, and DI27 on the basis of clock signals P1, P3, P5, and P7, thereby generating signals S21DP and S21DN. The signals S21DP and S21DN are signals that are inverted from each other.

In the operation mode MA (single-phase mode), the signals DI10, SI11, DI12, DI13, DI14, DI15, DI16, and DI17 are transmitted by using a signal SIG1, and the signals DI20, SI21, DI22, DI23, DI24, DI25, DI26, and DI27 are transmitted by using a signal SIG2.

Furthermore, in the operation mode MB (differential mode), the signals DI10, SI11, DI12, DI13, DI14, DI15, DI16, and DI17 are transmitted by using signals SIGP and SIGN. Moreover, in this operation mode MB, the signals DI20, SI21, DI22, DI23, DI24, DI25, DI26, and DI27 are used to perform an emphasis operation. As described below, data indicated by these signals DI20 to DI27 is set to be shifted by one bit from data indicated by the signals DI10 to DI17.

FIG. 3 illustrates a configuration example of the serializer 21A. It is to be noted that the same applies to the serializers 21B, 21C, and 21D. The serializer 21A is a so-called selector type serializer. The serializer 21A includes transistors M1 to M12. The transistors M1 to M10 are N-channel MOS (metal oxide semiconductor) type FETs (field effect transistors), and the transistors M11 and M12 are P-channel MOS type FETs. The signal DI10 includes signals DI10P and DI10N that are inverted from each other; the signal DI12 includes signals DI12P and DI12N that are inverted from each other; the signal DI14 includes signals DI14P and DI14N that are inverted from each other; the signal DI16 includes signals DI16P and DI16N that are inverted from each other.

A source of the transistor M1 is supplied with the signal DI10P, and a gate is supplied with the clock signal P0, and a drain is coupled to drains of the transistors M3, M5, and M7 and a source of the transistor M9. A source of the transistor M2 is supplied with the signal DI10N, and a gate is supplied with the clock signal P0, and a drain is coupled to drains of the transistors M4, M6, and M8 and a source of the transistor M10. A source of the transistor M3 is supplied with the signal DI12P, and a gate is supplied with the clock signal P2, and the drain is coupled to the drains of the transistors M1, M5, and M7 and the source of the transistor M9. A source of the transistor M4 is supplied with the signal DI12N, and a gate is supplied with the clock signal P2, and the drain is coupled to the drains of the transistors M2, M6, and M8 and the source of the transistor M10. A source of the transistor M5 is supplied with the signal DI14P, and a gate is supplied with the clock signal P4, and the drain is coupled to the drains of the transistors M1, M3, and M7 and the source of the transistor M9. A source of the transistor M6 is supplied with the signal DI14N, and a gate is supplied with the clock signal P4, and the drain is coupled to the drains of the transistors M2, M4, and M8 and the source of the transistor M10. A source of the transistor M7 is supplied with the signal DI16P, and a gate is supplied with the clock signal P6, and the drain is coupled to the drains of the transistors M1, M3, and M5 and the source of the transistor M9. A source of the transistor M8 is supplied with the signal DI16N, and a gate is supplied with the clock signal P6, and the drain is coupled to the drains of the transistors M2, M4, and M6 and the source of the transistor M10. The source of the transistor M9 is coupled to the drains of the transistors M1, M3, M5, and M7, and a gate is supplied with a power supply voltage VDD, and a drain is coupled to a drain of the transistor M11 and a gate of the transistor M12. The source of the transistor M10 is coupled to the drains of the transistors M2, M4, M6, and M8, and a gate is supplied with the power supply voltage VDD, and a drain is coupled to a drain of the transistor M12 and a gate of the transistor M11. A source of the transistor M11 is supplied with the power supply voltage VDD, and the gate is coupled to the drains of the transistors M10 and M12, and the drain is coupled to the drain of the transistor M9 and the gate of the transistor M12. A source of the transistor M12 is supplied with the power supply voltage VDD, and the gate is coupled to the drains of the transistors M9 and M11, and the drain is coupled to the drain of the transistor M10 and the gate of the transistor M11. The serializer 21A outputs the signal S21AP from the drains of the transistors M9 and M11, and outputs the signal S21AN from the drains of the transistors M10 and M12.

In FIG. 4, (A) to (I) illustrate an operation example of the serializer 21A; (A) to (D) illustrate respective waveforms of the signals DI10, DI12, DI14, and DI16, and (E) to (H) illustrate respective waveforms of the clock signals P0, P2, P4, and P6, and (I) illustrates waveforms of the signals S21AP and S21AN. In FIG. 4, (J) to (R) illustrate an operation example of the serializer 21C; (J) to (M) illustrate respective waveforms of the signals DI11, DI13, DI15, and DI17, (N) to (Q) illustrate respective waveforms of the clock signals P1, P3, P5, and P7, and (R) illustrates waveforms of the signals S21CP and S21CN.

In this example, at timing t11, the signal DI10 is set to data "D0($n$)", and the signal DI12 is set to data "D2($n$)" ((A) and (B) in FIG. 4). Furthermore, at timing t12, the signal DI11 is set to data "D1($n$)", and the signal DI13 is set to data "D3($n$)" ((J) and (K) in FIG. 4). At timing t15, the signal DI14 is set to data "D4($n$)", and the signal DI16 is set to data "D6($n$)" ((C) and (D) in FIG. 4). At timing t16, the signal DI15 is set to data "D5($n$)", and the signal DI17 is set to data "D7($n$)" ((L) and (M) in FIG. 4).

The clock signal P0 makes a transition from low level to high level at timing t13, and makes a transition from high level to low level at timing t15 ((E) in FIG. 4). Accordingly, in a period from timing t13 to timing t15, the serializer 21A selects the signal DI10 (the data "D2($n$)") and outputs it as signals S21AP and S21AN ((I) in FIG. 4). The clock signal P2 makes a transition from low level to high level at timing t15, and makes a transition from high level to low level at timing t17 ((F) in FIG. 4). Accordingly, in a period from timing t15 to timing t17, the serializer 21A selects the signal DI12 (the data "D2($n$)") and outputs it as signals S21AP and S21AN ((I) in FIG. 4). The clock signal P4 makes a transition from low level to high level at timing t17, and makes a transition from high level to low level at timing t19 ((G) in FIG. 4). Accordingly, in a period from timing t17 to timing t19, the serializer 21A selects the signal DI14 (the data "D4($n$)") and outputs it as signals S21AP and S21AN ((I) in FIG. 4). The clock signal P6 makes a transition from low level to high level at timing t19, and makes a transition from high level to low level at timing t21 ((H) in FIG. 4). Accordingly, in a period from timing t19 to timing t21, the serializer 21A selects the signal DI16 (the data "D6($n$)") and outputs it as signals S21AP and S21AN ((I) in FIG. 4).

The clock signal P1 makes a transition from low level to high level at timing t14, and makes a transition from high level to low level at timing t16 ((N) in FIG. 4). Accordingly, in a period from timing t14 to timing t16, the serializer 21C selects the signal DI11 (the data "D1($n$)") and outputs it as the signals S21CP and S21CN ((R) in FIG. 4). The clock signal P3 makes a transition from low level to high level at timing t16, and makes a transition from high level to low level at timing t18 ((O) in FIG. 4). Accordingly, in a period from timing t16 to timing t18, the serializer 21C selects the signal DI13 (the data "D3($n$)") and outputs it as the signals S21CP and S21CN ((R) in FIG. 4). The clock signal P5 makes a transition from low level to high level at timing t18, and makes a transition from high level to low level at timing t20 ((P) in FIG. 4). Accordingly, in a period from timing t18 to timing t20, the serializer 21C selects the signal DI15 (the data "D5($n$)") and outputs it as the signals S21CP and S21CN ((R) in FIG. 4). The clock signal P7 makes a transition from low level to high level at timing t20, and makes a transition from high level to low level at timing t22 ((Q) in FIG. 4). Accordingly, in a period from timing t20 to timing t22, the serializer 21C selects the signal DI17 (the data "D7($n$)") and outputs it as the signals S21CP and S21CN ((R) in FIG. 4).

In this way, the serializer 21A serializes the signals DI10, DI12, DI14, and DI16, thereby outputting the data "D0($n$)", "D2($n$)", "D4($n$)", and "D6($n$)" in this order ((I) in FIG. 4), and the serializer 21C serializes the signals DI11, DI13, DI15, and DI17, thereby outputting the data "D1($n$)", "D3($n$)", "D5($n$)", and "D7($n$)" in this order ((R) in FIG. 4). Likewise, the serializer 21B serializes the signals DI20, DI22, DI24, and DI26, and the serializer 21D serializes the signals DI21, DI23, DI25, and DI27.

In the operation mode MB (differential mode), because of an emphasis operation, data indicated by the signals DI20 to DI27 is set to be shifted by one bit from data indicated by the signals DI10 to DI17 as described below.

In FIG. 5, (A) to (I) illustrate an operation example of the serializer 21B in the operation mode MB; (J) to (R) in FIG. 5 illustrate an operation example of the serializer 21D in the operation mode MB.

In this example, at timing t11, the signal DI20 is set to data "D7($n-1$)", and the signal DI22 is set to data "D1($n$)" ((A) and (B) in FIG. 5). The data "D7($n-1$)" here is included in data "D0($n-1$)" to "D7($n-1$)" that is one before data "D0($n$)" to "D7($n$)". Furthermore, at timing t12, the signal DI21 is set to data "D0($n$)", and the signal DI23 is set to data "D2($n$)" ((J) and (K) in FIG. 5). At timing t15, the signal DI24 is set to data "D3($n$)", and the signal DI26 is set to data "D5($n$)" ((C) and (D) in FIG. 5). At timing t16, the signal DI25 is set to data "D4($n$)", and the signal DI27 is set to data "D6($n$)" ((L) and (M) in FIG. 5).

Accordingly, the serializer 21B serializes the signals DI20, DI22, DI24, and DI26, thereby outputting the data "D7($n-1$)", "D1($n$)", "D3($n$)", and "D5($n$)" in this order ((I) in FIG. 5), and the serializer 21D serializes the signals DI21, DI23, DI25, and DI27, thereby outputting the data "D0($n$)", "D2($n$)", "D4($n$)", and "D6($n$)" in this order ((R) in FIG. 5).

The multiplexer 22A (FIG. 2) alternately selects one of the signals S21AP and S21CP on the basis of a clock signal CLK, and outputs the selected signal as a signal S22A. The multiplexer 22B alternately selects one of the signals S21AN and S21CN on the basis of a clock signal CLK, and outputs the selected signal as a signal S22B. The multiplexer 22C alternately selects one of the signals S21BP and S21DP on the basis of a clock signal CLK, and outputs the selected signal as a signal S22C. The multiplexer 22D alternately selects one of the signals S21BN and S21DN on the basis of a clock signal CLK, and outputs the selected signal as a signal S22D.

FIG. 6 illustrates an operation example of the multiplexer 22A; (A) illustrates a waveform of the signal S21AP, (B) illustrates a waveform of the signal S21CP, (C) illustrates a waveform of the clock signal CLK, and (D) illustrates a waveform of the signal S22A.

The signal S21AP is set to data "D0($n$)" in a period from timing t13 to timing t15, and is set to data "D2($n$)" in a period from timing t15 to timing t17, and is set to data "D4($n$)" in a period from timing t17 to timing t19, and then is set to data "D6($n$)" in a period from timing t19 to timing t21 ((A) in FIG. 6). Furthermore, the signal S21CP is set to data "D1($n$)" in a period from timing t14 to timing t16, and is set to data "D3($n$)" in a period from timing t16 to timing t18, and is set to data "D5($n$)" in a period from timing t18 to timing t20, and then is set to data "D7($n$)" in a period from timing t20 to timing t22 ((B) in FIG. 6).

The multiplexer 22A selects the signal S21AP in a period in which the clock signal CLK is high level, and selects the signal S21CP in a period in which the clock signal CLK is low level. Specifically, the multiplexer 22A selects the signal S21AP (the data "D0($n$)") in a period from timing t31 to timing t32, and selects the signal S21CP (the data "D1($n$)") in a period from timing t32 to timing t33, and selects the signal S21AP (the data "D2(n)") in a period from timing t33 to timing t34, and selects the signal S21CP (the data "D3(n)") in a period from timing t34 to timing t35, and selects the signal S21AP (the data "D4(n)") in a period from timing t35 to timing t36, and selects the signal S21CP (the data "D5(n)") in a period from timing t36 to timing t37, and selects the signal S21AP (the data "D6(n)") in a period from timing t37 to timing t38, and then selects the signal S21CP (the data "D7(n)") in a period from timing t38 to timing t39. Accordingly, the multiplexer 22A outputs the data "D0(n)", "D1(n)", "D2(n)", "D3(n)", "D4(n)", "D5(n)", "D6(n)", and "D7(n)" in this order as illustrated in (D) in FIG. 6.

In this way, the multiplexer 22A selects the signal S21AP in a period in which the clock signal CLK is high level, and selects the signal S21CP in a period in which the clock signal CLK is low level. Furthermore, the multiplexer 22B selects the signal S21AN in a period in which the clock signal CLK is high level, and selects the signal S21CN in a period in which the clock signal CLK is low level. As described above, the signals S21AP and S21AN are signals that are inverted from each other, and the signals S21CP and S21CN are signals that are inverted from each other, and therefore, the output signal S22A of the multiplexer 22A and the output signal S22B of the multiplexer 22B are signals that are inverted from each other.

Likewise, the multiplexer 22C selects the signal S21BP in a period in which the clock signal CLK is high level, and selects the signal S21DP in a period in which the clock signal CLK is low level. Furthermore, the multiplexer 22D selects the signal S21BN in a period in which the clock signal CLK is high level, and selects the signal S21DN in a period in which the clock signal CLK is low level. As described above, the signals S21BP and S21BN are signals that are inverted from each other, and the signals S21DP and S21DN are signals that are inverted from each other, and therefore, the output signal S22C of the multiplexer 22C and the output signal S22D of the multiplexer 22D are signals that are inverted from each other.

FIG. 7 illustrates an operation example of the multiplexers 22A and 22C in the operation mode MB; (A) illustrates a waveform of the signal S21AP, (B) illustrates a waveform of the signal S21CP, (C) illustrates a waveform of the signal S21BP, (D) illustrates a waveform of the signal S21DP, (E) illustrates a waveform of the clock signal CLK, (F) illustrates a waveform of the signal S22A, and (G) illustrates a waveform of the signal S22C. The operation of the multiplexer 22A is the same as in the case of FIG. 6.

The signal S21BP is set to data "D7(n−1)" in a period from timing t13 to timing t15, and is set to data "D1(n)" in a period from timing t15 to timing t17, and is set to data "D3(n)" in a period from timing t17 to timing t19, and then is set to data "D5(n)" in a period from timing t19 to timing t21 ((C) in FIG. 7). Furthermore, the signal S21DP is set to data "D0(n)" in a period from timing t14 to timing t16, and is set to data "D2(n)" in a period from timing t16 to timing t18, and is set to data "D4(n)" in a period from timing t18 to timing t20, and then is set to data "D6(n)" in a period from timing t20 to timing t22 ((D) in FIG. 7).

The multiplexer 22C selects the signal S21BP in a period in which the clock signal CLK is high level, and selects the signal S21DP in a period in which the clock signal CLK is low level. Accordingly, the multiplexer 22C outputs the data "D7(n−1)", "D0(n)", "D1(n)", "D2(n)", "D3(n)", "D4(n)", "D5(n)", and "D6(n)" in this order as illustrated in (G) in FIG. 7.

On the basis of a signal Ssel, the selector 23A (FIG. 2) selects the signal S22A in a case where the operation mode is the operation mode MA (single-phase mode) or the signal S22D in a case where the operation mode is the operation mode MB (differential mode), and outputs the selected signal as a signal S23A. On the basis of a signal Ssel, the selector 23B selects the signal S22B in a case where the operation mode is the operation mode MA or the signal S22C in a case where the operation mode is the operation mode MB, and outputs the selected signal as a signal S23B. On the basis of a signal Ssel, the selector 23C selects the signal S22C in a case where the operation mode is the operation mode MA or the signal S22B in a case where the operation mode is the operation mode MB, and outputs the selected signal as a signal S23C. On the basis of a signal Ssel, the selector 23D selects the signal S22D in a case where the operation mode is the operation mode MA or the signal S22A in a case where the operation mode is the operation mode MB, and outputs the selected signal as a signal S23D.

The driver 24A sets a voltage at the output terminal Tout1 on the basis of the signals S22A, S22B, S23A, and S23B and a signal CTL. The driver 24B sets a voltage at the output terminal Tout2 on the basis of the signals S23C, S23D, S22C, and S22D and a signal CTL.

FIG. 8 illustrates a configuration example of the drivers 24A and 24B. It is to be noted that the selectors 23A to 23D are also depicted in this FIG. 8. The driver 24A includes M sub-drivers AA (sub-drivers AA1 to AAM) and N sub-drivers AB (sub-drivers AB1 to ABN). The driver 24B includes M sub-drivers BA (sub-drivers BA1 to BAM) and N sub-drivers BB (sub-drivers BB1 to BBN). The numbers "M" and "N" are configured to be able to be changed by the signal CTL.

The sub-drivers AA1 to AAM, AB1 to ABN, BA1 to BAM, and BB1 to BBN each include resistance elements 91 and 94 and transistors 92 and 93. The transistors 92 and 93 are N-channel MOS type FETs. It is to be noted that in FIG. 2, these transistors 92 and 93 are depicted in the drivers 24A and 24B. Furthermore, in FIG. 2, an illustration of the resistance elements 91 and 94 is omitted.

In the following, the driver 24A is described as an example. In each of the sub-drivers AA1 to AAM of the driver 24A, one end of the resistance element 91 is supplied with a voltage V1, and the other end is coupled to a drain of the transistor 92. A gate of the transistor 92 is supplied with the signal S22A, and the drain is coupled to the other end of the resistance element 91, and a source is coupled to a drain of the transistor 93 and the output terminal Tout1. A gate of the transistor 93 is supplied with the signal S22B, and the drain is coupled to the source of the transistor 92 and the output terminal Tout1, and a source is coupled to one end of the resistance element 94. The one end of the resistance element 94 is coupled to the source of the transistor 93, and the other end is grounded.

In each of the sub-drivers AB1 to ABN of the driver 24A, one end of the resistance element 91 is supplied with the voltage V1, and the other end is coupled to the drain of the transistor 92. The gate of the transistor 92 is supplied with the signal S23A, and the drain is coupled to the other end of the resistance element 91, and the source is coupled to the drain of the transistor 93 and the output terminal Tout1. The gate of the transistor 93 is supplied with the signal S23B, and the drain is coupled to the source of the transistor 92 and the output terminal Tout1, and the source is coupled to one end of the resistance element 94. The one end of the resistance element 94 is coupled to the source of the transistor 93, and the other end is grounded.

In each of the sub-drivers AA1 to AAM and AB1 to ABN of the driver 24A, the sum of a resistance value of the resistance element 91 and an on-state resistance value of the transistor 92 is "50×(M+N)" [Ω] in this example. Likewise, the sum of an on-state resistance value of the transistor 93 and a resistance value of the resistance element 94 is "50×(M+N)" [Ω] in this example.

The driver 24A is described above as an example; however, the same applies to the driver 24B. In each of the sub-drivers BA1 to BAM of the driver 24B, the gate of the transistor 92 is supplied with the signal S23C, and the drain is coupled to the other end of the resistance element 91, and the source is coupled to the drain of the transistor 93 and the output terminal Tout2. The gate of the transistor 93 is supplied with the signal S23D, and the drain is coupled to the source of the transistor 92 and the output terminal Tout2, and the source is coupled to one end of the resistance element 94. Furthermore, in each of the sub-drivers BB1 to BBN, the gate of the transistor 92 is supplied with the signal S22C, and the drain is coupled to the other end of the resistance element 91, and the source is coupled to the drain of the transistor 93 and the output terminal Tout2. The gate of the transistor 93 is supplied with the signal S22D, and the drain is coupled to the source of the transistor 92 and the output terminal Tout2, and the source is coupled to one end of the resistance element 94.

With this configuration, for example, in a case where in the operation mode MA (single-phase mode), the signal S22A is set to high level, and the signal S22B is set to low level, the signal S23A becomes high level, and the signal S23B becomes low level. Therefore, the transistors 92 in the sub-drivers AA1 to AAM and AB1 to ABN of the driver 24A go into on state, and the transistors 93 in the sub-drivers AA1 to AAM and AB1 to ABN go into off state. As a result, the driver 24A is able to set the voltage at the output terminal Tout1 to a high-level voltage VH and the output impedance to about 50[Ω].

Furthermore, for example, in a case where in the operation mode MA, the signal S22B is set to high level, and the signal S22A is set to low level, the signal S23B becomes high level, and the signal S23A becomes low level. Therefore, the transistors 93 in the sub-drivers AA1 to AAM and AB1 to ABN of the driver 24A go into on state, and the transistors 92 in the sub-drivers AA1 to AAM and AB1 to ABN go into off state. As a result, the driver 24A is able to set the voltage at the output terminal Tout1 to a low-level voltage VL and the output impedance to about 50[Ω].

Moreover, for example, in a case where in the operation mode MB (differential mode), the signals S22A and S22D are both set to high level, and the signals S22B and S22C are both set to low level, the signals S23A and S23D both become high level, and the signals S23B and S23C both become low level. Therefore, in the driver 24A, the transistors 92 in the sub-drivers AA1 to AAM and AB1 to ABN go into on state, and the transistors 93 in the sub-drivers AA1 to AAM and AB1 to ABN go into off state. As a result, the driver 24A is able to set the voltage at the output terminal Tout1 to the high-level voltage VH and the output impedance to about 50[Ω]. Likewise, in the driver 24B, the transistors 93 in the sub-drivers BA1 to BAM and BB1 to BBN go into on state, and the transistors 92 in the sub-drivers BA1 to BAM and BB1 to BBN go into off state. As a result, the driver 24B is able to set the voltage at the output terminal Tout2 to the low-level voltage VL and the output impedance to about 50[Ω].

Furthermore, for example, in a case where in the operation mode MB, the signals S22B and S22C are both set to high level, and the signals S22A and S22D are both set to low level, the signals S23B and S23C both become high level, and the signals S23A and S23D both become low level. Therefore, in the driver 24A, the transistors 93 in the sub-drivers AA1 to AAM and AB1 to ABN go into on state, and the transistors 92 in the sub-drivers AA1 to AAM and AB1 to ABN go into off state. As a result, the driver 24A is able to set the voltage at the output terminal Tout1 to the low-level voltage VL and the output impedance to about 50[Ω]. Likewise, in the driver 24B, the transistors 92 in the sub-drivers BA1 to BAM and BB1 to BBN go into on state, and the transistors 93 in the sub-drivers BA1 to BAM and BB1 to BBN go into off state. As a result, the driver 24B is able to set the voltage at the output terminal Tout2 to the high-level voltage VH and the output impedance to about 50[Ω].

Moreover, for example, in a case where in the operation mode MB, the signals S22A and S22C are both set to high level, and the signals S22B and S22D are both set to low level, the signals S23B and S23D both become high level, and the signals S23A and S23C both become low level. Therefore, in the driver 24A, the transistors 92 in the sub-drivers AA1 to AAM and the transistors 93 in the sub-drivers AB1 to ABN go into on state, and the transistors 93 in the sub-drivers AA1 to AAM and the transistors 92 in the sub-drivers AB1 to ABN go into off state. As a result, the driver 24A is able to set the voltage at the output terminal Tout1 to a voltage (VH−ΔV), which is lower by a voltage ΔV than the high-level voltage VH, and the output impedance to about 50[Ω]. Likewise, in the driver 24B, the transistors 93 in the sub-drivers BA1 to BAM and the transistors 92 in the sub-drivers BB1 to BBN go into on state, and the transistors 92 in the sub-drivers BA1 to BAM and the transistors 93 in the sub-drivers BB1 to BBN go into off state. As a result, the driver 24B is able to set the voltage at the output terminal Tout2 to a voltage (VL+ΔV), which is higher by the voltage ΔV than the low-level voltage VL, and the output impedance to about 50[Ω].

Furthermore, for example, in a case where in the operation mode MB, the signals S22B and S22D are both set to high level, and the signals S22A and S22C are both set to low level, the signals S23A and S23C both become high level, and the signals S23B and S23D both become low level. Therefore, in the driver 24A, the transistors 93 in the sub-drivers AA1 to AAM and the transistors 92 in the sub-drivers AB1 to ABN go into on state, and the transistors 92 in the sub-drivers AA1 to AAM and the transistors 93 in the sub-drivers AB1 to ABN go into off state. As a result, the driver 24A is able to set the voltage at the output terminal Tout1 to the voltage (VL+ΔV), which is higher by the voltage ΔV than the low-level voltage VL, and the output impedance to about 50[Ω]. Likewise, in the driver 24B, the transistors 92 in the sub-drivers BA1 to BAM and the transistors 93 in the sub-drivers BB1 to BBN go into on state, and the transistors 93 in the sub-drivers BA1 to BAM and the transistors 92 in the sub-drivers BB1 to BBN go into off state. As a result, the driver 24B is able to set the voltage at the output terminal Tout2 to the voltage (VH−ΔV), which is lower by the voltage ΔV than the high-level voltage VH, and the output impedance to about 50[Ω].

This voltage ΔV varies depending on "M" and "N". That is, for example, increasing "M" and reducing "N" make it possible to reduce the voltage ΔV. Furthermore, for example, reducing "M" and increasing "N" make it possible to increase the voltage ΔV.

The controller 25 (FIG. 2) generates clock signals P0 to P7 and CLK and signals Ssel and CTL on the basis of a mode signal Smode supplied from the processor 11.

(Receiving Device 30)

The receiving device 30 includes receivers 31 and 32 and a processor 33 as illustrated in FIG. 1A.

The receiver 31 receives a signal SIG1, and the receiver 32 receives a signal SIG2.

FIG. 9 illustrates a configuration example of the receiver 31. It is to be noted that the same applies to the receiver 32. The receiver 31 includes a resistance element 36 and an amplifier 37.

The resistance element 36 serves as a receiving-side terminating resistance in the communication system 1A. One end of the resistance element 36 is supplied with a bias voltage Vbias, and the other end is coupled to the input terminal Tin1 of the receiver 31 and an input terminal of the amplifier 37. A resistance value of this resistance element 36 is about 50[Ω] in this example.

The input terminal of the amplifier 37 is coupled to the input terminal Tin1 of the receiver 31 and the other end of the resistance element 36. Further, the amplifier 37 supplies its output signal to the processor 33.

The processor 33 performs a predetermined process on the basis of received results of the receivers 31 and 32.

(Receiving Device 40)

The receiving device 40 includes a receiver 41 and a processor 42 as illustrated in FIG. 1B.

The receiver 41 receives signals SIGP and SIGN.

FIG. 10 illustrates a configuration example of the receiver 41. The receiver 41 includes a resistance element 46 and an amplifier 47.

The resistance element 46 serves as a receiving-side terminating resistance in the communication system 1B. One end of the resistance element 46 is coupled to the input terminal TinP of the receiver 41 and a positive input terminal of the amplifier 47, and the other end is coupled to the input terminal TinN of the receiver 41 and a negative input terminal of the amplifier 47. A resistance value of this resistance element 46 is about 100[Ω] in this example.

The positive input terminal of the amplifier 47 is coupled to the input terminal TinP of the receiver 41 and one end of the resistance element 46, and the negative input terminal of the amplifier 47 is coupled to the input terminal TinN of the receiver 41 and the other end of the resistance element 46. Further, the amplifier 47 supplies its output signal to the processor 42.

The processor 42 performs a predetermined process on the basis of a received result of the receiver 41.

Here, the driver 24A corresponds to a specific example of a "first driver" in the present disclosure. The plurality of sub-drivers AA1 to AAM correspond to a specific example of a "first sub-driver unit" in the present disclosure, and the plurality of sub-drivers AB1 to ABN correspond to a specific example of a "second sub-driver unit" in the present disclosure. The driver 24B corresponds to a specific example of a "second driver" in the present disclosure. The plurality of sub-drivers BA1 to BAM correspond to a specific example of a "third sub-driver unit" in the present disclosure, and the plurality of sub-drivers BB1 to BBN correspond to a specific example of a "fourth sub-driver unit" in the present disclosure. The plurality of selectors 23A to 23D correspond to a specific example of a "selector unit" in the present disclosure. The plurality of multiplexers 22A to 22D correspond to a specific example of a "multiplexer unit" in the present disclosure. The plurality of serializers 21A to 21D correspond to a specific example of a "serializer unit" in the present disclosure. The operation mode MA corresponds to a specific example of a "first operation mode" in the present disclosure, and the operation mode MB corresponds to a specific example of a "second operation mode" in the present disclosure.

[Operation and Working]

Subsequently, the operation and working of each of the communication systems 1A and 1B in the present embodiment are described.

(Outline of Overall Operation)

First, an outline of the overall operation of each of the communication systems 1A and 1B is described with reference to FIGS. 1A and 1B. The processor 11 of the transmitting device 10 generates data to be transmitted by performing a predetermined process, and selects one of the two operation modes MA and MB and generates a mode signal Smode on the basis of the selected operation mode. Specifically, in a case where the transmitting device 10 is applied to the communication system 1A, the processor 11 selects the operation mode MA (single-phase mode), and instructs the transmitter 12 to perform the operation in the operation mode MA by using a mode signal Smode. Furthermore, in a case where the transmitting device 10 is applied to the communication system 1B, the transmitter 12 selects the operation mode MB (differential mode), and instructs the transmitter 12 to perform the operation in the operation mode MB by using a mode signal Smode. In a case where the operation mode indicated by the mode signal Smode is the operation mode MA, the transmitter 12 transmits the data generated by the processor 11 by using signals SIG1 and SIG2. Furthermore, in a case where the operation mode indicated by the mode signal Smode is the operation mode MB, the transmitter 12 transmits the data generated by the processor 11 by using signals SIGP and SIGN.

In the communication system 1A, the receiver 31 of the receiving device 30 receives a signal SIG1, and the receiver 32 receives a signal SIG2. The processor 33 performs a predetermined process on the basis of received results of the receivers 31 and 32.

In the communication system 1B, the receiver 41 of the receiving device 40 receives signals SIGP and SIGN. The processor 42 performs a predetermined process on the basis of a received result of the receiver 41.

(Operation Mode MA)

In a case where the transmitting device 10 is applied to the communication system 1A (FIG. 1A), the transmitting device 10 operates in the operation mode MA (single-phase mode). In the operation mode MA, the transmitting device 10 transmits data to the receiving device 30 by using signals SIG1 and SIG2. Detailed operation in the operation mode MA is described below.

FIG. 11 illustrates the flow of signals in the operation mode MA. In FIG. 11, bold solid lines indicate the flow of signals related to signals DI10 to DI17, and bold dashed lines indicate the flow of signals related to signals DI20 to DI27. The transmitter 12 generates a signal SIG1 on the basis of the signals DI10 to DI17, and generates a signal SIG2 on the basis of the signals DI20 to DI27. This operation is described in detail below.

First, the flow of signals related to signals DI10 to DI17 is described. The processor 11 generates signals DI10 to DI17. Here, for example, the signal DI10 includes signals DI10P and DI10N. Further, the processor 11 supplies, of the signals DI10 to DI17, the signals DI10, DI12, DI14, and DI16 to the serializer 21A and the signals DI11, DI13, DI15, and DI17 to the serializer 21C.

As illustrated in (A) to (I) of FIG. 4, the serializer 21A serializes the signals DI10, DI12, DI14, and DI16, thereby generating signals S21AP and S21AN. Furthermore, as illustrated in (J) to (R) of FIG. 4, the serializer 21C serializes the signals DI11, DI13, DI15, and DI17, thereby generating signals S21CP and S21CN.

As illustrated in FIG. 6, the multiplexer 22A alternately selects one of the signals S21AP and S21CP on the basis of a clock signal CLK, and outputs the selected signal as a signal S22A. Likewise, the multiplexer 22B alternately selects one of the signals S21AN and S21CN on the basis of a clock signal CLK, and outputs the selected signal as a signal S22B.

In the operation mode MA, the selector 23A selects the signal S22A on the basis of a signal Ssel, and outputs the signal S22A as a signal S23A. In the operation mode MA, the selector 23B selects the signal S22B on the basis of a signal Ssel, and outputs the signal S22B as a signal S23B. As a result, the driver 24A operates on the basis of the signals S22A and S22B. Specifically, the sub-drivers AA1 to AAM of the driver 24A operate on the basis of the signals S22A and S22B, and the sub-drivers AB1 to ABN of the driver 24A operate on the basis of the signals S22A and S22B. Then, the driver 24A generates a signal SIG1.

Next, the flow of signals related to signals DI20 to DI27 is described. The processor 11 generates signals DI20 to DI27. Here, for example, the signal DI20 includes signals DI20P and DI20N. Further, the processor 11 supplies, of the signals DI20 to DI27, the signals DI20, DI22, DI24, and DI26 to the serializer 21B and the signals DI21, DI23, DI25, and DI27 to the serializer 21D.

As with the case of the serializer 21A ((A) to (I) of FIG. 4), the serializer 21B serializes the signals DI20, DI22, DI24, and DI26, thereby generating signals S21BP and S21BN. Furthermore, as with the case of the serializer 21C ((J) to (R) of FIG. 4), the serializer 21D serializes the signals DI21, DI23, DI25, and DI27, thereby generating signals S21DP and S21DN.

As with the case of the multiplexer 22A (FIG. 6), the multiplexer 22C selects one of the signals S21BP and S21DP on the basis of a clock signal CLK, and outputs the selected signal as a signal S22C. Likewise, the multiplexer 22D selects one of the signals S21BN and S21DN on the basis of a clock signal CLK, and outputs the selected signal as a signal S22D.

In the operation mode MA, the selector 23C selects the signal S22C on the basis of a signal Ssel, and outputs the signal S22C as a signal S23C. In the operation mode MA, the selector 23D selects the signal S22D on the basis of a signal Ssel, and outputs the signal S22D as a signal S23D. As a result, the driver 24B operates on the basis of the signals S22C and S22D. Specifically, the sub-drivers BA1 to BAM of the driver 24B operate on the basis of the signals S22C and S22D, and the sub-drivers BB1 to BBN of the driver 24B operate on the basis of the signals S22C and S22D. Then, the driver 24B generates a signal SIG2.

In this way, in the operation mode MA, the driver 24A generates the signal SIG1 on the basis of the signals S22A and S22B, and the driver 24B generates the signal SIG2 on the basis of the signals S23C and S23D.

FIG. 12 illustrates an operation to generate the signal SIG1. In FIG. 12, a bold solid line indicates the flow of a signal related to the multiplexer 22A, and a bold dashed line indicates the flow of a signal related to the multiplexer 22B. It is to be noted that the same applies to an operation to generate the signal SIG2.

The output signals S21AP and S21AN of the serializer 21A are signals that are inverted from each other, and the output signals S21CP and S21CN of the serializer 21C are signals that are inverted from each other. Therefore, the output signal S22A of the multiplexer 22A and the output signal S22B of the multiplexer 22B are signals that are inverted from each other.

For example, in a case where the signal S22A is high level, and the signal S22B is low level, the signal S23A becomes high level, and the signal S23B becomes low level. In this case, in the driver 24A, the transistors 92 in the sub-drivers AA1 to AAM and AB1 to ABN go into on state, and the transistors 93 in the sub-drivers AA1 to AAM and AB1 to ABN go into off state. As a result, the driver 24A sets the voltage at the output terminal Tout1 to the high-level voltage VH and the output impedance to about 50[Ω].

Furthermore, for example, in a case where the signal S22B is high level, and the signal S22A is low level, the signal S23B becomes high level, and the signal S23A becomes low level. In this case, in the driver 24A, the transistors 93 in the sub-drivers AA1 to AAM and AB1 to ABN go into on state, and the transistors 92 in the sub-drivers AA1 to AAM and AB1 to ABN go into off state. Therefore, the driver 24A sets the voltage at the output terminal Tout1 to the low-level voltage VL and the output impedance to about 50[Ω].

In this way, in the operation mode MA, the transmitting device 10 transmits data to the receiving device 30 by using a single-phase signal.

(Operation Mode MB)

In a case where the transmitting device 10 is applied to the communication system 1B (FIG. 1B), the transmitting device 10 operates in the operation mode MB (differential mode). In the operation mode MB, the transmitting device 10 transmits data to the receiving device 40 by using signals SIGP and SIGN. Detailed operation in the operation mode MB is described below.

FIG. 13 illustrates the flow of signals in the operation mode MB. In FIG. 13, bold solid lines indicate the flow of signals related to signals DI10 to DI17, and bold dashed lines indicate the flow of signals related to signals DI20 to DI27. The transmitter 12 generates signals SIGP and SIGN on the basis of the signals DI10 to DI17 and DI20 to DI27. At this time, the transmitter 12 performs an emphasis operation on the basis of the signals DI20 to DI27. This operation is described in detail below.

First, the flow of signals related to signals DI10 to DI17 is described. The processor 11 generates signals DI10 to DI17, and supplies, of the signals DI10 to DI17, the signals DI10, DI12, DI14, and DI16 to the serializer 21A and the signals DI11, DI13, DI15, and DI17 to the serializer 21C. The serializers 21A and 21C and the multiplexers 22A and 22B operate as with the case of the operation mode MA.

In the operation mode MB, the selector 23C selects a signal S22B on the basis of a signal Ssel, and outputs the signal S22B as a signal S23C. In the operation mode MB, the selector 23D selects a signal S22A on the basis of a signal Ssel, and outputs the signal S22A as a signal S23D. As a result, the sub-drivers AA1 to AAM of the driver 24A operate on the basis of the signals S22A and S22B, and the sub-drivers BA1 to BAM of the driver 24B operate on the basis of the signals S22B and S22A.

Next, the flow of signals related to signals DI20 to DI27 is described. The processor 11 generates signals DI20 to DI27. In the operation mode MB, data indicated by these signals DI20 to DI27 is set to be shifted by one bit from data indicated by the signals DI10 to DI17. Further, the processor 11 supplies, of the signals DI20 to DI27, the signals DI20, DI22, DI24, and DI26 to the serializer 21B and the signals DI21, DI23, DI25, and DI27 to the serializer 21D. The serializers 21B and 21D and the multiplexers 22C and 22D operate as with the case of the operation mode MA.

In the operation mode MB, the selector 23A selects a signal S22D on the basis of a signal Ssel, and outputs the signal S22D as a signal S23A. In the operation mode MB, the selector 23B selects a signal S22C on the basis of a signal Ssel, and outputs the signal S22C as a signal S23B. As a result, the sub-drivers AB1 to ABN of the driver 24A operate on the basis of the signals S22D and S22C, and the sub-drivers BB1 to BBN of the driver 24B operate on the basis of the signals S22C and S22D.

In this way, the driver 24A generates the signal SIGP on the basis of the signals S22A, S22B, S22C, and S22D. Furthermore, the driver 24B generates the signal SIGN on the basis of the signals S22A, S22B, S22C, and S22D.

FIG. 14 illustrates the operation based on signals DI10 to DI17. In FIG. 14, a bold solid line indicates the flow of a signal related to the multiplexer 22A, and a bold dashed line indicates the flow of a signal related to the multiplexer 22B. Also in the operation mode MB, the output signal S22A of the multiplexer 22A and the output signal S22B of the multiplexer 22B are signals that are inverted from each other.

For example, in a case where the signal S22A is high level, and the signal S22B is low level, the signal S23D becomes high level, and the signal S23C becomes low level. In this case, in the sub-drivers AA1 to AAM of the driver 24A, the transistors 92 go into on state, and the transistors 93 go into off state; in the sub-drivers BA1 to BAM of the driver 24B, the transistors 93 go into on state, and the transistors 92 go into off state.

Furthermore, for example, in a case where the signal S22B is high level, and the signal S22A is low level, the signal S23C becomes high level, and the signal S23D becomes low level. In this case, in the sub-drivers AA1 to AAM of the driver 24A, the transistors 93 go into on state, and the transistors 92 go into off state; in the sub-drivers BA1 to BAM of the driver 24B, the transistors 92 go into on state, and the transistors 93 go into off state.

FIG. 15 illustrates the operation based on signals DI20 to DI27. In FIG. 15, a bold solid line indicates the flow of a signal related to the multiplexer 22C, and a bold dashed line indicates the flow of a signal related to the multiplexer 22D. The output signal S22C of the multiplexer 22C and the output signal S22D of the multiplexer 22D are signals that are inverted from each other.

For example, in a case where the signal S22C is high level, and the signal S22D is low level, the signal S23B becomes high level, and the signal S23A becomes low level. In this case, in the sub-drivers AB1 to ABM of the driver 24A, the transistors 93 go into on state, and the transistors 92 go into off state; in the sub-drivers BB1 to BBM of the driver 24B, the transistors 92 go into on state, and the transistors 93 go into off state.

Furthermore, for example, in a case where the signal S22D is high level, and the signal S22C is low level, the signal S23A becomes high level, and the signal S23B becomes low level. In this case, in the sub-drivers AB1 to ABM of the driver 24A, the transistors 92 go into on state, and the transistors 93 go into off state; in the sub-drivers BB1 to BBM of the driver 24B, the transistors 93 go into on state, and the transistors 92 go into off state.

In the transmitting device 10, the number "M" of sub-drivers AA is larger than the number "N" of sub-drivers AB in the driver 24A; and the number "M" of sub-drivers BA is larger than the number "N" of sub-drivers BB in the driver 24B. This makes it possible for an influence of the signals S22A and S22B on the signals SIGP and SIGN to be larger than an influence of the signals S22C and S22D on the signals SIGP and SIGN. Using this, the transmitting device 10 performs an emphasis operation as follows.

FIG. 16 illustrates an emphasis operation in the transmitter 12; (A) illustrates a waveform of the clock signal CLK, (B) illustrates a waveform of the signal S22A, (C) illustrates a waveform of the signal S22B, (D) illustrates a waveform of the signal S22C, (E) illustrates a waveform of the signal S22D, and (F) illustrates a waveform of the signal SIGP−the signal SIGN.

In this example, in a period from timing t41 to timing t42, the signals S22A and S22D are set to high level, and the signals S22B and S22C are set to low level. In this case, in the driver 24A, in the sub-drivers AA1 to AAM and AB1 to ABN, the transistors 92 go into on state, and the transistors 93 go into off state. Therefore, the driver 24A sets the voltage at the output terminal Tout1 to the high-level voltage VH and the output impedance to about 50[Ω]. Furthermore, in the driver 24B, in the sub-drivers BA1 to BAM and BB1 to BBN, the transistors 93 go into on state, and the transistors 92 go into off state. Therefore, the driver 24B sets the voltage at the output terminal Tout2 to the low-level voltage VL and the output impedance to about 50[Ω]. As a result, the signal SIGP−the signal SIGN becomes the high-level voltage VH−the low-level voltage VL (VH−VL) as illustrated in (F) of FIG. 16.

Furthermore, in a period from timing t42 to timing t44, the signals S22A and S22C are set to high level, and the signals S22B and S22D are set to low level. In this case, in the driver 24A, the transistors 92 in the sub-drivers AA1 to AAM and the transistors 93 in the sub-drivers AB1 to ABN go into on state, and the transistors 93 in the sub-drivers AA1 to AAM and the transistors 92 in the sub-drivers AB1 to ABN go into off state. Therefore, the driver 24A sets the voltage at the output terminal Tout1 to a voltage that is lower by a voltage ΔV than the high-level voltage VH, and sets the output impedance to about 50[Ω]. Furthermore, in the driver 24B, the transistors 93 in the sub-drivers BA1 to BAM and the transistors 92 in the sub-drivers BB1 to BBN go into on state, and the transistors 92 in the sub-drivers BA1 to BAM and the transistors 93 in the sub-drivers BB1 to BBN go into off state. Therefore, the driver 24B sets the voltage at the output terminal Tout2 to a voltage that is higher by the voltage ΔV than the low-level voltage VL, and sets the output impedance to about 50[Ω]. As a result, the signal SIGP−the signal SIGN becomes a voltage (VH−VL−2ΔV) that is lower by a voltage 2ΔV than the high-level voltage VH−the low-level voltage VL (VH−VL) as illustrated in (F) of FIG. 16.

Moreover, in a period from timing t44 to timing t45, the signals S22B and S22C are set to high level, and the signals S22A and S22D are set to low level. In this case, in the driver 24A, in the sub-drivers AA1 to AAM and AB1 to ABN, the transistors 93 go into on state, and the transistors 92 go into off state. Therefore, the driver 24A sets the voltage at the output terminal Tout1 to the low-level voltage VL and the output impedance to about 50[Ω]. Furthermore, in the driver 24B, in the sub-drivers BA1 to BAM and BB1 to BBN, the transistors 92 go into on state, and the transistors 93 go into off state; therefore, the driver 24B sets the voltage at the output terminal Tout2 to the high-level voltage VH and the output impedance to about 50[Ω]. As a result, the signal SIGP–the signal SIGN becomes the low-level voltage VL–the high-level voltage VH (VL−VH) as illustrated in (F) of FIG. 16.

Furthermore, the operation in a period from timing t45 to timing t46 is the same as the operation in a period from timing t41 to timing t42. As a result, the signal SIGP–the signal SIGN becomes the high-level voltage VH–the low-level voltage VL (VH−VL) as illustrated in (F) of FIG. 16.

Moreover, the operation in a period from timing t46 to timing t47 is the same as the operation in a period from timing t44 to timing t45. As a result, the signal SIGP–the signal SIGN becomes the low-level voltage VL–the high-level voltage VH (VL−VH) as illustrated in (F) of FIG. 16.

Furthermore, in a period from timing t47 to timing t49, the signals S22B and S22D are set to high level, and the signals S22A and S22C are set to low level. In this case, in the driver 24A, the transistors 93 in the sub-drivers AA1 to AAM and the transistors 92 in the sub-drivers AB1 to ABN go into on state, and the transistors 92 in the sub-drivers AA1 to AAM and the transistors 93 in the sub-drivers AB1 to ABN go into off state. Therefore, the driver 24A sets the voltage at the output terminal Tout1 to the voltage that is higher by the voltage ΔV than the low-level voltage VL, and sets the output impedance to about 50[Ω]. Furthermore, in the driver 24B, the transistors 92 in the sub-drivers BA1 to BAM and the transistors 93 in the sub-drivers BB1 to BBN go into on state, and the transistors 93 in the sub-drivers BA1 to BAM and the transistors 92 in the sub-drivers BB1 to BBN go into off state. Therefore, the driver 24B sets the voltage at the output terminal Tout2 to the voltage that is lower by the voltage ΔV than the high-level voltage VH, and sets the output impedance to about 50 [Ω]. As a result, the signal SIGP–the signal SIGN becomes a voltage (VL−VH+2ΔV) that is higher by the voltage 2ΔV than the low-level voltage VL–the high-level voltage VH (VL−VH) as illustrated in (F) of FIG. 16.

In this way, using a differential signal in the operation mode MB, the transmitting device 10 transmits data to the receiving device 40.

As described above, the transmitting device 10 is provided with the two operation modes MA and MB so as to be able to transmit data to a receiving device by using a single-phase signal or a differential signal; therefore, it is possible to implement various interfaces.

Accordingly, it is possible to increase the degree of freedom in, for example, system design of an electronic apparatus. Specifically, for example, in a case where this transmitting device 10 is installed in a processor, an electronic apparatus is able to include a peripheral device corresponding to a single-phase signal, or is able to include a peripheral device corresponding to a differential signal. Furthermore, for example, one processor makes it possible to implement various interfaces, and therefore, it is not necessary to prepare a processor for each interface. Therefore, it is possible to narrow down the number of varieties of processors and reduce the cost. Moreover, the four serializers 21, the four multiplexers 22, the four selectors 23, and the two drivers 24 are shared in the operation modes MA and MB; therefore, it is possible to suppress the area necessary for circuit layout as compared with a case where separate circuits are provided for respective interfaces.

Furthermore, in a case where the transmitting device 10 is applied to the communication system 1B, the transmitting device 10 is configured to perform an emphasis operation; therefore, in a case where the lines 111 and 112 are long, it is possible to increase the communication performance.

Subsequently, working of the present embodiment is described by comparison with some comparative examples.

(Comparative Example R)

FIG. 17 illustrates a configuration example of a main part of a transmitter 12R in a transmitting device 10R according to Comparative example R. The transmitter 12R includes serializers 21RA and 21RB, a selector 23R, multiplexers 22RA and 22RB, and drivers 24RA and 24RB. The serializer 21RA serializes signals DI10 to DI17, thereby generating signals S21RAP and S21RAN. The signals S21RAP and S21RAN are signals that are inverted from each other. The serializer 21RB serializes signals DI20 to DI27, thereby generating signals S21RBP and S21RBN. The signals S21RBP and S21RBN are signals that are inverted from each other. On the basis of a signal Ssel, the selector 23R selects the signal S21RBP in a case where the operation mode is the operation mode MA (single-phase mode), and selects the signal S21RBN in a case where the operation mode is the operation mode MB (differential mode), and then outputs the selected signal as a signal S23R. The multiplexer 22RA selects one of the signals S21RAP and S21RBP on the basis of a clock signal CLK, and outputs the selected signal. The multiplexer 22RB selects one of the signals S21RAN and S23R on the basis of a clock signal CLK, and outputs the selected signal. The driver 24RA sets a voltage at the output terminal Tout1 on the basis of the output signal of the multiplexer 22RA. The driver 24RB sets a voltage at the output terminal Tout2 on the basis of the output signal of the multiplexer 22RB.

FIG. 18 illustrates an operation example of the flow of signals in the operation mode MA (single-phase mode). In FIG. 18, a bold solid line indicates the flow of a signal related to a signal SIG1, and a bold dashed line indicates the flow of a signal related to a signal SIG2. In the operation mode MA, the selector 23R selects a signal S21RBP on the basis of a signal Ssel, and outputs the signal S21RBP as a signal S23R. In the operation mode MA, a clock signal CLK is stopped. Accordingly, the multiplexer 22RA selects a signal S21RAP, and outputs the signal S21RAP. Furthermore, the multiplexer 22RB selects the signal S23R, and outputs the signal S23R. The driver 24RA generates a signal SIG1 on the basis of the output signal of the multiplexer 22RA, and the driver 24RB generates a signal SIG2 on the basis of the output signal of the multiplexer 22RB.

FIG. 19 illustrates the flow of signals in the operation mode MB (differential mode). In FIG. 19, a bold solid line indicates the flow of a signal related to a signal SIGP, and a bold dashed line indicates the flow of a signal related to a signal SIGN. In the operation mode MB, the selector 23R selects a signal S21RBN on the basis of a signal Ssel, and outputs the signal S21RBN as a signal S23R. In the operation mode MB, a clock signal CLK is toggled. Accordingly, the multiplexer 22RA alternately selects one of signals S21RAP and S21RBP, and outputs the selected signal. Furthermore, the multiplexer 22RB alternately selects one of signals S21RAN and S23R, and outputs the selected signal. The driver 24RA generates a signal SIGP on the basis of the output signal of the multiplexer 22RA, and the driver 24RB generates a signal SIGN on the basis of the output signal of the multiplexer 22RB.

In this way, in the transmitting device 10R according to Comparative example R, a clock signal CLK is stopped in the operation mode MA (single-phase mode), and a clock signal CLK is toggled in the operation mode MB (differential mode). Accordingly, in the transmitting device 10R, the data rate of signals SIG1 and SIG2 in the operation mode MA is reduced to half of the data rate of signals SIGP and SIGN in the operation mode MB.

On the other hand, in the transmitting device 10 according to the present embodiment, a clock signal CLK is toggled in both of the operation modes MA and MB. Accordingly, in the transmitting device 10, it is possible to cause the data rate of signals SIG1 and SIG2 in the operation mode MA to be the same as the data rate of signals SIGP and SIGN in the operation mode MB, and therefore, it is possible to suppress reduction of the data rate in the operation mode MA.

(Comparative Example S)

FIG. 20 illustrates a configuration example of a main part of a transmitter 12S in a transmitting device 10S according to Comparative example S. The transmitter 12S includes serializers 21SA and 21SB and a selector 23S. The serializer 21SA serializes signals DI10 to DI17, thereby generating signals S21SAP and S21SAN. The signals S21SAP and S21SAN are signals that are inverted from each other. The serializer 21SB serializes signals DI20 to DI27, thereby generating a signal S21SBP. On the basis of a signal Ssel, the selector 23S selects the signal S21SBP in a case where the operation mode is the operation mode MA (single-phase mode), and selects the signal S21SAN in a case where the operation mode is the operation mode MB (differential mode), and then outputs the selected signal.

FIG. 21 illustrates the flow of signals in the operation mode MA (single-phase mode). In FIG. 21, a bold solid line indicates the flow of a signal related to a signal SIG1, and a bold dashed line indicates the flow of a signal related to a signal SIG2. In the operation mode MA, the selector 23S selects a signal S21SBP on the basis of a signal Ssel, and outputs the signal S21SBP. The driver 24RA generates a signal SIG1 on the basis of a signal S21SAP, and the driver 24RB generates a signal SIG2 on the basis of the output signal of the selector 23S.

FIG. 22 illustrates the flow of signals in the operation mode MB (differential mode). In FIG. 22, a bold solid line indicates the flow of a signal related to a signal SIGP, and a bold dashed line indicates the flow of a signal related to a signal SIGN. In the operation mode MB, the selector 23S selects a signal S21SAN on the basis of a signal Ssel, and outputs the signal S21SAN. The driver 24RA generates a signal SIGP on the basis of a signal S21SAP, and the driver 24RB generates a signal SIGN on the basis of the output signal of the selector 23S.

In this way, in the transmitting device 10S according to Comparative example S, despite the fact that the serializer 21SB is provided, the serializer 21SB is not put into operation in the operation mode MB; therefore, in a case where the transmitting device 10S is applied to the communication system 1B, the serializer 21SB is useless. Furthermore, in the transmitting device 10S, no multiplexers are provided in the subsequent stage of the serializers 21SA and 21SB; therefore, the data rate is reduced.

On the other hand, in the transmitting device 10 according to the present embodiment, all the four serializers 21 are put into operation in both of the operation modes MA and MB; therefore, it is possible to make efficient use of circuits. Furthermore, in the transmitting device 10, the four multiplexers 22 are provided in the subsequent stage of the four serializers 21; therefore, it is possible to increase the data rate.

[Effects]

As described above, in the present embodiment, the two operation modes MA and MB are provided, which makes it possible to transmit data to a receiving device by using a single-phase signal or a differential signal; therefore, it is possible to implement various interfaces.

In the present embodiment, an emphasis operation is performed in the operation mode MB; therefore, it is possible to increase the communication performance.

Modification Example 1-1

In the above-described embodiment, the four serializers 21 are configured as illustrated in FIG. 3; however, it is not limited to this. A modification example is described in detail below.

FIG. 23 illustrates a configuration example of a serializer 121A according to the present modification example. This serializer 121A corresponds to the serializer 21A according to the above-described embodiment. The serializer 121A serializes signals DI10, DI12, DI14, and DI16 on the basis of clock signals P0, P2, P4, and P6, thereby generating signals S21AP and S21AN. This serializer 121A includes inverters IV1 to IV6 and clocked inverters CIV1 to CIV4.

The inverter IV1 generates an inverted clock signal P0B by inverting the clock signal P0. The inverter IV2 generates an inverted clock signal P2B by inverting the clock signal P2. The inverter IV3 generates an inverted clock signal P4B by inverting the clock signal P4. The inverter IV4 generates an inverted clock signal P6B by inverting the clock signal P6.

The clocked inverter CIV1 applies an inverted signal of the signal DI10 to a node N1 in a case where the clock signal P0 is high level, and the inverted clock signal P0B is low level; and the clocked inverter CIV1 sets the output impedance to high impedance in a case where the clock signal P0 is low level, and the inverted clock signal P0B is high level. The clocked inverter CIV2 applies an inverted signal of the signal DI12 to the node N1 in a case where the clock signal P2 is high level, and the inverted clock signal P2B is low level; and the clocked inverter CIV2 sets the output impedance to high impedance in a case where the clock signal P2 is low level, and the inverted clock signal P2B is high level. The clocked inverter CIV3 applies an inverted signal of the signal DI14 to the node N1 in a case where the clock signal P4 is high level, and the inverted clock signal P4B is low level; and the clocked inverter CIV3 sets the output impedance to high impedance in a case where the clock signal P4 is low level, and the inverted clock signal P4B is high level. The clocked inverter CIV4 applies an inverted signal of the signal DI16 to the node N1 in a case where the clock signal P6 is high level, and the inverted clock signal P6B is low level; and the clocked inverter CIV4 sets the output impedance to high impedance in a case where the clock signal P6 is low level, and the inverted clock signal P6B is high level.

The inverter IV5 inverts the voltage at the node N1, thereby generating a signal S21AP. The inverter IV6 inverts the signal S21AP, thereby generating a signal S2 IAN.

This serializer 121A is able to operate in the same manner as the serializer 21A according to the above-described embodiment ((A) to (I) in FIG. 4).

FIG. 24 illustrates a configuration example of another serializer 122A according to the present modification example. This serializer 122A corresponds to the serializer 21A according to the above-described embodiment. This serializer 122A serializes signals DI10, DI12, DI14, and DI16 on the basis of clock signals P10, P12, P14, and P16, thereby generating signals S21AP and S21AN. The clock signals P10, P12, P14, and P16 are a so-called four-phase clock. The serializer 122A includes transistors M21 to M48.

The transistors M21 to M46 are N-channel MOS type FETs, and the transistors M47 and M48 are P-channel MOS type FETs.

A source of the transistor M21 is grounded, and a gate is supplied with a signal DI10P, and a drain is coupled to a source of the transistor M23. A source of the transistor M22 is grounded, and a gate is supplied with a signal DI10N, and a drain is coupled to a source of the transistor M24. The source of the transistor M23 is coupled to the drain of the transistor M21, a gate is supplied with the clock signal P16, and a drain is coupled to a source of the transistor M25. The source of the transistor M24 is coupled to the drain of the transistor M22, a gate is supplied with the clock signal P16, and a drain is coupled to a source of the transistor M26. The source of the transistor M25 is coupled to the drain of the transistor M23, a gate is supplied with the clock signal P10, and a drain is coupled to drains of the transistors M31, M37, and M43 and a source of the transistor M45. The source of the transistor M26 is coupled to the drain of the transistor M24, a gate is supplied with the clock signal P10, and a drain is coupled to drains of the transistors M32, M38, and M44 and a source of the transistor M46.

A source of the transistor M27 is grounded, and a gate is supplied with a signal DI12P, and a drain is coupled to a source of the transistor M29. A source of the transistor M28 is grounded, and a gate is supplied with a signal DI12N, and a drain is coupled to a source of the transistor M30. The source of the transistor M29 is coupled to the drain of the transistor M27, a gate is supplied with the clock signal P10, and the drain is coupled to a source of the transistor M31. The source of the transistor M30 is coupled to the drain of the transistor M28, a gate is supplied with the clock signal P10, and a drain is coupled to a source of the transistor M32. The source of the transistor M31 is coupled to the drain of the transistor M29, a gate is supplied with the clock signal P12, and the drain is coupled to the drains of the transistors M25, M37, and M43 and the source of the transistor M45. The source of the transistor M32 is coupled to the drain of the transistor M30, a gate is supplied with the clock signal P12, and the drain is coupled to the drains of the transistors M26, M38, and M44 and the source of the transistor M46.

A source of the transistor M33 is grounded, and a gate is supplied with a signal DI14P, and a drain is coupled to a source of the transistor M35. A source of the transistor M34 is grounded, and a gate is supplied with a signal DI14N, and a drain is coupled to a source of the transistor M36. The source of the transistor M35 is coupled to the drain of the transistor M33, a gate is supplied with the clock signal P12, and the drain is coupled to a source of the transistor M37. The source of the transistor M36 is coupled to the drain of the transistor M34, a gate is supplied with the clock signal P12, and a drain is coupled to a source of the transistor M38. The source of the transistor M37 is coupled to the drain of the transistor M35, a gate is supplied with the clock signal P14, and the drain is coupled to the drains of the transistors M25, M31, and M43 and the source of the transistor M45. The source of the transistor M38 is coupled to the drain of the transistor M36, a gate is supplied with the clock signal P14, and the drain is coupled to the drains of the transistors M26, M32, and M44 and the source of the transistor M46.

A source of the transistor M39 is grounded, and a gate is supplied with a signal DI16P, and a drain is coupled to a source of the transistor M41. A source of the transistor M40 is grounded, and a gate is supplied with a signal DI16N, and a drain is coupled to a source of the transistor M42. The source of the transistor M41 is coupled to the drain of the transistor M39, a gate is supplied with the clock signal P14, and the drain is coupled to a source of the transistor M43. The source of the transistor M42 is coupled to the drain of the transistor M40, a gate is supplied with the clock signal P14, and a drain is coupled to a source of the transistor M44. The source of the transistor M43 is coupled to the drain of the transistor M41, a gate is supplied with the clock signal P16, and the drain is coupled to the drains of the transistors M25, M31, and M37 and the source of the transistor M45. The source of the transistor M44 is coupled to the drain of the transistor M42, a gate is supplied with the clock signal P16, and the drain is coupled to the drains of the transistors M26, M32, and M38 and the source of the transistor M46.

The source of the transistor M45 is coupled to the drains of the transistors M25, M31, M37, and M43, and a gate is supplied with the power supply voltage VDD, and a drain is coupled to a drain of the transistor M47 and a gate of the transistor M48. The source of the transistor M46 is coupled to the drains of the transistors M26, M32, M38, and M44, and a gate is supplied with the power supply voltage VDD, and a drain is coupled to a drain of the transistor M48 and a gate of the transistor M47. A source of the transistor M47 is supplied with the power supply voltage VDD, and the gate is coupled to the drains of the transistors M46 and M48, and the drain is coupled to the drain of the transistor M45 and the gate of the transistor M48. A source of the transistor M48 is supplied with the power supply voltage VDD, and the gate is coupled to the drains of the transistors M45 and M47, and the drain is coupled to the drain of the transistor M46 and the gate of the transistor M47. The serializer 122A outputs a signal S21AP from the drains of the transistors M46 and M48, and outputs a signal S21AN from the drains of the transistors M45 and M47.

FIG. 25 illustrates an operation example of the serializer 122A; (A) to (D) illustrate respective waveforms of the signals DUO, DI12, DI14, and DI16, and (E) to (H) illustrate respective waveforms of the clock signals P10, P12, P14, and P16, and (I) illustrates waveforms of the signals S21AP and S21AN. The clock signal P10 makes a transition from low level to high level at timing t13, and makes a transition from high level to low level at timing t17 ((E) in FIG. 25). The clock signal P12 makes a transition from low level to high level at timing t15, and makes a transition from high level to low level at timing t19 ((F) in FIG. 25). The clock signal P14 makes a transition from high level to low level at timing t13, and makes a transition from low level to high level at timing t17 ((G) in FIG. 25). The clock signal P16 makes a transition from high level to low level at timing t15, and makes a transition from low level to high level at timing t19 ((H) in FIG. 25).

Accordingly, in a period from timing t13 to timing t15 in which the clock signals P10 and P16 are both high level, the serializer 122A selects the signal DI10 (data "D0($n$)") and outputs it as signals S21AP and S21AN ((I) in FIG. 25). Furthermore, in a period from timing t15 to timing t17 in which the clock signals P10 and P12 are both high level, the serializer 122A selects the signal DI12 (data "D2($n$)") and outputs it as signals S21AP and S21AN. Moreover, in a period from timing t17 to timing t19 in which the clock signals P12 and P14 are both high level, the serializer 122A selects the signal DI14 (data "D4($n$)") and outputs it as signals S21AP and S21AN. Furthermore, in a period from timing t19 to timing t21 in which the clock signals P14 and P16 are both high level, the serializer 122A selects the signal DI16 (data "D6($n$)") and outputs it as signals S21AP and S21AN.

Modification Example 1-2

In the above-described embodiment, the transition timing of the signals DI10 and DI12 and the transition timing of the signals DI14 and DI16 are staggered as illustrated in FIG. 4; however, they are not limited to this. Instead of this, the transition timings of the signals DI10, DI12, DI14, and DI16 may coincide with one another as illustrated in FIG. 26.

In this example, at timing t13, the signal DI10 is set to data "D0(n)", the signal DI12 is set to data "D2(n)", the signal DI14 is set to data "D4(n)", and the signal DI16 is set to data "D6(n)" ((A) to (D) in FIG. 26).

In a period from timing t13 to timing t15 in which the lock signal P0 is high level, the serializer 21A selects the signal DI10 (the data "D0(n)"), and outputs it as signals S21AP and S21AN ((I) in FIG. 26). Likewise, in a period from timing t15 to timing t17 in which the lock signal P2 is high level, the serializer 21A selects the signal DI12 (the data "D2(n)"), and outputs it as signals S21AP and S21AN. In a period from timing t17 to timing t19 in which the lock signal P4 is high level, the serializer 21A selects the signal DI14 (the data "D4(n)"), and outputs it as signals S21AP and S21AN. In a period from timing t19 to timing t21 in which the lock signal P6 is high level, the serializer 21A selects the signal DI16 (the data "D6(n)"), and outputs it as signals S21AP and S21AN.

Modification Example 1-3

In the above-described embodiment, the selector type serializers 21 are used; however, it is not limited to this. A modification example is described in detail below.

FIG. 27 illustrates a configuration example of a serializer 123A according to the present modification example. The serializer 123A corresponds to the serializer 21A according to the above-described embodiment. The serializer 123A is a shift register type serializer. The serializer 123A serializes signals DI10, DI12, DI14, and DI16 on the basis of a clock signal CLK2, thereby generating signals S21AP and S21AN. The serializer 123A includes selectors 51, 53, 55, and 57 and flip-flops (F/Fs) 52, 54, 56, and 58.

The selector 51 selects the signal DI16 in a case where the clock signal CLK2 is high level, and selects a ground level in a case where the clock signal CLK2 is low level, and outputs the selected signal. The flip-flop 52 samples and outputs the output signal of the selector 51 on the basis of the rising edge of the clock signal CLK2. The selector 53 selects the signal DI14 in a case where the clock signal CLK2 is high level, and selects the output signal of the flip-flop 52 in a case where the clock signal CLK2 is low level, and outputs the selected signal. The flip-flop 54 samples and outputs the output signal of the selector 53 on the basis of the rising edge of the clock signal CLK2. The selector 55 selects the signal DI12 in a case where the clock signal CLK2 is high level, and selects the output signal of the flip-flop 54 in a case where the clock signal CLK2 is low level, and outputs the selected signal. The flip-flop 56 samples and outputs the output signal of the selector 55 on the basis of the rising edge of the clock signal CLK2. The selector 57 selects the signal DI10 in a case where the clock signal CLK2 is high level, and selects the output signal of the flip-flop 56 in a case where the clock signal CLK2 is low level, and outputs the selected signal. The flip-flop 58 samples the output signal of the selector 57 on the basis of the rising edge of the clock signal CLK2 and outputs the sampled signal as a signal S21AP, and outputs an inverted signal of the signal S21AP as a signal S21AN.

FIG. 28 illustrates an operation example of the serializer 123A; (A) to (D) illustrate respective waveforms of signals DI10, DI12, DI14, and DI16, and (E) illustrates a waveform of a clock signal CLK2, and (F) illustrates a waveform of a signal CTL2, and (G) illustrates waveforms of signals S21AP and S21AN.

In this example, at timing t51, the signal DI10 is set to data "D0(n)", the signal DI12 is set to data "D2(n)", the signal DI14 is set to data "D4(n)", and the signal DI16 is set to data "D6(n)" ((A) to (D) in FIG. 28).

Further, the signal CTL2 makes a transition from low level to high level at timing t53, and makes a transition from high level to low level at timing t55 ((F) in FIG. 28). In a period from timing t53 to timing t55 in which the signal CTL2 is high level, the selector 51 selects the signal DI16 (the data "D6(n)"), the selector 53 selects the signal DI14 (the data "D4(n)"), the selector 55 selects the signal DI12 (the data "D2(n)"), and the selector 57 selects the signal DI10 (the data "D0(n)"). Then, on the basis of the rising edge of the clock signal CLK2 at timing t54, the flip-flop 52 samples the output signal (the data "D6(n)") of the selector 51, the flip-flop 54 samples the output signal (the data "D4(n)") of the selector 53, the flip-flop 56 samples the output signal (the data "D2(n)") of the selector 55, and the flip-flop 58 samples the output signal (the data "D0(n)") of the selector 57. Then, after the signal CTL2 becomes low level at timing t55, the serializer 123A operates as a shift register on the basis of the clock signal CLK2.

In this way, the serializer 123A outputs the data "D0(n)" in a period from timing t54 to timing t56, and outputs the data "D2(n)" in a period from timing t56 to timing t57, and outputs the data "D4(n)" in a period from timing t57 to timing t58, and outputs the data "D6(n)" in a period from timing t58 to timing t59 ((G) in FIG. 28).

Modification Example 1-4

In the above-described embodiment, the selectors 23 are provided; however, it is not limited to this. A modification example is described in detail below.

FIG. 29 illustrates a configuration example of a main part of a transmitter 12D according to the present modification example. FIG. 29 depicts a circuit subsequent to the serializers 21A to 21D in FIG. 2. The transmitter 12D includes four serializers 21 (the serializers 21A, 21B, 21C, and 21D), four multiplexers 22 (the multiplexers 22A, 22B, 22C, and 22D), two drivers 39 (drivers 39A and 39B), and a controller 25D.

The driver 39A sets a voltage at the output terminal Tout1 on the basis of signals S22A, S22B, S22C, and S22D, signals Ssel1, Ssel2, and Ssel3, and a signal CTL. The driver 39B sets a voltage at the output terminal Tout2 on the basis of the signals S22A, S22B, S22C, and S22D, the signals Ssel1, Ssel2, and Ssel3, and the signal CTL. The signals Ssel1, Ssel2, and Ssel3 are set in accordance with the operation mode. Specifically, in the operation mode MA, the signals Ssel1 and Ssel2 are both set to high level, and the signal Ssel3 is set to low level. Furthermore, in the operation mode MB, the signals Ssel1 and Ssel3 are both set to high level, and the signal Ssel2 is set to low level.

FIG. 30 illustrates a configuration example of the driver 39A. FIG. 31 illustrates a configuration example of the driver 39B. The driver 39A includes the M sub-drivers AA (the sub-drivers AA1 to AAM), the N sub-drivers AB (the sub-drivers AB1 to ABN), and N sub-drivers AC (sub-drivers AC1 to ACN). The driver 39B includes the M sub-drivers BA (the sub-drivers BA1 to BAM), M sub-drivers BB (sub-drivers BB1 to BBM), and N sub-drivers BC (sub-drivers BC1 to BCN).

The sub-drivers AA1 to AAM, AB1 to ABN, AC1 to ACN, BA1 to BAM, and BB1 to BBM, and BC1 to BCN each include the resistance elements 91 and 94 and transistors 92, 93, 95, and 96. The transistors 92, 93, 95, and 96 are N-channel MOS type FETs. It is to be noted that in FIG. 29, these transistors 92, 93, 95, and 96 are depicted in the drivers 39A and 39B. Furthermore, in FIG. 29, an illustration of the resistance elements 91 and 94 is omitted.

In each of the sub-drivers AA1 to AAM of the driver 39A (FIG. 30), one end of the resistance element 91 is supplied with a voltage V1, and the other end is coupled to a drain of the transistor 95. A gate of the transistor 95 is supplied with a signal Ssel1, and the drain is coupled to the other end of the resistance element 91, and a source is coupled to a drain of the transistor 92. A gate of the transistor 92 is supplied with a signal S22A, and the drain is coupled to a source of the transistor 95, and a source is coupled to a drain of the transistor 93 and the output terminal Tout1. A gate of the transistor 93 is supplied with a signal S22B, and the drain is coupled to the source of the transistor 92 and the output terminal Tout1, and a source is coupled to a drain of the transistor 96. A gate of the transistor 96 is supplied with the signal Ssel1, and the drain is coupled to the source of the transistor 93, and a source is coupled to one end of the resistance element 94. The one end of the resistance element 94 is coupled to the source of the transistor 96, and the other end is grounded.

In each of the sub-drivers AB1 to ABN of the driver 39A, one end of the resistance element 91 is supplied with the voltage V1, and the other end is coupled to the drain of the transistor 95. The gate of the transistor 95 is supplied with a signal Ssel2, and the drain is coupled to the other end of the resistance element 91, and the source is coupled to the drain of the transistor 92. The gate of the transistor 92 is supplied with a signal S22A, and the drain is coupled to the source of the transistor 95, and the source is coupled to the drain of the transistor 93 and the output terminal Tout1. The gate of the transistor 93 is supplied with a signal S22B, and the drain is coupled to the source of the transistor 92 and the output terminal Tout1, and the source is coupled to the drain of the transistor 96. The gate of the transistor 96 is supplied with the signal Ssel2, and the drain is coupled to the source of the transistor 93, and the source is coupled to one end of the resistance element 94. The one end of the resistance element 94 is coupled to the source of the transistor 96, and the other end is grounded.

In each of the sub-drivers AC1 to ACN of the driver 39A, one end of the resistance element 91 is supplied with the voltage V1, and the other end is coupled to the drain of the transistor 95. The gate of the transistor 95 is supplied with a signal Ssel3, and the drain is coupled to the other end of the resistance element 91, and the source is coupled to the drain of the transistor 92. The gate of the transistor 92 is supplied with a signal S22D, and the drain is coupled to the source of the transistor 95, and the source is coupled to the drain of the transistor 93 and the output terminal Tout1. The gate of the transistor 93 is supplied with a signal S22C, and the drain is coupled to the source of the transistor 92 and the output terminal Tout1, and the source is coupled to the drain of the transistor 96. The gate of the transistor 96 is supplied with the signal Ssel3, and the drain is coupled to the source of the transistor 93, and the source is coupled to one end of the resistance element 94. The one end of the resistance element 94 is coupled to the source of the transistor 96, and the other end is grounded.

In each of the sub-drivers BA1 to BAM of the driver 39B (FIG. 31), one end of the resistance element 91 is supplied with the voltage V1, and the other end is coupled to the drain of the transistor 95. The gate of the transistor 95 is supplied with a signal Ssel3, and the drain is coupled to the other end of the resistance element 91, and the source is coupled to the drain of the transistor 92. The gate of the transistor 92 is supplied with a signal S22B, and the drain is coupled to the source of the transistor 95, and the source is coupled to the drain of the transistor 93 and the output terminal Tout2. The gate of the transistor 93 is supplied with a signal S22A, and the drain is coupled to the source of the transistor 92 and the output terminal Tout2, and the source is coupled to the drain of the transistor 96. The gate of the transistor 96 is supplied with the signal Ssel3, and the drain is coupled to the source of the transistor 93, and the source is coupled to one end of the resistance element 94. The one end of the resistance element 94 is coupled to the source of the transistor 96, and the other end is grounded.

In each of the sub-drivers BB1 to BBM of the driver 39B, one end of the resistance element 91 is supplied with the voltage V1, and the other end is coupled to the drain of the transistor 95. The gate of the transistor 95 is supplied with a signal Ssel2, and the drain is coupled to the other end of the resistance element 91, and the source is coupled to the drain of the transistor 92. The gate of the transistor 92 is supplied with a signal S22C, and the drain is coupled to the source of the transistor 95, and the source is coupled to the drain of the transistor 93 and the output terminal Tout2. The gate of the transistor 93 is supplied with a signal S22D, and the drain is coupled to the source of the transistor 92 and the output terminal Tout2, and the source is coupled to the drain of the transistor 96. The gate of the transistor 96 is supplied with the signal Ssel2, and the drain is coupled to the source of the transistor 93, and the source is coupled to one end of the resistance element 94. The one end of the resistance element 94 is coupled to the source of the transistor 96, and the other end is grounded.

In each of the sub-drivers BC1 to BCN of the driver 39B, one end of the resistance element 91 is supplied with the voltage V1, and the other end is coupled to the drain of the transistor 95. The gate of the transistor 95 is supplied with a signal Ssel1, and the drain is coupled to the other end of the resistance element 91, and the source is coupled to the drain of the transistor 92. The gate of the transistor 92 is supplied with a signal S22C, and the drain is coupled to the source of the transistor 95, and the source is coupled to the drain of the transistor 93 and the output terminal Tout2. The gate of the transistor 93 is supplied with a signal S22D, and the drain is coupled to the source of the transistor 92 and the output terminal Tout2, and the source is coupled to the drain of the transistor 96. The gate of the transistor 96 is supplied with the signal Ssel1, and the drain is coupled to the source of the transistor 93, and the source is coupled to one end of the resistance element 94. The one end of the resistance element 94 is coupled to the source of the transistor 96, and the other end is grounded.

For example, in the operation mode MA (single-phase mode), the signals Ssel1 and Ssel2 are both set to high level, and the signal Ssel3 is set to low level. Accordingly, in the driver 39A (FIG. 30), the sub-drivers AA1 to AAM and AB1 to ABN are enabled, and the sub-drivers AC1 to ACN are disabled. Furthermore, in the driver 39B (FIG. 31), the sub-drivers BB1 to BBM and BC1 to BCN are enabled, and the sub-drivers BA1 to BAM are disabled.

Furthermore, for example, in the operation mode MB (differential mode), the signals Ssel1 and Ssel3 are both set to high level, and the signal Ssel2 is set to low level. Accordingly, in the driver 39A (FIG. 30), the sub-drivers AA1 to AAM and AC1 to ACN are enabled, and the sub-drivers AB1 to ABN are disabled. Furthermore, in the driver 39B (FIG. 31), the sub-drivers BA1 to BAM and BC1 to BCN are enabled, and the sub-drivers BB1 to BBM are disabled.

The controller 25D (FIG. 29) generates clock signals P0 to P7 and CLK and signals Ssel1, Ssel2, Ssel3, and CTL on the basis of a mode signal Smode supplied from the processor 11.

Here, the driver 39A corresponds to a specific example of the "first driver" in the present disclosure. The plurality of sub-drivers AA1 to AAM correspond to a specific example of the "first sub-driver unit" in the present disclosure; the plurality of sub-drivers AB1 to ABN correspond to a specific example of a "fifth sub-driver unit" in the present disclosure; and the plurality of sub-drivers AC1 to ACN correspond to a specific example of a "sixth sub-driver unit" in the present disclosure. The driver 39B corresponds to a specific example of the "second driver" in the present disclosure.

FIG. 32 illustrates the flow of signals in the operation mode MA. In FIG. 32, bold solid lines indicate the flow of signals related to signals DI10 to DI17, and bold dashed lines indicate the flow of signals related to signals DI20 to DI27. The sub-drivers AA1 to AAM of the driver 39A operate on the basis of signals S22A and S22B, and the sub-drivers AB1 to ABN of the driver 39A operate on the basis of the signals S22A and S22B. Furthermore, the sub-drivers BB1 to BBM of the driver 39B operate on the basis of signals S22C and S22D, and the sub-drivers BC1 to BCN of the driver 39B operate on the basis of the signals S22C and S22D.

FIG. 33 illustrates the flow of signals in the operation mode MB. In FIG. 33, bold solid lines indicate the flow of signals related to signals DI10 to DI17, and bold dashed lines indicate the flow of signals related to signals DI20 to DI27. The sub-drivers AA1 to AAM of the driver 39A operate on the basis of signals S22A and S22B, and the sub-drivers BA1 to BAM of the driver 39B operate on the basis of the signals S22B and S22A. The sub-drivers AC1 to ACN of the driver 39A operate on the basis of signals S22C and S22D, and the sub-drivers BC1 to BCM of the driver 39B operate on the basis of the signals S22D and S22C.

Modification Example 1-5

In the above-described embodiment, the selectors 23 are provided in the subsequent stage of the multiplexers 22; however, it is not limited to this. A modification example is described in detail below.

FIG. 34 illustrates a configuration example of a transmitter 12E according to the present modification example. The transmitter 12E includes eight selectors 26 (selectors 26A to 26H) and eight multiplexers 27 (multiplexers 27A to 27H).

On the basis of a signal Ssel, the selector 26A selects a signal S21AP in a case where the operation mode is the operation mode MA (single-phase mode), and selects a signal S21BN in a case where the operation mode is the operation mode MB (differential mode), and then outputs the selected signal. On the basis of a signal Ssel, the selector 26B selects a signal S21CP in a case where the operation mode is the operation mode MA, and selects a signal S21DN in a case where the operation mode is the operation mode MB, and then outputs the selected signal. On the basis of a signal Ssel, the selector 26C selects a signal S21AN in a case where the operation mode is the operation mode MA, and selects a signal S21BP in a case where the operation mode is the operation mode MB, and then outputs the selected signal. On the basis of a signal Ssel, the selector 26D selects a signal S21CN in a case where the operation mode is the operation mode MA, and selects a signal S21DP in a case where the operation mode is the operation mode MB, and then outputs the selected signal. On the basis of a signal Ssel, the selector 26E selects a signal S21BP in a case where the operation mode is the operation mode MA, and selects a signal S21AN in a case where the operation mode is the operation mode MB, and then outputs the selected signal. On the basis of a signal Ssel, the selector 26F selects a signal S21DP in a case where the operation mode is the operation mode MA, and selects a signal S21CN in a case where the operation mode is the operation mode MB, and then outputs the selected signal. On the basis of a signal Ssel, the selector 26G selects a signal S21BN in a case where the operation mode is the operation mode MA, and selects a signal S21AP in a case where the operation mode is the operation mode MB, and then outputs the selected signal. On the basis of a signal Ssel, the selector 26H selects a signal S21DN in a case where the operation mode is the operation mode MA, and selects a signal S21CP in a case where the operation mode is the operation mode MB, and then outputs the selected signal.

The multiplexer 27A alternately selects one of the signals S21AP and S21CP on the basis of a clock signal CLK, and outputs the selected signal. The multiplexer 27B alternately selects one of the signals S21AN and S21CN on the basis of a clock signal CLK, and outputs the selected signal. The multiplexer 27C alternately selects one of the output signals of the selectors 26A and 26B on the basis of a clock signal CLK, and outputs the selected signal. The multiplexer 27D alternately selects one of the output signals of the selectors 26C and 26D on the basis of a clock signal CLK, and outputs the selected signal. The multiplexer 27E alternately selects one of the output signals of the selectors 26E and 26F on the basis of a clock signal CLK, and outputs the selected signal. The multiplexer 27F alternately selects one of the output signals of the selectors 26G and 26H on the basis of a clock signal CLK, and outputs the selected signal. The multiplexer 27G alternately selects one of the signals S21BP and S21DP on the basis of a clock signal CLK, and outputs the selected signal. The multiplexer 27H alternately selects one of the signals S21BN and S21DN on the basis of a clock signal CLK, and outputs the selected signal.

Here, the plurality of multiplexers 27A to 27H correspond to a specific example of the "multiplexer unit" in the present disclosure.

With this configuration, in the driver 24A, the sub-drivers AA1 to AAM operate on the basis of the output signal of the multiplexer 27A and the output signal of the multiplexer 27B, and the sub-drivers AB1 to ABN operate on the basis of the output signal of the multiplexer 27C and the output signal of the multiplexer 27D. Furthermore, in the driver 24B, the sub-drivers BA1 to BAM operate on the basis of the output signal of the multiplexer 27E and the output signal of the multiplexer 27F, and the sub-drivers BB1 to BBN operate on the basis of the output signal of the multiplexer 27G and the output signal of the multiplexer 27H.

FIG. 35 illustrates the flow of signals in the operation mode MA (single-phase mode). In FIG. 35, bold solid lines indicate the flow of signals related to DI10 to DI17, and bold dashed lines indicate the flow of signals related to signals DI20 to DI27.

First, the flow of signals related to DI10 to DI17 is described. In the operation mode MA, the selector 26A selects a signal S21AP on the basis of a signal Ssel, and outputs the signal S21AP. The selector 26B selects a signal S21CP on the basis of a signal Ssel, and outputs the signal S21CP. The selector 26C selects a signal S21AN on the basis of a signal Ssel, and outputs the signal S21AN. The selector 26D selects a signal S21CN on the basis of a signal Ssel, and outputs the signal S21CN.

The multiplexer 27A alternately selects one of the signals S21AP and S21CP on the basis of a clock signal CLK, and outputs the selected signal. The multiplexer 27B alternately selects one of the signals S21AN and S21CN on the basis of a clock signal CLK, and outputs the selected signal. The multiplexer 27C alternately selects one of the output signal (the signal S21AP) of the selector 26A and the output signal (the signal S21CP) of the selector 26B on the basis of a clock signal CLK, and outputs the selected signal. The multiplexer 27D alternately selects one of the output signal (the signal S21AN) of the selector 26C and the output signal (the signal S21CN) of the selector 26D on the basis of a clock signal CLK, and outputs the selected signal.

Next, the flow of signals related to DI20 to DI27 is described. In the operation mode MA, the selector 26E selects a signal S21BP on the basis of a signal Ssel, and outputs the signal S21BP. The selector 26F selects a signal S21DP on the basis of a signal Ssel, and outputs the signal S21DP. The selector 26G selects a signal S21BN on the basis of a signal Ssel, and outputs the signal S21BN. The selector 26H selects a signal S21DN on the basis of a signal Ssel, and outputs the signal S21DN.

The multiplexer 27E alternately selects one of the output signal (the signal S21BP) of the selector 26E and the output signal (the signal S21DP) of the selector 26F on the basis of a clock signal CLK, and outputs the selected signal. The multiplexer 27F alternately selects one of the output signal (the signal S21BN) of the selector 26G and the output signal (the signal S21DN) of the selector 26H on the basis of a clock signal CLK, and outputs the selected signal. The multiplexer 27G alternately selects one of the signals S21BP and S21DP on the basis of a clock signal CLK, and outputs the selected signal. The multiplexer 27H alternately selects one of the signals S21BN and S21DN on the basis of a clock signal CLK, and outputs the selected signal.

FIG. 36 illustrates the flow of signals in the operation mode MB (differential mode). In FIG. 36, bold solid lines indicate the flow of signals related to DI10 to DI17, and bold dashed lines indicate the flow of signals related to signals DI20 to DI27.

First, the flow of signals related to DI10 to DI17 is described. In the operation mode MB, the selector 26E selects a signal S21AN on the basis of a signal Ssel, and outputs the signal S21AN. The selector 26F selects a signal S21CN on the basis of a signal Ssel, and outputs the signal S21CN. The selector 26G selects a signal S21AP on the basis of a signal Ssel, and outputs the signal S21AP. The selector 26H selects a signal S21CP on the basis of a signal Ssel, and outputs the signal S21CP.

The multiplexer 27A alternately selects one of the signals S21AP and S21CP on the basis of a clock signal CLK, and outputs the selected signal. The multiplexer 27B alternately selects one of the signals S21AN and S21CN on the basis of a clock signal CLK, and outputs the selected signal. The multiplexer 27E alternately selects one of the output signal (the signal S21AN) of the selector 26E and the output signal (the signal S21CN) of the selector 26F on the basis of a clock signal CLK, and outputs the selected signal. The multiplexer 27F alternately selects one of the output signal (the signal S21AP) of the selector 26G and the output signal (the signal S21CP) of the selector 26H on the basis of a clock signal CLK, and outputs the selected signal.

Next, the flow of signals related to DI20 to DI27 is described. In the operation mode MB, the selector 26A selects a signal S21BN on the basis of a signal Ssel, and outputs the signal S21BN. The selector 26B selects a signal S21DN on the basis of a signal Ssel, and outputs the signal S21DN. The selector 26C selects a signal S21BP on the basis of a signal Ssel, and outputs the signal S21BP. The selector 26D selects a signal S21DP on the basis of a signal Ssel, and outputs the signal S21DP.

The multiplexer 27C alternately selects and outputs one of the output signal (the signal S21BN) of the selector 26A and the output signal (the signal S21DN) of the selector 26B on the basis of a clock signal CLK. The multiplexer 27D alternately selects and outputs one of the output signal (the signal S21BP) of the selector 26C and the output signal (the signal S21DP) of the selector 26D on the basis of a clock signal CLK. The multiplexer 27G alternately selects and outputs one of the signals S21BP and S21DP on the basis of a clock signal CLK. The multiplexer 27H alternately selects and outputs one of the signals S21BN and S21DN on the basis of a clock signal CLK.

2. Second Embodiment

Subsequently, communication systems 2A to 2C according to a second embodiment are described. In the present embodiment, there is provided a transmitting device configured to be able to perform communication using a signal having three voltage levels in addition to a single-phase signal and a differential signal. It is to be noted that a component substantially identical to that of the communication systems 1A and 1B according to the above-described first embodiment is assigned the same reference numeral, and description of the component is omitted accordingly.

FIGS. 37A, 37B, and 37C illustrate respective configuration example of communication systems to which a transmitting device (a transmitting device 60) according to the second embodiment is applied; FIG. 37A illustrates the communication system 2A, FIG. 37B illustrates the communication system 2B, and FIG. 37C illustrates the communication system 2C. The communication system 2A performs communication using a single-phase signal, as with the communication system 1A according to the first embodiment. The communication system 2B performs communication using a differential signal, as with the communication system 1B according to the first embodiment. The communication system 2C performs communication using a signal having three voltage levels (hereinafter, also referred to as a "three-phase signal").

As illustrated in FIG. 37A, the communication system 2A includes the transmitting device 60 and a receiving device 130. The transmitting device 60 has four output terminals Tout1 to Tout4, and the receiving device 130 has four input terminals Tin1 to Tin4. The output terminal Tout1 of the transmitting device 60 and the input terminal Tin1 of the receiving device 130 are coupled to each other through the line 101; the output terminal Tout2 of the transmitting device 60 and the input terminal Tin2 of the receiving device 130 are coupled to each other through the line 102; the output terminal Tout3 of the transmitting device 60 and the input terminal Tin3 of the receiving device 130 are coupled to each other through a line 103; and the output terminal Tout4 of the transmitting device 60 and the input terminal Tin4 of the receiving device 130 are coupled to each other through a line 104. Respective characteristic impedances of the lines 101 to 104 are about 50[Ω] in this example. The transmitting device 60 uses the line 101 to transmit a signal SIG1, and uses the line 102 to transmit a signal SIG2, and uses the line 103 to transmit a signal SIG3, and uses the line 104 to transmit a signal SIG4. The signals SIG1 to SIG4 are each a single-phase signal.

As illustrated in FIG. 37B, the communication system 2B includes the transmitting device 60 and a receiving device 140. The receiving device 140 has four input terminals Tin1P, Tin1N, Tin2P, and Tin2N. The output terminal Tout1 of the transmitting device 60 and the input terminal Tin1P of the receiving device 140 are coupled to each other through the line 111; the output terminal Tout2 of the transmitting device 60 and the input terminal Tin1N of the receiving device 140 are coupled to each other through the line 112; the output terminal Tout3 of the transmitting device 60 and the input terminal Tin2P of the receiving device 140 are coupled to each other through a line 113; and the output terminal Tout4 of the transmitting device 60 and the input terminal Tin2N of the receiving device 140 are coupled to each other through a line 114. Respective characteristic impedances of the lines 111 to 114 are about 50[Ω] in this example. The transmitting device 60 uses the line 111 to transmit a signal SIG1P, and uses the line 112 to transmit a signal SIG1N. The signals SIG1P and SIG1N compose a differential signal. Furthermore, the transmitting device 60 uses the line 113 to transmit a signal SIG2P, and uses the line 114 to transmit a signal SIG2N. The signals SIG2P and SIG2N compose a differential signal. In the communication system 2B, the transmitting device 60 performs an emphasis operation, thereby transmitting signals SIG1P and SIG1N and signals SIG2P and SIG2N, as with the transmitting device 10 according to the first embodiment.

As illustrated in FIG. 37C, the communication system 2C includes the transmitting device 60 and a receiving device 150. The receiving device 150 has three input terminals TinA, TinB, and TinC. The output terminal Tout1 of the transmitting device 60 and the input terminal TinA of the receiving device 150 are coupled to each other through a line 121; the output terminal Tout2 of the transmitting device 60 and the input terminal TinB of the receiving device 150 are coupled to each other through a line 122; and the output terminal Tout3 of the transmitting device 60 and the input terminal TinC of the receiving device 150 are coupled to each other through a line 123. Respective characteristic impedances of the lines 121 to 123 are about 50[Ω] in this example. The transmitting device 60 uses the line 121 to transmit a signal SIGA, and uses the line 122 to transmit a signal SIGB, and uses the line 123 to transmit a signal SIGC. The signals SIGA, SIGB, and SIGC compose a three-phase signal.

FIG. 38 illustrates respective voltages of the signals SIGA, SIGB, and SIGC. In the communication system 2C, the transmitting device 60 uses three signals SIGA, SIGB, and SIGC to transmit six symbols "+x", "−x", "+y", "−y", "+z", and "−z". For example, in a case of transmitting the symbol "+x", the transmitting device 60 sets the signal SIGA to the high-level voltage VH, and sets the signal SIGB to the low-level voltage VL, and sets the signal SIGC to a medium-level voltage VM. In a case of transmitting the symbol "−x", the transmitting device 60 sets the signal SIGA to the low-level voltage VL, and sets the signal SIGB to the high-level voltage VH, and sets the signal SIGC to the medium-level voltage VM. In a case of transmitting the symbol "+y", the transmitting device 60 sets the signal SIGA to the medium-level voltage VM, and sets the signal SIGB to the high-level voltage VH, and sets the signal SIGC to the low-level voltage VL. In a case of transmitting the symbol "−y", the transmitting device 60 sets the signal SIGA to the medium-level voltage VM, and sets the signal SIGB to the low-level voltage VL, and sets the signal SIGC to the high-level voltage VH. In a case of transmitting the symbol "+z", the transmitting device 60 sets the signal SIGA to the low-level voltage VL, and sets the signal SIGB to the medium-level voltage VM, and sets the signal SIGC to the high-level voltage VH. In a case of transmitting the symbol "−z", the transmitting device 60 sets the signal SIGA to the high-level voltage VH, and sets the signal SIGB to the medium-level voltage VM, and sets the signal SIGC to the low-level voltage VL.

The transmitting device 60 has three operation modes MA, MB, and MC. In a case where the transmitting device 60 is applied to the communication system 2A, the transmitting device 60 operates in the operation mode MA (single-phase mode); in a case where the transmitting device 60 is applied to the communication system 2B, the transmitting device 60 operates in the operation mode MB (differential mode); in a case where the transmitting device 60 is applied to the communication system 2C, the transmitting device 60 operates in the operation mode MC (three-phase mode).

(Transmitting Device 60)

The transmitting device 60 includes a processor 61 and a transmitter 62 as illustrated in FIGS. 37A to 37C.

The processor 61 generates data to be transmitted by performing a predetermined process. Furthermore, the processor 61 selects one of the three operation modes MA, MB, and MC, and notifies the transmitter 62 of the selected operation mode by using a mode signal Smode. Specifically, in a case where the transmitting device 60 is applied to the communication system 2A, the processor 61 selects the operation mode MA (single-phase mode), and instructs the transmitter 62 to perform the operation in the operation mode MA by using a mode signal Smode. Furthermore, in a case where the transmitting device 60 is applied to the communication system 2B, the transmitter 62 selects the operation mode MB (differential mode), and instructs the transmitter 62 to perform the operation in the operation mode MB by using a mode signal Smode. Moreover, in a case where the transmitting device 60 is applied to the communication system 2C, the transmitter 62 selects the operation mode MC (three-phase mode), and instructs the transmitter 62 to perform the operation in the operation mode MC by using a mode signal Smode.

The transmitter 62 transmits data generated by the processor 61 on the basis of a mode signal Smode. Specifically, in a case where the operation mode indicated by the mode signal Smode is the operation mode MA (single-phase mode), the transmitter 62 transmits data generated by the processor 61 by using signals SIG1 to SIG4. Furthermore, in a case where the operation mode indicated by the mode signal Smode is the operation mode MB, the transmitter 62 transmits data generated by the processor 61 by using signals SIG1P and SIG1N and signals SIG2P and SIG2N. Moreover, in a case where the operation mode indicated by the mode signal Smode is the operation mode MC, the transmitter 62 transmits data generated by the processor 61 by using signals SIGA, SIGB, and SIGC.

FIG. 39 illustrates a configuration example of the transmitter 62. The transmitter 62 includes transmitting circuit units 62A and 62B and a controller 65. FIG. 40A illustrates a configuration example of the transmitting circuit unit 62A, and FIG. 40B illustrates a configuration example of the transmitting circuit unit 62B. The transmitting circuit unit 62A includes four serializers 28 (serializers 28A, 28B, 28C, and 28D), four encoders 29 (encoders 29A, 29B, 29C, and 29D), four multiplexers 22 (the multiplexers 22A, 22B, 22C, and 22D), four selectors 23 (the selectors 23A, 23B, 23C, and 23D), and two drivers 24 (the drivers 24A and 24B). The transmitting circuit unit 62B includes four serializers 28 (serializers 28E, 28F, 28G, and 28H), four encoders 29 (encoders 29E, 29F, 29G, and 29H), four multiplexers 22 (multiplexers 22E, 22F, 22G, and 22H), four selectors 23 (selectors 23E, 23F, 23G, and 23H), and two drivers 24 (drivers 24C and 24D).

The serializer 28A (FIG. 40A) serializes signals DI10, DI12, DI14, and DI16 on the basis of clock signals P0, P2, P4, and P6, thereby generating a signal S28A, as with the serializer 21A according to the first embodiment. The serializer 28B serializes signals DI20, DI22, DI24, and DI26 on the basis of clock signals P0, P2, P4, and P6, thereby generating a signal S28B, as with the serializer 21B according to the first embodiment. The serializer 28C serializes signals DI11, DI13, DI15, and DI17 on the basis of clock signals P1, P3, P5, and P7, thereby generating a signal S28C, as with the serializer 21C according to the first embodiment. The serializer 28D serializes signals DI21, DI23, DI25, and DI27 on the basis of clock signals P1, P3, P5, and P7, thereby generating a signal S28D, as with the serializer 21D according to the first embodiment. Likewise, serializer 28E (FIG. 40B) serializes signals DI30, DI32, DI34, and DI36 on the basis of clock signals P0, P2, P4, and P6, thereby generating a signal S28E. The serializer 28F serializes signals DI40, DI42, DI44, and DI46 on the basis of clock signals P0, P2, P4, and P6, thereby generating a signal S28F. The serializer 28G serializes signals DI31, DI33, DI35, and DI37 on the basis of clock signals P1, P3, P5, and P7, thereby generating a signal S28G. The serializer 28H serializes signals DI41, DI43, DI45, and DI47 on the basis of clock signals P1, P3, P5, and P7, thereby generating a signal S28H. The serializers 28A to 28H have the same configuration as the serializer 21A (FIG. 3) according to the first embodiment.

FIG. 41 illustrates respective signal paths of the signals S28A to S28H generated by the serializers 28A to 28H. The serializer 28A supplies the signal S28A to the encoders 29A and 29B. The serializer 28B supplies the signal S28B to the encoders 29B and 29E. The serializer 28C supplies the signal S28C to the encoders 29C and 29D. The serializer 28D supplies the signal S28D to the encoders 29D and 29G. The serializer 28E supplies the signal S28E to the encoders 29A and 29E. The serializer 28F supplies the signal S28F to the encoder 29F. The serializer 28G supplies the signal S28G to the encoders 29C and 29G. The serializer 28H supplies the signal S28H to the encoder 29H.

The encoder 29A (FIG. 40A) generates signals S29AP and S29AN on the basis of the signals S28A and S28E and a signal EN. The encoder 29A has input terminals in1, in2, and CEN and output terminals out1 and out2. The input terminal in1 of the encoder 29A is supplied with the signal S28A, and the input terminal in2 is supplied with the signal S28E, and the input terminal CEN is supplied with the signal EN. The signal EN is a signal that becomes low level "0" in the operation modes MA and MB, and becomes high level "1" in the operation mode MC. Then, the encoder 29A outputs the signal S29AP from the output terminal out1, and outputs the signal S29AN from the output terminal out2.

Likewise, the encoder 29B generates signals S29BP and S29BN on the basis of the signals S28B and S28A and a signal EN. The encoder 29C generates signals S29CP and S29CN on the basis of the signals S28C and S28G and a signal EN. The encoder 29D generates signals S29DP and S29DN on the basis of the signals S28D and S28C and a signal EN. The encoder 29E (FIG. 40B) generates signals S29EP and S29EN on the basis of the signals S28E and S28B and a signal EN. The encoder 29F generates signals S29FP and S29FN on the basis of the signal S28F and a signal EN. The encoder 29G generates signals S29GP and S29GN on the basis of the signals S28G and S28D and a signal EN. The encoder 29H generates signals S29HP and S29HN on the basis of the signal S28H and a signal EN.

FIG. 42 illustrates a configuration example of the encoder 29. The encoder 29 includes a selector 201, an exclusive OR circuit (EX-OR) 202, and AND circuits (ANDs) 203 and 204. The selector 201 selects an inverted signal of a signal at the input terminal in1 in a case where the signal EN at the input terminal CEN is low level, and selects a signal at the input terminal in2 in a case where the signal EN at the input terminal CEN is high level, and outputs the selected signal. The exclusive OR circuit 202 finds an exclusive logical sum of the signal at the input terminal in1 and the output signal of the selector 201, and outputs its result. The AND circuit 203 finds a logical product of the signal at the input terminal in1 and the output signal of the exclusive OR circuit 202, and outputs its result from the output terminal out1. The AND circuit 204 finds a logical product of the output signal of the selector 201 and the output signal of the exclusive OR circuit 202, and outputs its result from the output terminal out2.

FIG. 43 illustrates an operation example of the encoder 29. In the operation modes MA and MB, the signal EN at the input terminal CEN becomes low level "0". In this case, the encoder 29 outputs the same signal as the signal at the input terminal in1 from the output terminal out1, and outputs an inverted signal of the signal at the input terminal in1 from the output terminal out2. On the other hand, in the operation mode MC, the signal EN at the input terminal CEN becomes high level "1". In this case, in a case where the signals at the input terminals in1 and in2 are "1" and "0", respectively, the encoder 29 sets the signals at the output terminals out1 and out2 to "1" and "0", respectively; in a case where the signals at the input terminals in1 and in2 are "0" and "1", respectively, the encoder 29 sets the signals at the output terminals out1 and out2 to "0" and "1", respectively; and in a case where the signals at the input terminals in1 and in2 are equal to each other, the encoder 29 sets both of the signals at the output terminals out1 and out2 to "0".

It is to be noted that in this example, the encoder 29 is configured as illustrated in FIG. 42; however, it is not limited to this. For example, an encoder (an encoder 127) may be configured as illustrated in FIG. 44. This encoder 127 includes an OR circuit 221, inverted AND circuits 222 and 223, and AND circuits 224 and 225. The OR circuit 221 finds a logical sum of an inverted signal of the signal EN at the input terminal CEN and the signal at the input terminal in2, and outputs its result. The inverted AND circuit 222 finds an inverted logical product of the signal at the input terminal in1, the signal EN at the input terminal CEN, and the output signal of the OR circuit 221, and outputs its result. The inverted AND circuit 223 finds an inverted logical product of the signal at the input terminal in1 and the output signal of the OR circuit 221, and outputs its result. The AND circuit 224 finds a logical product of the signal at the input terminal in1 and the output signal of the inverted AND circuit 222, and outputs its result from the output terminal out1. The AND circuit 225 finds a logical product of the output signal of the OR circuit 221 and the output signal of the inverted AND circuit 223, and outputs its result from the output terminal out2. The operation of this encoder 127 is the same as the operation of the encoder 29 (FIG. 43).

The multiplexer 22A (FIG. 40A) alternately selects one of the signals S29AP and S29CP on the basis of a clock signal CLK, and outputs the selected signal as a signal S22A, as with the multiplexer 22A according to the first embodiment. The multiplexer 22B alternately selects one of the signals S29AN and S29CN on the basis of a clock signal CLK, and outputs the selected signal as a signal S22B, as with the multiplexer 22B according to the first embodiment. The multiplexer 22C alternately selects one of the signals S29BP and S29DP on the basis of a clock signal CLK, and outputs the selected signal as a signal S22C, as with the multiplexer 22C according to the first embodiment. The multiplexer 22D alternately selects one of the signals S29BN and S29DN on the basis of a clock signal CLK, and outputs the selected signal as a signal S22D, as with the multiplexer 22D according to the first embodiment. Likewise, the multiplexer 22E (FIG. 40B) alternately selects one of the signals S29EP and S29GP on the basis of a clock signal CLK, and outputs the selected signal as a signal S22E. The multiplexer 22F alternately selects one of the signals S29EN and S29GN on the basis of a clock signal CLK, and outputs the selected signal as a signal S22F. The multiplexer 22G alternately selects one of the signals S29FP and S29HP on the basis of a clock signal CLK, and outputs the selected signal as a signal S22G. The multiplexer 22H alternately selects one of the signals S29FN and S29HN on the basis of a clock signal CLK, and outputs the selected signal as a signal S22H.

On the basis of a signal Ssel, the selector 23A (FIG. 40A) selects the signal S22A in a case where the operation mode is the operation mode MA (single-phase mode) or the operation mode MC (three-phase mode), or selects the signal S22D in a case where the operation mode is the operation mode MB (differential mode), and outputs the selected signal as a signal S23A, as with the selector 23A according to the first embodiment. On the basis of a signal Ssel, the selector 23B selects the signal S22B in a case where the operation mode is the operation mode MA or the operation mode MC, or selects the signal S22C in a case where the operation mode is the operation mode MB, and outputs the selected signal as a signal S23B, as with the selector 23B according to the first embodiment. On the basis of a signal Ssel, the selector 23C selects the signal S22C in a case where the operation mode is the operation mode MA or the operation mode MC, or selects the signal S22B in a case where the operation mode is the operation mode MB, and outputs the selected signal as a signal S23C, as with the selector 23C according to the first embodiment. On the basis of a signal Ssel, the selector 23D selects the signal S22D in a case where the operation mode is the operation mode MA or the operation mode MC, or selects the signal S22A in a case where the operation mode is the operation mode MB, and outputs the selected signal as a signal S23D, as with the selector 23D according to the first embodiment. Likewise, on the basis of a signal Ssel, the selector 23E (FIG. 40B) selects the signal S22E in a case where the operation mode is the operation mode MA or the operation mode MC, or selects the signal S22H in a case where the operation mode is the operation mode MB, and outputs the selected signal as a signal S23E. On the basis of a signal Ssel, the selector 23F selects the signal S22F in a case where the operation mode is the operation mode MA or the operation mode MC, or selects the signal S22G in a case where the operation mode is the operation mode MB, and outputs the selected signal as a signal S23F. On the basis of a signal Ssel, the selector 23G selects the signal S22G in a case where the operation mode is the operation mode MA or the operation mode MC, or selects the signal S22F in a case where the operation mode is the operation mode MB, and outputs the selected signal as a signal S23G. On the basis of a signal Ssel, the selector 23H selects the signal S22H in a case where the operation mode is the operation mode MA or the operation mode MC, or selects the signal S22E in a case where the operation mode is the operation mode MB, and outputs the selected signal as a signal S23H.

The driver 24A (FIG. 40A) sets a voltage at the output terminal Tout1 on the basis of the signals S22A, S22B, S23A, and S23B and a signal CTL, as with the driver 24A according to the first embodiment. The driver 24B sets a voltage at the output terminal Tout2 on the basis of the signals S23C, S23D, S22C, and S22D and the signal CTL, as with the driver 24B according to the first embodiment. Likewise, the driver 24C (FIG. 40B) sets a voltage at the output terminal Tout3 on the basis of the signals S22E, S22F, S23E, and S23F and a signal CTL. The driver 24D sets a voltage at the output terminal Tout4 on the basis of the signals S23G, S23H, S22G, and S22H and the signal CTL.

The drivers 24C and 24D have the same configuration as the drivers 24A and 24B (FIG. 8). The driver 24C includes M sub-drivers CA (sub-drivers CA1 to CAM) and N sub-drivers CB (sub-drivers CB1 to CBN). The driver 24D includes M sub-drivers DA (sub-drivers DA1 to DAM) and N sub-drivers DB (sub-drivers DB1 to DBN).

In the driver 24C, in each of the sub-drivers CA1 to CAM, the gate of the transistor 92 is supplied with the signal S22E, and the drain is coupled to the other end of the resistance element 91, and the source is coupled to the drain of the transistor 93 and the output terminal Tout3. The gate of the transistor 93 is supplied with the signal S22F, and the drain is coupled to the source of the transistor 92 and the output terminal Tout3, and the source is coupled to one end of the resistance element 94. Furthermore, in each of the sub-drivers CB1 to CBN, the gate of the transistor 92 is supplied with the signal S23E, and the drain is coupled to the other end of the resistance element 91, and the source is coupled to the drain of the transistor 93 and the output terminal Tout3. The gate of the transistor 93 is supplied with the signal S23F, and the drain is coupled to the source of the transistor 92 and the output terminal Tout3, and the source is coupled to one end of the resistance element 94.

In the driver 24D, in each of the sub-drivers DA1 to DAM, the gate of the transistor 92 is supplied with the signal S23G, and the drain is coupled to the other end of the resistance element 91, and the source is coupled to the drain of the transistor 93 and the output terminal Tout4. The gate of the transistor 93 is supplied with the signal S23H, and the drain is coupled to the source of the transistor 92 and the output terminal Tout4, and the source is coupled to one end of the resistance element 94. Furthermore, in each of the sub-drivers DB1 to DBN, the gate of the transistor 92 is supplied with the signal S22G, and the drain is coupled to the other end of the resistance element 91, and the source is coupled to the drain of the transistor 93 and the output terminal Tout4. The gate of the transistor 93 is supplied with the signal S22H, and the drain is coupled to the source of the transistor 92 and the output terminal Tout4, and the source is coupled to one end of the resistance element 94.

With this configuration, for example, in a case where in the operation mode MC, the signals S22A and S22B are both set to low level, the signals S23A and 23B both become low level. Therefore, the transistors 92 and 93 in the sub-drivers AA1 to AAM and AB1 to ABN of the driver 24A go into off state. As a result, the driver 24A sets the output impedance to high impedance.

The controller 65 (FIG. 39) generates clock signals P0 to P7 and CLK and signals EN, Ssel, and CTL on the basis of a mode signal Smode supplied from the processor 61.

(Receiving Device 130)

The receiving device 130 includes receivers 131 to 134 and a processor 135 as illustrated in FIG. 37A. The receiver 131 receives a signal SIG1; the receiver 132 receives a signal SIG2; the receiver 133 receives a signal SIG3; and the receiver 134 receives a signal SIG4. The receivers 131 to 134 have the same configuration as the receiver 31 (FIG. 9) according to the first embodiment. The processor 135 performs a predetermined process on the basis of received results of the receivers 131 to 134.

(Receiving Device 140)

The receiving device 140 includes receivers 141 and 142 and a processor 143 as illustrated in FIG. 37B. The receiver 141 receives signals SIG1P and SIG1N; and the receiver 142 receives signals SIG2P and SIG2N. The receivers 141 and 142 have the same configuration as the receiver 41 (FIG. 10) according to the first embodiment. The processor 143 performs a predetermined process on the basis of received results of the receivers 141 and 142.

(Receiving Device 150)

The receiving device 150 includes a receiver 151 and a processor 152 as illustrated in FIG. 37C.

The receiver 151 receives signals SIGA, SIGB, and SIGC.

FIG. 45 illustrates a configuration example of the receiver 151. The receiver 151 includes resistance elements 154 to 156 and amplifiers 157 to 159.

The resistance elements 154 to 156 serve as a terminating resistance in the communication system 2C. One end of the resistance element 154 is coupled to the input terminal TinA, a positive input terminal of the amplifier 157, and a negative input terminal of the amplifier 159, and the other end is coupled to the other ends of the resistance elements 155 and 156. One end of the resistance element 155 is coupled to the input terminal TinB, a positive input terminal of the amplifier 158, and a negative input terminal of the amplifier 157, and the other end is coupled to the other ends of the resistance elements 154 and 156. One end of the resistance element 156 is coupled to the input terminal TinC, a positive input terminal of the amplifier 159, and a negative input terminal of the amplifier 158, and the other end is coupled to the other ends of the resistance elements 154 and 155. Respective resistance values of the resistance elements 154 to 156 are about 50[Ω] in this example.

The positive input terminal of the amplifier 157 is coupled to the negative input terminal of the amplifier 159, one end of the resistance element 154, and the input terminal TinA, and the negative input terminal is coupled to the positive input terminal of the amplifier 158, one end of the resistance element 155, and the input terminal TinB. The positive input terminal of the amplifier 158 is coupled to the negative input terminal of the amplifier 157, one end of the resistance element 155, and the input terminal TinB, and the negative input terminal is coupled to the positive input terminal of the amplifier 159, one end of the resistance element 156, and the input terminal TinC. The positive input terminal of the amplifier 159 is coupled to the negative input terminal of the amplifier 158, one end of the resistance element 156, and the input terminal TinC, and the negative input terminal is coupled to the positive input terminal of the amplifier 157, one end of the resistance element 154, and the input terminal TinA. Further, the amplifiers 157 to 159 supply their output signal to the processor 152.

FIG. 46 illustrates an operation example of the receiver 151. In this example, a signal SIGA is the high-level voltage VH, and a signal SIGB is the low-level voltage VL. In this case, a current Iin flows into the input terminal TinA, the resistance element 154, the resistance element 155, and the input terminal TinB in this order. As a result, a signal SIGC at the input terminal TinC becomes the medium-level voltage VM. Further, the positive input terminal of the amplifier 157 is supplied the high-level voltage VH, and the negative input terminal is supplied the low-level voltage VL, and then the amplifier 157 outputs "1". Furthermore, the positive input terminal of the amplifier 158 is supplied the low-level voltage VL, and the negative input terminal is supplied the medium-level voltage VM, and then the amplifier 158 outputs "0". Moreover, the positive input terminal of the amplifier 159 is supplied the medium-level voltage VM, and the negative input terminal is supplied the high-level voltage VH, and then the amplifier 159 outputs "0".

The processor 152 performs a predetermined process on the basis of a received result of the receiver 151.

Here, the plurality of encoders 29A to 29H correspond to a specific example of an "encoder unit" in the present disclosure. The plurality of serializers 28A to 28H correspond to a specific example of the "serializer unit" in the present disclosure. The operation mode MC corresponds to a specific example of a "third operation mode" in the present disclosure.

(Operation Mode MA)

In a case where the transmitting device 60 is applied to the communication system 2A (FIG. 37A), the transmitting device 60 operates in the operation mode MA (single-phase mode). In the operation mode MA, the transmitting device 60 transmits data to the receiving device 130 by using signals SIG1 to SIG4.

The processor 61 generates signals DI10 to DI17, DI20 to DI27, DI30 to DI37, and DI40 to DI47. Here, for example, the signal DI10 includes signals DI10P and DI10N. Further, the processor 61 supplies the signals DI10, DI12, DI14, and DI16 to the serializer 28A and the signals DI11, DI13, DI15, and DI17 to the serializer 28C. Furthermore, the processor 61 supplies the signals DI20, DI22, DI24, and DI26 to the serializer 28B and the signals DI21, DI23, DI25, and DI27 to the serializer 28D. Moreover, the processor 61 supplies the signals DI30, DI32, DI34, and DI36 to the serializer 28E and the signals DI31, DI33, DI35, and DI37 to the serializer 28G. Furthermore, the processor 61 supplies the signals DI40, DI42, DI44, and DI46 to the serializer 28F and the signals DI41, DI43, DI45, and DI47 to the serializer 28H. The operations of the serializers 28A to 28H are the same as in the case of the first embodiment.

In the operation mode MA, the controller 65 sets a signal EN to low-level "0" on the basis of a mode signal Smode. Accordingly, as illustrated in FIG. 43, each encoder 29 outputs the same signal as a signal at the input terminal in1 from the output terminal out1, and outputs an inverted signal of the signal at the input terminal in1 from the output terminal out2. Specifically, for example, the encoder 29A outputs the same signal as the signal S28A as a signal S29AP, and outputs an inverted signal of the signal S28A as a signal S29AN. The same applies to the encoders 29B to 29H. The operations of the multiplexers 22A to 22H, the selectors 23A to 23H, and the drivers 24A to 24D are the same as in the case of the first embodiment.

In this way, in the operation mode MA, the transmitting device 60 transmits data to the receiving device 130 by using signals SIG1 to SIG4, as with the transmitting device 10 according to the first embodiment.

(Operation Mode MB)

In a case where the transmitting device 60 is applied to the communication system 2B (FIG. 37B), the transmitting device 60 operates in the operation mode MB (differential mode). In the operation mode MB, the transmitting device 60 transmits data to the receiving device 140 by using signals SIG1P and SIG1N and signals SIG2P and SIG2N.

In the same manner as in the operation mode MA, the processor 61 generates signals DI10 to DI17, DI20 to DI27, DI30 to DI37, and DI40 to DI47, and supplies these signals to the serializers 28A to 28H. The operations of the serializers 28A to 28H are the same as in the case of the first embodiment.

In the operation mode MB, the controller 65 sets a signal EN to low-level "0" on the basis of a mode signal Smode. Accordingly, as illustrated in FIG. 43, each encoder 29 outputs the same signal as a signal at the input terminal in1 from the output terminal out1, and outputs an inverted signal of the signal at the input terminal in1 from the output terminal out2. Specifically, for example, the encoder 29A outputs the same signal as the signal S28A as a signal S29AP, and outputs an inverted signal of the signal S28A as a signal S29AN. The same applies to the encoders 29B to 29H. The operations of the multiplexers 22A to 22H, the selectors 23A to 23H, and the drivers 24A to 24D are the same as in the case of the first embodiment.

In this way, in the operation mode MB, the transmitting device 60 transmits data to the receiving device 140 by using signals SIG1P and SIG1N and signals SIG2P and SIG2N, as with the transmitting device 10 according to the first embodiment.

(Operation Mode MC)

In a case where the transmitting device 60 is applied to the communication system 2C (FIG. 37C), the transmitting device 60 operates in the operation mode MC (three-phase mode). In the operation mode MC, the transmitting device 60 transmits data to the receiving device 150 by using signals SIGA to SIGC.

In the operation mode MC, the processor 61 generates signals DI10 to DI17, DI20 to DI27, and DI30 to DI37. Here, for example, the signal DI10 includes signals DI10P and DI10N. Further, the processor 61 supplies the signals DI10, DI12, DI14, and DI16 to the serializer 28A and the signals DI11, DI13, DI15, and DI17 to the serializer 28C. Furthermore, the processor 61 supplies the signals DI20, DI22, DI24, and DI26 to the serializer 28B and the signals DI21, DI23, DI25, and DI27 to the serializer 28D. Moreover, the processor 61 supplies the signals DI30, DI32, DI34, and DI36 to the serializer 28E and the signals DI31, DI33, DI35, and DI37 to the serializer 28G. The operations of the serializers 28A to 28H are the same as in the case of the operation modes MA and MB.

In the operation mode MC, the controller 65 sets a signal EN to high-level "1" on the basis of a mode signal Smode. Accordingly, each encoder 29 operates as illustrated in FIG. 43. Specifically, for example, in a case where the signals S28A and S28E are "1" and "0", respectively, the encoder 29A sets the signal S29AP to "1" and the signal S29AN to "0"; in a case where the signals S28A and S28E are "0" and "1", respectively, the encoder 29A sets the signal S29AP to "0" and the signal S29AN to "1"; and in a case where the signals S28A and S28E are equal to each other, the encoder 29A sets both of the signals S29AP and S29AN to "0". The same applies to the encoders 29B to 29H.

FIGS. 47A and 47B illustrate the flow of signals in the operation mode MC. In FIG. 47A, bold solid lines indicate the flow of signals related to a signal SIGA, and bold dashed lines indicate the flow of signals related to a signal SIGB. In FIG. 47B, bold dashed-dotted lines indicate the flow of signals related to a signal SIGC.

The multiplexer 22A (FIG. 47A) alternately selects one of the signals S29AP and S29CP on the basis of a clock signal CLK, and outputs the selected signal as a signal S22A. The multiplexer 22B alternately selects one of the signals S29AN and S29CN on the basis of a clock signal CLK, and outputs the selected signal as a signal S22B. On the basis of a signal Ssel, the selector 23A selects the signal S22A in the operation mode MC, and outputs the selected signal S22A as a signal S23A. On the basis of a signal Ssel, the selector 23B selects the signal S22B in the operation mode MC, and outputs the selected signal S22B as a signal S23B. As a result, the driver 24A operates on the basis of the signals S22A and S22B.

Likewise, the multiplexer 22C alternately selects one of the signals S29BP and S29DP on the basis of a clock signal CLK, and outputs the selected signal as a signal S22C. The multiplexer 22D alternately selects one of the signals S29BN and S29DN on the basis of a clock signal CLK, and outputs the selected signal as a signal S22D. On the basis of a signal Ssel, the selector 23C selects the signal S22C in the operation mode MC, and outputs the selected signal S22C as a signal S23C. On the basis of a signal Ssel, the selector 23D selects the signal S22D in the operation mode MC, and outputs the selected signal S22D as a signal S23D. As a result, the driver 24B operates on the basis of the signals S22C and S22D.

Likewise, the multiplexer 22E (FIG. 47B) alternately selects one of the signals S29EP and S29GP on the basis of a clock signal CLK, and outputs the selected signal as a signal S22E. The multiplexer 22F alternately selects one of the signals S29EN and S29GN on the basis of a clock signal CLK, and outputs the selected signal as a signal S22F. On the basis of a signal Ssel, the selector 23E selects the signal S22E in the operation mode MC, and outputs the selected signal S22E as a signal S23E. On the basis of a signal Ssel, the selector 23F selects the signal S22F in the operation mode MC, and outputs the selected signal S22F as a signal S23F. As a result, the driver 24C operates on the basis of the signals S22E and S22F.

FIG. 48 illustrates an operation example of the transmitter 62 in the operation mode MC. FIGS. 49A and 49B illustrate the flow of signals in a certain operation state in the operation mode MC. In examples of FIGS. 49A and 49B, the multiplexer 22A selects the signal S29AP; the multiplexer 22B selects the signal S29AN; the multiplexer 22C selects the signal S29BP; the multiplexer 22D selects the signal S29BN; the multiplexer 22E selects the signal S29EP; and the multiplexer 22F selects the signal S29EN.

The encoder 29A (FIG. 49A) generates signals S29AP and S29AN on the basis of the signals S28A and S28E and a signal EN. The encoder 29B generates signals S29BP and S29BN on the basis of the signals S28B and S28A and a signal EN. The encoder 29E (FIG. 49B) generates signals S29EP and S29EN on the basis of the signals S28E and S28B and a signal EN.

For example, in a case where the signals S28A, S28B, and S28E are "1", "0", and "0", respectively, as illustrated in FIG. 43, the encoder 29A sets the signals S29AP and S29AN to "1" and "0", respectively; the encoder 29B sets the signals S29BP and S29BN to "0" and "1", respectively; and the encoder 29E sets the signals S29EP and S29EN to "0" and "0", respectively. As a result, as illustrated in FIG. 48, the output signal S22A of the multiplexer 22A becomes "1"; the output signal S22B of the multiplexer 22B becomes "0"; the output signal S22C of the multiplexer 22C becomes "0"; the output signal S22D of the multiplexer 22D becomes "1"; the output signal S22E of the multiplexer 22E becomes "0"; and the output signal S22F of the multiplexer 22F becomes "0".

At this time, in the driver 24A (FIG. 49A), the transistors 92 in the sub-drivers AA1 to AAM and AB1 to ABN go into on state, and the transistors 93 in the sub-drivers AA1 to AAM and AB1 to ABN go into off state. As a result, the driver 24A sets the voltage at the output terminal Tout1 to the high-level voltage VH and the output impedance to about 50[Ω].

Furthermore, in the driver 24B, the transistors 93 in the sub-drivers BA1 to BAM and BB1 to BBN go into on state, and the transistors 92 in the sub-drivers BA1 to BAM and BB1 to BBN go into off state. As a result, the driver 24B sets the voltage at the output terminal Tout2 to the low-level voltage VL and the output impedance to about 50[Ω].

Moreover, in the driver 24C (FIG. 49B), the transistors 92 and 93 in the sub-drivers CA1 to CAM and CB1 to CBN go into off state. As a result, the driver 24C sets the output impedance to high impedance. At this time, in the receiver 151 of the receiving device 150, the voltage at the input terminal TinC becomes the medium-level voltage VM as illustrated in FIG. 46.

In this way, the transmitter 62 sets the signal SIGA to the high-level voltage VH, the signal SIGB to the low-level voltage VL, and the signal SIGC to the medium-level voltage VM. As a result, the transmitting device 60 transmits the symbol "+x" to the receiving device 150. It is to be noted that the in this example, there is described a case where the transmitting device 60 transmits the symbol "+x"; however, the same applies to a case of transmitting other symbols.

In this way, in the operation mode MC, the transmitting device 60 transmits data to the receiving device 150 by using signals SIGA, SIGB, and SIGC.

As described above, in the present embodiment, the three operation modes MA, MB, and MC are provided, which makes it possible to transmit data to a receiving device by using a single-phase signal, a differential signal, or a three-phase signal; therefore, it is possible to implement various interfaces.

Modification Example 2-1

In the above-described embodiment, the encoders 29 are provided in the preceding stage of the multiplexers 22; however, it is not limited to this. Instead of this, for example, encoders may be provided in the subsequent stage of the multiplexers 22. This modification example is described in detail below.

FIGS. 50A and 50B illustrate respective configuration examples of transmitting circuit units 63A and 63B of a transmitter 63 according to the present modification example. The transmitting circuit unit 63A includes four serializers 21 (the serializers 21A, 21B, 21C, and 21D), four multiplexers 22 (the multiplexers 22A, 22B, 22C, and 22D), four encoders 64 (encoders 64A, 64B, 64C, and 64D), four selectors 23 (the selectors 23A, 23B, 23C, and 23D), and two drivers 24 (the drivers 24A and 24B). The transmitting circuit unit 63B includes four serializers 21 (serializers 21E, 21F, 21G, and 21H), four multiplexers 22 (the multiplexers 22E, 22F, 22G, and 22H), four encoders 64 (encoders 64E, 64F, 64G, and 64H), four selectors 23 (the selectors 23E, 23F, 23G, and 23H), and two drivers 24 (the drivers 24C and 24D).

FIG. 51 illustrates respective signal paths of signals S22A to S22H generated by the multiplexers 22A to 22H. The multiplexer 22A supplies the signal S22A to the encoders 64A and 64C. The multiplexer 22B supplies the signal S22B to the encoders 64B and 64D. The multiplexer 22C supplies the signal S22C to the encoders 64C and 64E. The multiplexer 22D supplies the signal S22D to the encoders 64D and 64F. The multiplexer 22E supplies the signal S22E to the encoders 64A and 64E. The multiplexer 22F supplies the signal S22F to the encoders 64B and 64F. The multiplexer 22G supplies the signal S22G to the encoder 64G. The multiplexer 22H supplies the signal S22H to the encoder 64H.

The encoder 64A (FIG. 50A) generates a signal S64A on the basis of the signals S22A and S22E and a signal EN. The encoder 64A has the input terminals in1, in2, and CEN and the output terminal out1. The input terminal in1 of the encoder 64A is supplied with the signal S22A, and the input terminal in2 is supplied with the signal S22E, and the input terminal CEN is supplied with the signal EN. Then, the encoder 64A outputs the signal S64A from the output terminal out1.

Likewise, the encoder 64B generates a signal S64B on the basis of the signals S22B and S22F and a signal EN. The encoder 64C generates a signal S64C on the basis of the signals S22C and S22A and a signal EN. The encoder 64D generates a signal S64D on the basis of the signals S22D and S22B and a signal EN. The encoder 64E (FIG. 50B) generates a signal S64E on the basis of the signals S22E and S22C and a signal EN. The encoder 64F generates a signal S64F on the basis of the signals S22F and S22D and a signal EN. The encoder 64G generates a signal S64G on the basis of the signal S22G and a signal EN. The encoder 64H generates a signal S64H on the basis of the signal S22H and a signal EN.

FIG. 52 illustrates a configuration example of the encoder 64. The encoder 64 includes a selector 205, an exclusive OR circuit 206, and an AND circuit 207. The selector 205 selects an inverted signal of a signal at the input terminal in1 in a case where the signal EN at the input terminal CEN is low level, and selects a signal at the input terminal in2 in a case where the signal EN at the input terminal CEN is high level, and outputs the selected signal. The exclusive OR circuit 206 finds an exclusive logical sum of the signal at the input terminal in1 and the output signal of the selector 205, and outputs its result. The AND circuit 207 finds a logical product of the signal at the input terminal in1 and the output signal of the exclusive OR circuit 206, and outputs its result from the output terminal out1.

FIG. 53 illustrates an operation example of the encoder 64. In the operation modes MA and MB, the signal EN at the input terminal CEN becomes low level "0". In this case, the encoder 64 outputs the same signal as the signal at the input terminal in1 from the output terminal out1. On the other hand, in the operation mode MC, the signal EN at the input terminal CEN becomes high level "1". In this case, in a case where the signals at the input terminals in1 and in2 are "1" and "0", respectively, the encoder 64 sets the signals at the output terminal out1 to high level "1"; in other cases, the encoder 64 sets the signal at the output terminal out1 to low level "0".

It is to be noted that in this example, the encoder 64 is configured as illustrated in FIG. 52; however, it is not limited to this. For example, an encoder (an encoder 129) may be configured as illustrated in FIG. 54. This encoder 129 includes an inverted AND circuit 226 and an AND circuit 227. The inverted AND circuit 226 finds an inverted logical product of the signal at the input terminal in1, the signal EN at the input terminal CEN, and the signal at the input terminal in2, and outputs its result. The AND circuit 227 finds a logical product of the signal at the input terminal in1 and the output signal of the inverted AND circuit 226, and outputs its result from the output terminal out1. The operation of this encoder 127 is the same as the operation of the encoder 64 (FIG. 53).

Here, the encoders 64A to 64H correspond to a specific example of the "encoder unit" in the present disclosure.

On the basis of a signal Ssel, the selector 23A (FIG. 50A) selects the signal S64A in a case where the operation mode is the operation mode MA (single-phase mode) or the operation mode MC (three-phase mode), or selects the signal S64D in a case where the operation mode is the operation mode MB (differential mode), and outputs the selected signal as a signal S23A. On the basis of a signal Ssel, the selector 23B selects the signal S64B in a case where the operation mode is the operation mode MA or the operation mode MC, or selects the signal S64C in a case where the operation mode is the operation mode MB, and outputs the selected signal as a signal S23B. On the basis of a signal Ssel, the selector 23C selects the signal S64C in a case where the operation mode is the operation mode MA or the operation mode MC, or selects the signal S64B in a case where the operation mode is the operation mode MB, and outputs the selected signal as a signal S23C. On the basis of a signal Ssel, the selector 23D selects the signal S64D in a case where the operation mode is the operation mode MA or the operation mode MC, or selects the signal S64A in a case where the operation mode is the operation mode MB, and outputs the selected signal as a signal S23D. On the basis of a signal Ssel, the selector 23E (FIG. 50B) selects the signal S64E in a case where the operation mode is the operation mode MA or the operation mode MC, or selects the signal S64H in a case where the operation mode is the operation mode MB, and outputs the selected signal as a signal S23E. On the basis of a signal Ssel, the selector 23F selects the signal S64F in a case where the operation mode is the operation mode MA or the operation mode MC, or selects the signal S64G in a case where the operation mode is the operation mode MB, and outputs the selected signal as a signal S23F. On the basis of a signal Ssel, the selector 23G selects the signal S64G in a case where the operation mode is the operation mode MA or the operation mode MC, or selects the signal S64F in a case where the operation mode is the operation mode MB, and outputs the selected signal as a signal S23G. On the basis of a signal Ssel, the selector 23H selects the signal S64H in a case where the operation mode is the operation mode MA or the operation mode MC, or selects the signal S64E in a case where the operation mode is the operation mode MB, and outputs the selected signal as a signal S23H.

The driver 24A (FIG. 50A) sets a voltage at the output terminal Tout1 on the basis of the signals S64A, S64B, S23A, and S23B and a signal CTL. The driver 24B sets a voltage at the output terminal Tout2 on the basis of the signals S23C, S23D, S64C, and S64D and a signal CTL. The driver 24C (FIG. 50B) sets a voltage at the output terminal Tout3 on the basis of the signals S64E, S64F, S23E, and S23F and a signal CTL. The driver 24D sets a voltage at the output terminal Tout4 on the basis of the signals S23G, S23H, S64G, and S64H and a signal CTL.

For example, in a case where the signals S22A, S22B, S22C, S22D, S22E, and S22F are "1", "0", "0", "1", "0", and "1", respectively, as illustrated in FIG. 53, the encoder 64A sets the signal S64A to "1"; the encoder 64B sets the signal S64B to "0"; the encoder 64C sets the signal S64C to "0"; the encoder 64D sets the signal S64D to "1"; the encoder 64E sets the signal S64E to "0"; and the encoder 64F sets the signal S64F to "0".

At this time, in the driver 24A (FIG. 50A), the transistors 92 in the sub-drivers AA1 to AAM and AB1 to ABN go into on state, and the transistors 93 in the sub-drivers AA1 to AAM and AB1 to ABN go into off state. As a result, the driver 24A sets the voltage at the output terminal Tout1 to the high-level voltage VH and the output impedance to about 50[Ω].

Furthermore, in the driver 24B, the transistors 93 in the sub-drivers BA1 to AAM and BB1 to BBN go into on state, and the transistors 92 in the sub-drivers BA1 to BAM and BB1 to BBN go into off state. As a result, the driver 24B sets the voltage at the output terminal Tout2 to the low-level voltage VL and the output impedance to about 50[Ω].

Moreover, in the driver 24C (FIG. 50B), the transistors 92 and 93 in the sub-drivers CA1 to CAM and CB1 to CBN go into off state. As a result, the driver 24C sets the output impedance to high impedance. At this time, in the receiver 151 of the receiving device 150, the voltage at the input terminal TinC becomes the medium-level voltage VM as illustrated in FIG. 46.

Modification Example 2-2

In the above-described embodiment, the serializers 28A to 28H having the same configuration as those in FIG. 3 are used; however, it is not limited to this. A modification example is described in detail below.

FIG. 55 illustrates a configuration example of a transmitter 67 according to the present modification example. The transmitter 67 includes transmitting circuit units 67A and 67B and the controller 65. FIG. 56A illustrates a configuration example of the transmitting circuit unit 67A, and FIG. 56B illustrates a configuration example of the transmitting circuit unit 67B. The transmitting circuit unit 67A includes four serializers 68 (serializers 68A, 68B, 68C, and 68D), four encoders 29 (the encoders 29A, 29B, 29C, and 29D), four multiplexers 22 (the multiplexers 22A, 22B, 22C, and 22D), four selectors 23 (the selectors 23A, 23B, 23C, and 23D), and two drivers 24 (the drivers 24A and 24B). The transmitting circuit unit 67B includes four serializers 68 (serializers 68E, 68F, 68G, and 68H), four encoders 29 (the encoders 29E, 29F, 29G, and 29H), four multiplexers 22 (the multiplexers 22E, 22F, 22G, and 22H), four selectors 23 (the selectors 23E, 23F, 23G, and 23H), and two drivers 24 (the drivers 24C and 24D).

The serializer 68A (FIG. 56A) generates signals S68AP and S68AN on the basis of clock signals P0, P2, P4, and P6 and signals DI10P, DI10N, DI12P, DI12N, DI14P, DI14N, DI16P, and DI16N. The serializer 68B generates signals S68BP and S68BN on the basis of clock signals P0, P2, P4, and P6 and signals DI20P, DI20N, DI22P, DI22N, DI24P, DI24N, DI26P, and DI26N. The serializer 68C generates signals S68CP and S68CN on the basis of clock signals P1, P3, P5, and P7 and signals DI11P, DI11N, DI13P, DI13N, DI15P, DI15N, DI17P, and DI17N. The serializer 68D generates signals S68DP and S68DN on the basis of clock signals P1, P3, P5, and P7 and signals DI21P, DI21N, DI23P, DI23N, DI25P, DI25N, DI27P, and DI27N. The serializer 68E (FIG. 56B) generates signals S68EP and S68EN on the basis of clock signals P0, P2, P4, and P6 and signals DI30P, DI30N, DI32P, DI32N, DI34P, DI34N, DI36P, and DI36N. The serializer 68F generates signals S68FP and S68FN on the basis of clock signals P0, P2, P4, and P6 and signals DI40P, DI40N, DI42P, DI42N, DI44P, DI44N, DI46P, and DI46N. The serializer 68G generates signals S68GP and S68GN on the basis of clock signals P1, P3, P5, and P7 and signals DI31P, DI31N, DI33P, DI33N, DI35P, DI35N, DI37P, and DI37N. The serializer 68H generates signals S68HP and S68HN on the basis of clock signals P1, P3, P5, and P7 and signals DI41P, DI41N, DI43P, DI43N, DI45P, DI45N, DI47P, and DI47N.

FIG. 57 illustrates a configuration example of the serializer 68A. The serializer 68A includes transistors M1 to M18 and inverted AND circuits 231 to 234. The transistors M1 to M10 and M13 to M16 are N-channel MOS type FETs, and the transistors M11, M12, M17, and M18 are P-channel MOS type FETs. The serializer 68A is the one that the inverted AND circuits 231 to 234 and the transistors M13 to M18 are added to the serializer 21A (FIG. 3).

The inverted AND circuit 231 finds an inverted logical product of the signals DI10P and DI10N, and outputs its result. The inverted AND circuit 232 finds an inverted logical product of the signals DI12P and DI12N, and outputs its result. The inverted AND circuit 233 finds an inverted logical product of the signals DI14P and DI14N, and outputs its result. The inverted AND circuit 234 finds an inverted logical product of the signals DI16P and DI16N, and outputs its result.

A source of the transistor M13 is supplied with the output signal of the inverted AND circuit 231, and a gate is supplied with the clock signal P0, and a drain is coupled to drains of the transistors M14 to M16 and gates of the transistors M17 and M18. A source of the transistor M14 is supplied with the output signal of the inverted AND circuit 232, and a gate is supplied with the clock signal P2, and the drain is coupled to to the drains of the transistors M13, M15, and M16 and the gates of the transistors M17 and M18. A source of the transistor M15 is supplied with the output signal of the inverted AND circuit 233, and a gate is supplied with the clock signal P4, and the drain is coupled to the drains of the transistors M13, M14, and M16 and the gates of the transistors M17 and M18. A source of the transistor M16 is supplied with the output signal of the inverted AND circuit 234, and a gate is supplied with the clock signal P6, and the drain is coupled to the drains of the transistors M13 to M15 and the gates of the transistors M17 and M18. A source of the transistor M17 is supplied with the power supply voltage VDD, and the gate is coupled to the drains of the transistors M13 to M16 and the gate of the transistor M18, and the drain is coupled to the drains of the transistors M9 and M11 and the gate of the transistor M12. A source of the transistor M18 is supplied with the power supply voltage VDD, and the gate is coupled to the drains of the transistors M13 to M16 and the gate of the transistor M17, and the drain is coupled to the drains of the transistors M10 and M12 and the gate of the transistor M11. The serializer 68A outputs the signal S68AP from the drains of the transistors M9, M11, and M17, and outputs the signal S68AN from the drains of the transistors M10, M12, and M18.

With this configuration, for example, in a period in which the clock signal P0 is high level, in a case where the signals DI10P and DI10N are different from each other, the serializer 68A operates as with the serializer 21A; in a case where the signals DI10P and DI10N are both high level, the serializer 68A sets both of the signals S68AP and S68AN to high level. Likewise, in a period in which the clock signal P2 is high level, in a case where the signals DI12P and DI12N are different from each other, the serializer 68A operates as with the serializer 21A; in a case where the signals DI12P and DI12N are both high level, the serializer 68A sets both of the signals S68AP and S68AN to high level. Furthermore, in a period in which the clock signal P4 is high level, in a case where the signals DI14P and DI14N are different from each other, the serializer 68A operates as with the serializer 21A; in a case where the signals DI14P and DI14N are both high level, the serializer 68A sets both of the signals S68AP and S68AN to high level. Moreover, in a period in which the clock signal P6 is high level, in a case where the signals DI16P and DI16N are different from each other, the serializer 68A operates as with the serializer 21A; in a case where the signals DI16P and DI16N are both high level, the serializer 68A sets both of the signals S68AP and S68AN to high level.

In the operation modes MA and MB, the processor 61 generates signals DI10 to DI17, DI20 to DI27, DI30 to DI37, and DI40 to DI47. Here, for example, the signal DI10 includes signals DI10P and DI10N. Further, the processor 61 supplies the signals DI10, DI12, DI14, and DI16 to the serializer 68A and the signals DI11, DI13, DI15, and DI17 to the serializer 68C. Furthermore, the processor 61 supplies the signals DI20, DI22, DI24, and DI26 to the serializer 68B and the signals DI21, DI23, DI25, and DI27 to the serializer 68D. Moreover, the processor 61 supplies the signals DI30, DI32, DI34, and DI36 to the serializer 68E and the signals DI31, DI33, DI35, and DI37 to the serializer 68G. Furthermore, the processor 61 supplies the signals DI40, DI42, DI44, and DI46 to the serializer 68F and the signals DI41, DI43, DI45, and DI47 to the serializer 68H.

Furthermore, in the operation mode MC, the processor 61 generates data D10 to D17, D20 to D27, and D30 to D37. Further, the processor 61 supplies the generated data D10 to D17, D20 to D27, and D30 to D37 to the serializers 68A to 68E and 68G as follows.

FIG. 58 illustrates an operation of supplying the data D10 to D17, D20 to D27, and D30 to D37 generated by the processor 61 to the serializers 68A to 68E and 68G. The processor 61 supplies the data D10, D12, D14, and D16 to the serializer 68A by using signals DI10P, DI12P, DI14P, and DI16P, and also supplies the data D10, D12, D14, and D16 to the serializer 68B by using signals DI20N, DI22N, DI24N, and DI26N. Furthermore, the processor 61 supplies the data D11, D13, D15, and D17 to the serializer 68C by using signals DI11P, DI13P, DI15P, and DI17P, and also supplies the data D11, D13, D15, and D17 to the serializer 68D by using signals DI21N, DI23N, DI25N, and DI27N. Moreover, the processor 61 supplies the data D20, D22, D24, and D26 to the serializer 68B by using signals DI20P, DI22P, DI24P, and DI26P, and also supplies the data D20, D22, D24, and D26 to the serializer 68E by using signals DI30N, DI32N, DI34N, and DI36N. Furthermore, the processor 61 supplies the data D21, D23, D25, and D27 to the serializer 68D by using signals DI21P, DI23P, DI25P, and DI27P, and also supplies the data D21, D23, D25, and D27 to the serializer 68G by using signals DI31N, DI33N, DI35N, and DI37N. Moreover, the processor 61 supplies the data D30, D32, D34, and D36 to the serializer 68E by using signals DI30P, DI32P, DI34P, and DI36P, and also supplies the data D30, D32, D34, and D36 to the serializer 68A by using signals DI10N, DI12N, DI14N, and DI16N. Furthermore, the processor 61 supplies the data D31, D33, D35, and D37 to the serializer 68G by using signals DI31P, DI33P, DI35P, and DI37P, and also supplies the data D31, D33, D35, and D37 to the serializer 68C by using signals DI11N, DI13N, DI15N, and DI17N.

Accordingly, for example, the signals DI10P, DI12P, DI14P, and DI16P and the signals SI10N, DI12N, DI14N, and DI16N that are supplied to the serializer 68A may become uncorrelated signals. Specifically, the signals DI10P and DI10N do not necessarily become signals that are inverted from each other; the signals DI12P and DI12N do not necessarily become signals that are inverted from each other; the signals DI14P and DI14N do not necessarily become signals that are inverted from each other; and the signals DI16P and DI16N do not necessarily become signals that are inverted from each other. The same applies to the serializers 68B to 68H.

The operations of supplying the data D10 to D17, D20 to D27, and D30 to D37 to the serializers 68A to 68E and 68G illustrated in FIG. 58 corresponds to the signal paths (FIG. 41) of the signals S28A to S28H generated by the serializers 28A to 28H. That is, in the above-described embodiment, a three-phase signal is generated by providing the encoders 29A to 29H and modifying the signal paths from the serializers 28A to 28H to the encoders 29A to 29H; however, in the present modification example, a three-phase signal is generated by providing the encoders 29A to 29H and modifying the way to supply data to the serializers 68A to 68H.

The plurality of serializers 68A to 68H here correspond to a specific example of the "serializer unit" in the present disclosure.

The encoder 29A (FIG. 56A) generates signals S29AP and S29AN on the basis of the signals S68AP and S68AN and a signal EN. The input terminal in1 of the encoder 29A is supplied with the signal S68AP, and the input terminal in2 is supplied with the signal S68AN, and the input terminal CEN is supplied with the signal EN. Then, the encoder 29A outputs the signal S29AP from the output terminal out1, and outputs the signal S29AN from the output terminal out2.

Likewise, the encoder 29B generates signals S29BP and S29BN on the basis of the signals S68BP and S68BN and a signal EN. The encoder 29C generates signals S29CP and S29CN on the basis of the signals S68CP and S68CN and a signal EN. The encoder 29D generates signals S29DP and S29DN on the basis of the signals S68DP and S68DN and a signal EN. The encoder 29E (FIG. 56B) generates signals S29EP and S29EN on the basis of the signals S68EP and S68EN and a signal EN. The encoder 29F generates signals S29FP and S29FN on the basis of the signals S68FP and S68FN and a signal EN. The encoder 29G generates signals S29GP and S29GN on the basis of the signals S68GP and S68GN and a signal EN. The encoder 29H generates signals S29HP and S29HN on the basis of the signals S68HP and S68HN and a signal EN.

In the transmitter 67 according to the present modification example, the encoders 29 are provided in the preceding stage of the multiplexers 22; however, it is not limited to this. Instead of this, for example, encoders may be provided in the subsequent stage of the multiplexers 22. A transmitter 69 according to this modification example is described in detail below.

FIGS. 59A and 59B illustrate respective configuration examples of transmitting circuit units 69A and 69B of the transmitter 69 according to the present modification example. The transmitting circuit unit 69A includes four serializers 68 (the serializers 68A, 68B, 68C, and 68D), four multiplexers 22 (the multiplexers 22A, 22B, 22C, and 22D), two encoders 29 (encoders 29A and 29B), four selectors 23 (the selectors 23A, 23B, 23C, and 23D), and two drivers 24 (the drivers 24A and 24B). The transmitting circuit unit 69B includes four serializers 68 (serializers 68E, 68F, 68G, and 68H), four multiplexers 22 (the multiplexers 22E, 22F, 22G, and 22H), two encoders 29 (the encoders 29C and 29D), four selectors 23 (the selectors 23E, 23F, 23G, and 23H), and two drivers 24 (the drivers 24C and 24D).

The encoder 29A (FIG. 59A) generates signals S29AP and S29AN on the basis of the signals S22A and S22B and a signal EN. The encoder 29B generates signals S29BP and S29BN on the basis of the signals S22C and S22D and a signal EN. The encoder 29C (FIG. 59B) generates signals S29CP and S29CN on the basis of the signals S22E and S22F and a signal EN. The encoder 29D generates signals S29DP and S29DN on the basis of the signals S22G and S22H and a signal EN.

On the basis of a signal Ssel, the selector 23A (FIG. 59A) selects the signal S29AP in a case where the operation mode is the operation mode MA (single-phase mode) or the operation mode MC (three-phase mode), or selects the signal S29BN in a case where the operation mode is the operation mode MB (differential mode), and outputs the selected signal as a signal S23A. On the basis of a signal Ssel, the selector 23B selects the signal S29AN in a case where the operation mode is the operation mode MA or the operation mode MC, or selects the signal S29BP in a case where the operation mode is the operation mode MB, and outputs the selected signal as a signal S23B. On the basis of a signal Ssel, the selector 23C selects the signal S29BP in a case where the operation mode is the operation mode MA or the operation mode MC, or selects the signal S29AN in a case where the operation mode is the operation mode MB, and outputs the selected signal as a signal S23C. On the basis of a signal Ssel, the selector 23D selects the signal S29BN in a case where the operation mode is the operation mode MA or the operation mode MC, or selects the signal S29AP in a case where the operation mode is the operation mode MB, and outputs the selected signal as a signal S23D. On the basis of a signal Ssel, the selector 23E (FIG. 59B) selects the signal S29CP in a case where the operation mode is the operation mode MA or the operation mode MC, or selects the signal S29DN in a case where the operation mode is the operation mode MB, and outputs the selected signal as a signal S23E. On the basis of a signal Ssel, the selector 23F selects the signal S29CN in a case where the operation mode is the operation mode MA or the operation mode MC, or selects the signal S29DP in a case where the operation mode is the operation mode MB, and outputs the selected signal as a signal S23F. On the basis of a signal Ssel, the selector 23G selects the signal S29DP in a case where the operation mode is the operation mode MA or the operation mode MC, or selects the signal S29CN in a case where the operation mode is the operation mode MB, and outputs the selected signal as a signal S23G. On the basis of a signal Ssel, the selector 23H selects the signal S29DN in a case where the operation mode is the operation mode MA or the operation mode MC, or selects the signal S29CP in a case where the operation mode is the operation mode MB, and outputs the selected signal as a signal S23H.

The driver 24A (FIG. 59A) sets a voltage at the output terminal Tout1 on the basis of the signals S29AP, S29AN, S23A, and S23B and a signal CTL. The driver 24B sets a voltage at the output terminal Tout2 on the basis of the signals S23C, S23D, S29BP, and S29BN and a signal CTL. The driver 24C (FIG. 59B) sets a voltage at the output terminal Tout3 on the basis of the signals S29CP, S29CN, S23E, and S23F and a signal CTL. The driver 24D sets a voltage at the output terminal Tout4 on the basis of the signals S23G, S23H, S29DP, and S29DN and a signal CTL.

3. Third Embodiment

Subsequently, communication systems 3A to 3C according to a third embodiment are described. The present embodiment describes a different method in which an output terminal is set to the medium-level voltage VM in a case where communication is performed by using a signal having three voltage levels. It is to be noted that a component substantially identical to that of the communication systems 2A to 2C according to the above-described second embodiment is assigned the same reference numeral, and description of the component is omitted accordingly.

As illustrated in FIG. 37A, the communication system 3A includes a transmitting device 70 and the receiving device 130. In the communication system 3A, the transmitting device 70 uses the line 101 to transmit a signal SIG1, and uses the line 102 to transmit a signal SIG2, and uses the line 103 to transmit a signal SIG3, and uses the line 104 to transmit a signal SIG4.

As illustrated in FIG. 37B, the communication system 3B includes the transmitting device 70 and the receiving device 140. In the communication system 3B, the transmitting device 70 uses the lines 111 and 112 to transmit signals SIG1P and SIG1N, and uses the lines 113 and 114 to transmit signals SIG2P and SIG2N.

As illustrated in FIG. 37C, the communication system 3C includes the transmitting device 70 and the receiving device 150. In the communication system 3C, the transmitting device 70 uses the lines 121, 122, and 123 to transmit signals SIGA, SIGB, and SIGC.

(Transmitting Device 70)

The transmitting device 70 includes a transmitter 72 as illustrated in FIGS. 37A to 37C.

The transmitter 72 transmits data generated by the processor 61 on the basis of a mode signal Smode. Specifically, in a case where the operation mode indicated by the mode signal Smode is the operation mode MA (single-phase mode), the transmitter 72 transmits data generated by the processor 61 by using signals SIG1 to SIG4. Furthermore, in a case where the operation mode indicated by the mode signal Smode is the operation mode MB, the transmitter 72 transmits data generated by the processor 61 by using signals SIG1P and SIG1N and signals SIG2P and SIG2N. Moreover, in a case where the operation mode indicated by the mode signal Smode is the operation mode MC, the transmitter 72 transmits data generated by the processor 61 by using signals SIGA, SIGB, and SIGC. The transmitter 72 includes transmitting circuit units 72A and 72B and a controller 75 as illustrated in FIG. 39.

FIG. 60A illustrates a configuration example of the transmitting circuit unit 72A, and FIG. 60B illustrates a configuration example of the transmitting circuit unit 72B. The transmitting circuit unit 62A includes four serializers 28 (the serializers 28A, 28B, 28C, and 28D), four encoders 29 (the encoders 29A, 29B, 29C, and 29D), four multiplexers 22 (the multiplexers 22A, 22B, 22C, and 22D), four inverters 73 (inverters 73A, 73B, 73C, and 73D), four selectors 23 (the selectors 23A, 23B, 23C, and 23D), and two drivers 24 (the drivers 24A and 24B). The transmitting circuit unit 62B includes four serializers 28 (the serializers 28E, 28F, 28G, and 28H), four encoders 29 (the encoders 29E, 29F, 29G, and 29H), four multiplexers 22 (the multiplexers 22E, 22F, 22G, and 22H), four selectors 23 (the selectors 23E, 23F, 23G, and 23H), four inverters 73 (inverters 73E, 73F, 73G, and 73H), and two drivers 24 (the drivers 24C and 24D).

The inverter 73A generates an inverted signal of the signal S22B. The inverter 73B generates an inverted signal of the signal S22A. The inverter 73C generates an inverted signal of the signal S22D. The inverter 73D generates an inverted signal of the signal S22C. The inverter 73E generates an inverted signal of the signal S22F. The inverter 73F generates an inverted signal of the signal S22E. The inverter 73G generates an inverted signal of the signal S22H. The inverter 73H generates an inverted signal of the signal S22G.

On the basis of a signal Ssel, the selector 23A (FIG. 60A) selects the output signal of the inverter 73A in a case where the operation mode is the operation mode MA (single-phase mode) or the operation mode MC (three-phase mode), or selects the signal S22D in a case where the operation mode is the operation mode MB (differential mode), and outputs the selected signal as a signal S23A. On the basis of a signal Ssel, the selector 23B selects the output signal of the inverter 73B in a case where the operation mode is the operation mode MA or the operation mode MC, or selects the signal S22C in a case where the operation mode is the operation mode MB, and outputs the selected signal as a signal S23B. On the basis of a signal Ssel, the selector 23C selects the output signal of the inverter 73C in a case where the operation mode is the operation mode MA or the operation mode MC, or selects the signal S22B in a case where the operation mode is the operation mode MB, and outputs the selected signal as a signal S23C. On the basis of a signal Ssel, the selector 23D selects the output signal of the inverter 73D in a case where the operation mode is the operation mode MA or the operation mode MC, or selects the signal S22A in a case where the operation mode is the operation mode MB, and outputs the selected signal as a signal S23D. On the basis of a signal Ssel, the selector 23E (FIG. 60B) selects the output signal of the inverter 73E in a case where the operation mode is the operation mode MA or the operation mode MC, or selects the signal S22H in a case where the operation mode is the operation mode MB, and outputs the selected signal as a signal S23E. On the basis of a signal Ssel, the selector 23F selects the output signal of the inverter 73F in a case where the operation mode is the operation mode MA or the operation mode MC, or selects the signal S22G in a case where the operation mode is the operation mode MB, and outputs the selected signal as a signal S23F. On the basis of a signal Ssel, the selector 23G selects the output signal of the inverter 73G in a case where the operation mode is the operation mode MA or the operation mode MC, or selects the signal S22F in a case where the operation mode is the operation mode MB, and outputs the selected signal as a signal S23G. On the basis of a signal Ssel, the selector 23H selects the output signal of the inverter 73H in a case where the operation mode is the operation mode MA or the operation mode MC, or selects the signal S22E in a case where the operation mode is the operation mode MB, and outputs the selected signal as a signal S23H.

The driver 24A (FIG. 60A) sets a voltage at the output terminal Tout1 on the basis of the signals S22A, S22B, S23A, and S23B and a signal CTL. The driver 24B sets a voltage at the output terminal Tout2 on the basis of the signals S23C, S23D, S22C, and S22D and the signal CTL. The driver 24C (FIG. 60B) sets a voltage at the output terminal Tout3 on the basis of the signals S22E, S22F, S23E, and S23F and a signal CTL. The driver 24D sets a voltage at the output terminal Tout4 on the basis of the signals S23G, S23H, S22G, and S22H and the signal CTL.

In the operation modes MA (single-phase mode) and MB (differential mode), for example, as illustrated in FIG. 8, the driver 24A sets the number of sub-drivers AA to "M" and the number of sub-drivers AB to "N" on the basis of a signal CTL. The same applies to the drivers 24B to 24D.

On the other hand, in the operation mode MC (three-phase mode), on the basis of a signal CTL, the drivers 24A, 24B, 24C, and 24D set the number of sub-drivers AA, AB, BA, BB, CA, CB, DA, and DB to be different from those in the case of the operation modes MA and MB as described below.

FIG. 61 illustrates a configuration example of the drivers 24A and 24B in the operation mode MC. In in the operation mode MC, the driver 24A sets both the number of sub-drivers AA and the number of sub-drivers AB to "L" on the basis of a signal CTL. The number "L" may be set so as to meet, for example, "2×L=M+N". The same applies to the drivers 24B to 24D.

With this configuration, for example, in a case where in the operation mode MC, the signals S22A and S22B are both set to low level, the signals S23A and 23B both become high level. Therefore, the transistors 92 and 93 in the sub-drivers AB1 to ABL of the driver 24A go into on state, and the transistors 92 and 93 in the sub-drivers AA1 to AAL go into off state. As a result, the driver 24A is able to set the voltage at the output terminal Tout1 to the medium-level voltage VM and the output impedance to about 50[Ω].

(Operation Mode MA)

FIG. 62 illustrates the flow of signals in the operation mode MA. In FIG. 62, bold solid lines indicate the flow of signals related to signals DI10 to DI17, and bold dashed lines indicate the flow of signals related to signals DI20 to DI27. In this example, the operation of the transmitting circuit unit 72A is described; however, the same applies to the operation of the transmitting circuit unit 72B.

First, the flow of signals related to DI10 to DI17 is described. The operations of the serializers 28A and 28C, the encoders 29A and 29C, and the multiplexers 22A and 22B are the same as in the case of the second embodiment. On the basis of a signal Ssel, the selector 23A selects an inverted signal of the signal S22B in the operation mode MA, and outputs the selected signal as a signal S23A. On the basis of a signal Ssel, the selector 23B selects an inverted signal of the signal S22A in the operation mode MA, and outputs the selected signal as a signal S23B. In the operation mode MA, the signals S22A and S22B are signals that are inverted from each other; therefore, the inverted signal of the signal S22B corresponds to the signal S22A, and the inverted signal of the signal S22A corresponds to the signal S22B. As a result, the driver 24A operates on the basis of the signals S22A and S22B.

Next, the flow of signals related to signals DI20 to DI27 is described. The operations of the serializers 28B and 28D, the encoders 29B and 29D, and the multiplexers 22C and 22D are the same as in the case of the second embodiment. On the basis of a signal Ssel, the selector 23C selects an inverted signal of the signal S22D in the operation mode MA, and outputs the selected signal as a signal S23C. On the basis of a signal Ssel, the selector 23D selects an inverted signal of the signal S22C in the operation mode MA, and outputs the selected signal as a signal S23D. In the operation mode MA, the signals S22C and S22D are signals that are inverted from each other; therefore, the inverted signal of the signal S22D corresponds to the signal S22C, and the inverted signal of the signal S22C corresponds to the signal S22D. As a result, the driver 24B operates on the basis of the signals S22C and S22D.

In this way, in the operation mode MA, the transmitting device 70 transmits data to the receiving device 130 by using signals SIG1 to SIG4, as with the transmitting device 60 according to the second embodiment.

(Operation Mode MB)

FIG. 63 illustrates the flow of signals in the operation mode MB. In FIG. 63, bold solid lines indicate the flow of signals related to signals DI10 to DI17, and bold dashed lines indicate the flow of signals related to signals DI20 to DI27. In this example, the operation of the transmitting circuit unit 72A is described; however, the same applies to the operation of the transmitting circuit unit 72B.

First, the flow of signals related to DI10 to DI17 is described. The operations of the serializers 28A and 28C, the encoders 29A and 29C, and the multiplexers 22A and 22B are the same as in the case of the second embodiment. On the basis of a signal Ssel, the selector 23C selects the signal S22B in the operation mode MB, and outputs the selected signal as a signal S23C. On the basis of a signal Ssel, the selector 23D selects the signal S22A in the operation mode MB, and outputs the selected signal as a signal S23D. As a result, the sub-drivers AA1 to AAM of the driver 24A operate on the basis of the signals S22A and S22B, and the sub-drivers BA1 to BAM of the driver 24B operate on the basis of the signals S22B and S22A.

Next, the flow of signals related to signals DI20 to DI27 is described. The operations of the serializers 28B and 28D, the encoders 29B and 29D, and the multiplexers 22C and 22D are the same as in the case of the second embodiment. On the basis of a signal Ssel, the selector 23A selects the signal S22D in the operation mode MB, and outputs the selected signal as a signal S23A. On the basis of a signal Ssel, the selector 23B selects the signal S22C in the operation mode MB, and outputs the selected signal as a signal S23B. As a result, the sub-drivers AB1 to ABN of the driver 24A operate on the basis of the signals S22D and S22C, and the sub-drivers BB1 to BBN of the driver 24B operate on the basis of the signals S22C and S22D.

In this way, in the operation mode MB, the transmitting device 70 transmits data to the receiving device 140 by using signals SIG1P and SIG1N and signals SIG2P and SIG2N, as with the transmitting device 60 according to the second embodiment.

(Operation Mode MC)

FIGS. 64A and 64B illustrate the flow of signals in the operation mode MC. In FIG. 64A, bold solid lines indicate the flow of signals related to a signal SIGA, and bold dashed lines indicate the flow of signals related to a signal SIGB. In FIG. 64B, bold dashed-dotted lines indicate the flow of signals related to a signal SIGC. The operations of the serializers 28A to 28H, the encoders 29A to 29H, and the multiplexers 22A to 22H are the same as in the case of the second embodiment.

On the basis of a signal Ssel, the selector 23A (FIG. 64A) selects an inverted signal of the signal S22B in the operation mode MC, and outputs the selected signal as a signal S23A. On the basis of a signal Ssel, the selector 23B selects an inverted signal of the signal S22A in the operation mode MC, and outputs the selected signal as a signal S23B. As a result, the driver 24A operates on the basis of the signals S22A and S22B.

Likewise, on the basis of a signal Ssel, the selector 23C selects an inverted signal of the signal S22D in the operation mode MC, and outputs the selected signal as a signal S23C. On the basis of a signal Ssel, the selector 23D selects an inverted signal of the signal S22C in the operation mode MC, and outputs the selected signal as a signal S23D. As a result, the driver 24B operates on the basis of the signals S22C and S22D.

Likewise, on the basis of a signal Ssel, the selector 23E (FIG. 64B) selects an inverted signal of the signal S22F in the operation mode MC, and outputs the selected signal as a signal S23E. On the basis of a signal Ssel, the selector 23F selects an inverted signal of the signal S22E in the operation mode MC, and outputs the selected signal as a signal S23F. As a result, the driver 24C operates on the basis of the signals S22E and S22F.

For example, in a case where the signals S28A, S28B, and S28E are "1", "0", and "0", respectively, as illustrated in FIG. 43, the encoder 29A sets the signals S29AP and S29AN to "1" and "0", respectively; the encoder 29B sets the signals S29BP and S29BN to "0" and "1", respectively; and the encoder 29E sets the signals S29EP and S29EN to "0" and "0", respectively. As a result, as illustrated in FIG. 48, the output signal S22A of the multiplexer 22A becomes "1"; the output signal S22B of the multiplexer 22B becomes "0"; the output signal S22C of the multiplexer 22C becomes "0"; the output signal S22D of the multiplexer 22D becomes "1"; the output signal S22E of the multiplexer 22E becomes "0"; and the output signal S22F of the multiplexer 22F becomes "0".

At this time, in the driver 24A (FIG. 64A), the transistors 92 in the sub-drivers AA1 to AAL and AB1 to ABL go into on state, and the transistors 93 in the sub-drivers AA1 to AAL and AB1 to ABL go into off state. As a result, the driver 24A sets the voltage at the output terminal Tout1 to the high-level voltage VH and the output impedance to about 50[Ω].

Furthermore, in the driver 24B, the transistors 93 in the sub-drivers BA1 to BAL and BB1 to BBL go into on state, and the transistors 92 in the sub-drivers BA1 to BAL and BB1 to BBL go into off state. As a result, the driver 24B sets the voltage at the output terminal Tout2 to the low-level voltage VL and the output impedance to about 50[Ω].

Moreover, in the driver 24C (FIG. 64B), the transistors 92 and 93 in the sub-drivers CB1 to CBL go into on state, and the transistors 92 and 93 in the sub-drivers CA1 to CAL go into off state. As a result, the driver 24C sets the voltage at the output terminal Tout3 to the medium-level voltage VM and the output impedance to about 50 [Ω].

In this way, the transmitter 72 sets the signal SIGA to the high-level voltage VH, the signal SIGB to the low-level voltage VL, and the signal SIGC to the medium-level voltage VM. As a result, the transmitting device 70 transmits the symbol "+x" to the receiving device 150.

In this way, in the operation mode MC, the transmitting device 70 transmits data to the receiving device 150 by using signals SIGA, SIGB, and SIGC.

In this way, in the transmitting device 70, when the voltages at the output terminals Tout1, Tout2, and Tout3 are set to the medium-level voltage VM, the output impedance is set to about 50[Ω]. Accordingly, for example, the transmitting device 70 makes it possible to suppress signal reflection, and therefore, it is possible to enhance the waveform quality. Furthermore, in the transmitting device 70, in a case where the voltages at the output terminals Tout1, Tout2, and Tout3 are made transition from the high-level voltage VH or the low-level voltage VL to the medium-level voltage VM, the transition time is able to be reduced; therefore, it is possible to enhance the waveform quality. Consequently, it is possible to enhance the communication quality in the transmitting device 70.

As described above, in the present embodiment, the output impedance is set to about 50[Ω] when the voltage at the output terminal is set to the medium-level voltage VM; therefore, it is possible to enhance the communication quality.

Modification Example 3-1

In the above-described embodiment, the four drivers 24A, 24B, 24C, and 24D are provided; however, it is not limited to this. A modification example is described in detail below.

FIGS. 65A and 65B illustrate respective configuration examples of main parts of transmitting circuit units 74A and 74B of a transmitter 74 according to the present modification example. FIG. 65A depicts a circuit subsequent to the encoders 29A to 29D in FIG. 60A, and FIG. 65B depicts a circuit subsequent to the encoders 29E to 29H in FIG. 60B. The transmitting circuit unit 74A includes four serializers 28 (the serializers 28A, 28B, 28C, and 28D), four encoders 29 (the encoders 29A, 29B, 29C, and 29D), four multiplexers 76 (multiplexers 76A, 76B, 76C, and 76D), eight selectors 77 (selectors 77A, 77B, 77C, 77D, 77E, 77F, 77G, and 77H), and four drivers 79 (drivers 79A, 79B, 79C, and 79D). The transmitting circuit unit 74B includes four serializers 28 (the serializers 28E, 28F, 28G, and 28H), four encoders 29 (the encoders 29E, 29F, 29G, and 29H), four multiplexers 76 (multiplexers 76E, 76F, 76G, and 76H), eight selectors 77 (selectors 77I, 77J, 77K, 77L, 77M, 77N, 77O, and 77P), and four drivers 79 (drivers 79E, 79F, 79G, and 79H).

The multiplexer 76A (FIG. 65A) alternately selects one of the signals S29AP and S29CP on the basis of a clock signal CLK, and outputs the selected signal as a signal S76AP, and outputs an inverted signal of the signal S76AP as a signal S76AN. The multiplexer 76B alternately selects one of the signals S29AN and S29CN on the basis of a clock signal CLK, and outputs the selected signal as a signal S76BP, and outputs an inverted signal of the signal S76BP as a signal S76BN. The multiplexer 76C alternately selects one of the signals S29BP and S29DP on the basis of a clock signal CLK, and outputs the selected signal as a signal S76CP, and outputs an inverted signal of the signal S76CP as a signal S76CN. The multiplexer 76D alternately selects one of the signals S29BN and S29DN on the basis of a clock signal CLK, and outputs the selected signal as a signal S76DP, and outputs an inverted signal of the signal S76DP as a signal S76DN. The multiplexer 76E (FIG. 65B) alternately selects one of the signals S29EP and S29GP on the basis of a clock signal CLK, and outputs the selected signal as a signal S76EP, and outputs an inverted signal of the signal S76EP as a signal S76EN. The multiplexer 76F alternately selects one of the signals S29EN and S29GN on the basis of a clock signal CLK, and outputs the selected signal as a signal S76FP, and outputs an inverted signal of the signal S76FP as a signal S76FN. The multiplexer 76G alternately selects one of the signals S29FP and S29HP on the basis of a clock signal CLK, and outputs the selected signal as a signal S76GP, and outputs an inverted signal of the signal S76GP as a signal S76GN. The multiplexer 27H alternately selects one of the signals S29FN and S29HN on the basis of a clock signal CLK, and outputs the selected signal as a signal S76HP, and outputs an inverted signal of the signal S76HP as a signal S76HN.

On the basis of a signal Ssel, the selector 77A (FIG. 65A) selects the signal S76AP in a case where the operation mode is the operation mode MA (single-phase mode) or the operation mode MC (three-phase mode), or selects the signal S76DP in a case where the operation mode is the operation mode MB (differential mode), and outputs the selected signal as a signal S77A. On the basis of a signal Ssel, the selector 77B selects the signal S76BP in a case where the operation mode is the operation mode MA or the operation mode MC, or selects the signal S76CP in a case where the operation mode is the operation mode MB, and outputs the selected signal as a signal S77B. On the basis of a signal Ssel, the selector 77C selects the signal S76CP in a case where the operation mode is the operation mode MA or the operation mode MC, or selects the signal S76BP in a case where the operation mode is the operation mode MB, and outputs the selected signal as a signal S77C. On the basis of a signal Ssel, the selector 77D selects the signal S76DP in a case where the operation mode is the operation mode MA or the operation mode MC, or selects the signal S76AP in a case where the operation mode is the operation mode MB, and outputs the selected signal as a signal S77D. On the basis of a signal Ssel, the selector 77E selects the signal S76BN in a case where the operation mode is the operation mode MA or the operation mode MC, or selects the signal S76CN in a case where the operation mode is the operation mode MB, and outputs the selected signal as a signal S77E. On the basis of a signal Ssel, the selector 77F selects the signal S76AN in a case where the operation mode is the operation mode MA or the operation mode MC, or selects the signal S76DN in a case where the operation mode is the operation mode MB, and outputs the selected signal as a signal S77F. On the basis of a signal Ssel, the selector 77G selects the signal S76DN in a case where the operation mode is the operation mode MA or the operation mode MC, or selects the signal S76AN in a case where the operation mode is the operation mode MB, and outputs the selected signal as a signal S77G. On the basis of a signal Ssel, the selector 77H selects the signal S76CN in a case where the operation mode is the operation mode MA or the operation mode MC, or selects the signal S76BN in a case where the operation mode is the operation mode MB, and outputs the selected signal as a signal S77H.

On the basis of a signal Ssel, the selector 77I (FIG. 65B) selects the signal S76EP in a case where the operation mode is the operation mode MA or the operation mode MC, or selects the signal S76HP in a case where the operation mode is the operation mode MB, and outputs the selected signal as a signal S77I. On the basis of a signal Ssel, the selector 77J selects the signal S76FP in a case where the operation mode is the operation mode MA or the operation mode MC, or selects the signal S76GP in a case where the operation mode is the operation mode MB, and outputs the selected signal as a signal S77J. On the basis of a signal Ssel, the selector 77K selects the signal S76GP in a case where the operation mode is the operation mode MA or the operation mode MC, or selects the signal S76FP in a case where the operation mode is the operation mode MB, and outputs the selected signal as a signal S77K. On the basis of a signal Ssel, the selector 77L selects the signal S76HP in a case where the operation mode is the operation mode MA or the operation mode MC, or selects the signal S76EP in a case where the operation mode is the operation mode MB, and outputs the selected signal as a signal S77L. On the basis of a signal Ssel, the selector 77M selects the signal S76FN in a case where the operation mode is the operation mode MA or the operation mode MC, or selects the signal S76GN in a case where the operation mode is the operation mode MB, and outputs the selected signal as a signal S77M. On the basis of a signal Ssel, the selector 77N selects the signal S76EN in a case where the operation mode is the operation mode MA or the operation mode MC, or selects the signal S76HN in a case where the operation mode is the operation mode MB, and outputs the selected signal as a signal S77N. On the basis of a signal Ssel, the selector 77O selects the signal S76HN in a case where the operation mode is the operation mode MA or the operation mode MC, or selects the signal S76EN in a case where the operation mode is the operation mode MB, and outputs the selected signal as a signal S77O. On the basis of a signal Ssel, the selector 77P selects the signal S76GN in a case where the operation mode is the operation mode MA or the operation mode MC, or selects the signal S76FN in a case where the operation mode is the operation mode MB, and outputs the selected signal as a signal S77P.

The driver 79A (FIG. 65A) operates on the basis of the signals S76AP, S76BP, S77A, and S77B and a signal CTL, and the driver 79C operates on the basis of the signals S76BN, S76AN, S77E, S77F and a signal CTL. Then, the drivers 79A and 79C set a voltage at the output terminal Tout1. The driver 79B operates on the basis of the signals S77C, S77D, S76CP, and S76DP and a signal CTL, and the driver 79D operates on the basis of the signals S77G, S77H, S76DN, and S76CN and a signal CTL. Then, the drivers 79B and 79D set a voltage at the output terminal Tout2.

The driver 79E (FIG. 65B) operates on the basis of the signals S76EP, S76FP, S77I, and S77J and a signal CTL, and the driver 79G operates on the basis of the signals S76FN, S76EN, S77M, S77N and a signal CTL. Then, the drivers 79E and 79G set a voltage at the output terminal Tout3. The driver 79F operates on the basis of the signals S77K, S77L, S76GP, and S76HP and a signal CTL, and the driver 79H operates on the basis of the signals S77O, S77P, S76HN, and S76GN and a signal CTL. Then, the drivers 79F and 79H set a voltage at the output terminal Tout4.

In the operation modes MA (single-phase mode) and MB (differential mode), the drivers 79A sets the number of sub-drivers AA to "M/2" and the number of sub-drivers AB to "N/2" on the basis of a signal CTL. The same applies to the drivers 79B to 79H.

On the other hand, in the operation mode MC (three-phase mode), the driver 24A sets both the number of sub-drivers AA and the number of sub-drivers AB to "L/2" on the basis of a signal CTL. The number "L" may be set so as to meet, for example, "2×L=M+N". The same applies to the drivers 79B to 79H.

With this configuration, for example, in a case where in the operation mode MC, the signals S76BP and S76BP are both set to low level, and the signals S76AN and S76BN are both set to high level, the signals S77A and S77B both become low level, and the signals S77E and S77F both become high level. Therefore, the transistors 92 and 93 in the driver 79C go into on state, and the transistors 92 and 93 in the driver 79A go into off state. As a result, the drivers 79A and 79C are able to set the voltage at the output terminal Tout1 to the medium-level voltage VM and the output impedance to about 50[Ω].

The two drivers 79A and 79C here correspond to a specific example of the "first driver" in the present disclosure. The plurality of sub-drivers AA1 to AA(M/2) and CA1 to CA(M/2) correspond to a specific example of the "first sub-driver unit" in the present disclosure, and the plurality of sub-drivers AB1 to AB(N/2) and CB1 to CB(N/2) correspond to a specific example of the "second sub-driver unit" in the present disclosure. The two drivers 79B and 79D correspond to a specific example of the "second driver" in the present disclosure. The plurality of sub-drivers BA1 to BA(M/2) and DA1 to DA(M/2) correspond to a specific example of the "third sub-driver unit" in the present disclosure, and the plurality of sub-drivers BB1 to BB(N/2) and DB1 to DB(N/2) correspond to a specific example of the "fourth sub-driver unit" in the present disclosure. The plurality of selectors 77A to 77H correspond to a specific example of the "selector unit" in the present disclosure. The plurality of multiplexers 76A to 76H correspond to a specific example of the "multiplexer unit" in the present disclosure.

FIG. 66 illustrates the flow of signals in the operation mode MA (single-phase mode). In this example, the operation of the transmitting circuit unit 74A is described; however, the same applies to the operation of the transmitting circuit unit 74B.

First, the flow of signals related to DI10 to DI17 is described. On the basis of a signal Ssel, the selector 77A selects the signal S76AP in the operation mode MA, and outputs the selected signal as a signal S77A. On the basis of a signal Ssel, the selector 77B selects the signal S76BP in the operation mode MA, and outputs the selected signal as a signal S77B. On the basis of a signal Ssel, the selector 77E selects the signal S76BN in the operation mode MA, and outputs the selected signal as a signal S77E. On the basis of a signal Ssel, the selector 77F selects the signal S76AN in the operation mode MA, and outputs the selected signal as a signal S77F. In the operation mode MA, the signals S76AP and S76BP are signals that are inverted from each other; therefore, the signal S76BN corresponds to the signal S76AP, and the signal S76BP corresponds to the signal S76AN. As a result, the driver 79A operates on the basis of the signals S76AP and S76BP, and the driver 79C operates on the basis of the signals S76AP and S76BP.

Next, the flow of signals related to signals DI20 to DI27 is described. On the basis of a signal Ssel, the selector 77C selects the signal S76CP in the operation mode MA, and outputs the selected signal as a signal S77C. On the basis of a signal Ssel, the selector 77D selects the signal S76DP in the operation mode MA, and outputs the selected signal as a signal S77D. On the basis of a signal Ssel, the selector 77G selects the signal S76DN in the operation mode MA, and outputs the selected signal as a signal S77G. On the basis of a signal Ssel, the selector 77H selects the signal S76CN in the operation mode MA, and outputs the selected signal as a signal S77H. In the operation mode MA, the signals S76CP and S76DP are signals that are inverted from each other; therefore, the signal S76DN corresponds to the signal S76CP, and the signal S76DP corresponds to the signal S76CN. As a result, the driver 79B operates on the basis of the signals S76CP and S76DP, and the driver 79D operates on the basis of the signals S76CP and S76DP.

FIG. 67 illustrates the flow of signals in the operation mode MB (differential mode). In this example, the operation of the transmitting circuit unit 74A is described; however, the same applies to the operation of the transmitting circuit unit 74B.

First, the flow of signals related to DI10 to DI17 is described. On the basis of a signal Ssel, the selector 77C selects the signal S76BP in the operation mode MB, and outputs the selected signal as a signal S77C. On the basis of a signal Ssel, the selector 77D selects the signal S76AP in the operation mode MB, and outputs the selected signal as a signal S77D. On the basis of a signal Ssel, the selector 77G selects the signal S76AN in the operation mode MB, and outputs the selected signal as a signal S77G. On the basis of a signal Ssel, the selector 77H selects the signal S76BN in the operation mode MB, and outputs the selected signal as a signal S77H. In the operation mode MB, the signals S76AP and S76BP are signals that are inverted from each other; therefore, the signal S76BN corresponds to the signal S76AP, and the signal S76BP corresponds to the signal S76AN. As a result, the sub-drivers AA1 to AA(M/2) of the driver 79A operate on the basis of the signals S76AP and S76BP, and the sub-drivers CA1 to CA(M/2) of the driver 79C operate on the basis of the signals S76AP and S76BP. Likewise, the sub-drivers BA1 to BA(M/2) of the driver 79B operate on the basis of the signals S76BP and S76AP, and the sub-drivers DA1 to DA(M/2) of the driver 79D operate on the basis of the signals S76BP and S76AP.

Next, the flow of signals related to signals DI20 to DI27 is described. On the basis of a signal Ssel, the selector 77A selects the signal S76DP in the operation mode MB, and outputs the selected signal as a signal S77A. On the basis of a signal Ssel, the selector 77B selects the signal S76CP in the operation mode MB, and outputs the selected signal as a signal S77B. On the basis of a signal Ssel, the selector 77E selects the signal S76CN in the operation mode MB, and outputs the selected signal as a signal S77E. On the basis of a signal Ssel, the selector 77F selects the signal S76DN in the operation mode MB, and outputs the selected signal as a signal S77F. In the operation mode MB, the signals S76CP and S76DP are signals that are inverted from each other; therefore, the signal S76DN corresponds to the signal S76CP, and the signal S76DP corresponds to the signal S76CN. As a result, the sub-drivers AB1 to AB(N/2) of the driver 79A operate on the basis of the signals S76DP and S76CP, and the sub-drivers CB1 to CB(N/2) of the driver 79C operate on the basis of the signals S76DP and S76CP. Likewise, the sub-drivers BB1 to BB(N/2) of the driver 79B operate on the basis of the signals S76CP and S76DP, and the sub-drivers DB1 to DB(N/2) of the driver 79D operate on the basis of the signals S76CP and S76DP.

FIGS. 68A and 68B illustrate the flow of signals in the operation mode MC (three-phase mode).

On the basis of a signal Ssel, the selector 77A (FIG. 68A) selects the signal S76AP in the operation mode MC, and outputs the signal S76AP as a signal S77A. On the basis of a signal Ssel, the selector 77B selects the signal S76BP in the operation mode MC, and outputs the signal S76BP as a signal S77B. On the basis of a signal Ssel, the selector 77E selects the signal S76BN in the operation mode MC, and outputs the signal S76BN as a signal S77E. On the basis of a signal Ssel, the selector 77F selects the signal S76AN in the operation mode MC, and outputs the signal S76AN as a signal S77F. As a result, the driver 79A operates on the basis of the signals S76AP and S76BP, and the driver 79C operates on the basis of the signals S76BN and S76AN.

Likewise, on the basis of a signal Ssel, the selector 77C selects the signal S76CP in the operation mode MC, and outputs the signal S76CP as a signal S77C. On the basis of a signal Ssel, the selector 77D selects the signal S76DP in the operation mode MC, and outputs the signal S76DP as a signal S77D. On the basis of a signal Ssel, the selector 77G selects the signal S76DN in the operation mode MC, and outputs the signal S76DN as a signal S77G. On the basis of a signal Ssel, the selector 77H selects the signal S76CN in the operation mode MC, and outputs the signal S76CN as a signal S77H. As a result, the driver 79B operates on the basis of the signals S76CP and S76DP, and the driver 79D operates on the basis of the signals S76DN and S76CN.

Likewise, on the basis of a signal Ssel, the selector 77I (FIG. 68B) selects the signal S76EP in the operation mode MC, and outputs the selected signal as a signal S77I. On the basis of a signal Ssel, the selector 77J selects the signal S76FP in the operation mode MC, and outputs the signal S76FP as a signal S77J. On the basis of a signal Ssel, the selector 77M selects the signal S76FN in the operation mode MC, and outputs the signal S76FN as a signal S77M. On the basis of a signal Ssel, the selector 77N selects the signal S76EN in the operation mode MC, and outputs the signal S76EN as a signal S77N. As a result, the driver 79E operates on the basis of the signals S76EP and S76FP, and the driver 79G operates on the basis of the signals S76FN and S76EN.

Modification Example 3-2

In the above-described embodiment, the encoders 29 are provided in the preceding stage of the multiplexers 22;

however, it is not limited to this. Instead of this, for example, encoders may be provided in the subsequent stage of the multiplexers 22. FIGS. 69A and 69B illustrate respective configuration examples of transmitting circuit units 78A and 78B of a transmitter 78 according to a modification example. The transmitting circuit unit 78A includes four serializers 21 (the serializers 21A, 21B, 21C, and 21D), four multiplexers 22 (the multiplexers 22A, 22B, 22C, and 22D), four encoders 64 (the encoders 64A, 64B, 64C, and 64D), four inverters 73 (the inverters 73A, 73B, 73C, and 73D), four selectors 23 (the selectors 23A, 23B, 23C, and 23D), and two drivers 24 (the drivers 24A and 24B). The transmitting circuit unit 78B includes four serializers 21 (the serializers 21E, 21F, 21G, and 21H), four multiplexers 22 (the multiplexers 22E, 22F, 22G, and 22H), four encoders 64 (the encoders 64E, 64F, 64G, and 64H), four inverters 73 (the inverters 73E, 73F, 73G, and 73H), four selectors 23 (the selectors 23E, 23F, 23G, and 23H), and two drivers 24 (the drivers 24C and 24D).

Modification Example 3-3

In the above-described embodiment, the serializers 28A to 28H having the same configuration as those in FIG. 3 are used; however, it is not limited to this. FIGS. 70A and 70B illustrate respective configuration examples of transmitting circuit units 81A and 81B of a transmitter 81 according to a modification example. The transmitting circuit unit 81A includes four serializers 68 (the serializers 68A, 68B, 68C, and 68D), four encoders 29 (the encoders 29A, 29B, 29C, and 29D), four multiplexers 22 (the multiplexers 22A, 22B, 22C, and 22D), four inverters 73 (the inverters 73A, 73B, 73C, and 73D), four selectors 23 (the selectors 23A, 23B, 23C, and 23D), and two drivers 24 (the drivers 24A and 24B). The transmitting circuit unit 81B includes four serializers 68 (the serializers 68E, 68F, 68G, and 68H), four encoders 29 (the encoders 29E, 29F, 29G, and 29H), four multiplexers 22 (the multiplexers 22E, 22F, 22G, and 22H), four inverters 73 (the inverters 73E, 73F, 73G, and 73H), four selectors 23 (the selectors 23E, 23F, 23G, and 23H), and two drivers 24 (the drivers 24C and 24D).

In the transmitter 81 according to the present modification example, the encoders 29 are provided in the preceding stage of the multiplexers 22; however, it is not limited to this. Instead of this, for example, encoders may be provided in the subsequent stage of the multiplexers 22. FIGS. 71A and 71B illustrate respective configuration examples of transmitting circuit units 82A and 82B of a transmitter 82 according to a modification example. The transmitting circuit unit 82A includes four serializers four serializers 68 (the serializers 68A, 68B, 68C, and 68D), four multiplexers 22 (the multiplexers 22A, 22B, 22C, and 22D), two encoders 29 (the encoders 29A and 29B), four inverters 73 (the inverters 73A, 73B, 73C, and 73D), four selectors 23 (the selectors 23A, 23B, 23C, and 23D), and two drivers 24 (the drivers 24A and 24B). The transmitting circuit unit 82B includes four serializers 68 (the serializers 68E, 68F, 68G, and 68H), four multiplexers 22 (the multiplexers 22E, 22F, 22G, and 22H), two encoders 29 (the encoders 29C and 29D), four inverters 73 (the inverters 73E, 73F, 73G, and 73H), four selectors 23 (the selectors 23E, 23F, 23G, and 23H), and two drivers 24 (the drivers 24C and 24D).

4. Application Example

Subsequently, some application examples of the communication systems described in the above embodiments and modification examples are described.

Application Example 1

FIG. 72 illustrates an external appearance of a smartphone 300 (a multi-function mobile phone) to which the communication system in any of the above-described embodiments, etc. is applied. This smartphone 300 is equipped with various devices; the communication system in any of the above-described embodiments, etc. is applied to a communication system in which these devices exchange data between them.

FIG. 73 illustrates a configuration example of an application processor 310 used in the smartphone 300. The application processor 310 includes a central processing unit (CPU) 311, a memory controller 312, a power controller 313, an external interface 314, a graphics processing unit (GPU) 315, a media processor 316, a display controller 317, and a MIPI (Mobile Industry Processor Interface) interface 318. In this example, the CPU 311, the memory controller 312, the power controller 313, the external interface 314, the GPU 315, the media processor 316, and the display controller 317 are coupled to a system bus 319, which makes it possible for them to exchange data with one another through this system bus 319.

The CPU 311 processes various pieces of information handled by the smartphone 300 in accordance with a program. The memory controller 312 controls a memory 501 that the CPU 311 uses when performing information processing. The power controller 313 controls the power to the smartphone 300.

The external interface 314 is an interface for communication with an external device, and, in this example, is coupled to a wireless communication section 502 and an image sensor 410. The wireless communication section 502 performs wireless communication with a mobile phone base station, and includes, for example, a baseband, radio frequency (RF) front-end, etc. The image sensor 410 acquires an image, and includes, for example, a CMOS sensor.

The GPU 315 performs image processing. The media processor 316 processes information of voice, text, graphics, etc. The display controller 317 controls a display 504 through the MIPI interface 318. The MIPI interface 318 transmits an image signal to the display 504. For example, a YUV or RGB signal or the like may be used as the image signal. The MIPI interface 318 operates on the basis of a reference clock supplied from an oscillation circuit 330 including, for example, a quartz crystal unit. For example, the communication system in any of the above-described embodiments, etc. is applied to this communication system between the MIPI interface 318 and the display 504.

FIG. 74 illustrates a configuration example of the image sensor 410. The image sensor 410 includes a sensor section 411, an ISP (image signal processor) 412, a JPEG (Joint Photographic Experts Group) encoder 413, a CPU 414, a RAM (random access memory) 415, a ROM (read-only memory) 416, a power controller 417, an I$^2$C (Inter-Integrated Circuit) interface 418, and a MIPI interface 419. In this example, these blocks are coupled to a system bus 420, which makes it possible for them to exchange data with one another through this system bus 420.

The sensor section 411 acquires an image, and includes, for example, a CMOS sensor. The ISP 412 performs a predetermined process on the image acquired by the sensor section 411. The JPEG encoder 413 generates a JPEG image by encoding the image processed by the ISP 412. The CPU 414 controls the blocks of the image sensor 410 in accordance with a program. The RAM 415 is a memory that the CPU 414 uses when performing information processing.

The ROM 416 stores therein the program executed by the CPU 414, a setting value obtained through calibration, etc. The power controller 417 controls the power to the image sensor 410. The I²C interface 418 receives a control signal from the application processor 310. Furthermore, although not illustrated, the image sensor 410 receives a clock signal as well as the control signal from the application processor 310. Specifically, the image sensor 410 is configured to be able to operate on the basis of clock signals of various frequencies. The MIPI interface 419 transmits an image signal to the application processor 310. For example, a YUV or RGB signal or the like may be used as the image signal. The MIPI interface 419 operates on the basis of a reference clock supplied from an oscillation circuit 430 including, for example, a quartz crystal unit. For example, the communication system in any of the above-described embodiments, etc. is applied to this communication system between the MIPI interface 419 and the application processor 310.

Application Example 2

FIG. 75 illustrates a configuration example of a vehicle control system 600 to which the communication system in any of the above-described embodiments, etc. is applied. The vehicle control system 600 controls the operation of a vehicle, such as a car, an electric car, a hybrid electric car, or a motorcycle. This vehicle control system 600 includes a drive system control unit 610, a body system control unit 620, a battery control unit 630, an outside-vehicle information detecting unit 640, an in-vehicle information detecting unit 650, and an integrated control unit 660. These units are coupled to one another through a communication network 690. As the communication network 690, for example, a network that meets any standards such as CAN (Controller Area Network), LIN (Local Interconnect Network), LAN (Local Area Network), and FlexRay® may be used. The units each include, for example, a microcomputer, a storage device, a drive circuit that drives a device to be controlled, a communication I/F, etc.

The drive system control unit 610 controls the operation of a device associated with a drive system of the vehicle. A vehicle state detecting section 611 is coupled to the drive system control unit 610. The vehicle state detecting section 611 detects the state of the vehicle, and includes, for example, a gyrosensor, an acceleration sensor, sensors to detect respective manipulated variables of an accelerator pedal and a brake pedal, the steering angle, etc. On the basis of information detected by the vehicle state detecting section 611, the drive system control unit 610 controls the operation of a device associated with the drive system of the vehicle. For example, the communication system in any of the above-described embodiments, etc. is applied to this communication system between the drive system control unit 610 and the vehicle state detecting section 611.

The body system control unit 620 controls the operations of on-board various devices, such as a keyless entry system, a power window device, and a variety of lamps.

The battery control unit 630 controls a battery 631. The battery 631 is coupled to the battery control unit 630. The battery 631 supplies electric power to a motor for driving, and includes, for example, a secondary battery, a cooling device, etc. The battery control unit 630 acquires information of temperature, output voltage, remaining battery, etc. from the battery 631, and, on the basis of these pieces of information, controls the cooling device, etc. of the battery 631. For example, the communication system in any of the above-described embodiments, etc. is applied to this communication system between the battery control unit 630 and the battery 631.

The outside-vehicle information detecting unit 640 detects information of the outside of the vehicle. An imaging device 641 and an outside-vehicle information detector 642 are coupled to the outside-vehicle information detecting unit 640. The imaging device 641 takes an image of the outside of the vehicle, and includes, for example, a ToF (Time-Of-Flight) camera, a stereo camera, a monocular camera, an infrared camera, etc. The outside-vehicle information detector 642 detects information of the outside of the vehicle, and includes, for example, a sensor to detect the weather and climate, a sensor to detect other vehicles, obstacles, pedestrians, etc. around the vehicle, etc. On the basis of the image obtained by the imaging device 641 and the information detected by the outside-vehicle information detector 642, the outside-vehicle information detecting unit 640 recognizes, for example, the weather and climate, the road condition, etc., and detects objects around the vehicle, such as other vehicles, obstacles, pedestrians, and characters of signs and road markings, or detects the distance between these objects and the vehicle. For example, the communication system in any of the above-described embodiments, etc. is applied to this communication system between the outside-vehicle information detecting unit 640 and the imaging device 641 and the outside-vehicle information detector 642.

The in-vehicle information detecting unit 650 detects information of the inside of the vehicle. A driver state detector 651 is coupled to the in-vehicle information detecting unit 650. The driver state detector 651 detects the state of a driver, and includes, for example, a camera, a biosensor, a microphone, etc. On the basis of information detected by the driver state detector 651, the in-vehicle information detecting unit 650 monitors, for example, the driver's level of tiredness, the driver's concentration degree, whether or not the driver is asleep at the wheel, etc. For example, the communication system in any of the above-described embodiments, etc. is applied to this communication system between the in-vehicle information detecting unit 650 and the driver state detector 651.

The integrated control unit 660 controls the operation of the vehicle control system 600. An operation section 661, a display section 662, and an instrument panel 663 are coupled to the integrated control unit 660. The operation section 661 is a part handled by a passenger, and includes, for example, a touch panel, various buttons and switches, etc. The display section 662 displays thereon an image, and includes, for example, a liquid-crystal display panel, etc. The instrument panel 663 displays thereon the state of the vehicle, and includes meters such as a speedometer, various alarm lamps, etc. For example, the communication system in any of the above-described embodiments, etc. is applied to this communication system between the integrated control unit 660 and the operation section 661, the display section 662, and the instrument panel 663.

The present technology is described above citing some embodiments and modification examples, and application examples; however, present technology is not limited to these embodiments, etc., and various modifications are possible.

For example, in the second and third embodiments, the transmitting device is provided with four output terminals; however, it is not limited to this, and the transmitting device may be provided with three output terminals instead. In this case, the transmitting device is able to transmit data by using signals SIG1, SIG2, and SIG3 in the operation mode MA;

signals SIG1P and SIG1N in the operation mode MB; and signals SIGA, SIGB, and SIGC in the operation mode MC. Furthermore, the transmitting device may be provided with, for example, five or more output terminals. Specifically, for example, in a case where the transmitting device is provided with six output terminals, the transmitting device is able to transmit data by using signals SIG1 to SIG6 in the operation mode MA; signals SIG1P and SIG1N, SIG2P and SIG2N, and SIG3P and SIG3N in the operation mode MB; and signals SIG1A, SIG1B, and SIG1C and SIG2A, SIG2B, and SIG2C in the operation mode MC.

It is to be noted that the effects described in this specification are mere examples and non-limiting, and there may be other effects.

It is to be noted that the present technology may have the following configurations.

(1)

A transmitting device including:
a first driver including a first sub-driver unit and a second sub-driver unit, the first driver being configured to be able to set a voltage at a first output terminal, the first sub-driver unit operating on the basis of a first control signal, the second sub-driver unit operating on the basis of, of the first control signal and a second control signal, a signal selected through a first selecting operation; and
a controller that controls the first selecting operation.

(2)

The transmitting device according to (1), further including a second driver including a third sub-driver unit and a fourth sub-driver unit, the second driver being configured to be able to set a voltage at a second output terminal, the third sub-driver unit operating on the basis of, of the first control signal and the second control signal, a signal selected through a second selecting operation, the fourth sub-driver unit operating on the basis of the second control signal,
in which the controller also controls the second selecting operation.

(3)

The transmitting device according to (2), in which
the transmitting device has a first operation mode and a second operation mode, and
the controller selects:
in the first operation mode, the first control signal in the first selecting operation and the second control signal in the second selecting operation; and
in the second operation mode, the second control signal in the first selecting operation and the first control signal in the second selecting operation.

(4)

The transmitting device according to (2) or (3), in which
an output impedance of the first sub-driver unit is lower than an output impedance of the second sub-driver unit, and
an output impedance of the third sub-driver unit is lower than an output impedance of the fourth sub-driver unit.

(5)

The transmitting device according to any of (2) to (4), in which the output impedance of the first sub-driver unit, the output impedance of the second sub-driver unit, the output impedance of the third sub-driver unit, and the output impedance of the fourth sub-driver unit are each configured to be settable.

(6)

The transmitting device according to any of (2) to (5), further including:
a first selector unit that performs the first selecting operation; and
a second selector unit that performs the second selecting operation.

(7)

The transmitting device according to any of (2) to (5), in which
the second sub-driver unit further performs the first selecting operation, and
the third sub-driver unit further performs the second selecting operation.

(8)

The transmitting device according to (7), in which
the second sub-driver unit includes:
a fifth sub-driver unit that operates on the basis of the first control signal; and
a sixth sub-driver unit that operates on the basis of the second control signal, and
the controller controls the first selecting operation by enabling one of the fifth sub-driver unit and the sixth sub-driver unit.

(9)

The transmitting device according to any of (2) to (8), further including a multiplexer unit that generates a first signal, a second signal, a third signal, and a fourth signal,
in which the first control signal includes the first signal and the second signal, and
the second control signal includes the third signal and the fourth signal.

(10)

The transmitting device according to (9), further including a serializer unit that generates a first serial signal, a second serial signal, a third serial signal, and a fourth serial signal,
in which the multiplexer unit generates:
the first signal on the basis of the first serial signal and the third serial signal;
the second signal on the basis of an inverted signal of the first serial signal and an inverted signal of the third serial signal;
the third signal on the basis of the second serial signal and the fourth serial signal; and
the fourth signal on the basis of an inverted signal of the second serial signal and an inverted signal of the fourth serial signal.

(11)

The transmitting device according to (10), in which
in a case where the multiplexer unit generates the first signal on the basis of, of the first serial signal and the third serial signal, the first serial signal, the multiplexer unit generates the second signal on the basis of, of the inverted signal of the first serial signal and the inverted signal of the third serial signal, the inverted signal of the first serial signal, the third signal on the basis of, of the second serial signal and the fourth serial signal, the second serial signal, and the fourth signal on the basis of, of the inverted signal of the second serial signal and the inverted signal of the fourth serial signal, the inverted signal of the second serial signal, and
in a case where the multiplexer unit generates the first signal on the basis of, of the first serial signal and the third serial signal, the third serial signal, the multiplexer unit generates the second signal on the basis of, of the inverted signal of the first serial signal and the inverted signal of the third serial signal, the inverted signal of the third serial signal, the third signal on the basis of, of the second serial signal and the fourth serial signal, the fourth serial signal, and the fourth signal on the basis of, of the inverted signal of the second serial signal and the inverted signal of the fourth serial signal, the inverted signal of the fourth serial signal.

(12)

The transmitting device according to (10) or (11), in which the serializer unit generates the first serial signal by sequentially selecting each piece of bit data included in a parallel signal on the basis of a plurality of clock signals that differ from one another in phase.

(13)

The transmitting device according to (10) or (11), in which the serializer unit includes a shift register.

(14)

The transmitting device according to any of (2) to (6), further including:

a serializer unit that generates a first serial signal, a second serial signal, a third serial signal, and a fourth serial signal; and a multiplexer unit that generates a first signal, a second signal, a third signal, and a fourth signal, in which the first control signal includes the first serial signal and the third serial signal, the second control signal includes the second serial signal and the fourth serial signal, the multiplexer unit generates the first signal on the basis of the first serial signal and the third serial signal, the second signal on the basis of an inverted signal of the first serial signal and an inverted signal of the third serial signal, the third signal on the basis of a first selected signal being, of an inverted signal of the second serial signal and the first serial signal, one selected through the first selecting operation and a second selected signal being, of an inverted signal of the fourth serial signal and the third serial signal, one selected through the first selecting operation, and the fourth signal on the basis of a third selected signal being, of the inverted signal of the first serial signal and the second serial signal, one selected through the first selecting operation and a fourth selected signal being, of the inverted signal of the third serial signal and the fourth serial signal, one selected through the first selecting operation, the first sub-driver unit operates on the basis of the first signal and the second signal, and the second sub-driver unit operates on the basis of the third signal and the fourth signal.

(15)

The transmitting device according to (14), in which in a case where the multiplexer unit generates the first signal on the basis of, of the first serial signal and the third serial signal, the first serial signal, the multiplexer unit generates the second signal on the basis of, of the inverted signal of the first serial signal and the inverted signal of the third serial signal, the inverted signal of the first serial signal, the third signal on the basis of, of the first selected signal and the second selected signal, the first selected signal, and the fourth signal on the basis of, of the third selected signal and the fourth selected signal, the third selected signal, and in a case where the multiplexer unit generates the first signal on the basis of, of the first serial signal and the third serial signal, the third serial signal, the multiplexer unit generates the second signal on the basis of, of the inverted signal of the first serial signal and the inverted signal of the third serial signal, the inverted signal of the third serial signal, the third signal on the basis of, of the first selected signal and the second selected signal, the second selected signal, and the fourth signal on the basis of, of the third selected signal and the fourth selected signal, the fourth selected signal.

(16)

The transmitting device according to (14) or (15), in which the multiplexer unit further generates: a fifth signal on the basis of, of the inverted signal of the first serial signal and the second serial signal, a signal selected through the second selecting operation and, of the inverted signal of the third serial signal and the fourth serial signal, a signal selected through the second selecting operation; a sixth signal on the basis of, of the inverted signal of the second serial signal and the first serial signal, a signal selected through the second selecting operation and, of the inverted signal of the fourth serial signal and the third serial signal, a signal selected through the second selecting operation; a seventh signal on the basis of the second serial signal and the fourth serial signal; and an eighth signal on the basis of the inverted signal of the second serial signal and the inverted signal of the fourth serial signal, the third sub-driver unit operates on the basis of the fifth signal and the sixth signal, and the fourth sub-driver unit operates on the basis of the seventh signal and the eighth signal.

(17)

The transmitting device according to any of (2) to (8), further including a third driver including a seventh sub-driver unit and an eighth sub-driver unit, the third driver being configured to be able to set a voltage at a third output terminal, the seventh sub-driver unit operating on the basis of a third control signal and the eighth sub-driver unit operating on the basis of, of the third control signal and a fourth control signal, a signal selected through a third selecting operation, in which the controller also controls the third selecting operation.

(18)

The transmitting device according to (17), in which the transmitting device has the first operation mode in which communication is performed by using a single-phase signal, the second operation mode in which communication is performed by using a differential signal, and a third operation mode in which communication is performed by using a signal having three voltage levels: a first voltage level, a second voltage level, and a third voltage level between the first voltage level and the second voltage level, and the controller selects:

in the first operation mode and the third operation mode, the first control signal in the first selecting operation, the second control signal in the second selecting operation, and the third control signal in the third selecting operation; and in the second operation mode, the second control signal in the first selecting operation, the first control signal in the second selecting operation, and the fourth control signal in the third selecting operation.

(19)

The transmitting device according to (18), in which the first sub-driver unit includes a first switch provided on a path from a first power source to the first output terminal and a second switch provided on a path from a second power source to the first output terminal, the second sub-driver unit includes a third switch provided on a path from the first power source to the first output terminal and a fourth switch provided on a path from the second power source to the first output terminal, and in the third operation mode, the first driver puts all the first switch, the second switch, the third switch, and the fourth switch into off state, thereby setting the voltage at the first output terminal to the third voltage level.

(20)

The transmitting device according to (18), in which the first sub-driver unit includes a first switch provided on a path from a first power source to the first output terminal and a second switch provided on a path from a second power source to the first output terminal, the second sub-driver unit includes a third switch provided on a path from the first power source to the first output terminal and a fourth switch provided on a path from the second power source to the first output terminal, and in the third operation mode, the first driver puts one of the first switch and the third switch into on state and the other one into off state, and puts one of the second switch and the fourth switch into on state and the other one into off state, thereby setting the voltage at the first output terminal to the third voltage level.

(21)

The transmitting device according to any of (18) to (10), further including a multiplexer unit that generates a first signal, a second signal, a third signal, a fourth signal, a fifth signal, a sixth signal, a seventh signal, and an eighth signal, in which the first control signal includes the first signal and the second signal, the second control signal includes the third signal and the fourth signal, the third control signal includes the fifth signal and the sixth signal, and the fourth control signal includes the seventh signal and the eighth signal.

(22)

The transmitting device according to (21), in which in the third operation mode, the first driver selectively sets the voltage at the first output terminal to the first voltage level or the second voltage level in a case where the first signal and the second signal are different from each other; and in the third operation mode, the first driver sets the voltage at the first output terminal to the third voltage level in a case where the first signal and the second signal are equal to each other.

(23)

The transmitting device according to (21) or (22), further including:

a serializer unit that generates eight serial signals including a first serial signal and a second serial signal; and an encoder unit that generates a first encoding signal and a second encoding signal on the basis of the first serial signal and generates a third encoding signal and a fourth encoding signal on the basis of the second serial signal, in the first operation mode and the second operation mode, in which the multiplexer unit generates the first signal on the basis of the first encoding signal and the third encoding signal and generates the second signal on the basis of the second encoding signal and the fourth encoding signal.

(24)

The transmitting device according to (23), in which in the third operation mode, the encoder unit generates the first encoding signal and the second encoding signal on the basis of, of the eight serial signals, two signals including the first serial signal, and generates the third encoding signal and the fourth encoding signal on the basis of, of the eight serial signals, two signals including the second serial signal.

(25)

The transmitting device according to (23) or (24), in which in a case where the multiplexer unit generates the first signal on the basis of, of the first encoding signal and the third encoding signal, the first encoding signal, the multiplexer unit generates the second signal on the basis of, of the second encoding signal and the fourth encoding signal, the second encoding signal, and in a case where the multiplexer unit generates the first signal on the basis of, of the first encoding signal and the third encoding signal, the third encoding signal, the multiplexer unit generates the second signal on the basis of, of the second encoding signal and the fourth encoding signal, the fourth encoding signal.

(26)

The transmitting device according to (23) or (25), in which the first serial signal includes a first sub signal and a second sub signal, the second serial signal includes a third sub signal and a fourth sub signal, and the encoder unit generates the first encoding signal and the second encoding signal on the basis of the first sub signal and the second sub signal, and generates the third encoding signal and the fourth encoding signal on the basis of the third sub signal and the fourth sub signal.

(27)

The transmitting device according to (26), in which the serializer unit generates the first sub signal and the second sub signal on the basis of a first parallel signal and a second parallel signal, in the first operation mode and the second operation mode, the first parallel signal and the second parallel signal constitute a differential parallel signal, and the first sub signal and the second sub signal constitute a differential signal, and in the first operation mode and the second operation mode, the serializer unit generates the first sub signal and the second sub signal by sequentially selecting each piece of bit data included in the differential parallel signal.

(28)

The transmitting device according to (27), in which in the third operation mode, the first parallel signal and the second parallel signal are separate signals, in the third operation mode, the serializer unit selects both first bit data included in the first parallel signal and second bit data included in the second parallel signal, in a case where the first bit data and the second bit data are different from each other, the serializer unit generates the first sub signal and the second sub signal that are inverted from each other on the basis of the first bit data and the second bit data, and in a case where the first bit data and the second bit data are equal to each other, the serializer unit generates the first sub signal and the second sub signal that have an equal predetermined signal level.

(29)

The transmitting device according to any of (18) to (20), further including an encoder unit that generates a first encoding signal, a second encoding signal, a third encoding signal, a fourth encoding signal, a fifth encoding signal, a sixth encoding signal, a seventh encoding signal, and an eighth encoding signal, in which the first control signal includes the first encoding signal and the second encoding signal, the second control signal includes the third encoding signal and the fourth encoding signal, the third control signal includes the fifth encoding signal and the sixth encoding signal, and the fourth control signal includes the seventh encoding signal and the eighth encoding signal.

(30)

The transmitting device according to (29), further including a multiplexer unit that generates eight signals including a first signal and a second signal, in which the encoder unit generates:

in the first operation mode and the second operation mode, the first encoding signal on the basis of the first signal, and the second encoding signal on the basis of the second signal; and in the third operation mode, the first encoding signal on the basis of, of the eight signals, two signals including the first signal, and the second encoding signal on the basis of, of the eight signals, two signals including the second signal.

(31)

The transmitting device according to (29), further including a multiplexer unit that generates eight signals including a first signal and a second signal, in which the encoder unit generates the first encoding signal and the second encoding signal on the basis of the first signal and the second signal.

(32)

The transmitting device according to (31), further including a serializer unit that generates eight serial signals including a first serial signal and a second serial signal, in which the first serial signal includes a first sub signal and a second sub signal, the second serial signal includes a third sub signal and a fourth sub signal, and the multiplexer unit generates the first signal on the basis of the first sub signal and the third sub signal, and generates the second signal on the basis of the second sub signal and the fourth sub signal.

(33)

A transmitting method including:

preparing a first control signal and a second control signal; and causing a first sub-driver unit to operate on the basis of the first control signal and a second sub-driver unit to operate on the basis of, of the first control signal and the second control signal, a signal selected through a first selecting operation, thereby setting a voltage at a first output terminal.

(34)

A communication system provided with a transmitting device, and a receiving device, the transmitting device including:

a first driver including a first sub-driver unit and a second sub-driver unit, the first driver being configured to be able to set a voltage at a first output terminal, the first sub-driver unit operating on the basis of a first control signal, the second sub-driver unit operating on the basis of, of the first control signal and a second control signal, a signal selected through a first selecting operation; and a controller that controls the first selecting operation.

This application claims the benefit of Japanese Priority Patent Application JP2016-139024 filed with the Japan Patent Office on Jul. 14, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A transmitting device comprising:
a first driver including a first sub-driver circuitry and a second sub-driver circuitry, the first driver being configured to be able to set a voltage at a first output terminal, the first sub-driver circuitry operating on a basis of a first control signal, the second sub-driver circuitry operating on a basis of, of the first control signal and a second control signal, a signal selected through a first selecting operation;
a controller that controls the first selecting operation; and
a second driver including a third sub-driver circuitry and a fourth sub-driver circuitry, the second driver being configured to be able to set a voltage at a second output terminal, the third sub-driver circuitry operating on a basis of, of the first control signal and the second control signal, a signal selected through a second selecting operation, the fourth sub-driver circuitry operating on a basis of the second control signal,
wherein the controller also controls the second selecting operation.

2. The transmitting device according to claim 1, wherein the transmitting device has a first operation mode and a second operation mode, and
the controller selects:
in the first operation mode, the first control signal in the first selecting operation and the second control signal in the second selecting operation; and
in the second operation mode, the second control signal in the first selecting operation and the first control signal in the second selecting operation.

3. The transmitting device according to claim 1, wherein an output impedance of the first sub-driver circuitry is lower than an output impedance of the second sub-driver circuitry, and
an output impedance of the third sub-driver circuitry is lower than an output impedance of the fourth sub-driver circuitry.

4. The transmitting device according to claim 1, wherein the output impedance of the first sub-driver circuitry, the output impedance of the second sub-driver circuitry, the output impedance of the third sub-driver circuitry, and the output impedance of the fourth sub-driver circuitry are each configured to be settable.

5. The transmitting device according to claim 1, further comprising:
a first selector circuitry that performs the first selecting operation; and
a second selector circuitry that performs the second selecting operation.

6. The transmitting device according to claim 1, wherein the second sub-driver circuitry further performs the first selecting operation, and
the third sub-driver circuitry further performs the second selecting operation.

7. The transmitting device according to claim 6, wherein the second sub-driver circuitry includes:
a fifth sub-driver circuitry that operates on a basis of the first control signal; and
a sixth sub-driver circuitry that operates on a basis of the second control signal, and
the controller controls the first selecting operation by enabling one of the fifth sub-driver circuitry and the sixth sub-driver circuitry.

8. The transmitting device according to claim 1, further comprising a multiplexer that generates a first signal, a second signal, a third signal, and a fourth signal,
   wherein the first control signal includes the first signal and the second signal, and
   the second control signal includes the third signal and the fourth signal.

9. The transmitting device according to claim 8, further comprising a serializer circuitry that generates a first serial signal, a second serial signal, a third serial signal, and a fourth serial signal,
   wherein the multiplexer generates:
      the first signal on a basis of the first serial signal and the third serial signal;
      the second signal on a basis of an inverted signal of the first serial signal and an inverted signal of the third serial signal;
      the third signal on a basis of the second serial signal and the fourth serial signal; and
      the fourth signal on a basis of an inverted signal of the second serial signal and an inverted signal of the fourth serial signal.

10. The transmitting device according to claim 9, wherein
   in a case where the multiplexer generates the first signal on a basis of, of the first serial signal and the third serial signal, the first serial signal, the multiplexer generates the second signal on a basis of, of the inverted signal of the first serial signal and the inverted signal of the third serial signal, the inverted signal of the first serial signal, the third signal on a basis of, of the second serial signal and the fourth serial signal, the second serial signal, and the fourth signal on a basis of, of the inverted signal of the second serial signal and the inverted signal of the fourth serial signal, the inverted signal of the second serial signal, and
   in a case where the multiplexer generates the first signal on a basis of, of the first serial signal and the third serial signal, the third serial signal, the multiplexer generates the second signal on a basis of, of the inverted signal of the first serial signal and the inverted signal of the third serial signal, the inverted signal of the third serial signal, the third signal on a basis of, of the second serial signal and the fourth serial signal, the fourth serial signal, and the fourth signal on a basis of, of the inverted signal of the second serial signal and the inverted signal of the fourth serial signal, the inverted signal of the fourth serial signal.

11. The transmitting device according to claim 9, wherein the serializer circuitry generates the first serial signal by sequentially selecting each piece of bit data included in a parallel signal on a basis of a plurality of clock signals that differ from one another in phase.

12. The transmitting device according to claim 9, wherein the serializer circuitry includes a shift register.

13. The transmitting device according to claim 1, further comprising:
   a serializer circuitry that generates a first serial signal, a second serial signal, a third serial signal, and a fourth serial signal; and
   a multiplexer that generates a first signal, a second signal, a third signal, and a fourth signal,
   wherein the first control signal includes the first serial signal and the third serial signal,
   the second control signal includes the second serial signal and the fourth serial signal,
   the multiplexer generates the first signal on a basis of the first serial signal and the third serial signal, the second signal on a basis of an inverted signal of the first serial signal and an inverted signal of the third serial signal, the third signal on a basis of a first selected signal being, of an inverted signal of the second serial signal and the first serial signal, one selected through the first selecting operation and a second selected signal being, of an inverted signal of the fourth serial signal and the third serial signal, one selected through the first selecting operation, and the fourth signal on a basis of a third selected signal being, of the inverted signal of the first serial signal and the second serial signal, one selected through the first selecting operation and a fourth selected signal being, of the inverted signal of the third serial signal and the fourth serial signal, one selected through the first selecting operation,
   the first sub-driver circuitry operates on a basis of the first signal and the second signal, and
   the second sub-driver circuitry operates on a basis of the third signal and the fourth signal.

14. The transmitting device according to claim 13, wherein
   in a case where the multiplexer generates the first signal on a basis of, of the first serial signal and the third serial signal, the first serial signal, the multiplexer generates the second signal on a basis of, of the inverted signal of the first serial signal and the inverted signal of the third serial signal, the inverted signal of the first serial signal, the third signal on a basis of, of the first selected signal and the second selected signal, the first selected signal, and the fourth signal on a basis of, of the third selected signal and the fourth selected signal, the third selected signal, and
   in a case where the multiplexer generates the first signal on a basis of, of the first serial signal and the third serial signal, the third serial signal, the multiplexer generates the second signal on a basis of, of the inverted signal of the first serial signal and the inverted signal of the third serial signal, the inverted signal of the third serial signal, the third signal on a basis of, of the first selected signal and the second selected signal, the second selected signal, and the fourth signal on a basis of, of the third selected signal and the fourth selected signal, the fourth selected signal.

15. The transmitting device according to claim 13, wherein
   the multiplexer further generates: a fifth signal on a basis of, of the inverted signal of the first serial signal and the second serial signal, a signal selected through the second selecting operation and, of the inverted signal of the third serial signal and the fourth serial signal, a signal selected through the second selecting operation; a sixth signal on a basis of, of the inverted signal of the second serial signal and the first serial signal, a signal selected through the second selecting operation and, of the inverted signal of the fourth serial signal and the third serial signal, a signal selected through the second selecting operation; a seventh signal on a basis of the second serial signal and the fourth serial signal; and an eighth signal on a basis of the inverted signal of the second serial signal and the inverted signal of the fourth serial signal,
   the third sub-driver circuitry operates on a basis of the fifth signal and the sixth signal, and
   the fourth sub-driver circuitry operates on a basis of the seventh signal and the eighth signal.

16. The transmitting device according to claim 1, further comprising a third driver including a seventh sub-driver circuitry and an eighth sub-driver circuitry, the third driver being configured to be able to set a voltage at a third output terminal, the seventh sub-driver circuitry operating on a basis of a third control signal and the eighth sub-driver circuitry operating on a basis of, of the third control signal and a fourth control signal, a signal selected through a third selecting operation, wherein the controller also controls the third selecting operation.

17. The transmitting device according to claim 16, wherein the transmitting device has the first operation mode in which communication is performed by using a single-phase signal, the second operation mode in which communication is performed by using a differential signal, and a third operation mode in which communication is performed by using a signal having three voltage levels: a first voltage level, a second voltage level, and a third voltage level between the first voltage level and the second voltage level, and the controller selects:

in the first operation mode and the third operation mode, the first control signal in the first selecting operation, the second control signal in the second selecting operation, and the third control signal in the third selecting operation; and in the second operation mode, the second control signal in the first selecting operation, the first control signal in the second selecting operation, and the fourth control signal in the third selecting operation.

18. The transmitting device according to claim 17, wherein the first sub-driver circuitry includes a first switch provided on a path from a first power source to the first output terminal and a second switch provided on a path from a second power source to the first output terminal, the second sub-driver circuitry includes a third switch provided on a path from the first power source to the first output terminal and a fourth switch provided on a path from the second power source to the first output terminal, and in the third operation mode, the first driver puts all the first switch, the second switch, the third switch, and the fourth switch into off state, thereby setting the voltage at the first output terminal to the third voltage level.

19. The transmitting device according to claim 17, wherein the first sub-driver circuitry includes a first switch provided on a path from a first power source to the first output terminal and a second switch provided on a path from a second power source to the first output terminal, the second sub-driver circuitry includes a third switch provided on a path from the first power source to the first output terminal and a fourth switch provided on a path from the second power source to the first output terminal, and in the third operation mode, the first driver puts one of the first switch and the third switch into on state and the other one into off state, and puts one of the second switch and the fourth switch into on state and the other one into off state, thereby setting the voltage at the first output terminal to the third voltage level.

20. The transmitting device according to claim 17, further comprising a multiplexer that generates a first signal, a second signal, a third signal, a fourth signal, a fifth signal, a sixth signal, a seventh signal, and an eighth signal, wherein the first control signal includes the first signal and the second signal, the second control signal includes the third signal and the fourth signal, the third control signal includes the fifth signal and the sixth signal, and the fourth control signal includes the seventh signal and the eighth signal.

21. The transmitting device according to claim 20, wherein in the third operation mode, the first driver selectively sets the voltage at the first output terminal to the first voltage level or the second voltage level in a case where the first signal and the second signal are different from each other; and in the third operation mode, the first driver sets the voltage at the first output terminal to the third voltage level in a case where the first signal and the second signal are equal to each other.

22. The transmitting device according to claim 20, further comprising:

a serializer circuitry that generates eight serial signals including a first serial signal and a second serial signal; and an encoder that generates a first encoding signal and a second encoding signal on a basis of the first serial signal and generates a third encoding signal and a fourth encoding signal on a basis of the second serial signal, in the first operation mode and the second operation mode, wherein the multiplexer generates the first signal on a basis of the first encoding signal and the third encoding signal and generates the second signal on a basis of the second encoding signal and the fourth encoding signal.

23. The transmitting device according to claim 22, wherein in the third operation mode, the encoder generates the first encoding signal and the second encoding signal on a basis of, of the eight serial signals, two signals including the first serial signal, and generates the third encoding signal and the fourth encoding signal on a basis of, of the eight serial signals, two signals including the second serial signal.

24. The transmitting device according to claim 22, wherein in a case where the multiplexer generates the first signal on a basis of, of the first encoding signal and the third encoding signal, the first encoding signal, the multiplexer generates the second signal on a basis of, of the second encoding signal and the fourth encoding signal, the second encoding signal, and in a case where the multiplexer generates the first signal on a basis of, of the first encoding signal and the third encoding signal, the third encoding signal, the multiplexer generates the second signal on a basis of, of the second encoding signal and the fourth encoding signal, the fourth encoding signal.

25. The transmitting device according to claim 22, wherein the first serial signal includes a first sub signal and a second sub signal, the second serial signal includes a third sub signal and a fourth sub signal, and the encoder generates the first encoding signal and the second encoding signal on a basis of the first sub signal and the second sub signal, and generates the third encoding signal and the fourth encoding signal on a basis of the third sub signal and the fourth sub signal.

26. The transmitting device according to claim 25, wherein
the serializer circuitry generates the first sub signal and the second sub signal on a basis of a first parallel signal and a second parallel signal,
in the first operation mode and the second operation mode, the first parallel signal and the second parallel signal constitute a differential parallel signal, and the first sub signal and the second sub signal constitute a differential signal, and
in the first operation mode and the second operation mode, the serializer circuitry generates the first sub signal and the second sub signal by sequentially selecting each piece of bit data included in the differential parallel signal.

27. The transmitting device according to claim 26, wherein
in the third operation mode, the first parallel signal and the second parallel signal are separate signals,
in the third operation mode, the serializer circuitry selects both first bit data included in the first parallel signal and second bit data included in the second parallel signal,
in a case where the first bit data and the second bit data are different from each other, the serializer circuitry generates the first sub signal and the second sub signal that are inverted from each other on a basis of the first bit data and the second bit data, and
in a case where the first bit data and the second bit data are equal to each other, the serializer circuitry generates the first sub signal and the second sub signal that have an equal predetermined signal level.

28. The transmitting device according to claim 17, further comprising an encoder that generates a first encoding signal, a second encoding signal, a third encoding signal, a fourth encoding signal, a fifth encoding signal, a sixth encoding signal, a seventh encoding signal, and an eighth encoding signal,
wherein the first control signal includes the first encoding signal and the second encoding signal,
the second control signal includes the third encoding signal and the fourth encoding signal,
the third control signal includes the fifth encoding signal and the sixth encoding signal, and
the fourth control signal includes the seventh encoding signal and the eighth encoding signal.

29. The transmitting device according to claim 28, further comprising a multiplexer that generates eight signals including a first signal and a second signal,
wherein the encoder generates:
in the first operation mode and the second operation mode, the first encoding signal on a basis of the first signal, and the second encoding signal on a basis of the second signal; and
in the third operation mode, the first encoding signal on a basis of, of the eight signals, two signals including the first signal, and the second encoding signal on a basis of, of the eight signals, two signals including the second signal.

30. The transmitting device according to claim 28, further comprising a multiplexer that generates eight signals including a first signal and a second signal,
wherein the encoder generates the first encoding signal and the second encoding signal on a basis of the first signal and the second signal.

31. The transmitting device according to claim 30, further comprising a serializer circuitry that generates eight serial signals including a first serial signal and a second serial signal,
wherein the first serial signal includes a first sub signal and a second sub signal,
the second serial signal includes a third sub signal and a fourth sub signal, and
the multiplexer generates the first signal on a basis of the first sub signal and the third sub signal, and generates the second signal on a basis of the second sub signal and the fourth sub signal.

32. A communication system comprising:
the transmitting device according to claim 1, and
a receiving device.

* * * * *